US012592179B2

(12) United States Patent
Bok et al.

(10) Patent No.: US 12,592,179 B2
(45) Date of Patent: Mar. 31, 2026

(54) DISPLAY PANEL AND DISPLAY APPARATUS INCLUDING THE SAME

(71) Applicant: Samsung Display Co., Ltd., Yongin-si (KR)

(72) Inventors: Seunglyong Bok, Yongin-si (KR); Yongje Jeon, Yongin-si (KR); Songi Kim, Yongin-si (KR); Okkyung Park, Yongin-si (KR); Youngran Son, Yongin-si (KR); Dongho Lee, Yongin-si (KR); Seunghoon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/414,930

(22) Filed: Jan. 17, 2024

(65) Prior Publication Data

US 2024/0184390 A1     Jun. 6, 2024

Related U.S. Application Data

(63) Continuation of application No. 17/094,368, filed on Nov. 10, 2020, now Pat. No. 11,899,862.

(30) Foreign Application Priority Data

Dec. 24, 2019     (KR) ........................ 10-2019-0174360

(51) Int. Cl.
 *G06F 3/041*     (2006.01)
 *G06F 1/16*     (2006.01)
 (Continued)

(52) U.S. Cl.
 CPC ............. *G09G 3/32* (2013.01); *G06F 1/1626* (2013.01); *G06F 3/0412* (2013.01);
 (Continued)

(58) Field of Classification Search
 None
 See application file for complete search history.

(56) References Cited

U.S. PATENT DOCUMENTS

| 6,454,414 B1 | 9/2002 | Ting |
| 7,663,607 B2 | 2/2010 | Hotelling et al. |
| | (Continued) | |

FOREIGN PATENT DOCUMENTS

| CN | 106603772 | 4/2017 |
| CN | 106611771 A | 5/2017 |
| | (Continued) | |

OTHER PUBLICATIONS

"LED and PHOTODIODE : Are They Same?", Sep. 11, 2016, https://www.youtube.com/watch?v=9wtykHesCEU.
(Continued)

*Primary Examiner* — Brian M Butcher
(74) *Attorney, Agent, or Firm* — Sughrue Mion, PLLC

(57) ABSTRACT

A display panel includes a main display area, and a component area including a transmission area. The display panel includes a substrate including a groove disposed in the transmission area in a depth direction of the substrate; main display elements disposed above the substrate in the main display area; main pixel circuits electrically connected to the main display elements; and auxiliary display elements disposed above the substrate in the component area; and auxiliary pixel circuits electrically connected to the auxiliary display elements.

20 Claims, 169 Drawing Sheets

(51) Int. Cl.

| | |
|---|---|
| *G06F 3/044* | (2006.01) |
| *G09G 3/32* | (2016.01) |
| *G09G 3/3233* | (2016.01) |
| *H04N 23/55* | (2023.01) |
| *H10K 59/121* | (2023.01) |
| *H10K 59/125* | (2023.01) |
| *H10K 59/38* | (2023.01) |
| *H10K 59/40* | (2023.01) |
| *H10K 77/10* | (2023.01) |
| *H10K 59/12* | (2023.01) |
| *H10K 59/80* | (2023.01) |

(52) U.S. Cl.

CPC .......... *G06F 3/0443* (2019.05); *G06F 3/0446* (2019.05); *G09G 3/3233* (2013.01); *H04N 23/55* (2023.01); *H10K 59/121* (2023.02); *H10K 59/125* (2023.02); *H10K 59/38* (2023.02); *H10K 59/40* (2023.02); *H10K 77/111* (2023.02); *H10K 59/12* (2023.02); *H10K 59/8722* (2023.02); *H10K 59/879* (2023.02)

(56) References Cited

U.S. PATENT DOCUMENTS

| | | | |
|---|---|---|---|
| 7,714,923 | B2 | 5/2010 | Cok et al. |
| 7,759,863 | B2 | 7/2010 | Kim et al. |
| 7,916,167 | B2 | 3/2011 | Miyagawa et al. |
| 8,390,582 | B2 | 3/2013 | Hotelling et al. |
| 8,530,910 | B2 | 9/2013 | Song et al. |
| 8,796,702 | B2 | 8/2014 | Kim et al. |
| 8,847,860 | B2 | 9/2014 | Nakamura et al. |
| 8,872,206 | B2 | 10/2014 | Chung et al. |
| 9,081,453 | B2 | 7/2015 | Bulea et al. |
| 9,112,112 | B2 | 8/2015 | Do et al. |
| 9,430,180 | B2 | 8/2016 | Hirakata et al. |
| 9,648,216 | B2 | 5/2017 | Yoo et al. |
| 9,773,761 | B2 | 9/2017 | Do |
| 9,927,898 | B2 | 3/2018 | Bok et al. |
| 10,121,831 | B2 | 11/2018 | Rappoport et al. |
| 10,185,430 | B2 | 1/2019 | Zhu et al. |
| 10,276,640 | B2 | 4/2019 | Chung et al. |
| 10,331,164 | B2 | 6/2019 | Bao |
| 10,338,712 | B2 | 7/2019 | Bok et al. |
| 10,345,905 | B2 | 7/2019 | McCLURE et al. |
| 10,368,022 | B2 | 7/2019 | Wan |
| 10,381,750 | B2 | 8/2019 | Jung et al. |
| 10,403,855 | B2 | 9/2019 | Liang et al. |
| 10,431,636 | B2 | 10/2019 | Rappoport et al. |
| 10,564,350 | B2 | 2/2020 | Bang et al. |
| 2011/0163664 | A1 | 7/2011 | Kang et al. |
| 2012/0104422 | A1 | 5/2012 | Lee et al. |
| 2012/0206669 | A1 | 8/2012 | Kim et al. |
| 2013/0194204 | A1 | 8/2013 | Kang et al. |
| 2014/0002385 | A1 | 1/2014 | Ka et al. |
| 2014/0145156 | A1 | 5/2014 | Choi et al. |
| 2014/0312321 | A1 | 10/2014 | Yoo et al. |
| 2015/0123086 | A1 | 5/2015 | Lee et al. |
| 2015/0243685 | A1 | 8/2015 | Lee et al. |
| 2015/0338888 | A1 | 11/2015 | Kim et al. |
| 2015/0379923 | A1 | 12/2015 | Lee et al. |
| 2016/0035812 | A1 | 2/2016 | Kwon et al. |
| 2016/0172633 | A1 | 6/2016 | Ahn et al. |
| 2016/0233289 | A1 | 8/2016 | Son et al. |
| 2016/0260780 | A1 | 9/2016 | Kim et al. |
| 2017/0064173 | A1 | 3/2017 | Yoo et al. |
| 2017/0115785 | A1 | 4/2017 | Seo et al. |
| 2017/0162111 | A1 | 6/2017 | Kang et al. |
| 2017/0213873 | A1* | 7/2017 | Bok ...................... H10K 59/40 |
| 2017/0236877 | A1 | 8/2017 | Jeong |
| 2018/0089485 | A1 | 3/2018 | Bok |
| 2018/0157357 | A1 | 6/2018 | Lin et al. |
| 2018/0173050 | A1 | 6/2018 | Yaegashi et al. |
| 2018/0301658 | A1 | 10/2018 | Chung et al. |
| 2019/0004640 | A1 | 1/2019 | Ye |
| 2019/0081118 | A1 | 3/2019 | Oh et al. |
| 2019/0130822 | A1 | 5/2019 | Jung et al. |
| 2019/0206953 | A1 | 7/2019 | Hsieh et al. |
| 2019/0355509 | A1 | 11/2019 | Yio et al. |
| 2019/0373166 | A1 | 12/2019 | Jia |
| 2019/0373229 | A1 | 12/2019 | Zhang et al. |
| 2020/0098308 | A1 | 3/2020 | Li |

FOREIGN PATENT DOCUMENTS

| | | | |
|---|---|---|---|
| CN | 107025875 | | 8/2017 |
| CN | 206451466 | | 8/2017 |
| CN | 107425041 | | 12/2017 |
| CN | 108366186 | | 8/2018 |
| CN | 108810201 | | 11/2018 |
| CN | 108881530 | | 11/2018 |
| CN | 108900659 | | 11/2018 |
| CN | 108983872 | | 12/2018 |
| CN | 109001934 | | 12/2018 |
| CN | 208384466 | | 1/2019 |
| CN | 208386639 | | 1/2019 |
| CN | 110071161 | A | 7/2019 |
| CN | 110265448 | | 9/2019 |
| CN | 110518141 | A | 11/2019 |
| DE | 10 2011 089 443 | | 8/2012 |
| KR | 10-2011-0080384 | | 7/2011 |
| KR | 10-2012-0122159 | | 11/2012 |
| KR | 10-2014-0001576 | | 1/2014 |
| KR | 10-2014-0125029 | | 10/2014 |
| KR | 10-2015-0006798 | | 1/2015 |
| KR | 10-2015-0052490 | | 5/2015 |
| KR | 10-2015-0101406 | | 9/2015 |
| KR | 10-2016-0071567 | | 6/2016 |
| KR | 10-2016-0096760 | A | 8/2016 |
| KR | 10-2016-0106825 | | 9/2016 |
| KR | 10-2017-0029041 | | 3/2017 |
| KR | 10-2018-0027467 | | 3/2018 |
| KR | 10-2018-0116512 | | 10/2018 |
| KR | 10-2019-0019802 | | 2/2019 |
| KR | 10-2019-0091711 | | 8/2019 |
| KR | 10-2019-0130822 | | 11/2019 |
| KR | 10-2040651 | | 11/2019 |

OTHER PUBLICATIONS

Chinese Office Action dated Dec. 30, 2024, in Chinese Patent Application No. 202011527361.3.

Communication issued on Jun. 24, 2025 by the China National Intellectual Property Administration in Chinese Patent Application No. 202011527361.3.

\* cited by examiner

OFL

TSL

ED

ENCM

ED

DISL

TFT

IL

BML

TFT

100

PY

LBY

PB

CY

HSY

PB_OP

OCR    40    40RS

40SP

MDA    CA    MDA z x

ILED

DISPLAY PANEL AND DISPLAY APPARATUS INCLUDING THE SAME

CROSS-REFERENCE TO RELATED APPLICATIONS

This is a continuation application of U.S. patent application Ser. No. 17/094,368, filed Nov. 10, 2020, now U.S. Pat. No. 11,899,862, which issued Feb. 13, 2025, the disclosure of which is incorporated herein by reference in its entirety. U.S. patent application Ser. No. 17/094,368 claims priority to and benefits of Korean Patent Application No. 10-2019-0174360 under 35 U.S.C. § 119, filed Dec. 24, 2019 in the Korean Intellectual Property Office, the entire contents of which are incorporated herein by reference.

BACKGROUND

1. Technical Field

One or more embodiments relate to display panels and display apparatuses including the same, and, to a display panel having an extended display area such that an image or images may be displayed even in an area where a component such as an electronic element may be arranged or disposed, and a display apparatus including the display panel.

2. Description of the Related Art

Applications of display apparatuses have recently become diversified. Moreover, since display apparatuses have become thinner and lighter, their range of use has increased.

Given that display apparatuses are utilized in various ways, various methods may be used to design the shapes of display apparatuses, and the number of functions that may be connected or linked to display apparatuses are increasing.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include a display panel having an extended display area such that an image may be displayed even in an area where an electronic component may be arranged or disposed, and a display apparatus including the display panel. However, one or more embodiments are only examples, and the scope of the disclosure is not limited thereto.

Additional aspects will be set forth in part in the description which follows and, in part, will be apparent from the description, or may be learned by practice of the embodiments.

According to an embodiment, a display panel may include a main display area, and a component area which may include a transmission area. The display panel may include a substrate including a groove disposed in the transmission area in a depth direction of the substrate; main display elements disposed above the substrate in the main display area, main pixel circuits electrically connected to the main display elements, auxiliary display elements disposed above the substrate in the component area; and auxiliary pixel circuits electrically connected to the auxiliary display elements.

The substrate may comprise a first base layer, a first inorganic barrier layer, a second base layer, and a second inorganic barrier layer that may be sequentially stacked, the second inorganic barrier layer may comprise a first opening in the transmission area, the second base layer may comprise a second opening overlapping the first opening, and the groove may comprise the first opening, the second opening, and an upper surface of the first inorganic barrier layer.

The main display elements may include main subpixels disposed in the main display area, the main subpixels may have a first pixel arrangement structure, the auxiliary display elements may include auxiliary subpixels disposed in the component area, the auxiliary subpixels may have a second pixel arrangement structure, and the first pixel arrangement structure may be different from the second pixel arrangement structure.

The component area may comprise a first component area and a second component area, auxiliary subpixels disposed in the first component area may have a third pixel arrangement structure, and auxiliary subpixels disposed in the second component area may have a fourth pixel arrangement structure that may be different from the third pixel arrangement structure.

A plurality of pixel groups may correspond to groups of the auxiliary display elements may be disposed in the component area, a plurality of transmission areas may be disposed in the component area, and the plurality of pixel groups and the plurality of transmission areas may alternate with each other.

A bottom metal layer may be disposed between the substrate and the auxiliary pixel circuit, the bottom metal layer may comprise a bottom-hole in the transmission area, and the bottom-hole may have a polygonal shape having eight or more sides or may have a circular shape.

An upper layer may be disposed on an opposite electrode that may be disposed in the main display elements and the auxiliary display elements, the opposite electrode may comprise a first opening in the transmission area, the upper layer may comprise a second opening in the transmission area, and an inner side surface of the first opening and an inner side surface of the second opening may be coplanar.

A weak adhesive layer may be disposed in the transmission area; and an opposite electrode may be disposed in the main display elements and the auxiliary display elements. The opposite electrode may include a transmission hole or a transmission groove corresponding to the weak adhesive layer.

A functional layer may be disposed in the main display elements and the auxiliary display elements and may include an organic material, the functional layer may be continuously disposed in the transmission area, and an opposite electrode may be disposed in the main display elements and the auxiliary display elements and may include a transmission hole or a transmission groove corresponding to a weak adhesive layer.

An opposite electrode may be disposed in the main display elements and the auxiliary display elements. The opposite electrode may include: a first thickness at a portion of the opposite electrode that may overlap pixel electrodes of the auxiliary display elements; and a second thickness at a portion of the opposite electrode between the auxiliary display elements. The second thickness may be greater than the first thickness.

The auxiliary display elements may include auxiliary subpixels which may include an auxiliary subpixel emitting a first color, the main display elements may include main subpixels which may include a main subpixel emitting the first color, and a size of the auxiliary subpixel emitting the first color may be greater than a size of the main subpixel emitting the first color.

At least one of the main pixel circuits and the auxiliary pixel circuits may comprise a first thin-film transistor that may include an oxide semiconductor layer; and a second thin-film transistor that may include a polysilicon semiconductor layer.

The auxiliary display elements may comprise a first auxiliary display element and a second auxiliary display element, a thickness of a first pixel electrode of the first auxiliary display element may be greater than a thickness of a second pixel electrode of the second auxiliary display element, and the first pixel electrode may comprise a reflective layer.

The auxiliary display elements may comprise a first auxiliary display element, a pixel electrode of the first auxiliary display element may comprise a first pixel electrode unit and a second pixel electrode unit, a thickness of the first pixel electrode unit may be different from a thickness of the second pixel electrode unit, the first pixel electrode unit may be a stack of a first transparent electrode layer, a reflective layer, and a second transparent electrode layer, and the second pixel electrode unit may extend from the first transparent electrode layer.

A wire may be disposed in the transmission area and may include a transparent conductive material.

A first display driving unit may drive the main pixel circuits, and a second display driving unit may drive the auxiliary pixel circuits, wherein at least one of a driving voltage and a common voltage that is applied to the main pixel circuits may be different from at least one of a driving voltage and a common voltage that is applied to the auxiliary pixel circuits.

A first main data line may be electrically connected to the main pixel circuits, and a first auxiliary data line may be electrically connected to the auxiliary pixel circuits, wherein the first main data line and the first auxiliary data line may be disposed in a same column, and an end of the first main data line and an end of the first auxiliary data line may be spaced apart from each other with the transmission area disposed between the end of the first main data line and the end of the first auxiliary data line.

A first wire may be electrically connected to a predetermined number of the main pixel circuits and a predetermined number of the auxiliary pixel circuits, a load matching unit may be electrically connected to the first wire and may be disposed in a peripheral area adjacent to the component area, and a first load connecting line may electrically connect the first wire to the load matching unit, wherein the first load connecting line may be disposed between the substrate and the main pixel circuits, and the first wire may electrically contact the first load connecting line via a contact hole.

A thin-film encapsulation layer may be disposed in the main display elements and the auxiliary display elements and may comprise a first inorganic encapsulation layer, an organic encapsulation layer, and a second inorganic encapsulation layer, wherein the first inorganic encapsulation layer may be disposed within the groove of the substrate.

An encapsulation member may be disposed in the main display elements and the auxiliary display elements; and a touch screen layer may be disposed on the encapsulation member. The touch screen layer may overlap the main display area and may comprise sensing electrodes disposed in a first direction; driving electrodes disposed in a second direction intersecting the first direction; first connecting electrodes electrically connecting the sensing electrodes to each other; and second connecting electrodes electrically connecting the driving electrodes to each other. The touch screen layer may overlap the component area and may comprise touch electrodes disposed in the first direction and the second direction and spaced apart from each other.

The sensing electrodes and the driving electrodes may be driven according to a mutual capacitance method, and the touch electrodes may be driven according to a self capacitance method.

The touch screen layer may comprise a touch opening in the transmission area.

An encapsulation member may encapsulate the main display elements and the auxiliary display elements, and a mirror member may be disposed on a surface of the encapsulation member. At least one of the main display area and the component area may comprise a mirror area, and the mirror member may be disposed in the mirror area and may comprise a first mirror layer including a first mirror opening in the main display elements and the auxiliary display elements; and a second mirror layer disposed in the mirror area and the first mirror opening.

At least one of the first mirror layer and the second mirror layer may be a self capacitance type touch electrode.

An encapsulation member may be disposed in the main display elements and the auxiliary display elements; a touch screen layer may be disposed on the encapsulation member; a filter plate may be disposed on the touch screen layer and may comprise a color filter and a black matrix, and the filter plate may comprise an opening in the transmission area.

The substrate may comprise an upper surface portion; a first side surface portion extending from a side of the upper surface portion and may be bent with a first radius of curvature; and a second side surface portion extending from another side of the upper surface portion and bent with a second radius of curvature. The component area may be disposed on the upper surface portion and the first side surface portion.

The first radius of curvature may be greater than the second radius of curvature.

According to an embodiment, a display panel may include a main display area, a component area including auxiliary display areas and image sensor areas. The display panel may include a substrate; main display elements disposed above the substrate in the main display area; main pixel circuits electrically connected to the main display elements; auxiliary display elements disposed above the substrate in the auxiliary display areas; auxiliary pixel circuits electrically connected to the auxiliary display elements; photodiodes disposed above the substrate in the image sensor areas; and light-receiving pixel circuits electrically connected to the photodiodes. The auxiliary display areas and the image sensor areas may alternate with each other.

An encapsulation member may encapsulate the main display elements, the auxiliary display elements, and the photodiodes; and a filter plate may be disposed on the encapsulation member and may comprise a filter plater which may be disposed in the main display elements, the auxiliary display elements, and the photodiodes.

A micro-lens may be disposed above the filter plate in the image sensor areas.

A touch screen layer may be disposed between the encapsulation member and the color filter.

The auxiliary display elements may include auxiliary subpixels disposed in a pentile matrix structure, and light-receiving pixels including the photodiodes may be disposed in a Bayer pattern.

Each of the auxiliary display elements may be an organic light-emitting diode and may include a stack of a pixel electrode, an emission layer, and an opposite electrode, each of the photodiodes may be a PN diode or PIN diode and may include a stack of a first electrode, an active layer that may include an amorphous silicon semiconductor, and a second electrode, and the pixel electrode and the first electrode may be disposed on different layers.

According to an embodiment, a display apparatus may include a first display panel that may include first display elements that emit light; a main display area; and a component area; a second display panel disposed below the first display panel and including second display elements that emit light; and a second display area; and a lower cover that may accommodate the first display panel and the second display panel.

A component may be disposed below the first display panel and may receive light obtained from an outside of the display apparatus; a movement driving unit that may move the second display panel relative to the first display panel; and a controller that may control the movement driving unit, wherein the component may be disposed on the second display panel and may be disposed in a side of the second display area.

The movement driving unit may move the second display panel such that the component may correspond to the component area when the component is in a first state, and the movement driving unit may move the second display panel such that the second display area may correspond to the component area when the component is in a second state.

The component may comprise a first component and a second component, and the first component and the second component may be selected from an imaging device, an infrared sensor, a solar battery, and a flash.

The first display elements may be organic light-emitting diodes, and the second display elements may be inorganic light-emitting diodes.

The second display panel may comprise an image sensor area disposed in a side of the second display area, and light-receiving pixels may be disposed in the image sensor area and may include photodiodes disposed on a substrate where the second display elements are disposed.

The image sensor area of the second display panel may comprise the substrate on which the light-receiving pixels including the photodiodes may be disposed in a two-dimensional array structure, wherein the substrate may include a first surface and a second surface opposite to the first surface; a multi-wire layer disposed on the first surface; a color filter and a micro-lens disposed on the second surface; and a pixel separation structure disposed in the substrate. The pixel separation structure may separate the light-receiving pixels from each other.

The second display elements may be disposed on the second surface.

The second display elements may be inorganic light-emitting diodes, and the inorganic light-emitting diodes may be disposed between a first electrode and a second electrode that are disposed on different layers.

The second display elements may be inorganic light-emitting diodes, and the inorganic light-emitting diodes may be disposed between a first electrode and a second electrode that are disposed on a same layer.

The component area of the first display panel may be a transmission area, the second display panel may comprise photodiodes, and the second display elements and the photodiodes may be alternately disposed.

The component area of the first display panel may be a transmission area, the second display elements may be light-emitting and light-receiving elements, and each of the second display elements may be electrically connected to a first pixel circuit to display an image and a second pixel circuit to capture an image through a switch element.

The light-emitting and light-receiving elements may be PN diodes or PIN diodes.

A substrate of the first display panel may comprise a through hole corresponding to the component area.

According to an embodiment, a display apparatus may include a display panel which may include display elements that emit light in a first direction; a main display area; and a component area; a component disposed to face a direction that is opposite to the first direction; a light guiding unit that may guide light incident upon the component area toward the component; and a lower cover that may include a hole corresponding to the component.

The light guiding unit may include a light guide including at least one being portion; a first path changer that may change a path of light that travels along the light guide; and a path change driver connected to the first path changer. The path change driver may change a location of the first path changer.

The path change driver may change the location of the first path changer such that the first path changer may overlap the hole or may not overlap the hole.

The light guiding unit may comprise a second path changer that may change the path of light, and the second path changer may be a mirror or a prism.

The component area of the display panel may comprise a transmission area, and the display panel may comprise a substrate that may include a groove disposed in the transmission area in a depth direction of the substrate; main display elements disposed above the substrate in the main display area; main pixel circuits electrically connected to the main display elements; auxiliary display elements disposed above the substrate in the component area; and auxiliary pixel circuits electrically connected to the auxiliary display elements. Details of other embodiments are included in the detailed description and drawings.

BRIEF DESCRIPTION OF THE DRAWINGS

The above and other aspects, features, and advantages of described embodiments will be more apparent from the following description taken in conjunction with the accompanying drawings, in which:

FIG. 3 is a block diagram of a display apparatus according to an embodiment;

FIGS. 9A through 9E are schematic cross-sectional views of respective portions of display apparatuses according to embodiments;

FIG. 17 is a schematic cross-sectional view of a portion of a display panel according to an embodiment;

FIG. 24 is a schematic cross-sectional view of a portion or region of a display panel according to an embodiment;

FIG. 25 is a schematic cross-sectional view of a portion or region of a display panel according to an embodiment;

FIG. 50 is a schematic cross-sectional view of a portion or region of a display panel according to an embodiment;

FIG. 55 is a plan view of a touch screen layer of a display panel according to an embodiment;

FIG. 78 is a schematic plan view of a component area of a display panel according to an embodiment;

FIGS. 84A and 84B are schematic cross-sectional views of a portion or region of a display apparatus according to an embodiment;

FIG. 86A is a schematic plan view of a second display panel according to an embodiment;

FIG. 91 is a schematic cross-sectional view taken along a line VII-VII' of FIG. 90;

FIG. 99 is a schematic cross-sectional view of a portion or region of a display panel according to an embodiment;

FIG. 103 is a schematic cross-sectional view of a display apparatus according to an embodiment.

DETAILED DESCRIPTION OF THE EMBODIMENTS

Figure 1:
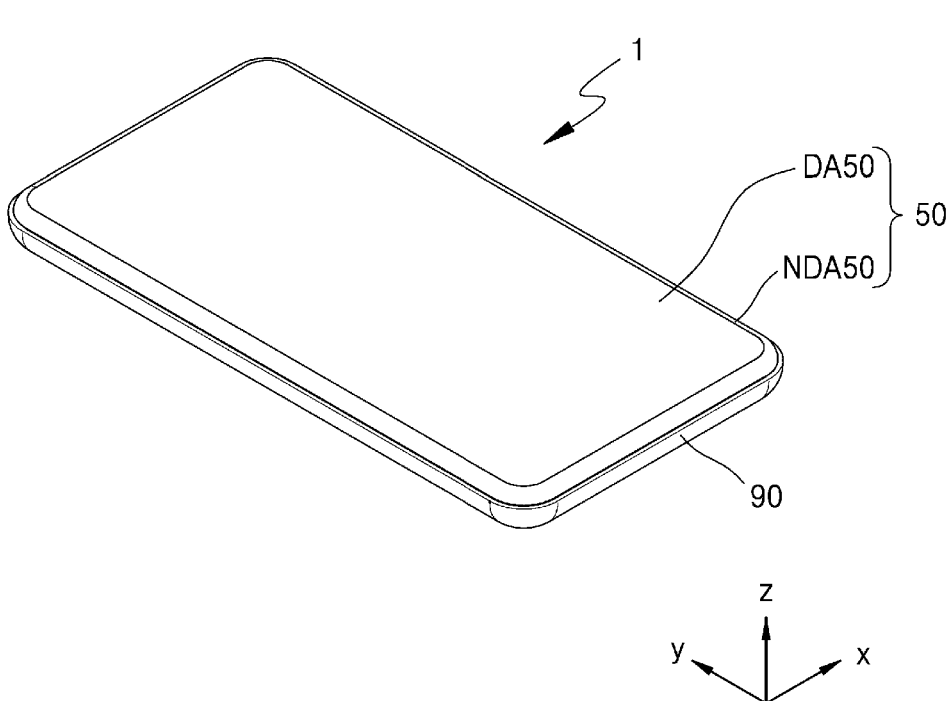
FIG. 1 is a perspective view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

Some of the parts which are not associated with the description may not be provided in order to describe embodiments of the disclosure and like reference numerals refer to like elements throughout the specification.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

One or more embodiments of the disclosure will be described below in more detail with reference to the accompanying drawings. Those components that are the same or are in correspondence with each other are rendered the same reference numeral regardless of the figure number, and redundant explanations are omitted.

It will be understood that although the terms "first," "second," etc. may be used herein to describe various components, these components should not be limited by these terms. These components are only used to distinguish one component from another. For instance, a first element or component discussed below could be termed a second element or component without departing from the teachings of the disclosure. Similarly, the second element or component could also be termed the first element or component.

As used herein, the singular forms "a," "an," and "the" are intended to include the plural forms as well, unless the context clearly indicates otherwise.

It will be further understood that when the terms "comprises," "comprising," "includes" and/or "including", "have" and/or "having" are used in this specification, they or it may specify the presence of stated features, integers, steps, operations, elements and/or components, but do not preclude the presence or addition of other features, integers, steps, operations, elements, components, and/or any combination thereof.

When a layer, film, region, substrate, or area, or element is referred to as being "on" another layer, film, region, substrate, or area, or element, it may be directly on the other film, region, substrate, or area, or element, or intervening films, regions, substrates, or areas, or elements may be present therebetween. Conversely, when a layer, film, region, substrate, or area, or element, is referred to as being "directly on" another layer, film, region, substrate, or area, or element, intervening layers, films, regions, substrates, or areas, may be absent therebetween. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for case of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

In the drawings, sizes and thicknesses of elements may be enlarged for better understanding, clarity, and ease of description thereof. However, the disclosure is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

When an embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" or "coupled" to another layer, region, or component, it may be "directly connected" or "directly coupled" to the other layer, region, or component and/or may be "indirectly connected" or "indirectly coupled" to the other layer, region, or component with other layers, regions, or components interposed therebetween. For example, it will be understood that when a layer, region, or component is referred to as being "electrically connected" to another layer, region, or component, it may be "directly electrically connected" to the other layer, region, or component and/or may be "indirectly electrically connected" to the other layer, region, or component with other layers, regions, or components interposed therebetween.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that may not be perpendicular to one another.

As used herein, the term "unit" denotes a structure or element as illustrated in the drawings and as described in the specification. However, the disclosure is not limited thereto. The term "unit" is not to be limited to that which is illustrated in the drawings.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
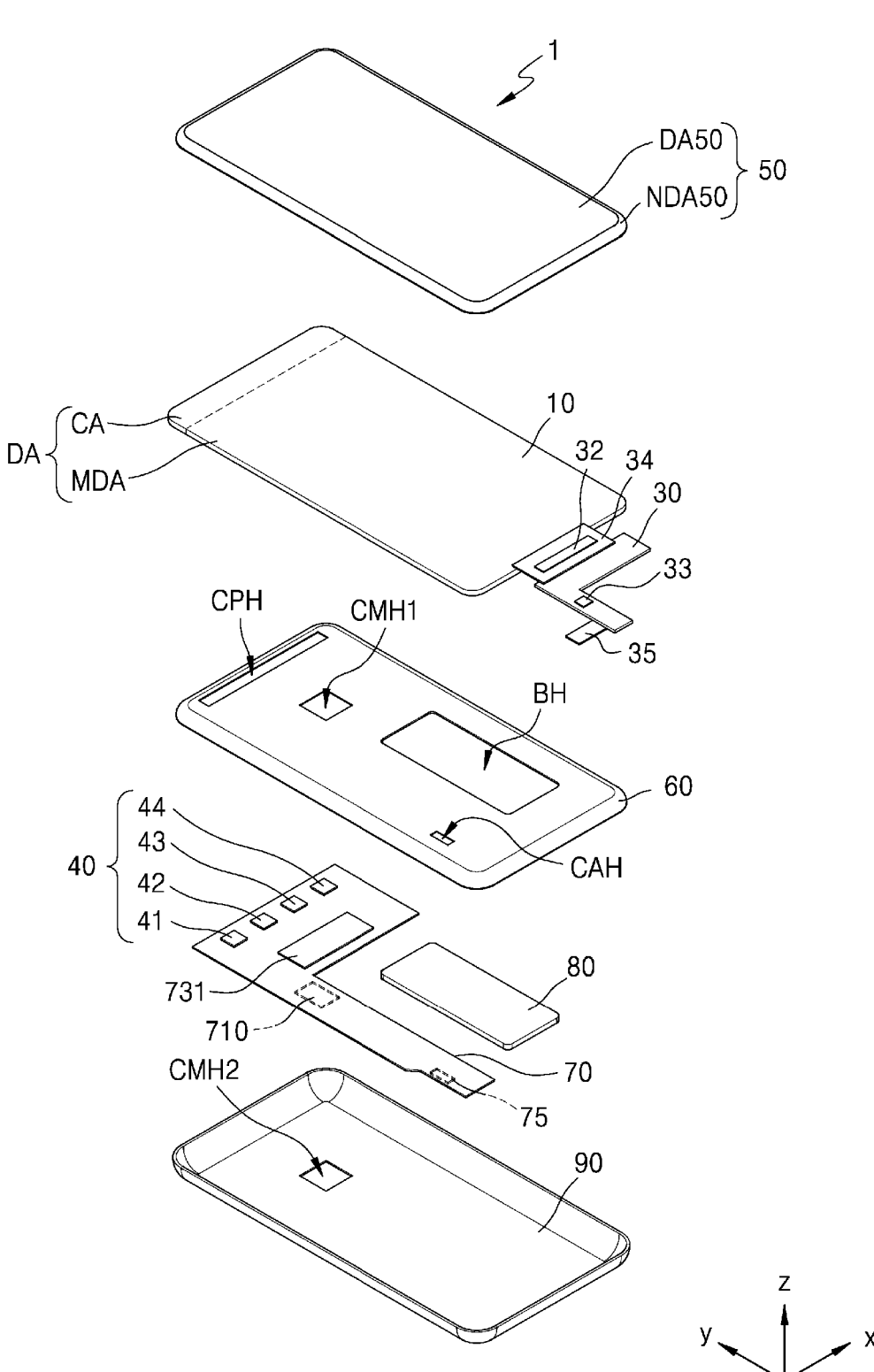
FIG. 2 is an exploded perspective view of a display apparatus according to an embodiment.
Figure 3:
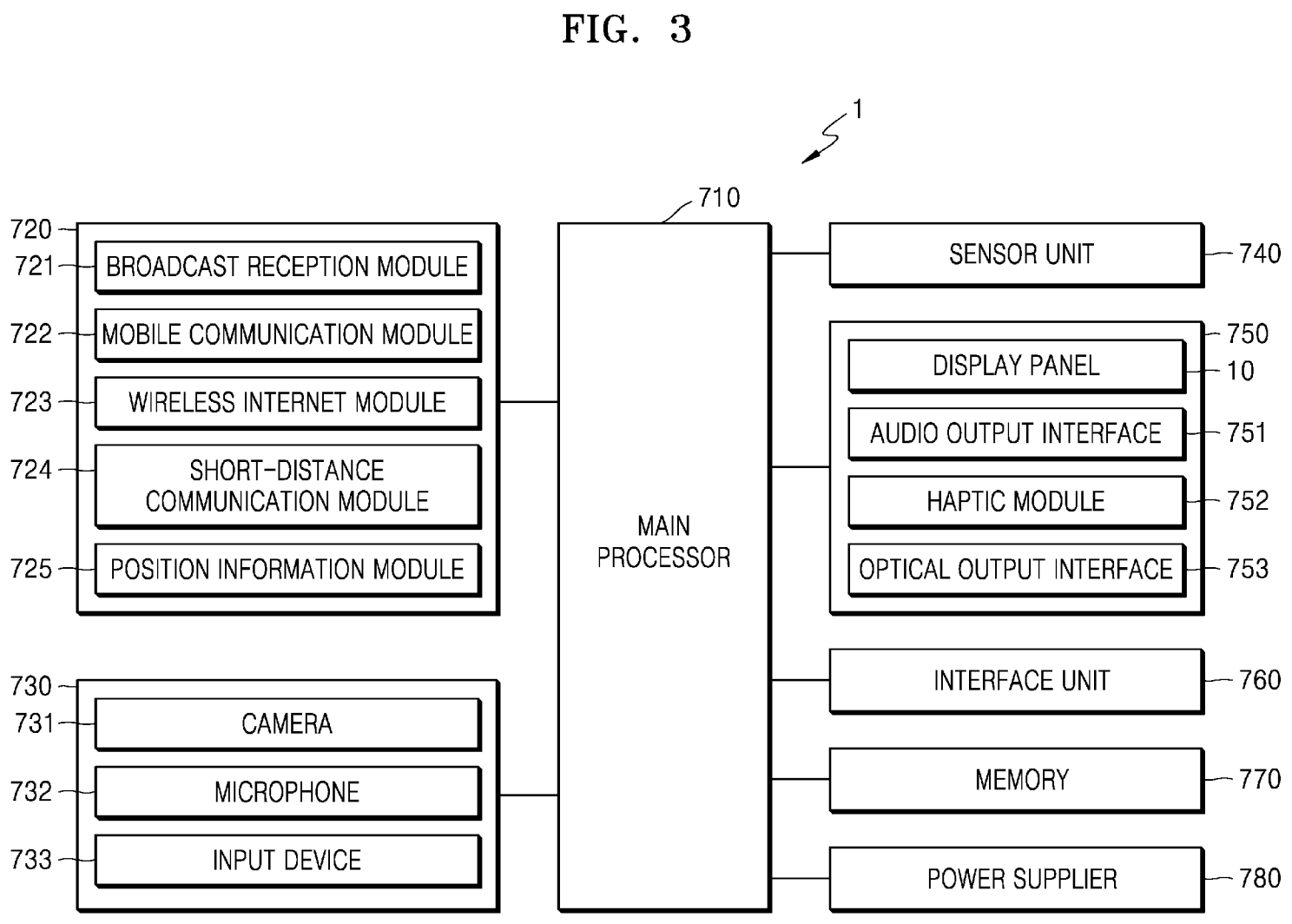

FIG. 1 is a perspective view of a display apparatus 1 according to an embodiment, and FIG. 2 is an exploded perspective view of the display apparatus 1 according to an embodiment. FIG. 3 is a block diagram of the display apparatus 1 according to an embodiment.

Referring to FIGS. 1 and 2, the display apparatus 1 according to an embodiment displays a moving picture or a still image, and thus may be used as the display screens of various products such as not only portable electronic apparatuses, such as mobile phones, smartphones, tablet personal computers (PCs), mobile communication terminals, electronic notebooks, electronic books, portable multimedia players (PMPs), navigation devices, and ultra mobile PCs (UMPCs), but also televisions, notebooks, monitors, advertisement panels, and internet of things (IoT) devices. The display apparatus 1 according to an embodiment may also be used in wearable devices such as smart watches, watch phones, glasses-type displays, and head mounted displays (HMDs). The display apparatus 1 according to an embodiment may also be used as dashboards of vehicles, center information displays (CIDs) of the center fascia or dashboards of vehicles, room mirror displays that replace the side mirrors of vehicles, and displays arranged or disposed on the rear sides of front seats to serve as entertainment devices for back seat passengers of vehicles.

For convenience of explanation, FIGS. 1 and 2 illustrate use of a smartphone as the display apparatus 1 according to an embodiment. The display apparatus 1 according to an embodiment may include a cover window 50, a display panel 10, a display circuit board 30, a display driving unit 32, a touch sensor driving unit 33, a bracket 60, a main circuit board 70, a battery 80, and a lower cover 90.

The term "above" may indicate a direction in which the cover window 50 may be arranged or disposed in relation to the display panel 10, namely, a +z direction, and the term "below" may indicate a direction in which the lower cover 90 may be arranged or disposed in relation to the display panel 10, namely, a −z direction. The terms "left", "right", "upper", and "lower" may indicate directions in a case that the display panel 10 may be viewed from the top. For example, "left" indicates a −x direction, "right" indicates a +x direction, "upper" indicates a +y direction, and "lower" indicates a −y direction. However, the disclosure is not limited thereto.

The display apparatus 1 may have a substantially rectangular shape according to a plan view. For example, the display apparatus 1 may have a substantially rectangular planar shape having shorter sides in a first direction (x direction) and longer sides in a second direction (y direction), as shown in FIG. 1. Corners between the shorter sides in the first direction (x direction) and the longer sides in the second direction (y direction) may be rounded to have a certain or predetermined curvature, or may have right angles. The planar shape of the display apparatus 1 is not limited to a rectangle, and may be any other polygon, an oval, or an irregular shape within the spirit and the scope of the disclosure.

The cover window 50 may be above the display panel 10 to cover or overlap an upper surface of the display panel 10. Thus, the cover window 50 may function to protect the upper surface of the display panel 10.

The cover window 50 may include a transmission cover unit DA50 corresponding to the display panel 10, and a light-shielding cover unit NDA50 corresponding to an area other than the display panel 10. The light-shielding cover unit NDA50 may include an opaque material that shields light. The light-shielding cover unit NDA50 may include a pattern that may be shown to a user in a case that no images may be displayed.

The display panel 10 may be disposed below the cover window 50. The display panel 10 may be overlapped by the transmission cover unit DA50 of the cover window 50.

The display panel 10 may include a main display area MDA and a component area CA. Both the main display area MDA and the component area CA are areas where an image may be displayed, and the component area CA may be an area below which a component 40 such as a sensor sensing visible light, infrared light, sound, or the like, and a camera may be arranged or disposed. According to an embodiment, the component area CA may have a higher light transmittance and/or a higher sound transmittance than the main display area MDA. According to an embodiment, in a case that light is transmitted through the component area CA, a light transmittance in the component area CA may be about 25% or greater or about 30% or greater, for example, about 50% or greater, about 75% or greater, about 80% or greater, about 85% or greater, or about 90% or greater.

The display panel 10 may be a light-emitting display panel including a light-emitting element. For example, the display panel 10 may be an organic light-emitting display panel using an organic light-emitting diode including an organic emission layer, a micro light-emitting diode (LED) display panel using a micro LED, a quantum dot light-emitting display panel using a quantum dot LED including a quantum dot emission layer, or an inorganic light-emitting display panel using an inorganic light-emitting element including an inorganic semiconductor.

The display panel 10 may be a rigid display panel having rigidity and thus not being easily bent, or a flexible display panel having flexibility and thus being easily bent, folded, or rolled. For example, the display panel 10 may be a foldable display panel, a curved display panel having a curved display surface, a bent display panel of which an area other than a display surface is bent, a rollable display panel, or a stretchable display panel.

The display panel 10 may be a transparent display panel that may be realized to be transparent so that an object or a background arranged or disposed on the lower surface of the display panel 10 may be seen through the upper surface of the display panel 10. Alternatively, the display panel 10 may be a reflective display panel that may reflect an object or a background on the upper surface of the display panel 10.

A first flexible film 34 may be attached to an edge of the display panel 10. A side of the first flexible film 34 may be attached to an edge of the display panel 10 by using an anisotropic conductive film. The first flexible film 34 may be a flexible film that may be bendable.

The display driving unit 32 may be on the first flexible film 34. The display driving unit 32 may receive control signals and power supply voltages and generate and output signals and voltages for driving the display panel 10. The display driving unit 32 may be an integrated circuit (IC).

The display circuit board 30 may be attached on another side of the first flexible film 34. The other side of the first flexible film 34 may be attached to an upper surface of the display circuit board 30 by using an anisotropic conductive film. The display circuit board 30 may be a flexible printed circuit board (FPCB) that may be bendable, a rigid printed circuit board (PCB) that has rigidity and thus may not easily be bent, or a complex PCB including both a rigid PCB and an FPCB.

The touch sensor driving unit 33 may be on the display circuit board 30. The touch sensor driving unit 33 may be implemented as an IC. The touch sensor driving unit 33 may be attached to the upper surface of the display driving unit 30. The touch sensor driving unit 33 may be electrically connected to touch electrodes of a touch screen layer of the display panel 10 via the display circuit board 30.

The touch screen layer of the display panel 10 may sense a touch input of a user by using at least one of several touch methods such as a resistance film method and a capacitance method. For example, in a case that the touch screen layer of the display panel 10 senses a touch input of a user by using a capacitance method, the touch sensor driving unit 33 may apply driving signals to driving electrodes from among the touch electrodes and sense voltages charged in a mutual capacitance between sensing electrodes from among the touch electrodes and the driving electrodes via the sensing electrodes, thereby determining whether there is a touch of a user. The touch of the user may include a contact touch and a proximity touch. The contact touch indicates that a finger of a user or an object such as a pen directly touches the cover window 50 arranged or disposed on the touch screen layer. The proximity touch indicates that a finger of a user or an object such as a pen may be located or disposed over the cover window 50 at a close distance from the cover window 50, such as hovering. The touch sensor driving unit 33 may transmit sensor data to a main processor 710 according to the sensed voltages, and the main processor 710 may calculate a touch coordinate at which a touch is input, by analyzing the sensor data.

A power supplier that may supply driving voltages that may drive the pixels of the display panel 10, a scan driving unit, and the display driving unit 32 may be additionally arranged or disposed on the display circuit board 30. Alternatively, the power supplier may be integral with the display driving unit 32. In this case, the display driving unit 32 and the power supplier may be realized as a single IC.

The bracket 60 for supporting the display panel 10 may be below the display panel 10. The bracket 60 may include plastic, metal, or both plastic and metal. The bracket 60 may include a first camera hole CMH1 through which a camera 731 may be inserted, a battery hole BH in which the battery 80 may be arranged or disposed, and a cable hole CAH through which a cable 35 connected to the display circuit board 30 may pass. The bracket 60 may also include a component hole CPH that may be overlapped by the component area CA of the display panel 10. The component hole CPH may overlap components 40 of the main circuit board 70 in a third direction (z direction). Accordingly, the component area CA of the display panel 10 may overlap the components 40 of the main circuit board 70 in the third direction (z direction). The bracket 60 may not include the component hole CPH. In this case, the bracket 60 may be located or disposed not to be overlapped by the component area CA of the display panel 10 in the third direction (z direction).

Components 40 that may be overlapped by the component area CA of the display panel 10 may be included. For example, first, second, third, and fourth components 41, 42, 43, and 44 may be overlapped by the component area CA. The first, second, third, and fourth components 41, 42, 43, and 44 be a proximity sensor, an illumination sensor, an iris sensor, and a camera (or an image sensor), respectively, however the disclosure is not limited thereto. Because the component area CA of the display panel 10 may include a certain or a predetermined light transmittance, the proximity sensor using infrared light may detect an object arranged close to the upper surface of the display apparatus 1, and the illumination sensor may sense the brightness of light that may be incident upon the upper surface of the display apparatus 1. The iris sensor arranged or disposed on an upper surface of the display apparatus 1 may image the iris of a person, and the camera may capture an image of an object arranged or disposed on an upper surface of the display apparatus 1. The components 40 overlapped by the component area CA of the display panel 10 are not limited to a proximity sensor, an illumination sensor, an iris sensor, and a camera, and may be various other sensors which will be described later.

The main circuit board 70 and the battery 80 may be below the bracket 60. The main circuit board 70 may be a PCB or a FPCB.

The main circuit board 70 may include the main processor 710, the camera 731, a main connector 75, and the components 40. The main processor 710 may be implemented as an IC. The camera 731 may be arranged or disposed on both the upper and lower surfaces of the main circuit board 70, and each of the main processor 710 and the main connector 75 may be arranged or disposed on one of the upper and lower surfaces of the main circuit board 70. The main processor 710 may control all functions of the display apparatus 1. For example, the main processor 710 may output digital video data to the display driving unit 32 via the display circuit board 30 so that the display panel 10 displays an image. The main processor 710 receives the sensor data from the touch sensor driving unit 33. The main processor 710 may determine whether there is a user's touch, according to the sensor data, and may execute an operation corresponding to a direct touch or proximity touch of the user. For example, the main processor 710 may calculate the touch coordinate of the user by analyzing the sensor data, and then may execute an application or operation indicated by an icon touched by the user. The main processor 710 may be an application processor, a central processing unit, or a system chip each realized as an IC.

The camera 731 processes an image frame such as a still image or moving picture obtained by the image sensor in a camera mode, and outputs a result of the processing to the main processor 710. The camera 731 may include at least one of a camera sensor (for example, a CCD or a CMOS), a photo sensor (or an image sensor), and a laser sensor. The camera 731 may be connected to the image sensor from among the components 40 overlapped by the component area CA, and may process an image input to the image sensor.

The cable 35 that passed through the cable hole CAH of the bracket 60 may be connected to the main connector 75, and accordingly, the main circuit board 70 may be electrically connected to the display circuit board 30.

The main circuit board 70 may include, in addition to the main processor 710, the camera 731, and the main connector 75, at least one of the modules included in a wireless communication interface 720, at least one of the components included in an input interface 730, at least one of the components included in a sensor unit 740, at least one of the components included in an output interface 750, at least one of the components included in an interface unit 760, a memory 770, and a power supplier 780.

The wireless communication interface 720 may include at least one of a broadcast reception module 721, a mobile communication module 722, a wireless Internet module 723, a short-distance communication module 724, and a position information module 725.

The broadcast reception module 721 may receive a broadcasting signal and/or broadcasting-related information from an external broadcasting management server via a broadcasting channel. The broadcasting channel may be a satellite channel, a ground wave channel, or the like within the spirit and the scope of the disclosure.

The mobile communication module 722 may transmit or receive a wireless signal to or from at least one of a base station, an external terminal, and a server on a mobile communication network established according to technology standards or communication methods for mobile communication (for example, Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), and Long Term Evolution-Advanced (LTE-A)). Examples of the wireless signal may include a voice call signal, a video call signal, and various types of data according to text/multimedia messages transmission.

The wireless Internet module 723 indicates a module for wireless Internet access. The wireless Internet module 723 may transmit or receive a wireless signal in a communication network based on the wireless Internet technologies. The wireless Internet technologies may be, for example, a Wireless LAN (WLAN), Wireless-Fidelity (Wi-Fi), Wi-Fi Direct, and Digital Living Network Alliance (DLNA).

The short-distance communication module 724 is for short-range communication, and thus may support short-distance communication by using at least one technology from among Bluetooth™, Radio Frequency Identification (RFID), Infrared Data Association (IrDA), Ultra Wideband (UWB), ZigBee, Near Field Communication (NFC), Wi-Fi, Wi-Fi Direct, and Wireless Universal Serial Bus (Wireless USB). The short-distance communication module 724 may support wireless communication between the display apparatus 1 and a wireless communication system, between the display apparatus 1 and another electronic apparatus, or between the display apparatus 1 and a network where another electronic apparatus (or an external server) may be located or disposed, through wireless area networks. The wireless area networks may be wireless personal area networks. The other electronic apparatus may be a wearable device that may exchange data with (or interoperating with) the display apparatus 1.

The position information module 725 is included to obtain a position (or a current position) of the display apparatus 1, and thus representative examples of the position information module 725 include a global positioning system (GPS) module and a WiFi module. For example, the display apparatus 1 may obtain the position of the display apparatus 1 by using a signal sent by a GPS satellite, in a case that a GPS module may be used. In a case that a Wi-Fi module may be used, the display apparatus 1 may obtain the position of the display apparatus 1, based on information of a wireless access point (AP) that may transmit or receive a wireless signal to or from the Wi-Fi module. Because the position information module 725 may be used to obtain the position (or the current position) of the display apparatus 1, the position information module 725 is not limited to a module that directly calculates or obtains the position of the display apparatus 1.

The input interface 730 may include an image input interface such as the camera 731 for inputting an image signal, an audio input interface such as a microphone, 732 for inputting an audio signal, and an input device 733 for receiving information from a user.

The camera 731 processes an image frame such as a still image or moving picture obtained by the image sensor in a video call mode or an image capture mode. A processed image frame corresponding to a result of the processing may be displayed on the display panel 10 or may be stored in the memory 770.

The microphone 732 processes an external audio signal into electrical audio data. The electrical audio data may be used in various ways according to a function currently being performed (or an application currently being executed) in the display apparatus 1. Various noise removal algorithms that may remove noise that may be generated while receiving the external audio signal may be implemented in the microphone 732.

The main processor 710 may control an operation of the display apparatus 1 to correspond to information that may be input via the input device 733. The input device 733 may include a mechanical input unit such as a button, a dome switch, a jog wheel, and a jog switch each located or disposed on a rear or lateral surface of the display apparatus 1, or a touch input unit. The touch input unit may be implemented as the touch screen layer of the display panel 10.

The sensor unit 740 may include at least one sensor that senses at least one of information within the display apparatus 1, information of a surrounding environment of the display apparatus 1, and user information, and generates a sensing signal corresponding to the at least one information. Based on such a sensing signal, the main processor 710 may control driving or operation of the display apparatus 1 or may perform data processing, a function, or an operation associated with an application provided in the display apparatus 1. The sensor unit 740 may include at least one of a proximity sensor, an illumination sensor, an acceleration sensor, a magnetic sensor, a gravity (G)-sensor, a gyroscope sensor, a motion sensor, an RGB sensor, an infrared (IR) sensor, a finger scan sensor, an ultrasonic sensor, an optical sensor, a battery gauge, an environment sensor (for example, a barometer, a hygrometer, a thermometer, a radiation sensor, a heat sensor, and a gas sensor), and a chemical sensor (for example, an electronic nose, a healthcare sensor, and a biometric sensor).

The proximity sensor may be a sensor that may sense the existence of an object that approaches a predetermined sensing surface or exists near the predetermined sensing surface, without mechanical contact, by using an electromagnetic force or IR rays. Examples of the proximity sensor include a transmission-type photoelectric sensor, a direct reflection-type photoelectric sensor, a mirror reflection-type photoelectric sensor, a high frequency oscillation-type proximity sensor, a capacity-type proximity sensor, a magnetic proximity sensor, and an infrared-type proximity sensor. The proximity sensor may not only sense a proximity touch operation but also may sense a proximity touch pattern such as a proximity touch distance, a proximity touch direction, a proximity touch speed, a proximity touch time, a proximity touch location, or a proximity touch moving state. The main processor 710 may process data (or information) corresponding to the proximity touch operation and the proximity touch pattern both sensed by the proximity sensor, and may control visual information corresponding to the processed data to be displayed on the display panel 10.

The ultrasonic sensor may recognize location information of an object by using ultrasonic waves. The main processor 710 may calculate the location of an object from information sensed by an optical sensor and ultrasonic sensors. Because the speed of light is different from the speed of ultrasonic waves, the location of the object may be calculated using a time when light reaches the optical sensor and a time when ultrasonic waves reach the ultrasonic sensors.

The output interface 750 generates an output associated with sight, hearing, or tactile sense, and thus may include at least one of the display panel 10, an audio output interface 751, a haptic module 752, and an optical output interface 753.

The display panel 10 may display (or output) information that may be processed by the display apparatus 1. For example, the display panel 10 may display execution screen information of an application being driven by the display apparatus 1, or may display user interface (UI) and graphic user interface (GUI) information based on the execution screen information. The display panel 10 may include a display layer that displays an image, and a touch screen layer that senses a touch input of a user. Accordingly, the display panel 10 may function as the input device 733 providing an input interface between the display apparatus 1 and a user, and also function as the output interface 750 providing an output interface between the display apparatus 1 and the user.

The audio output interface 751 may output audio data received from the wireless communication interface 720 in a call signal reception mode, a call or recording mode, a voice recognition mode, a broadcast reception mode, and the like, or audio data stored in the memory 770. The audio output interface 751 also outputs an audio signal related with a function performed by the display apparatus 1 (for example, a call signal receiving sound or a message receiving sound). The audio output interface 751 may include a receiver and a speaker. At least one of the receiver and the speaker may be an audio generation device that may be attached to a lower portion of the display panel 10 and vibrates the display panel 10 to output an audio. The audio generation device may be a piezoelectric element or piezoelectric actuator that shrinks and expands according to an electrical signal, or an exciter that generates a magnetic force by using a voice coil and vibrates the display panel 10.

The haptic module 752 generates various tactile effects that a user may feel. The haptic module 752 may provide a user with vibration as a tactile effect. The intensity, pattern, and the like of vibration generated by the haptic module 752 may be controlled according to a user's selection or settings of the main processor 710. For example, the haptic module 752 may synthesize different vibrations and output a result of the synthesis, or may sequentially output the different vibrations. The haptic module 752 may generate, in addition to vibrations, various other tactile effects such as an effect due to a pin arrangement vertically moving with respect to a skin surface, a jet force or suction force of the air through a nozzle or inlet, grazing of the skin surface, a contact of an electrode, and a stimulus such as an electrostatic force, and an effect due to reproduction of cold and warmth senses by using an element that may absorb and emit heat. The haptic module 752 may transmit a tactile effect through direct contact, and may also be implemented such that a user may feel a tactile effect through a muscle sense of a finger, an arm, or the like within the spirit and the scope of the disclosure.

The optical output interface 753 outputs a signal for notifying occurrence of an event, by using the light of a light source. Examples of the event generated in the display apparatus 1 may include message reception, call signal reception, a missed call, an alarm, schedule notification, e-mail reception, and information reception through an application. The signal output by the optical output interface 753 may be implemented as the display apparatus 1 emits light of a single color or light beams of multiple colors to its front surface or rear surface. The outputting of the signal may be terminated in a case that the display apparatus 1 senses that a user confirms an event.

The interface unit 760 serves as a passage with various types of external apparatuses that are connected to the display apparatus 1. The interface unit 760 may include at least one of a wired/wireless headset port, an external charger port, a wired/wireless data port, a memory card port, a port connecting a device including an identification module, an audio input/output (I/O) port, a video I/O port, and an earphone port. In a case that an external apparatus is connected to the interface unit 760, the display apparatus 1 may perform an appropriate control related with the connected external apparatus.

The memory 770 may store data that supports various functions of the display apparatus 1. The memory 770 may store application programs driven by the display apparatus 1, pieces of data for operations of the display apparatus 1, and instructions. At least some or a predetermined number of the application programs may be downloaded from an external server through wireless communication. The memory 770 may store an application for an operation of the main processor 710, and may temporarily store input/output data, for example, a phone book, a message, a still image, and a moving picture. The memory 770 may also store haptic data for various patterns of vibration that may be provided to the haptic module 752, and audio data about various sounds that may be provided to the audio output interface 751. The memory 770 may include at least one type of storage medium selected from among a flash memory type, a hard disk type, a solid state disk (SSD) type, a silicon disk drive (SDD) type, a multimedia card micro type, a card type memory (for example, a secure digital (SD) or extreme digital (XD) memory), a random access memory (RAM), a static random access memory (SRAM), a read-only memory (ROM), an electrically erasable programmable ROM (EEPROM), a programmable ROM (PROM), magnetic memory, a magnetic disk, and an optical disk.

Under the control of the main processor 710, the power supplier 780 may receive external power and internal power and may supply the external and internal power to the components included in the display apparatus 1. The power supplier 780 may include the battery 80. The power supplier 780 may include a connection port that may be an example of the interface unit 760 to which an external charger supplying power to charge a battery may be electrically connected. Alternatively, the power supplier 780 may be charge the battery 80 in a wireless manner without using a connection port. The battery 80 may receive power from an external wireless power transmission device by using at least one of an inductive coupling method based on a magnetic induction phenomenon or a magnetic resonance coupling method based on an electromagnetic resonance phenomenon. The battery 80 may be arranged or disposed to not overlap the main circuit board 70 in the third direction (z direction). The battery 80 may be overlapped by the battery hole BH of the bracket 60.

The lower cover 90 may be below the main circuit board 70 and the battery 80. The lower cover 90 may be fastened to the bracket 60 and fixed in place. The lower cover 90 may form the outer appearance of the lower surface of the display apparatus 1. The lower cover 90 may include plastic, metal, or both plastic and metal.

A second camera hole CMH2 via which the lower surface of the camera 731 may be exposed may be provided or disposed in the lower cover 90. The location of the camera 731 and the locations of the first and second camera holes CMH1 and CMH2 corresponding to the camera 731 are not limited to the embodiment of FIGS. 1 and 2.

Figure 4:
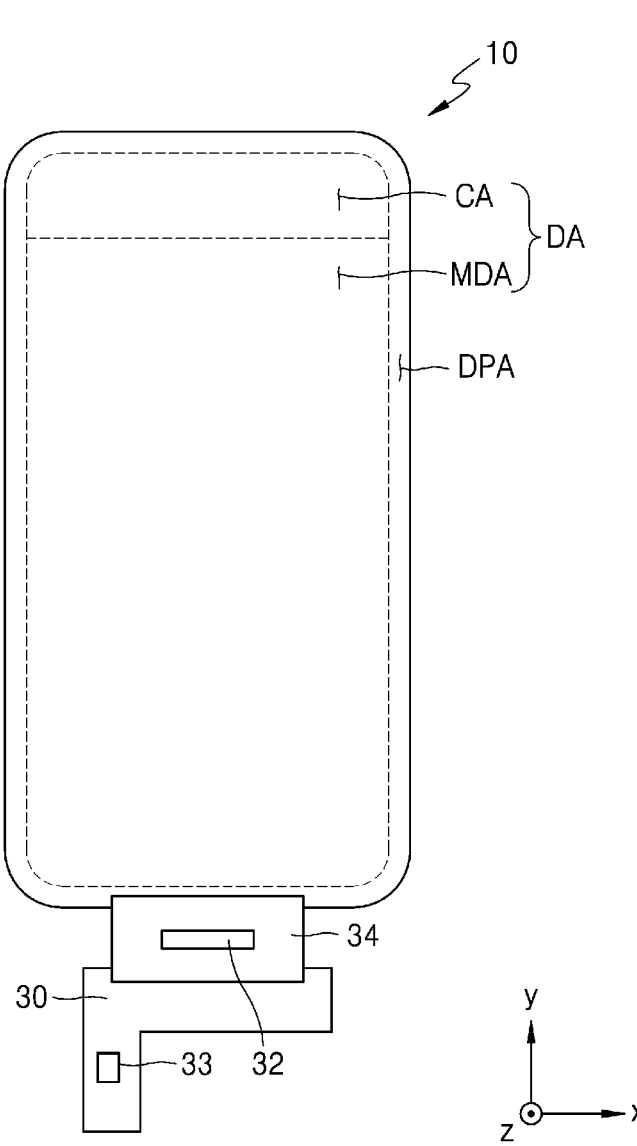
FIG. 4 is a plan view of a display panel according to an embodiment.
Figure 5:
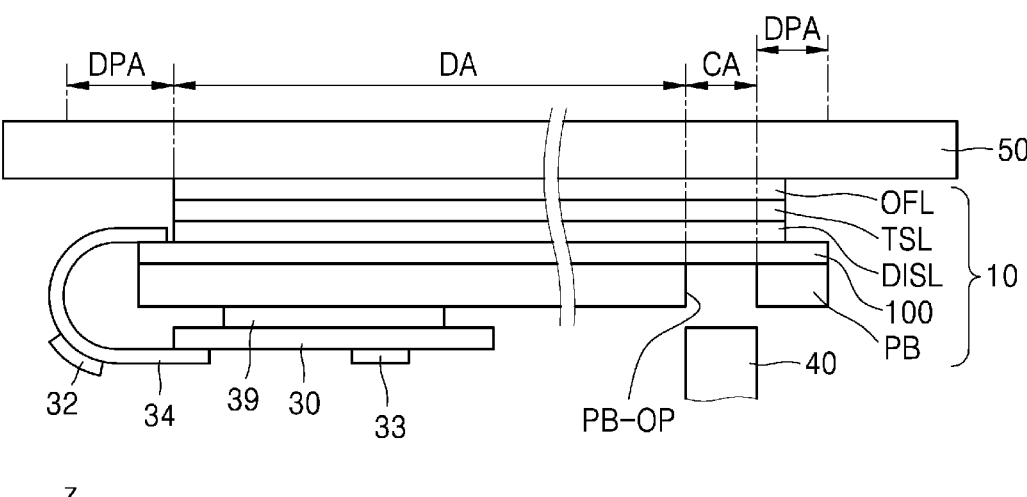
FIG. 5 is a side view of an example of the display panel of FIG. 4.

FIG. 4 is a plan view of the display panel 10 according to an embodiment. FIG. 5 is a side view of an example of the display panel 10 of FIG. 4. FIG. 4 shows a plan view of the display panel 10 of which the first flexible film 34 is unfolded.

Referring to FIGS. 4 and 5, the display panel 10 may include a substrate 100, a display layer DISL, a touch screen layer TSL, an optical functional layer OFL, and a panel protection member PB.

The substrate 100 may include an insulative material, such as glass, quartz, and polymer resin. The substrate 100 may be a rigid substrate or a flexible substrate that may be bendable, foldable, or rollable. For example, the substrate 100 may include polymer resin such as polyethersulphone, polyacrylate, polyetherimide, polyethylene naphthalate, polyethylene terephthalate, polyphenylene sulfide, polyarylate, polyimide, polycarbonate, or cellulose acetate propionate. The substrate 100 may have a multi-layered structure including a layer including the aforementioned polymer resin and an inorganic layer (not shown). For example, the substrate 100 may include two layers including the aforementioned polymer resin and an inorganic barrier layer between the two layers.

The display layer DISL may be disposed on the substrate 100. The display layer DISL may include pixels, and may be a layer that that may display an image. The display layer DISL may include a circuit layer including thin-film transistors, a display element layer on which display elements may be arranged or disposed, and an encapsulation member that may encapsulate the display element layer.

The display layer DISL may be divided into a display area DA and a peripheral area DPA. The display area DA may be an area that may include pixels arranged or disposed therein and may display an image. The peripheral area DPA may be an area outside or adjacent to the display area DA and may not display an image. The peripheral area DPA may be arranged or disposed to surround or be adjacent to the display area DA. The peripheral area DPA may be an area ranging from the outside of the display area DA to the edge of the display panel 10. In the display area DA, not only the pixels but also pixel circuits driving the pixels, and scan lines, data lines, and power lines electrically connected to the pixel circuits may be arranged or disposed. A scan driving unit that may apply scan signals to the scan lines, and fan out lines that may electrically connect the data lines to the display driving unit 32 may be arranged or disposed in the peripheral area DPA.

The touch screen layer TSL may be on the display layer DISL. The touch screen layer TSL may include touch electrodes, and may sense whether there is a user's touch. The touch screen layer TSL may be directly on the encapsulation member of the display layer DISL. Alternatively, the touch screen layer TSL may be separately provided and then coupled to the upper surface of the encapsulation member of the display layer DISL via an adhesive layer, such as an optically clear adhesive (OCA).

The optical functional layer OFL may be on the touch screen layer TSL. The optical functional layer OFL may include an anti-reflection layer. The anti-reflection layer may reduce reflectivity of light (external light) that may be incident from an external source toward the display apparatus 1.

According to an embodiment, the anti-reflection layer may include a polarization film. The polarization film may include a linear planarization plate and a phase delay film such as a quarter-wave ($\lambda$/4) plate. The phase delay film may be on the touch screen layer TSL, and the linear planarization plate may be on the phase delay film.

According to an embodiment, the anti-reflection layer may include a filter layer including a black matrix and color filters. The color filters may be arranged or disposed by considering the colors of light beams emitted by the pixels of the display apparatus 1. For example, the filter layer may include a color filter of a red, green, or blue color.

According to an embodiment, the anti-reflection layer may include a destructive interference structure. The destructive interference structure may include a first reflection layer and a second reflection layer arranged or disposed on different layers. First reflected light and second reflected light respectively reflected by the first reflection layer and the second reflection layer may destructively interfere with each other, and thus the reflectance of external light may be reduced.

The cover window 50 may be arranged or disposed on the optical functional layer OFL. The cover window 50 may be attached to the upper surface of the optical functional layer OFL by a transparent adhesive member such as an OCA film.

The panel protection member PB may be below the display panel 10. The panel protection member PB may be attached to the lower surface of the display panel 10 by using an adhesive member. The adhesive member may be a pressure sensitive adhesive (PSA). The panel protection member PB may include at least one of a light absorption layer for absorbing externally incident light, a cushion layer for absorbing an external impact, and a heat sink layer for efficiently dissipating heat of the display panel 10.

The light absorption layer may be disposed below the display panel 10. The light absorption layer may stop the transmission of light to prevent the components, for example, the display circuit board 30, arranged or disposed below the light absorption layer, from being visible from above the display panel 10. The light absorption layer may include a light absorbing material, such as, for example, a black pigment or a black dye.

The cushion layer may be disposed below the light absorption layer. The cushion layer may absorb an external impact to prevent the display panel 10 from being destroyed. The cushion layer may be a single layer or layers. For example, the cushion layer may include a copolymer resin such as polyurethane, polycarbonate, polypropylene, or polyethylene, or may include an elastic material, such as rubber, an urethane-based material, or a sponge obtained by foam-molding an acryl-based material.

The heat sink layer may be below the cushion layer. The heat sink layer may include a first heat sink layer including graphite or carbon nanotubes, and a second heat sink layer that may shield electromagnetic waves and including a metal thin film having high thermal conductivity, such as copper, nickel, ferrite, or silver.

The panel protection member PB may include an opening PB_OP corresponding to the component area CA. The inclusion of the opening PB_OP in the panel protection member PB may improve the light transmittance of the component area CA.

The component area CA may have a larger area than an area where the components 40 may be arranged or disposed. Accordingly, the area of the opening PB_OP included in the panel protection member PB may not be identical with the area of the component area CA. The components 40 may be arranged or disposed to be overlapped by the opening PB_OP. According to an embodiment, the components 40 may be arranged or disposed to be inserted into the opening PB_OP.

The first flexible film 34 may be in a peripheral area DPA of an edge of the display panel 10. The first flexible film 34 may be bent below the display panel 10, and the display circuit board 30 may be located or disposed on a lower surface of the panel protection member PB. The display circuit board 30 may be attached to and fixed to a lower surface of the panel protection member PB via a first adhesive member 39. The first adhesive member 39 may be a PSA.

The display area DA of the display panel 10 may include the component area CA below which the components 40 may be arranged or disposed, and the main display area MDA. The component area CA may be arranged or disposed on a side of the main display area MDA. According to an embodiment, FIG. 4 illustrates that the component area CA may be a bar-type component area including the same width as the width of the main display area MDA in the x direction. The component area CA may be disposed between the peripheral area DPA and the main display area MDA such that upper, right, and left edges of the component area CA may contact the peripheral area DPA and a lower edge thereof may contact the main display area MDA.

Figure 6:
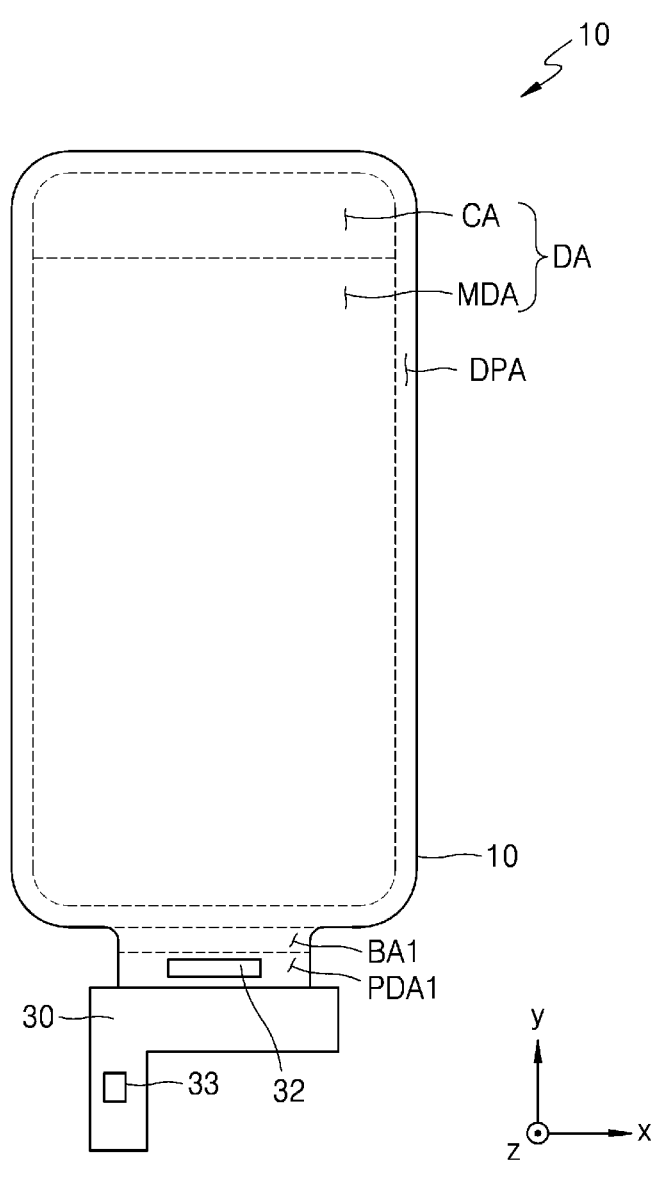
FIG. 6 is a plan view of a display panel according to an embodiment.
Figure 7:
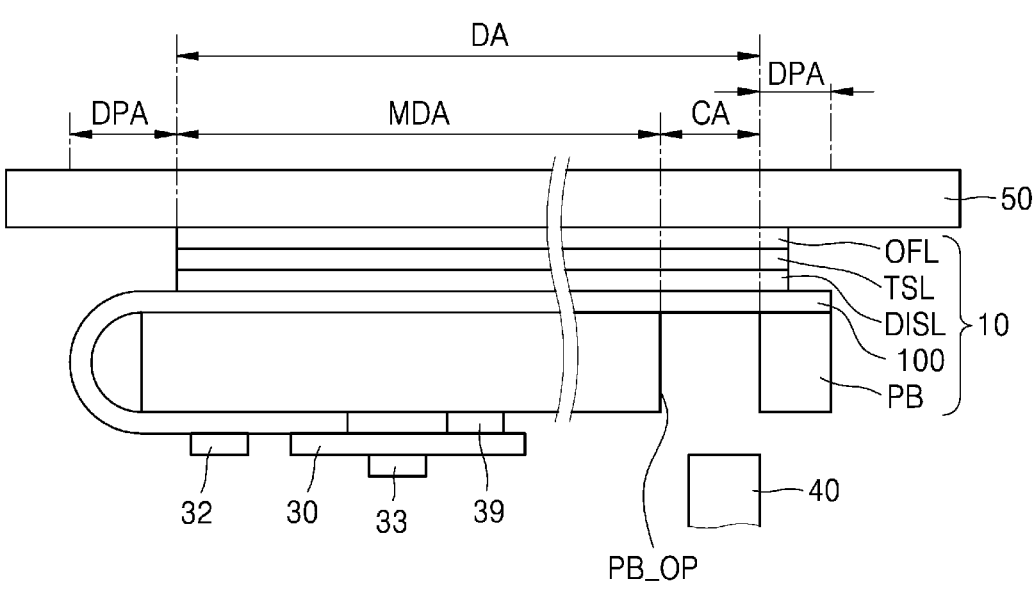
FIG. 7 is a side view of an example of the display panel of FIG. 6.
Figure 7:
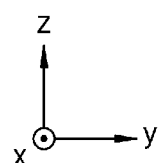

FIG. 6 is a plan view of a display panel 10 according to an embodiment. FIG. 7 is a side view of an example of the display panel 10 of FIG. 6. FIG. 6 shows a plan view of the display panel 10 of which a first bending area BA1 is unfolded.

The embodiments of FIGS. 6 and 7 may be different from those of FIGS. 4 and 5 in that the first bending area BA1 on a side of the display panel 10 may be bent and thus a first pad area PDA1 may be located or disposed on a lower surface of the panel protection member PB. In other words, the display panel 10 may be a display panel of which a side may be bent.

Referring to FIGS. 6 and 7, the first bending area BA1 and the first pad area PDA1 may protrude from a peripheral area DPA of a side of the display panel 10 in the −y direction. As shown in FIG. 6, respective lengths of the first bending area BA1 and the first pad area PDA1 in the x direction may each be less than a length of the display area DA in the x direction.

The display panel 10 may be bent at the first bending area BA1, and the first pad area PDA1 may be arranged or disposed on the lower surface of the panel protection member PB. The first pad area PDA1 may be overlapped by the display area DA in a thickness direction (z direction) of the display panel 10. The display driving unit 32 and the display circuit board 30 may be arranged or disposed in the first pad area PDA1.

Although the component area CA of the display area DA is included as a bar-type in FIGS. 4 and 6, embodiments are not limited thereto. For example, the shape of the component area CA may be a circle, an oval, or a polygon such as a triangle or a pentagon, and the location of the component area CA may vary. A display apparatus may have two or more component areas CA, and the component areas CA may have different shapes and different sizes.

FIGS. 8A through 8I illustrate component areas CA having shapes and arrangements according to various embodiments.

Figure 8A:
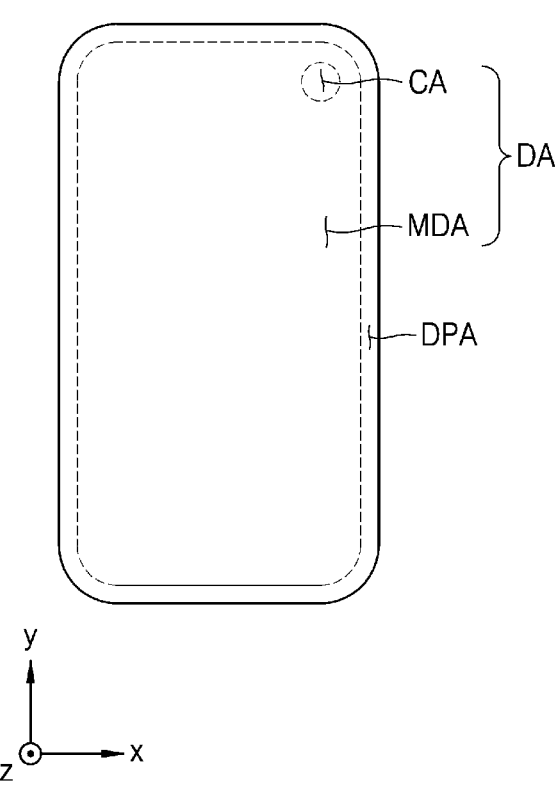
FIGS. 8A through 8I are layout views illustrating component areas having shapes and arrangements according to various embodiments.
Figure 8B:
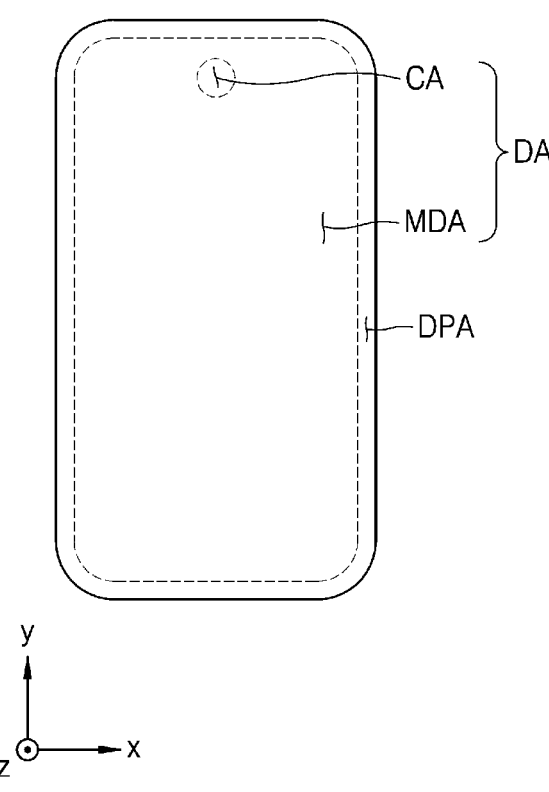
Figure 8C:
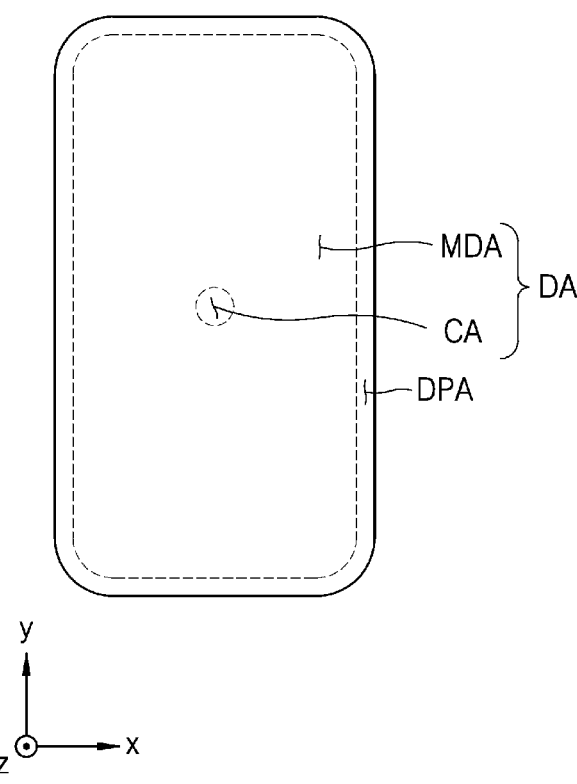

Referring to FIGS. 8A through 8F, each component area CA may be arranged or disposed inside the main display area MDA and may be surrounded by or adjacent to the main display area MDA. The component area CA may have a substantially circular shape, and component areas may be included. As shown in FIG. 8A, the component area CA may be arranged or disposed in a right upper portion of the display area DA. As shown in FIG. 8B, the component area CA may be arranged or disposed at the center of an upper portion of the display area DA. As shown in FIG. 8C, the component area CA may be arranged or disposed at the center of the display area DA. This arrangement may allow the eyes of a user taking a selfie or making a video call to be naturally photographed in a case that an image capturing device such as a camera may be arranged or disposed to correspond to the component area CA.

Figure 8D:
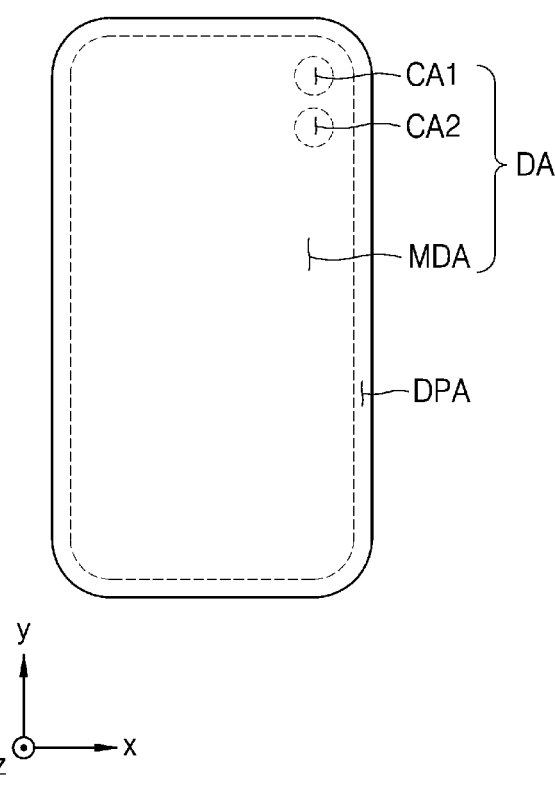
Figure 8E:
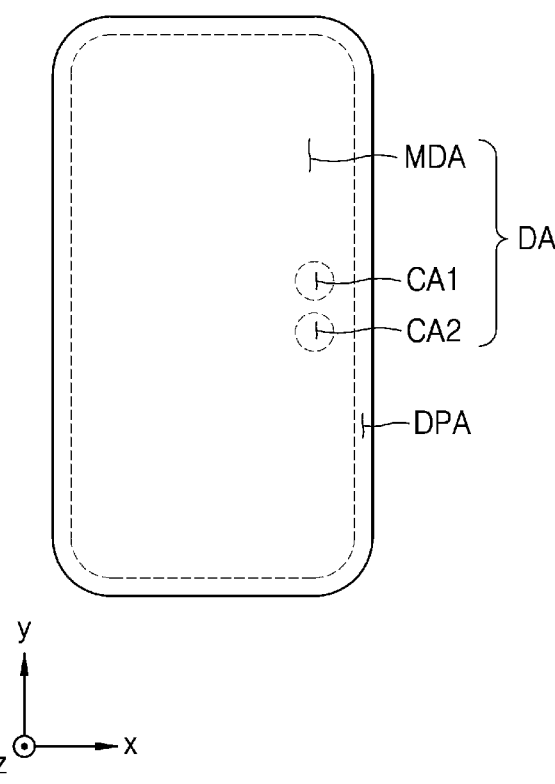
Figure 8F:
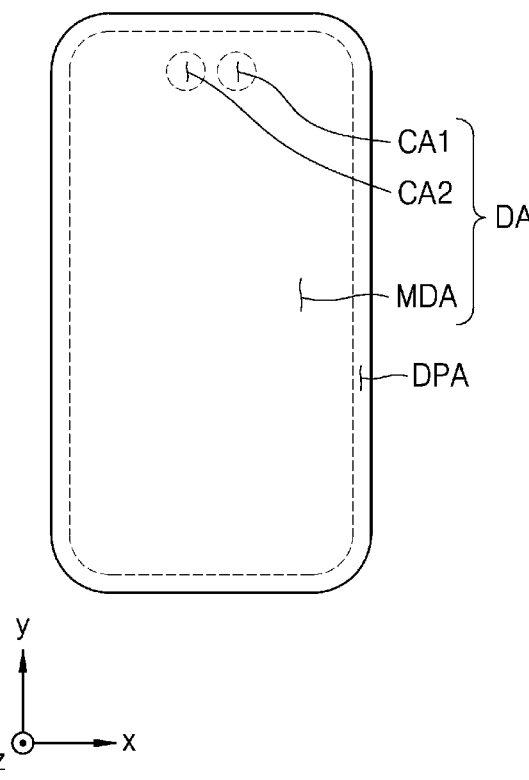

As shown in FIGS. 8D and 8E, the component area CA may include a first component area CA1 and a second component area CA2 arranged or disposed side by side in the y direction. Alternatively, as shown in FIG. 8F, the component area CA may include a first component area CAL and a second component area CA2 arranged or disposed side by side in the x direction. In this case, the first component area CAL and the second component area CA2 may be spaced apart from each other, and each of the first component area CA1 and the second component area CA2 may be surrounded by or adjacent to the main display area MDA. In this case, a first camera may be arranged or disposed to correspond to the first component area CA1, and a second camera may be arranged or disposed to correspond to the second component area CA2. As shown in FIG. 8E, the component area CA may be arranged or disposed at the center of a longer edge of the display area DA. This may be a useful arrangement in a case that a display apparatus may be used in a transverse mode.

Figure 8G:
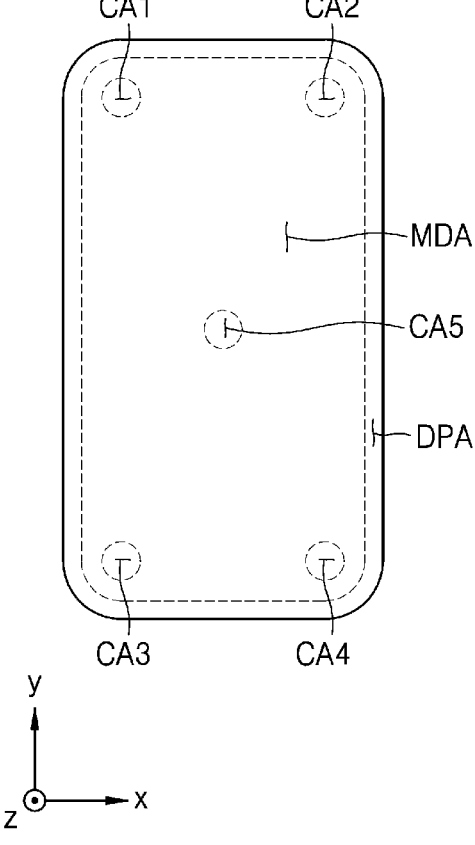

Three or more component areas CA may be included as shown in FIG. 8G. The component area CA may include first through fourth component areas CA1 through CA4 respectively in four corner portions of the display area DA, respectively. The component area CA may also include a fifth component area CA5 at the center of the display area DA. First through fifth cameras may be arranged or disposed to correspond to the first through fifth component areas CA1 through CA5, respectively. In this case, because images may be captured at various angles, image compensation may be achieved based on images captured by the first through fifth cameras.

Figure 8H:
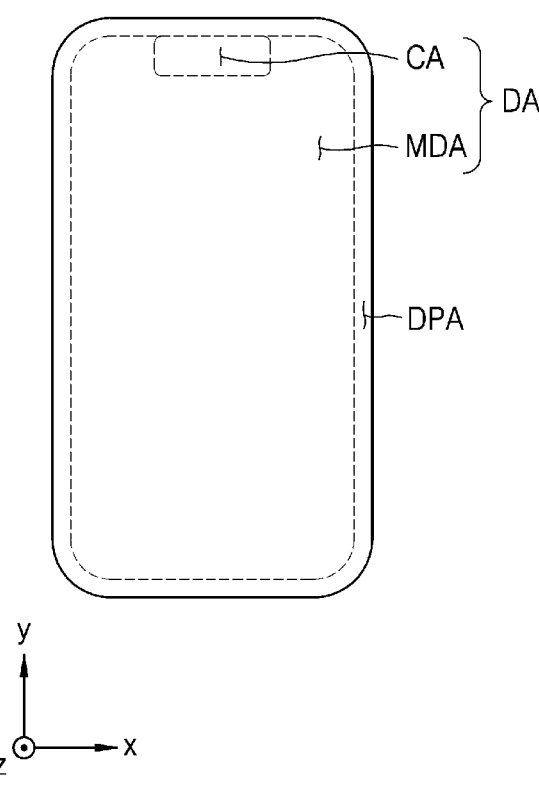
Figure 8I:
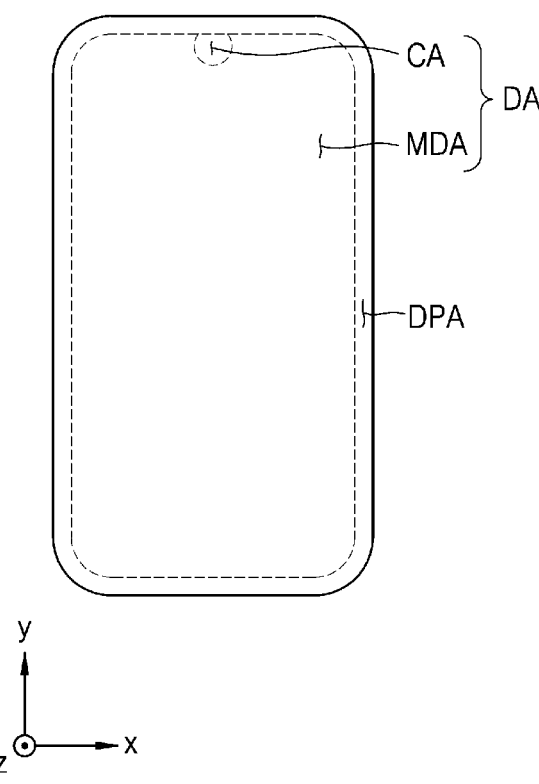

As shown in FIGS. 8H and 8I, the component areas CA may be arranged or disposed such that a side of each of the component areas CA contacts the peripheral area DPA. Referring to FIGS. 8H and 8I, each of the component areas CA may be a notch-type component area that may be inserted from a side of the display area DA toward the center of the display area DA. The notch type may be any of various shapes, such as a rectangle, a semi-circle, and a semi-oval.

FIGS. 9A through 9E are schematic cross-sectional views of a portion or region of a display apparatus 1 according to an embodiment.

Referring to FIGS. 9A through 9E, the display apparatus 1 may include a display panel 10 and a component 40 overlapped by the display panel 10. The display panel 10 may include a component area CA overlapping the component 40, and a main display area MDA on which a main image is displayed.

The display panel 10 may include a substrate 100, a display layer DISL, a touch screen layer TSL, and an optical functional layer OFL on the substrate 100, and a panel protection member PB below the substrate 100. The display layer DISL may include a circuit layer PCL including main and auxiliary thin-film transistors TFT and TFT', a display element layer including main and auxiliary light-emitting elements ED and ED' that are display elements, and an encapsulation member ENCM such as a thin-film encapsulation layer TFEL or an encapsulation substrate ENS. Insulating layers IL and IL' may be arranged or disposed between the substrate 100 and the display layer DISL and within the display layer DISL.

As described above, the substrate 100 may include an insulative material, such as glass, quartz, or polymer resin. The substrate 100 may be a rigid substrate or a flexible substrate that may be bendable, foldable, or rollable.

The main thin-film transistor TFT and the main light-emitting element ED electrically connected thereto may be arranged or disposed to realize or to form a main subpixel Pm in the main display area MDA of the display panel 10. The auxiliary thin-film transistor TFT' and the auxiliary light-emitting element ED' electrically connected thereto may be arranged or disposed to realize an auxiliary subpixel Pa in the component area CA of the display panel 10.

A transmission area TA having no display elements arranged or disposed therein may be arranged or disposed in the component area CA. The transmission area TA may transmit a light/signal emitted by the component 40 arranged or disposed to correspond to the component area CA or a light/signal incident upon the component 40.

A bottom metal layer BML may be arranged or disposed in the component area CA. The bottom metal layer BML may be arranged or disposed below the auxiliary thin-film transistor TFT'. For example, the bottom metal layer BML may be disposed between the auxiliary thin-film transistor TFT' and the substrate 100. The bottom metal layer BML may prevent external light from reaching the auxiliary thin-film transistor TFT'. According to an embodiment, a static voltage or a signal may be applied to the bottom metal layer BML, and thus the bottom metal layer BML may prevent a pixel circuit from being damaged by electrostatic discharge. Bottom metal layers BML may be arranged or disposed within the component area CA. In some cases, different voltages may be applied to the bottom metal layers BML. A single bottom metal layer BML including a hole corresponding to the transmission area TA may be located or disposed within the component area CA.

Figure 9A:
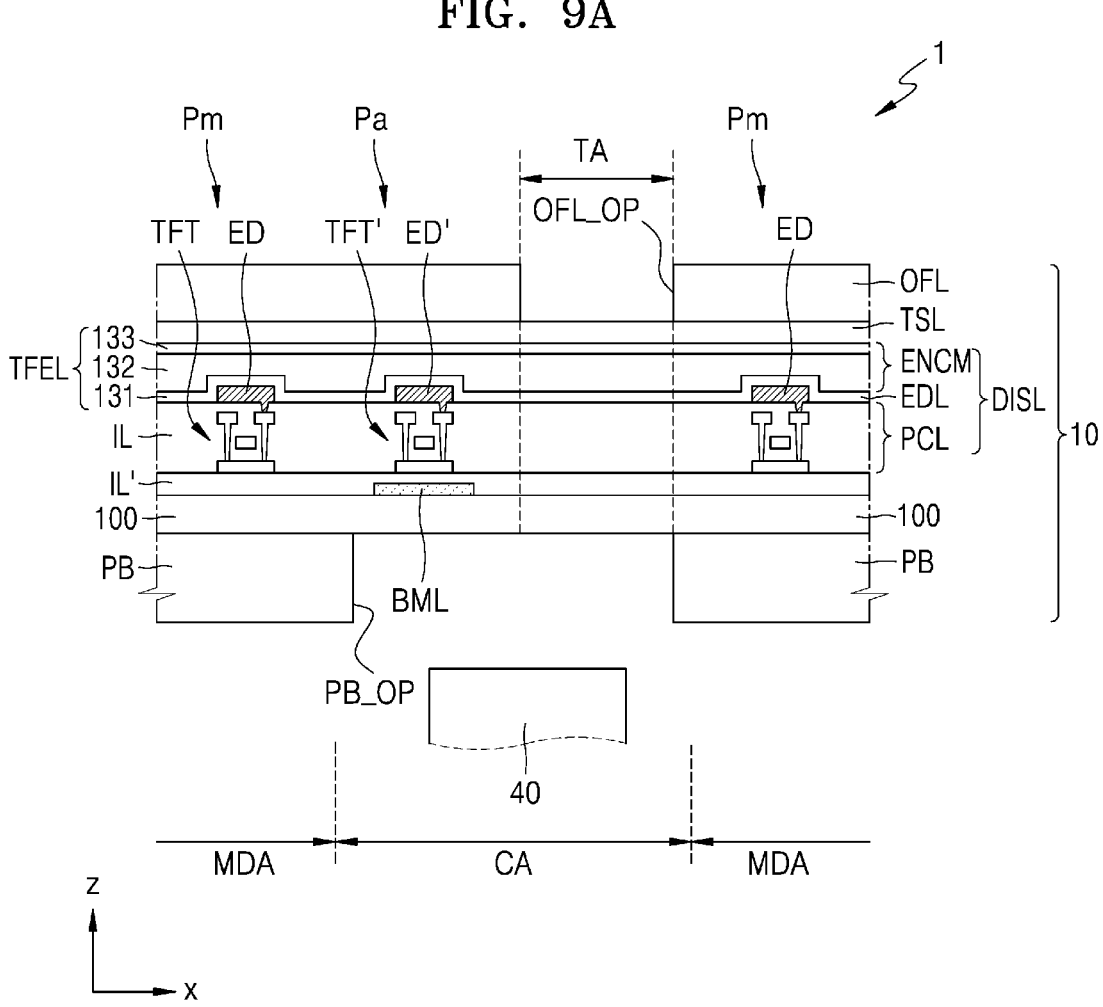

The display element layer EDL may be covered or overlapped by the thin-film encapsulation layer TFEL or by the encapsulation substrate ENS. According to an embodiment, the thin-film encapsulation layer TFEL may include at least one inorganic encapsulation layer and at least one organic encapsulation layer, as shown in FIG. 9A. According to an embodiment, the thin-film encapsulation layer TFEL may include first and second inorganic encapsulation layers 131 and 133 and an organic encapsulation layer 132 therebetween.

Figure 9B:
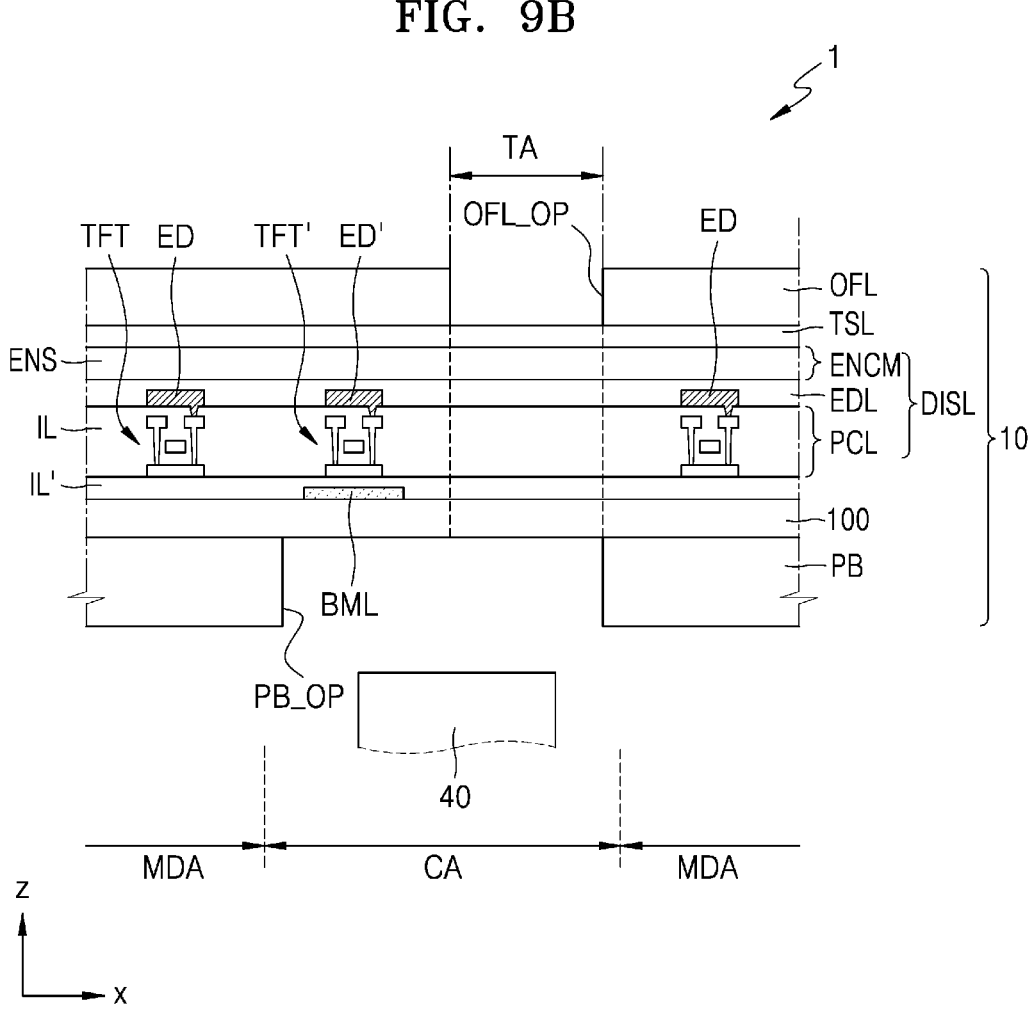

According to an embodiment, the encapsulation substrate ENS may be arranged or disposed to face the substrate 100 with the display element layer EDL therebetween, as shown in FIG. 9B. A gap may exist between the encapsulation substrate ENS and the display element layer EDL. The encapsulation substrate ENS may include glass. A sealant including frit or the like may be arranged or disposed between the substrate 100 and the encapsulation substrate ENS, and may be arranged or disposed in the peripheral area DPA. The sealant arranged or disposed in the peripheral area DPA may surround the display area DA and may prevent moisture from permeating through the side surfaces of the display panel 10.

The touch screen layer TSL may obtain coordinate information based on an external input, for example, a touch event. The touch screen layer TSL may include a touch electrode and touch wires electrically connected to the touch electrode. The touch screen layer TSL may sense an external input according to a self capacitance method or a mutual capacitance method.

The touch screen layer TSL may be on the thin-film encapsulation layer TFEL. Alternatively, the touch screen layer TSL may be separately provided or disposed on a touch substrate and then coupled to the upper surface of the thin-film encapsulation layer TFEL via the adhesive layer, such as an OCA. According to an embodiment, as shown in FIGS. 9A through 9D, the touch screen layer TSL may be provided or disposed directly on the thin-film encapsulation layer TFEL. In this case, no adhesive layers may be between the touch screen layer TSL and the thin-film encapsulation layer TFEL.

The optical functional layer OFL may include an anti-reflection layer. The anti-reflection layer may reduce reflectivity of light (external light) that may be incident from an external source toward the display apparatus 1.

According to an embodiment, the optical functional layer OFL may be a polarization film. The optical functional layer OFL may include an opening OFL_OP corresponding to the transmission area TA. Accordingly, the light transmittance of the transmission area TA may significantly improve. The opening OFL_OP may be filled with a transparent material such as an optically clear resin (OCR).

Figure 9C:
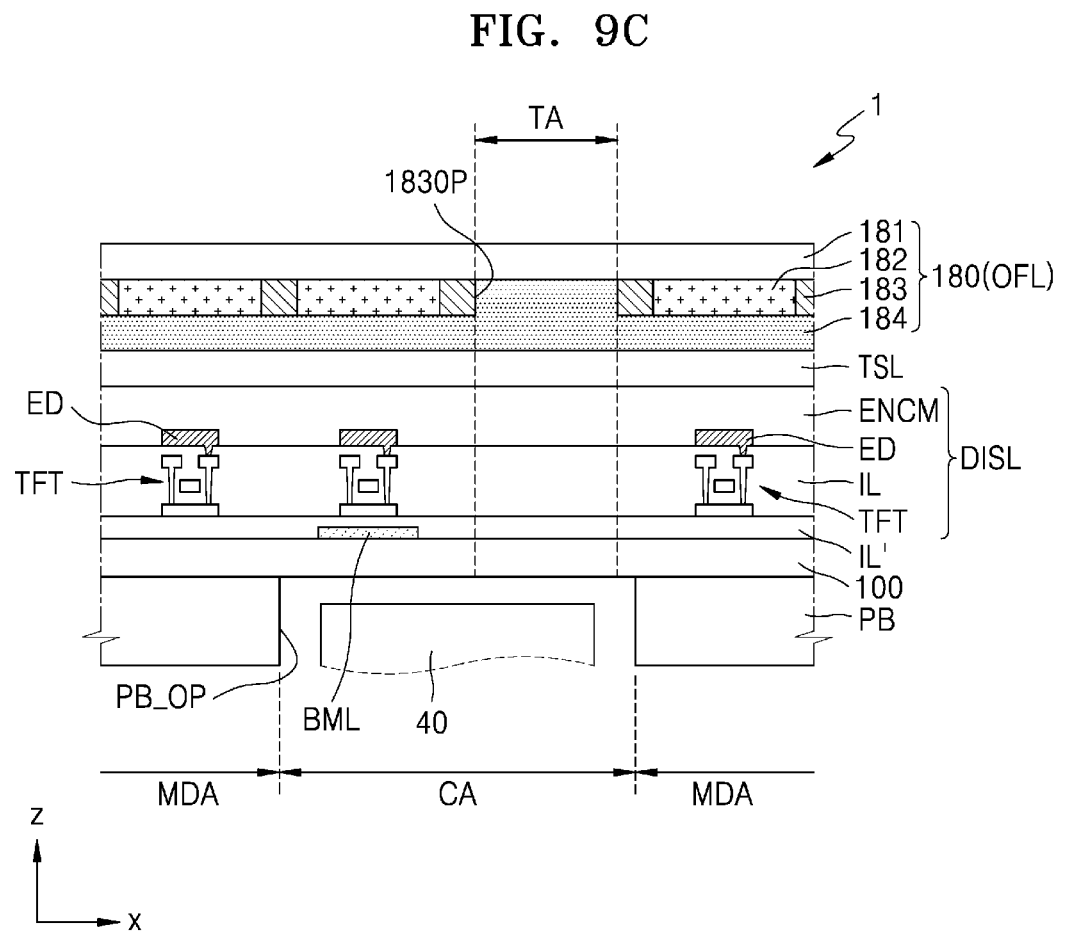

According to an embodiment, the optical functional layer OFL may include a filter plate 180 including a black matrix and color filters, as shown in FIG. 9C. The filter plate 180 may include a base layer 181, color filters 182 on the base layer 181, a black matrix 183, and an overcoat layer 184.

The color filters 182 may be arranged or disposed by considering the colors of light beams emitted by the pixels of the display panel 10. For example, each color filter 182 may have a red, green, or blue color according to the colors of light beams emitted by the main and auxiliary light-emitting elements ED and ED'. In the transmission area TA, the color filters 182 and the black matrix 183 do not exist. For example, a layer including the color filters 182 and the black matrix 183 may include a hole 1830P corresponding to the transmission area TA, and at least a portion of the hole 1830P may be filled with a portion of the overcoat layer 184. The overcoat layer 184 may include an organic material such as resin, and the organic material may be transparent.

Figure 9D:
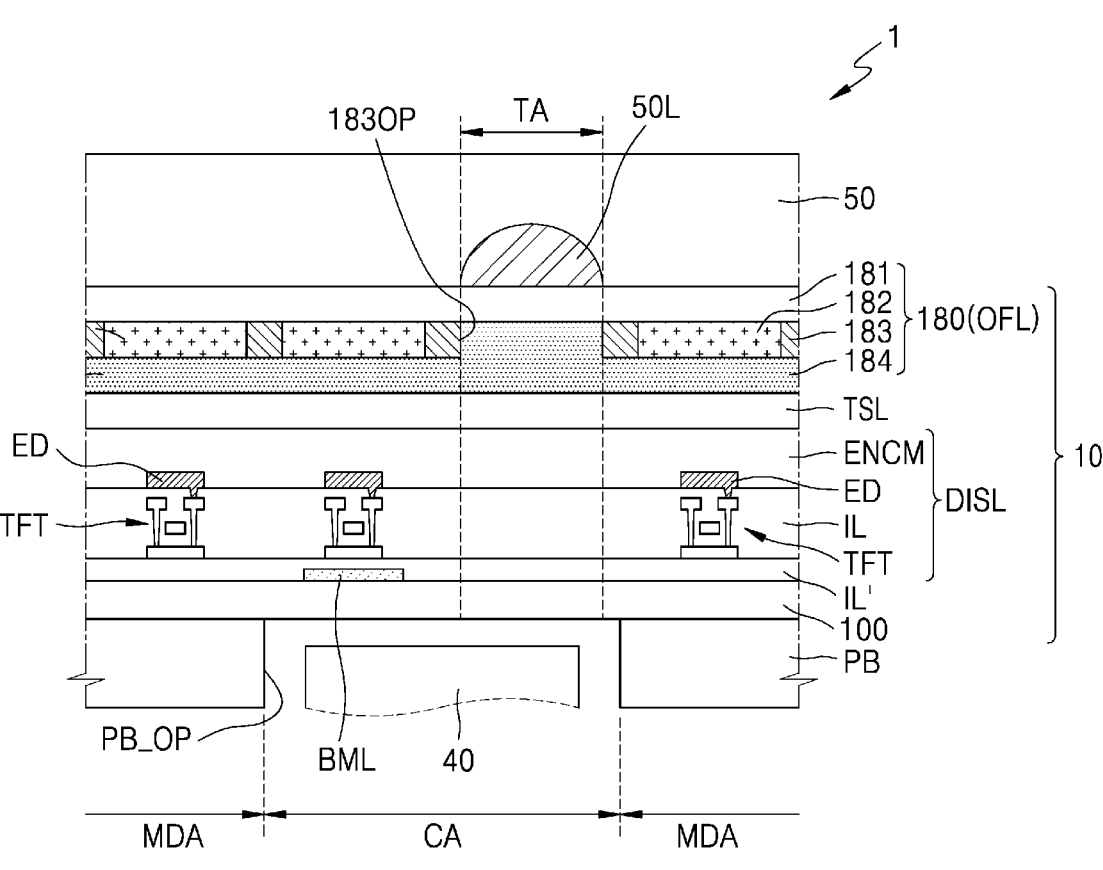
Figure 9D:
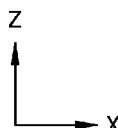

As shown in FIG. 9D, the cover window 50 may be arranged or disposed above the display panel 10 to protect the display panel 10. The cover window 50 may include a lens member 50L embedded therein to correspond to the transmission area TA of the display panel 10. The lens member 50L may be arranged or disposed in a case that the component 40 arranged or disposed in the component area CA may be a camera or an image sensor. Due to the lens member 50L being arranged or disposed, external light may be collected on the component 40, which may be a camera, and thus the quality of an image captured by the camera may improve.

Figure 9E:
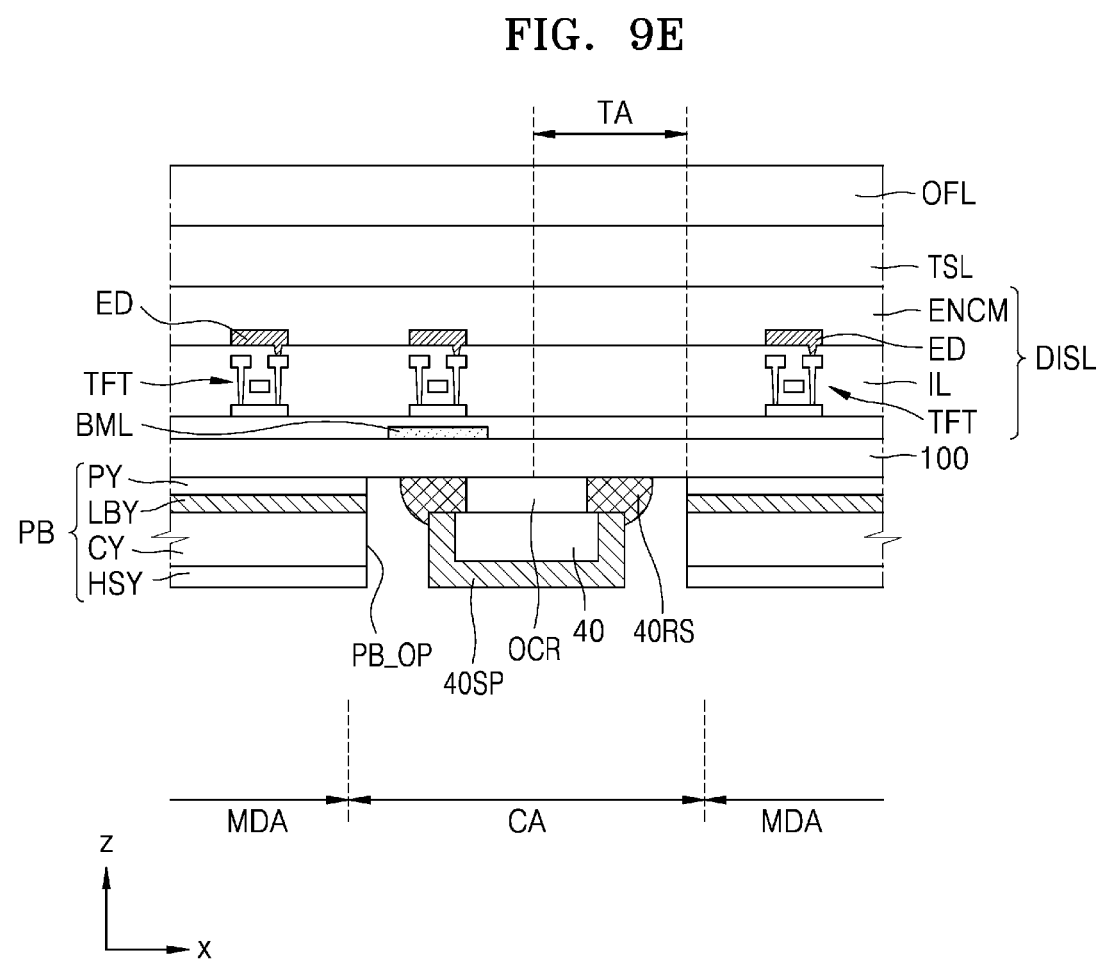

As shown in FIG. 9E, the component 40 may be attached to the lower surface of the display panel 10. The panel protection member PB may include a protection layer PY, a light blocking layer LBY, a cushion layer CY, and a heat sink layer HSY. The protection layer PY may be attached to the lower surface of the substrate 100 and protect the substrate 100. For example, the protection layer PY may absorb an external physical impact, or may prevent a foreign material, moisture, or the like from permeating into the display layer DISL. The protection layer PY may be coated on the lower surface of the substrate 100 or may be attached in the form of a film to the lower surface of the substrate 100.

According to an embodiment, the protection layer PY may include a material that blocks ultraviolet rays (UV). For example, the protection layer PY may include a base resin, a UV absorber, and inorganic particles. The UV absorber and the inorganic particles may be distributed and provided to the base resin. The base resin may be an acrylate-based resin, for example, urethane acrylate. However, embodiments are not limited thereto. A base resin that may be optically transparent and that may distribute a UV absorber and inorganic particles may be used in the protection layer PY without restrictions or limitations.

For example, the UV absorber may include at least one of a benzotriazol compound, a benzophenone compound, a salicylic acid compound, a salicylate compound, a cyanoacrylate compound, a cinnamate compound, an oxanilide compound, a polystyrene compound, an azomethine compound, and a triazine compound.

The light blocking layer LBY may be on the lower surface of the protection layer PY, and the cushion layer CY may be on the lower surface of the light blocking layer LBY. The light blocking layer LBY may be a double-sided adhesive between the protection layer PY and the cushion layer CY. The light blocking layer LBY may absorb externally incident light. For example, the light blocking layer LBY may be provided as a black layer to absorb external light. However, embodiments are not limited thereto. The light blocking layer LBY may include various materials that may absorb external light.

The cushion layer CY may be attached to the lower surface of the light blocking layer LBY to protect the display panel 10. The cushion layer CY may include an elastic material, and may be provided as, for example, a sponge or rubber.

The heat sink layer HSY may be below the cushion layer CY. The heat sink layer HSY may include a first heat sink layer including graphite or carbon nanotubes, and a second heat sink layer that may shield electromagnetic waves and including a metal thin film having high thermal conductivity, such as copper, nickel, ferrite, or silver.

The locations of the protection layer PY, the light blocking layer LBY, the cushion layer CY, and the heat sink layer HSY constituting the panel protection member PB may vary.

As described above, the panel protection member PB may include the opening PB-OP corresponding to the component area CA, and the component 40 may be within the opening PB-OP.

The component 40 may be mounted on a package 40SP, and the package 40SP may be attached to the lower surface of the substrate 100 by an adhesion member 40RS. The package 40SP may include a control circuit electrically connected to the main circuit board 70 and the component 40.

An OCR may be filled between the component 40 and the lower surface of the substrate 100. The OCR may have optical transparency and thus may minimize loss of the light incident upon the component 40.

The adhesion member 40RS may fix or adhere the package 40SP to the lower surface of the substrate 100. The adhesion member 40RS may include a resin. In other words, after the resin is arranged or disposed to contact the package

40SP and the lower surface of the substrate 100, curing by UV may be conducted. The adhesion member 40RS may include a light absorbing material.

Figure 10:
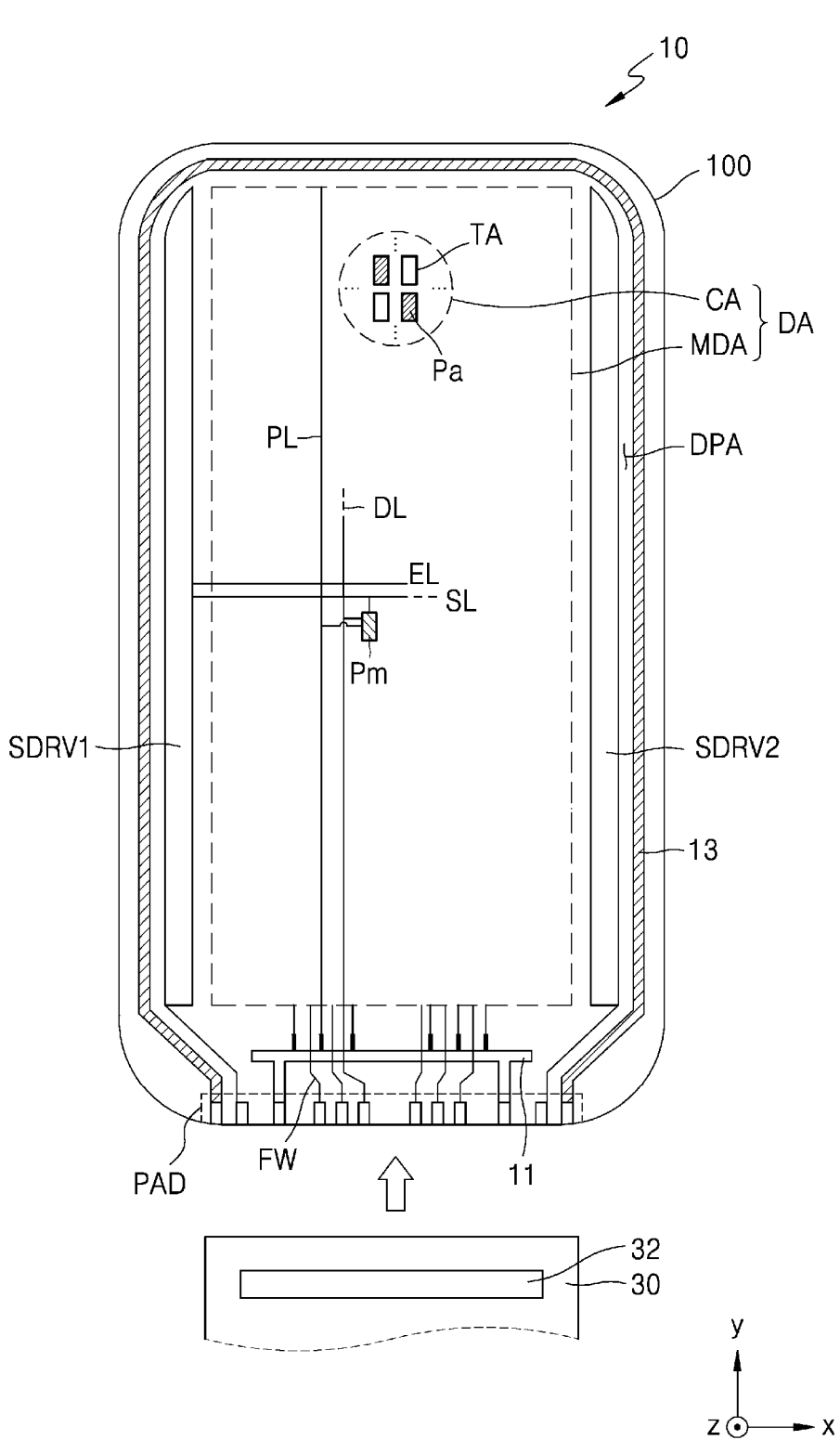
FIG. 10 is a schematic plan view of a display panel according to an embodiment.

FIG. 10 is a schematic plan view of a display panel 10 according to an embodiment.

Referring to FIG. 10, various components that constitute the display panel 10 may be arranged or disposed on a substrate 100. The substrate 100 may include a display area DA and a peripheral area PDA surrounding or adjacent to the display area DA. The display area DA may include a main display area MDA on which a main image may be displayed, and a component area CA which may include a transmission area TA and on which an auxiliary image may be displayed. The auxiliary image may form a single entire image together with the main image, or may be an image independent from the main image.

Main subpixels Pm may be arranged or disposed in the main display area MDA. Each of the main pixels Pm may be implemented as a display element, such as an organic light-emitting diode OLED. Each of the main subpixels Pm may emit, for example, red light, green light, blue light, or white light. The main display area MDA may be covered with or overlapped by an encapsulation member and thus may be protected from ambient air, moisture, or the like within the spirit and the scope of the disclosure.

The component area CA may be located or disposed on a side of the main display area MDA as described above, or may be arranged or disposed within the display area DA and surrounded by or adjacent to the main display area MDA. Auxiliary subpixels Pa may be arranged or disposed in the component area CA. Each of the auxiliary subpixels Pa may be implemented as a display element, such as an organic light-emitting diode OLED. Each of the auxiliary subpixels Pa may emit, for example, red light, green light, blue light, or white light. The component CA may be covered with or overlapped by an encapsulation member and thus may be protected from ambient air, moisture, or the like within the spirit and the scope of the disclosure.

The component area CA may have transmission areas TA. The transmission areas TA may be arranged or disposed to surround or be adjacent to the auxiliary subpixels Pa. Alternatively, the transmission areas TA may be arranged or disposed in a lattice configuration, together with the auxiliary subpixels Pa.

Because the component area CA has the transmission areas TA, a resolution of the component area CA may be lower than a resolution of the main display area MDA. For example, the resolution of the component area CA may be about $\frac{1}{2}$, $\frac{3}{8}$, $\frac{1}{3}$, $\frac{1}{4}$, $\frac{2}{9}$, $\frac{1}{8}$, $\frac{1}{9}$, or $\frac{1}{16}$ of the resolution of the main display area MDA. For example, the resolution of the main display area MDA may be about 400 ppi or greater, and the resolution of the component area CA may be about 200 ppi or about 100 ppi.

Pixel circuits that may drive the main and auxiliary subpixels Pm and Pa may be electrically connected to outer circuits arranged or disposed in the peripheral area DPA. A first scan driving circuit SDRV1, a second scan driving circuit SDRV2, a terminal unit PAD, a driving voltage supply line 11, and a common voltage line 13 may be arranged or disposed in the peripheral area DPA.

The first scan driving circuit SDRV1 may apply a scan signal, via a scan line SL, to each of the pixel circuits that drive the main and auxiliary subpixels Pm and Pa. The first scan driving circuit SDRV1 may apply a light-emission control signal to each of the pixel circuits via a light-emission control line EL. The second scan driving circuit SDRV2 may be located or disposed on a side of the main display area MDA that may be opposite to a side where the first scan driving circuit SDRV1 may be located or disposed, and may be approximately parallel to the first scan driving circuit SDRV1. Some or a predetermined number of the pixel circuits of the main subpixels Pm arranged or disposed in the main display area MDA may be electrically connected to the first scan driving circuit SDRV1, and the remaining pixel circuits may be electrically connected to the second scan driving circuit SDRV2. Some or a predetermined number of the pixel circuits of the auxiliary subpixels Pa arranged or disposed in the component area CA may be electrically connected to the first scan driving circuit SDRV1, and the remaining pixel circuits may be electrically connected to the second scan driving circuit SDRV2. The second scan driving circuit SDRV2 may not be included.

The terminal unit PAD may be arranged or disposed on a side of the substrate 100. The terminal unit PAD may be exposed without being covered or overlapped by an insulating layer, and may be electrically connected to the display circuit board 30. The display driving unit 32 may be disposed on the display circuit board 30. The display driving unit 32 may generate a control signal that may be transmitted to the first scan driving circuit SDRV1 and the second scan driving circuit SDRV2. The display driving unit 32 may supply a driving voltage ELVDD to the driving voltage supply line 11, and may supply a common voltage ELVSS to the common voltage supply line 13. The driving voltage ELVDD may be applied to the pixel circuits of the main and auxiliary subpixels Pm and Pa via a driving voltage line PL electrically connected to the driving voltage supply line 11, and the common voltage ELVSS may be electrically connected to the second power supply line 13 and thus may be applied to an opposite electrode of each display element. The display driving unit 32 may generate a data signal, and the generated data signal may be transmitted to the pixel circuits of the main and auxiliary subpixels Pm and Pa via fanout wires FW and data lines DL electrically connected to the fanout wires FW.

The driving voltage supply line 11 may extend in the x direction along a lower side of the main display area MDA. The common voltage supply line 13 may have a substantially loop shape of which a side may be open, and may surround or be adjacent to a portion of the main display area MDA.

Figure 11A:
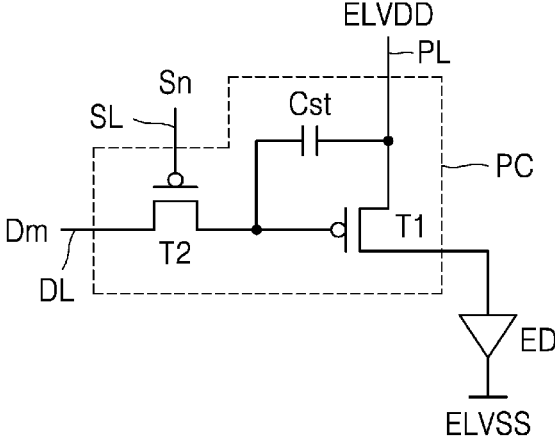
FIGS. 11A and 11B are equivalent circuit diagrams of pixel circuits for driving subpixels, according to embodiments.
Figure 11B:
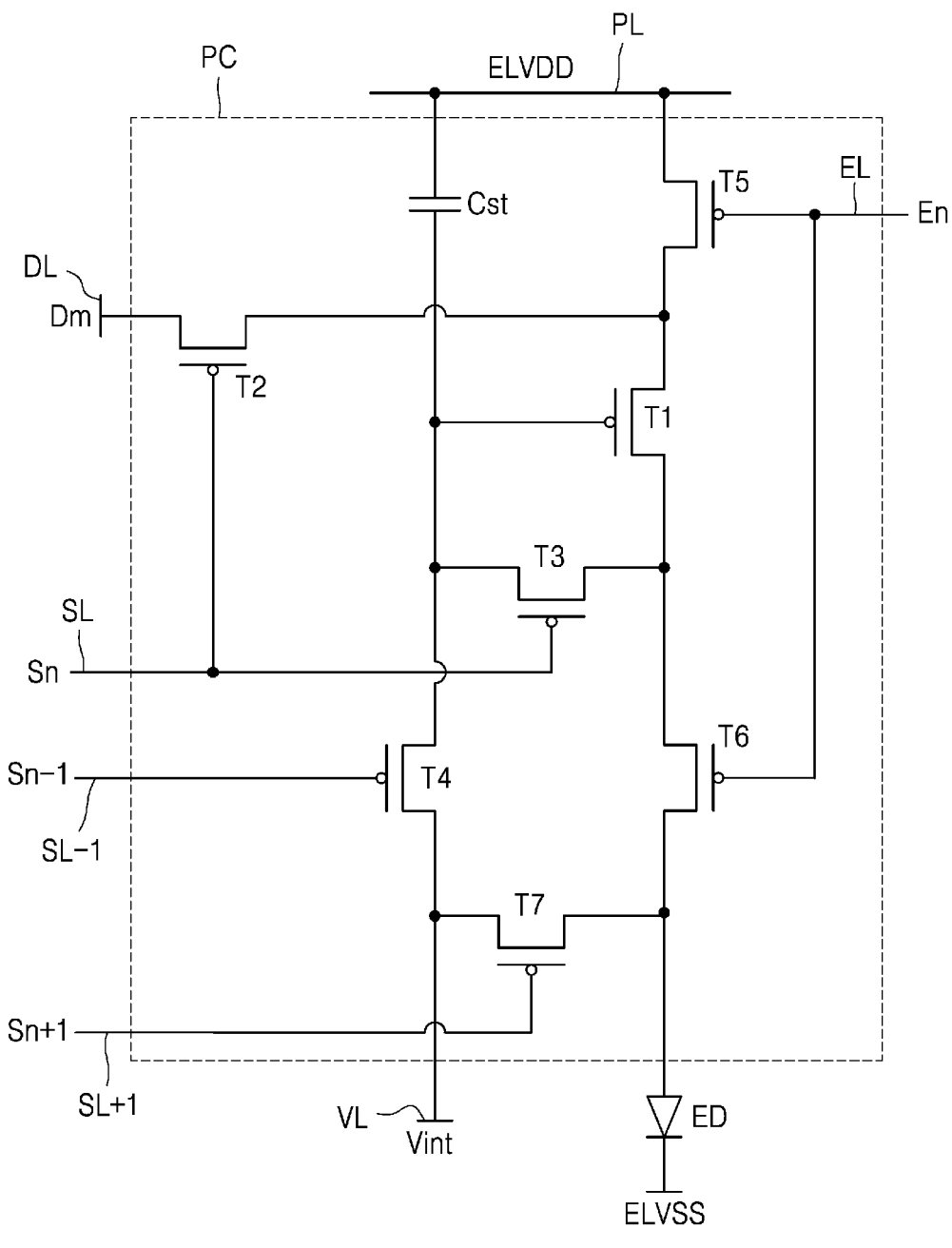

FIGS. 11A and 11B are equivalent circuit diagrams of pixel circuits for driving main and auxiliary subpixels Pm and Pa, according to embodiments.

Referring to FIG. 11A, a pixel circuit PC may be electrically connected to a light-emitting element ED and may realize light emission of subpixels. The pixel circuit PC may include a driving thin-film transistor T1, a switching thin-film transistor T2, and a storage capacitor Cst. The switching thin-film transistor T2 may be electrically connected to the scan line SL and the data line DL, and may transmit, to the driving thin-film transistor T1, a data signal Dm received via the data line DL according to a scan signal Sn received via the scan line SL.

The storage capacitor Cst may be electrically connected to the switching thin-film transistor T2 and a driving voltage line PL, and stores a voltage corresponding to a difference between a voltage received from the switching thin-film transistor T2 and the driving voltage ELVDD supplied to the driving voltage line PL.

The driving thin-film transistor T1 may be electrically connected to the driving voltage line PL and the storage capacitor Cst, and may control a driving current flowing from the driving voltage line PL to the light-emitting element ED, in accordance with a voltage value stored in the storage capacitor Cst. The light-emitting element ED may emit light having a certain or a predetermined brightness due to the driving current.

Although a case where the pixel circuit PC may include two thin-film transistors and one storage capacitor is illustrated in FIG. 11A, embodiments are not limited thereto.

Referring to FIG. 11B, a pixel circuit PC may include a driving thin-film transistor T1, a switching thin-film transistor T2, a compensating thin-film transistor T3, a first initializing thin-film transistor T4, an operation control thin-film transistor T5, a light-emission control thin-film transistor T6, and a second initializing thin-film transistor T7.

Although the pixel circuit PC may include signal lines, namely, a scan line SL, a previous scan line SL−1, a next scan line SL+1, a light-emission control line EL, and a data line DL, an initializing voltage line VL, and a driving voltage line PL in FIG. 11B, embodiments are not limited thereto. According to an embodiment, at least one of the signal lines, namely, the scan line SL, the previous scan line SL−1, the next scan line SL+1, the light-emission control line EL, and the data line DL, or/and the initializing voltage line VL may be shared by neighboring pixel circuits.

A drain electrode of the driving thin-film transistor T1 may be electrically connected to the light-emitting element ED via the light-emission control thin-film transistor T6. The driving thin-film transistor T1 receives the data signal Dm according to a switching operation of the switching thin-film transistor T2 and supplies a driving current to the light-emitting element ED.

A gate electrode of the switching thin-film transistor T2 may be electrically connected to the scan line SL, and a source electrode thereof may be electrically connected to the data line DL. A drain electrode of the switching thin-film transistor T2 may be electrically connected to a source electrode of the driving thin-film transistor T1 and at the same time may be electrically connected to the driving voltage line PL via the operation control thin-film transistor T5.

The switching thin-film transistor T2 is turned on according to the scan signal Sn received via the scan line SL and performs a switching operation of transmitting the data signal Dm received from the data line DL to the source electrode of the driving thin-film transistor T1.

A gate electrode of the compensating thin-film transistor T3 may be electrically connected to the scan line SL. A source electrode of the compensating thin-film transistor T3 may be electrically connected to the drain electrode of the driving thin-film transistor T1 and at the same time may be electrically connected to a pixel electrode of the light-emitting element ED via the light-emission control thin-film transistor T6. A drain electrode of the compensating thin-film transistor T3 may be electrically connected to one electrode of the storage capacitor Cst, a source electrode of the first initializing thin-film transistor T4, and a gate electrode of the driving thin-film transistor T1. The compensating thin film transistor T3 is turned on according to the scan signal Sn received via the scan line SL and electrically connects the gate electrode and the drain electrode of the driving thin film transistor T1 to each other thus achieving diode-connection of the driving thin film transistor T1.

A gate electrode of the first initializing thin-film transistor T4 may be electrically connected to the previous scan line SL−1. A drain electrode of the first initializing thin-film transistor T4 may be electrically connected to the initializing voltage line VL. A source electrode of the first initializing thin-film transistor T4 may be electrically connected to the one electrode of the storage capacitor Cst, the drain electrode of the compensating thin film transistor T3, and the gate electrode of the driving thin-film transistor T1. The first initializing thin-film transistor T4 may be turned on according to a previous scan signal Sn−1 received via the previous scan line SL−1 and may transmit an initializing voltage Vint to the gate electrode of the driving thin-film transistor T1 to thereby initialize a voltage of the gate electrode of the driving thin-film transistor T1.

A gate electrode of the operation control thin-film transistor T5 may be electrically connected to the light-emission control line EL. A source electrode of the operation control thin-film transistor T5 may be electrically connected to the driving voltage line PL. A drain electrode of the operation control thin-film transistor T5 may be electrically connected to the source electrode of the driving thin-film transistor T1 and the drain electrode of the switching thin-film transistor T2.

A gate electrode of the light-emission control thin-film transistor T6 may be electrically connected to the light-emission control line EL. A source electrode of the light-emission control thin-film transistor T6 may be electrically connected to the drain electrode of the driving thin-film transistor T1 and the source electrode of the compensating thin-film transistor T3. A drain electrode of the light-emission control thin-film transistor T6 may be electrically connected to the pixel electrode of the light-emitting element ED. The operation control thin-film transistor T5 and the light-emission control thin-film transistor T6 are simultaneously turned on according to a light-emission control signal En received via the light-emission control line EL, and thus the driving voltage ELVDD is transmitted to the light-emitting element ED and the driving current flows in the light-emitting element ED.

A gate electrode of the second initializing thin-film transistor T7 may be electrically connected to the next scan line SL+1. A source electrode of the second initializing thin-film transistor T7 may be electrically connected to the pixel electrode of the light-emitting element ED. A drain electrode of the second initializing thin-film transistor T7 may be electrically connected to the initializing voltage line VL. The second initializing thin-film transistor T7 may be turned on according to a next scan signal Sn+1 received via the next scan line SL+1 and may initialize the pixel electrode of the light-emitting element ED.

Although the first initializing thin-film transistor T4 and the second initializing thin-film transistor T7 may be respectively electrically connected to the previous scan line SL−1 and the next scan line SL+1 in FIG. 11B, embodiments are not limited thereto. According to an embodiment, both the first initializing thin-film transistor T4 and the second initializing thin-film transistor T7 may be electrically connected to the previous scan line SL−1 and may be driven according to the previous scan signal Sn−1.

Another electrode of the storage capacitor Cst may be electrically connected to the driving voltage line PL. The one electrode of the storage capacitor Cst may be electrically connected to the gate electrode of the driving thin-film transistor T1, the drain electrode of the compensating thin film transistor T3, and the source electrode of the first initializing thin-film transistor T4.

An opposite electrode (for example, a cathode) of the light-emitting element ED provides the common voltage ELVSS. The light-emitting element ED receives the driving current from the driving thin-film transistor T1 and emits light.

The pixel circuit PC is not limited to the number of thin-film transistors, the number of storage capacitors, and the circuit designs all described above with reference to FIGS. 11A and 11B. The number of thin-film transistors, the number of storage capacitors, and a circuit design may vary.

The pixel circuits PC driving a main subpixel Pm and an auxiliary subpixel Pa may be the same as each other or may be different from each other. For example, the pixel circuit PC of FIG. 11B may be used as each of the pixel circuits PC driving a main subpixel Pm and an auxiliary subpixel Pa. According to an embodiment, the pixel circuit PC of FIG. 11B may be used as a pixel circuit PC driving a main subpixel Pm, and the pixel circuit PC of FIG. 11A may be used as a pixel circuit PC driving an auxiliary subpixel Pa.

Figure 12:
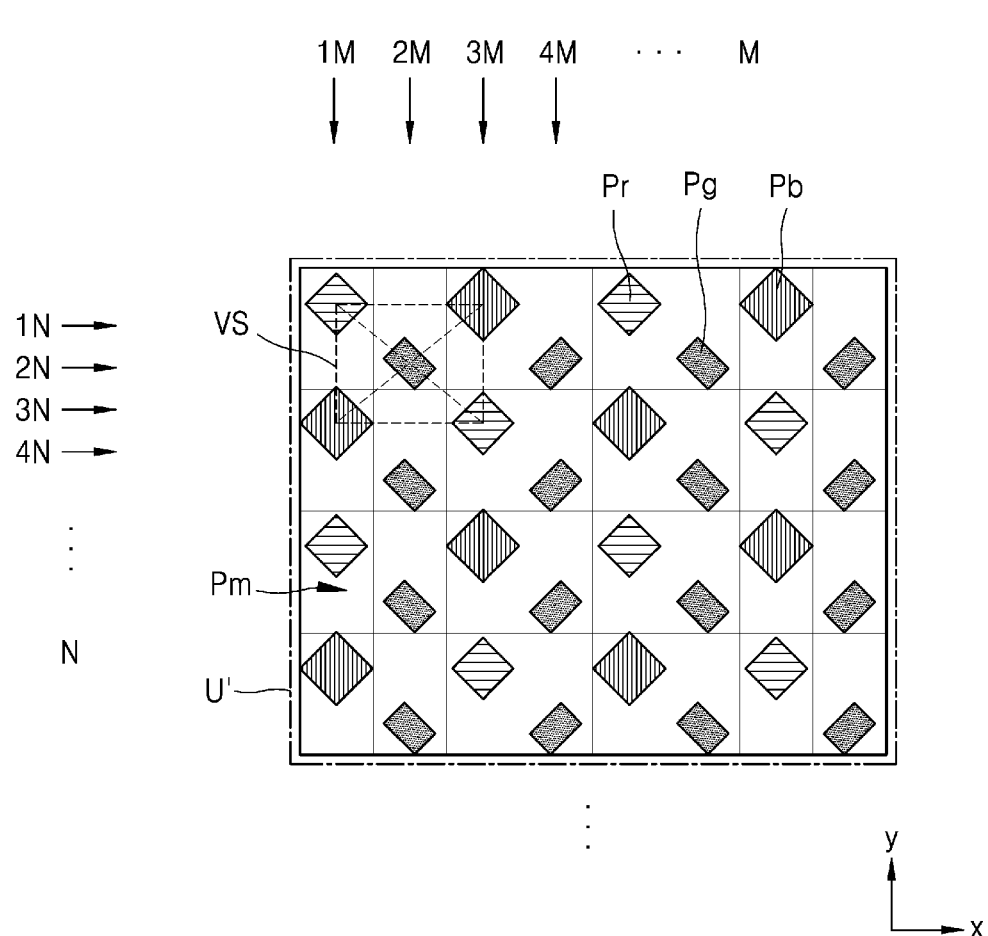
FIG. 12 is a schematic layout view illustrating a pixel arrangement structure in a main display area of a display panel according to an embodiment.

FIG. 12 is a schematic layout view illustrating a pixel arrangement structure in the main display area MDA according to an embodiment.

Main subpixels Pm may be arranged or disposed in the main display area MDA. A subpixel, as used herein, may refer to a light-emission area as a minimum unit that may realize an image. In a case that an organic light-emitting diode is used as a display element, the light-emission area may be defined by the opening of a pixel defining layer. This will be described later.

As shown in FIG. 12, the main subpixels Pm arranged or disposed in the main display area MDA may have a pentile structure. A red subpixel Pr, a green subpixel Pg, and a blue subpixel Pb may represent a red color, a green color, and a blue color, respectively.

Accordingly, red subpixels Pr and blue subpixels Pb may alternate with each other on a first row 1N, green subpixels Pg may be a predetermined distance apart from each other on a second row 2N adjacent to the first row 1N, blue subpixels Pb and red subpixels Pr may alternate with each other on a third row 3N adjacent to the second row 2N, and green subpixels Pg may be a predetermined distance apart from each other on a fourth row 4N adjacent to the third row 3N, and this pixel arrangement may be repeated up to an N-th row. In this case, the blue subpixels Pb and the red subpixels Pr may be larger than the green subpixels Pg.

The red subpixels Pr and the blue subpixels Pb disposed on the first row 1N, and the green subpixels Pg disposed on the second row 2N may be arranged or disposed in a zigzag configuration. Accordingly, red subpixels Pr and blue subpixels Pb may alternate with each other on a first column 1M, green subpixels Pg may be disposed a predetermined distance apart from each other on a second column 2M adjacent to the first column 1M, blue subpixels Pb and red subpixels Pr may alternate with each other on a third column 3M adjacent to the second column 2M, and green subpixels Pg may be a predetermined distance apart from each other on a fourth column 4M adjacent to the third column 3M, and this pixel arrangement may be repeated up to an M-th column.

Describing this pixel arrangement structure differently, red subpixels Pr may be arranged or disposed at first and third facing vertexes of the four vertexes of a virtual quadrilateral VS having a center point of a green subpixel Pg as its center point, and blue subpixels Pb may be arranged or disposed at the remaining vertexes, namely, second and fourth vertexes. The virtual quadrilateral VS may be a rectangle, a rhombus, a square, or the like within the spirit and the scope of the disclosure.

This pixel arrangement structure may be referred to as a pentile matrix structure or a pentile structure. By applying rendering, in which a color of a pixel may be represented by sharing the colors of its adjacent pixels, a high resolution may be obtained via a small number of pixels.

Although the main subpixels Pm may be arranged or disposed in a pentile matrix structure in FIG. 12, embodiments are not limited thereto. For example, the main sub-pixels Pm may be arranged or disposed in various configurations, such as a stripe structure, a mosaic arrangement structure, and a delta arrangement structure.

FIGS. 13A through 15 are schematic layout views illustrating pixel arrangement structures in the component area CA, according to various embodiments.

Figure 13A:
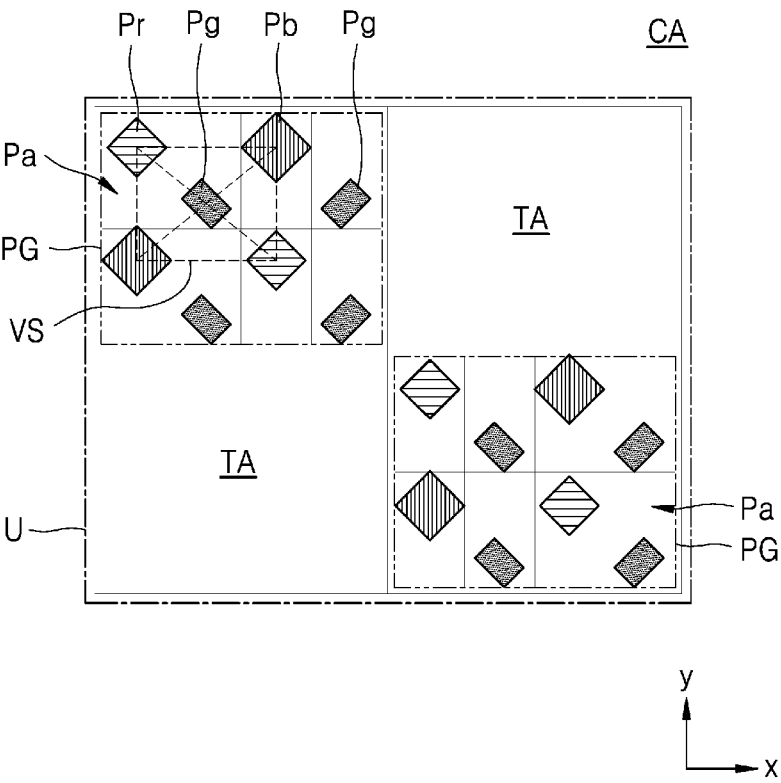
FIGS. 13A through 15 are schematic layout views illustrating pixel arrangement structures in a component area of a display panel, according to various embodiments.

Referring to FIG. 13A, auxiliary subpixels Pa may be arranged or disposed in the component area CA. Each of the auxiliary subpixels Pa may emit, for example, red light, green light, blue light, or white light.

The component area CA may include a pixel group PG and a transmission area TA, the pixel group PG including at least one auxiliary subpixel Pa. The pixel group PG and the transmission area TA may alternate with each other both in the x direction and the y direction, and may be arranged or disposed in, for example, a lattice configuration. In this case, the component area CA may have pixel groups PG and transmission areas TA.

The pixel group PG may be defined as a subpixel set in which auxiliary subpixels Pa may be grouped in a predetermined unit. For example, as shown in FIG. 13A, a single pixel group PG may include eight auxiliary subpixels Pa arranged or disposed in a pentile structure. In other words, a single pixel group PG may include two red subpixels Pr, four green subpixels Pg, and two blue subpixels Pb.

In the component area CA, a basic unit U including a certain or a predetermined number of pixel groups PG and a certain or a predetermined number of transmission areas TA may be repeated in the x direction and the y direction. In FIG. 13A, the basic unit U may have a quadrilateral shape in which two pixel groups PG and two transmission areas TA may be arranged or disposed around the pixel groups PG may be grouped. The basic unit U is a repetitive structure and does not indicate a disconnected configuration.

In the main display area MDA, a corresponding unit U' having the same area as that of the basic unit U may be set. In this case, the number of main subpixels Pm included in the corresponding unit U' may be greater than that of auxiliary subpixels Pa included in the basic unit U. In other words, the number of auxiliary subpixels Pa included in the basic unit U is 16 and the number of main subpixels Pm included in the corresponding unit U' is 32, and thus the number of auxiliary subpixels Pa and the number of main subpixels Pm arranged or disposed on the same area may be 1:2.

A pixel arrangement structure of the component area CA in which the auxiliary subpixels Pa may be arranged or disposed in a pentile structure as shown in FIG. 13A and a resolution of the component area CA is ½ of the resolution of the main display area MDA is referred to as a ½ pentile structure. The number of auxiliary subpixels Pa included in the pixel group PG or an arrangement method thereof may be modified according to the resolution of the component area CA.

Figure 13B:
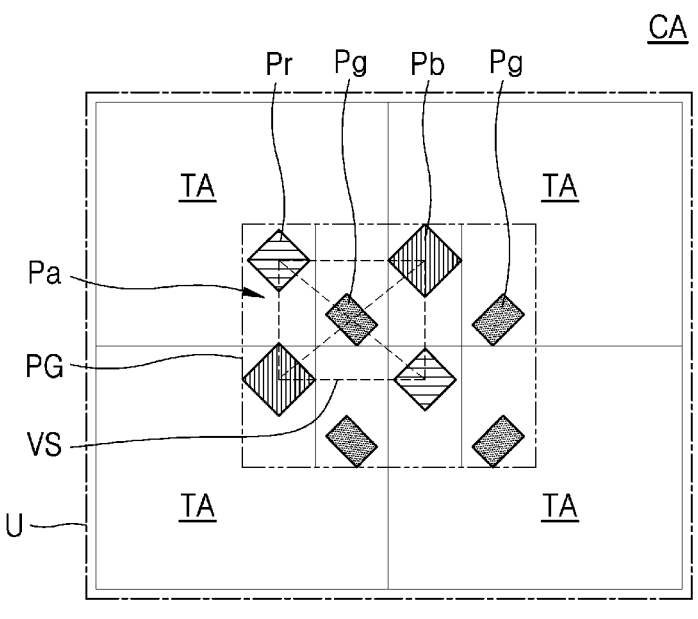

Referring to FIG. 13B, the pixel arrangement structure of the component area CA may be a ¼ pentile structure. According to an embodiment, the pixel group PG may include eight auxiliary subpixels Pa arranged or disposed in a pentile structure, but a basic unit U may include only one pixel group PG. The remaining area of the basic unit U not occupied by the one pixel group PG may be filled with transmission areas TA. Accordingly, the number of auxiliary subpixels Pa and the number of main subpixels Pm arranged or disposed on the same area may be in a ratio of 1:4. In this case, the one pixel group PG may be surrounded by or be adjacent to the transmission areas TA.

Figure 13C:
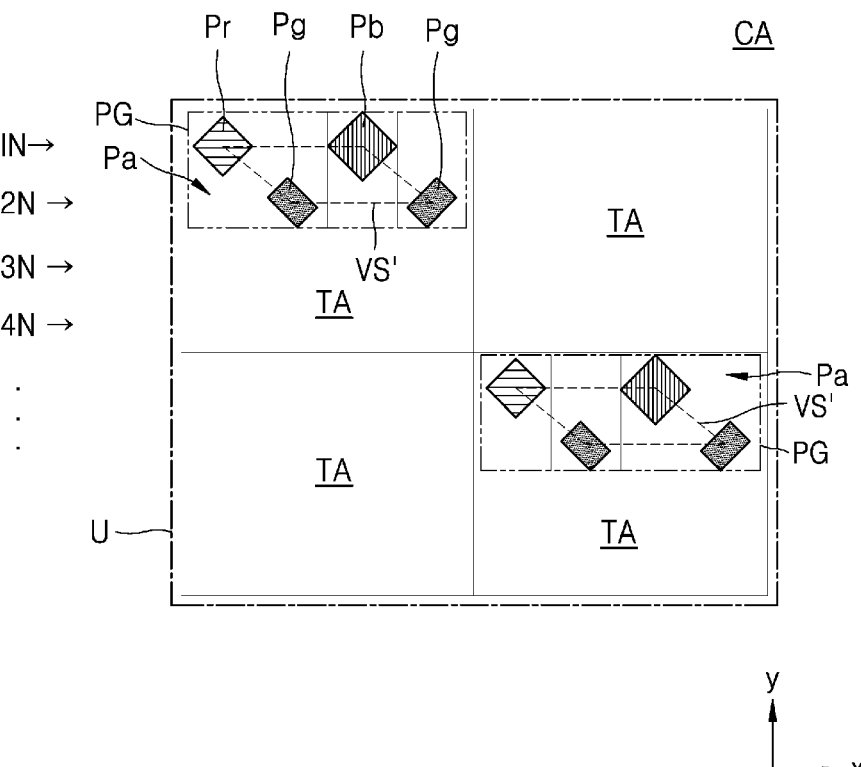

Referring to FIG. 13C, the pixel arrangement structure of the component area CA may be a ¼ pentile distributed structure. According to an embodiment, two pixel groups PG may be distributed and arranged or disposed in a basic unit U. A single pixel group PG may be based on a pentile structure and may include a total of four auxiliary subpixels Pa, namely, one red subpixel Pr, two green subpixels Pg, and one blue subpixel Pb.

The four auxiliary subpixels Pa may be arranged or disposed at the four vertexes of a virtual quadrilateral VS', respectively. According to an embodiment, the virtual quadrilateral VS' may be a parallelogram. The red subpixel Pr and the blue subpixel Pb may be arranged or disposed on the first row 1N, and the two green subpixels Pg may be arranged or disposed on the second row 1N.

Because a pixel group PG and a transmission area TA may be alternately arranged or disposed, as the number of auxiliary subpixels Pa included in each pixel group PG decreases, the auxiliary subpixels Pa may be more distributed within a basic unit U.

Figure 13D:
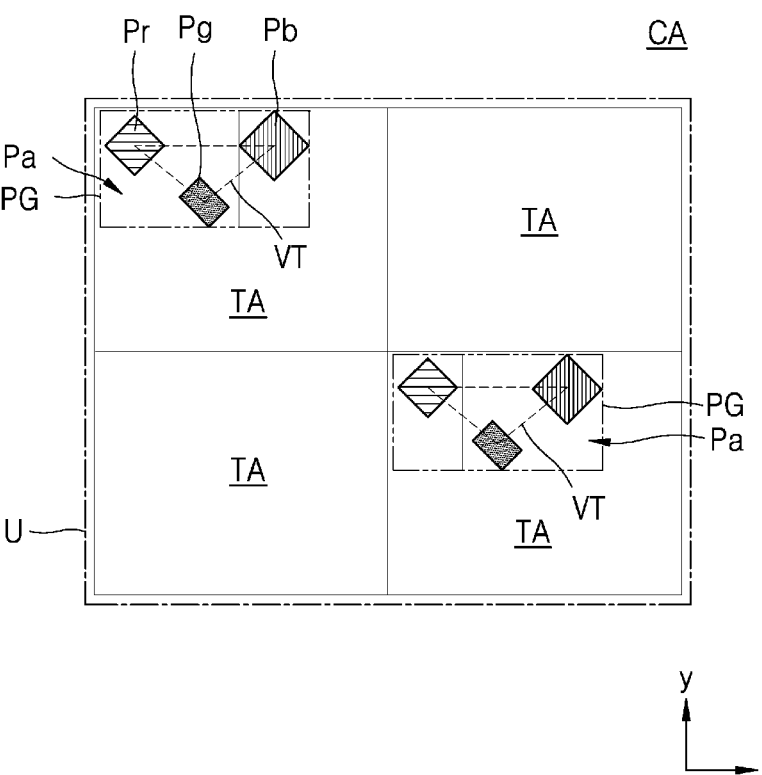

Referring to FIG. 13D, the pixel arrangement structure of the component area CA may be a ⅜ pentile structure. According to an embodiment, two pixel groups PG may be distributed and arranged or disposed in a basic unit U. A single pixel group PG may be based on a pentile structure and may include a total of three auxiliary subpixels Pa, namely, one red subpixel Pr, one green subpixel Pg, and one blue subpixel Pb. In the arrangement of the auxiliary sub-pixels Pa in the single pixel group PG, the red subpixel Pr, the green subpixel Pg, and the blue subpixel Pb may be arranged or disposed at the three vertexes of a virtual triangle VT, respectively.

Compared with the basic pentile structure in the main display area MDA of FIG. 12, the pixel arrangement structure according to an embodiment may include no subpixels on the third row 3N and the fourth row 4N and also may include no subpixels on a fourth column 4M. Accordingly, the number of auxiliary subpixels Pa included in the basic unit U is 6 and the number of main subpixels Pm included in the corresponding unit U' is 32, and thus the number of auxiliary subpixels Pa and the number of main subpixels Pm arranged or disposed on the same area may be at a ratio of 3:16.

Figure 13E:
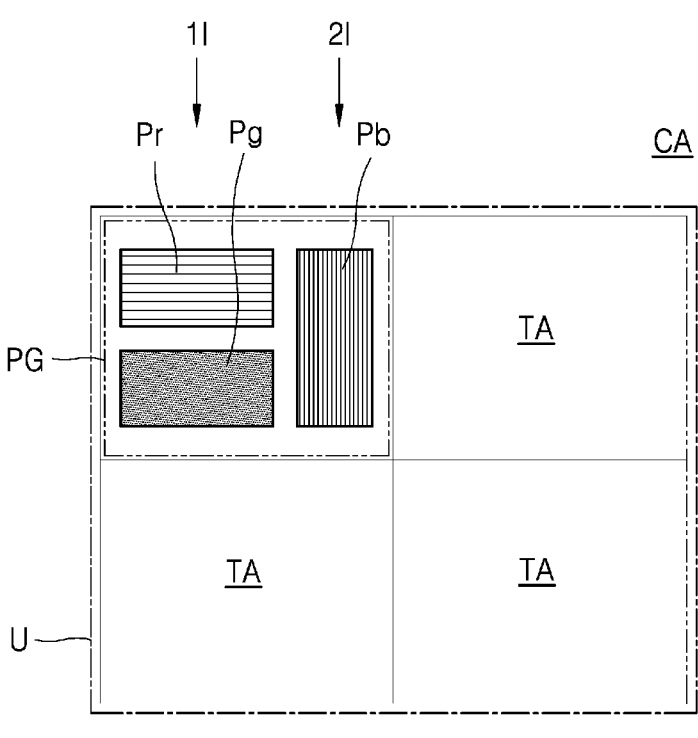

Referring to FIG. 13E, the pixel arrangement structure of the component area CA may be an S-stripe structure. According to an embodiment, a single pixel group PG may include a total of three auxiliary subpixels Pa, namely, one red subpixel Pr, one green subpixel Pg, and one blue subpixel Pb.

According to an embodiment, one red subpixel Pr and one green subpixel Pg may alternate with each other on a first column 1I, and one blue subpixel Pb may be arranged or disposed on a second column 2I adjacent to the first column 1I. In this case, each of the red subpixel Pr and the green subpixel Pg may have a substantially rectangular shape having a longer side in the x direction, and the blue subpixel Pb may be arranged or disposed to have a substantially rectangular shape having a longer side in the y direction. A length of the blue subpixel Pb in the y direction may be equal to or greater than a sum of a length of the red subpixel Pr in the y direction and a length of the green subpixel Pg in the y direction. Accordingly, a size of the blue subpixel Pb may be greater than a size of each of the red and green subpixels Pr and Pg.

According to an embodiment, an area of the basic unit U occupied by the pixel group PG may be about ¼ of the basic unit U. In FIG. 13E, only one pixel group PG may be included in the basic unit U. However, according to an embodiment, the basic unit U may include two or more pixel groups PG. The area of the auxiliary subpixels Pa included in each pixel group PG may vary.

Figure 13F:
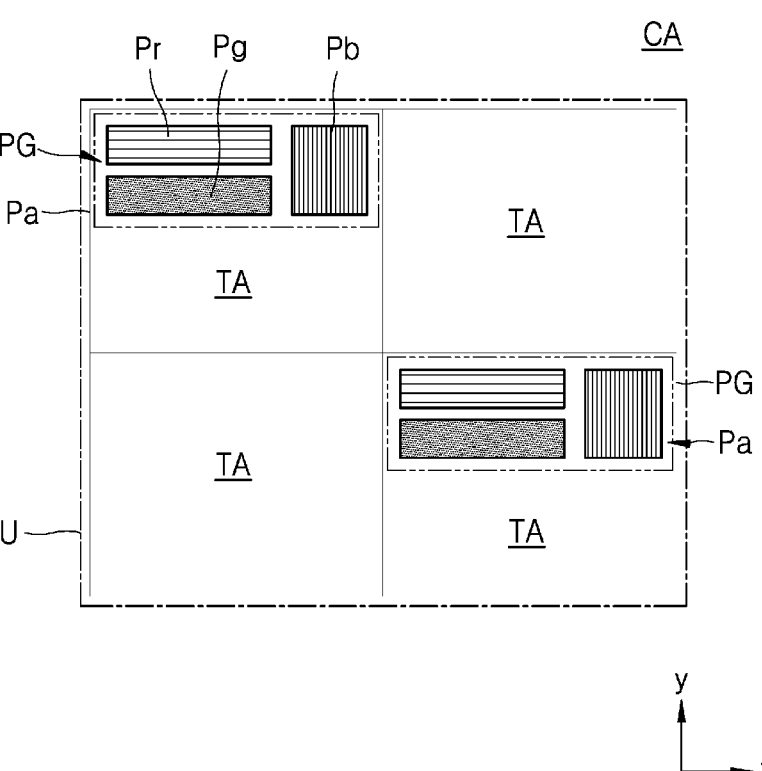

Referring to FIG. 13F, a basic unit U arranged or disposed in the component area CA may include two pixel groups PG based on an S-stripe structure. The two pixel groups PG may be arranged or disposed apart from each other with a transmission area TA therebetween.

According to an embodiment, an area of the basic unit U occupied by the two pixel groups PG may be about ¼ of the basic unit U. In other words, the area of the auxiliary subpixels Pa of FIG. 13F may be smaller than that of the auxiliary subpixels Pa of FIG. 13E.

Figure 13G:
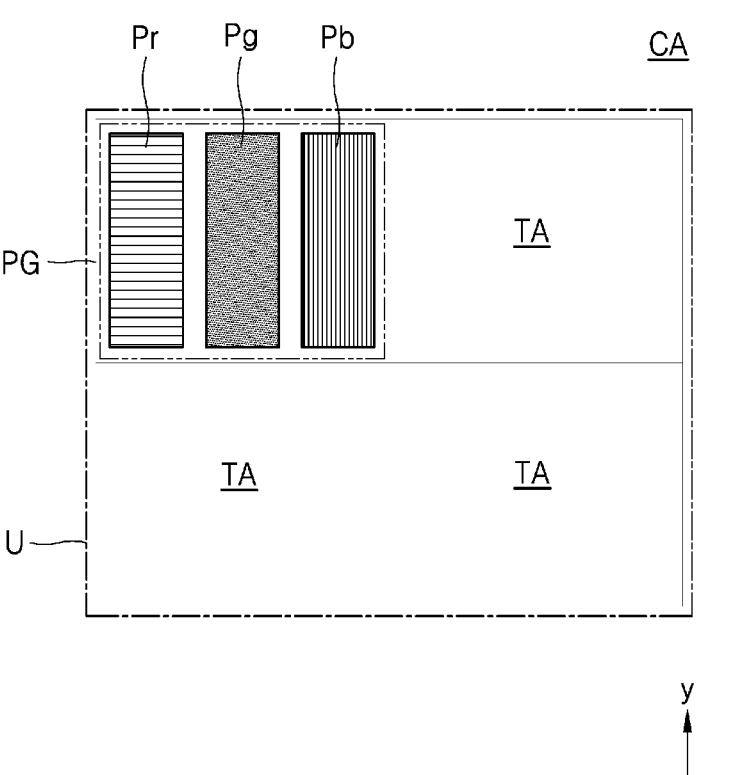

Referring to FIG. 13G, the pixel arrangement structure of the component area CA may be a stripe structure. In other words, a red subpixel Pr, a green subpixel Pg, and a blue subpixel Pb may be juxtaposed in the x direction. In this case, each of the red subpixel Pr, the green subpixel Pg, and the blue subpixel Pb may have a longer side in the y direction.

Alternatively, a red subpixel Pr, a green subpixel Pg, and a blue subpixel Pb may be juxtaposed in the y direction. In this case, each of the red subpixel Pr, the green subpixel Pg, and the blue subpixel Pb may have a longer side in the x direction.

Referring to FIGS. 14A through 14F, auxiliary subpixels Pa may be arranged or disposed in a substantially circle configuration within the component area CA. For example, auxiliary subpixels Pa may be arranged or disposed in a circumferential direction of a virtual circle VC such that a red subpixel Pr, a green subpixel Pg, and a blue subpixel Pb may be sequentially arranged or disposed and repeated in the circumferential direction of the virtual circle VC. The shapes of the auxiliary pixels Pa included in a pixel group PG, an arrangement of the auxiliary pixels Pa, and the number of auxiliary pixels Pa included in the pixel group PG may vary.

Figure 14A:
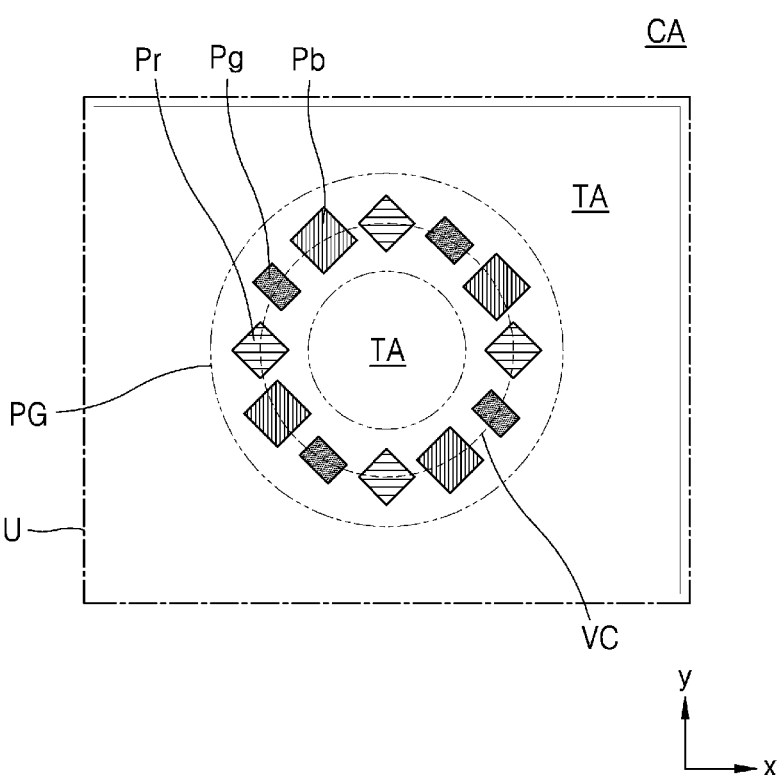
Figure 14B:
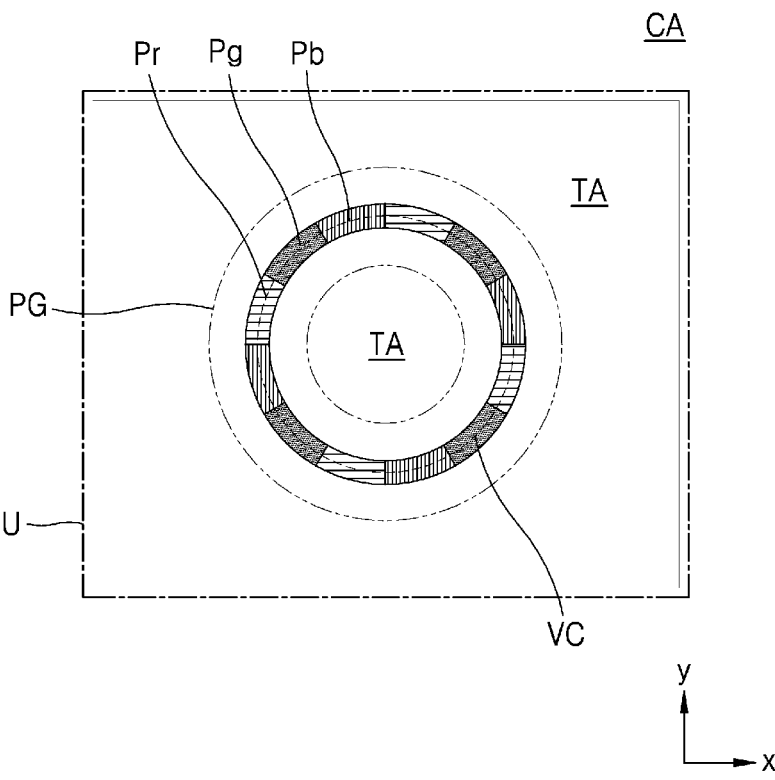
Figure 14C:
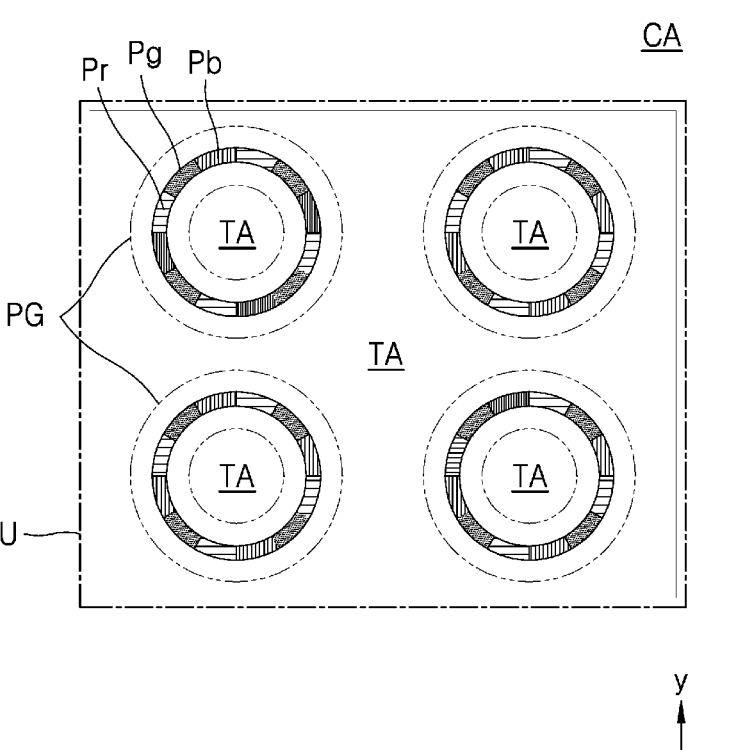

For example, as shown in FIG. 14A, the shape of each of the auxiliary subpixels Pa may be a rhombus. Alternatively, as shown in FIG. 14B, each auxiliary subpixel Pa may have a certain or a predetermined width and a length extending in the circumferential direction. In a case that the auxiliary subpixels Pa may be arranged or disposed in a circle configuration as described above, the auxiliary subpixels Pa included in the pixel group PG may be arranged or disposed to surround or be adjacent to a transmission area TA. As shown in FIG. 14C, a basic unit U may include pixel groups PG each having a substantially circular shape.

Figure 14D:
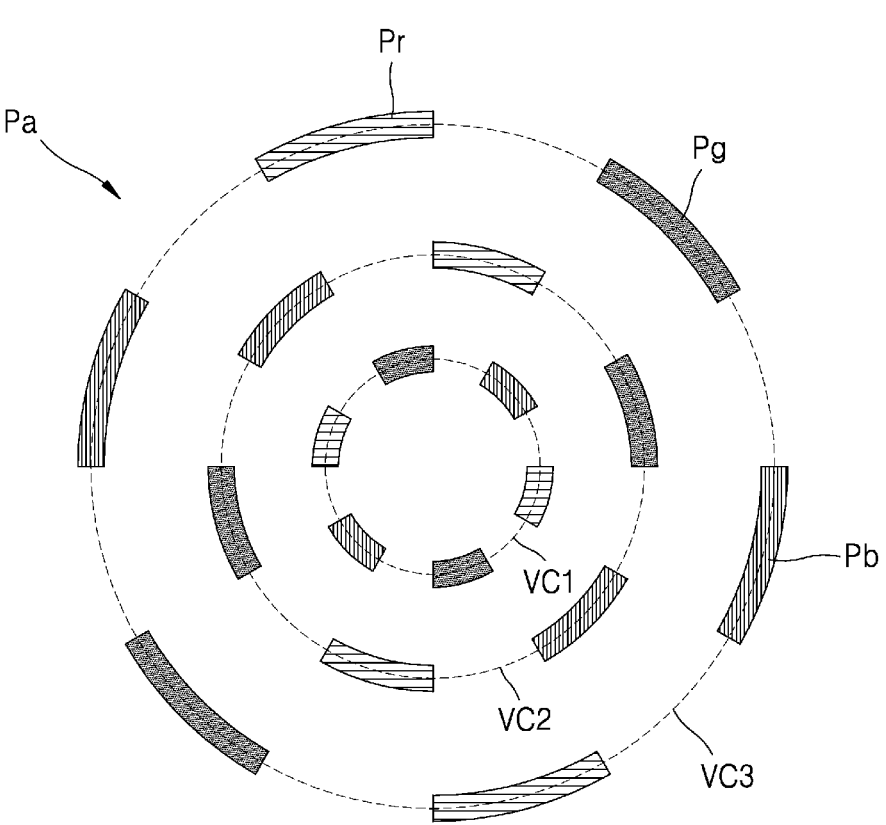
Figure 14E:
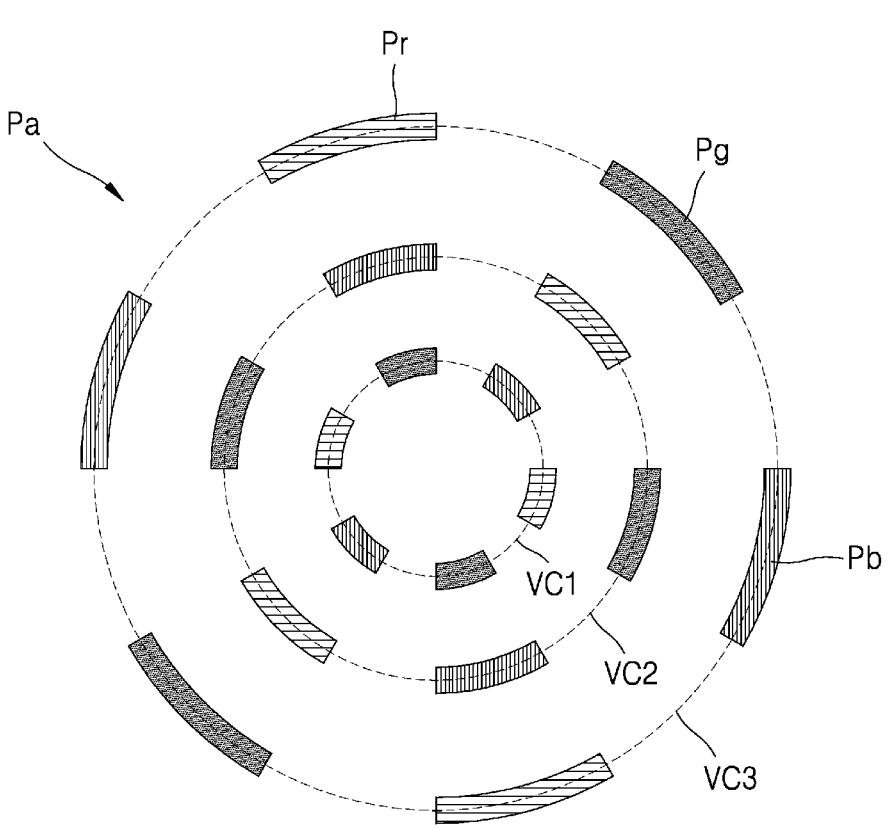
Figure 14F:
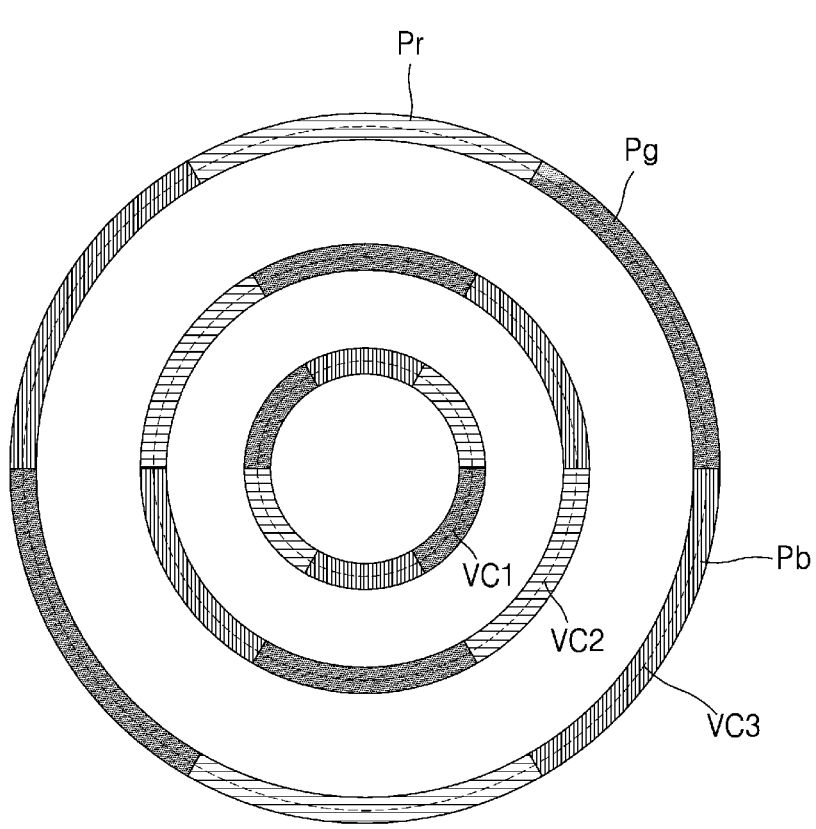

Referring to FIGS. 14D through 14F, the component area CA may include auxiliary subpixels Pa arranged or disposed along the respective circumferences of virtual circles VC1, VC2 through VC3 having the same center and having different diameters. The auxiliary subpixels Pa arranged or disposed in the virtual circles VC1, VC2 through VC3 may be aligned in a row or may be arranged or disposed in a zigzag configuration, in the diameter direction of each of the virtual circles VC1, VC2 through VC3.

Figure 15:
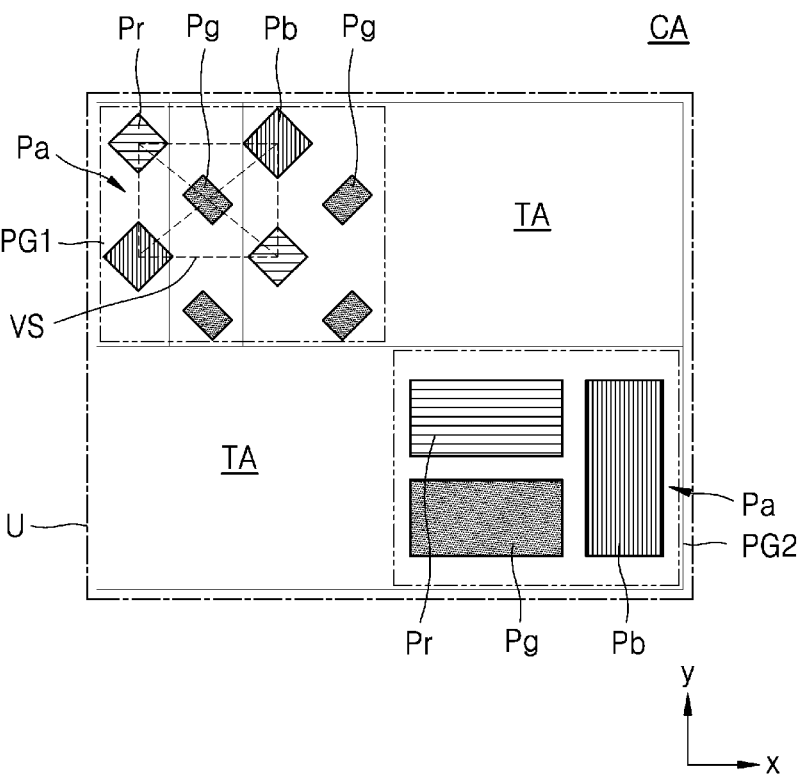

Referring to FIG. 15, the component area CA may include a first pixel group PG1 and a second pixel group PG2 having different pixel arrangements. The pixel arrangement structures illustrated in FIGS. 13A through 14F may be applied to the first pixel group PG1 and the second pixel group PG2. For example, the auxiliary subpixels Pa of the first pixel group PG1 may be arranged or disposed in a pentile structure, and the auxiliary subpixels Pa of the second pixel group PG2 may be arranged or disposed in an S-stripe structure.

FIGS. 16A through 16H are schematic plan views illustrating the shapes of bottom metal layers BML that may be arranged or disposed in the component area CA.

Referring to FIGS. 16A through 16H, the bottom metal layers BML may be arranged or disposed to correspond to the component area CA, and may each include a bottom-hole BMLH. The bottom metal layers BML and the bottom-holes BMLH may have various shapes and various sizes.

Figure 16A:
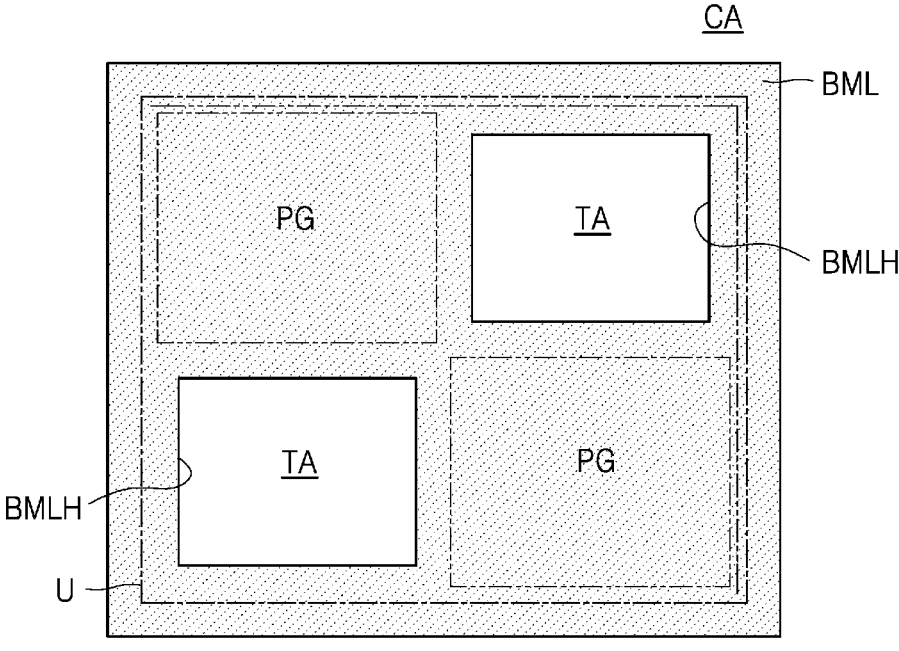
FIGS. 16A through 16H are schematic plan views illustrating shapes of a bottom metal layer according to embodiments.

Referring to FIG. 16A, a bottom-hole BMLH may be rectangular, and the bottom-hole BMLH may not face a pixel group PG. In this case, the shape and size of a transmission area TA may be defined by the shape and size of the bottom-hole BMLH. According to a plan view, two bottom-holes BMLH may be included in each base unit U, and may alternate with pixel groups PG.

Figure 16B:
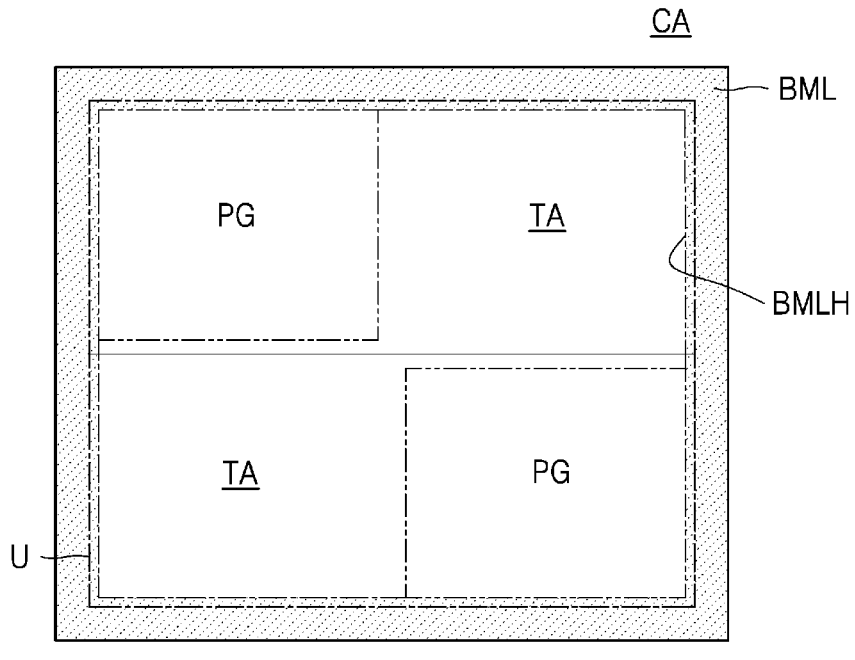

Referring to FIG. 16B, a bottom-hole BMLH may face a transmission area TA and some or a predetermined number of pixel groups PG. In this case, the shape and size of the bottom-hole BMLH may be different from those of the transmission area TA.

Figure 16C:
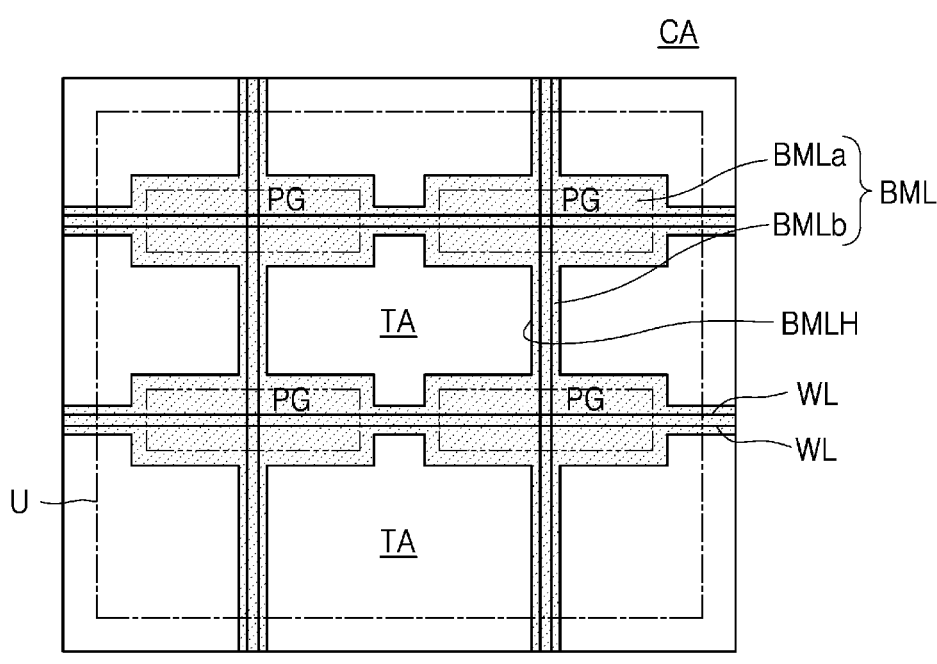

Referring to FIG. 16C, a bottom metal layer BML may include a first bottom metal layer BMLa corresponding to a pixel group PG, and a second bottom metal layer BMLb corresponding to a wire WL between adjacent pixel groups PG. A width of the second bottom metal layer BMLb may be less than that of the first bottom metal layer BMLa, and the first bottom metal layer BMLa and the second bottom metal layer BMLb may be integral with each other. Accordingly, a bottom-hole BMLH may have a '+' shape. Due to the bottom metal layer BML being arranged or disposed to correspond to wires WL, diffraction of light by slits provided or disposed between the wires WL may be prevented.

Figure 16D:
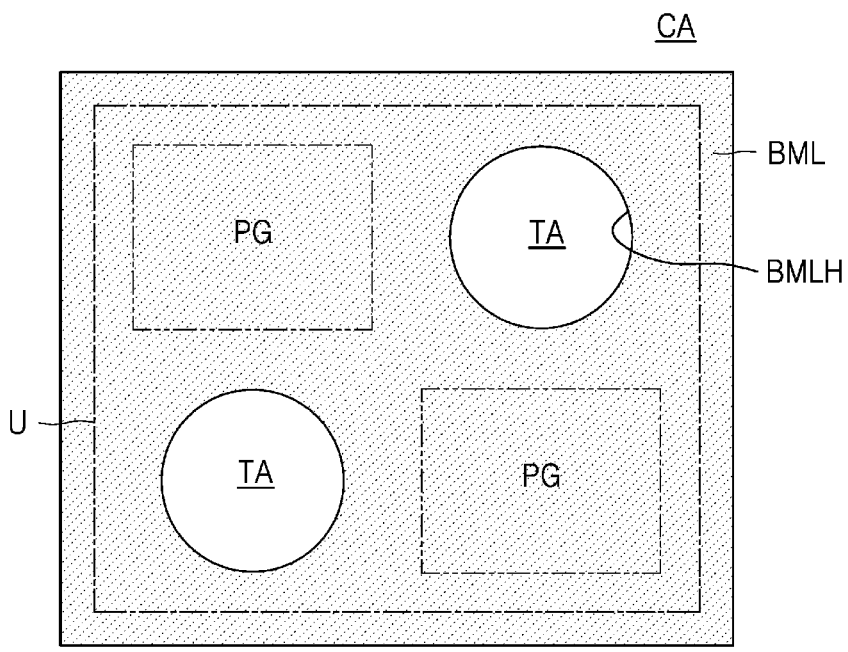
Figure 16E:
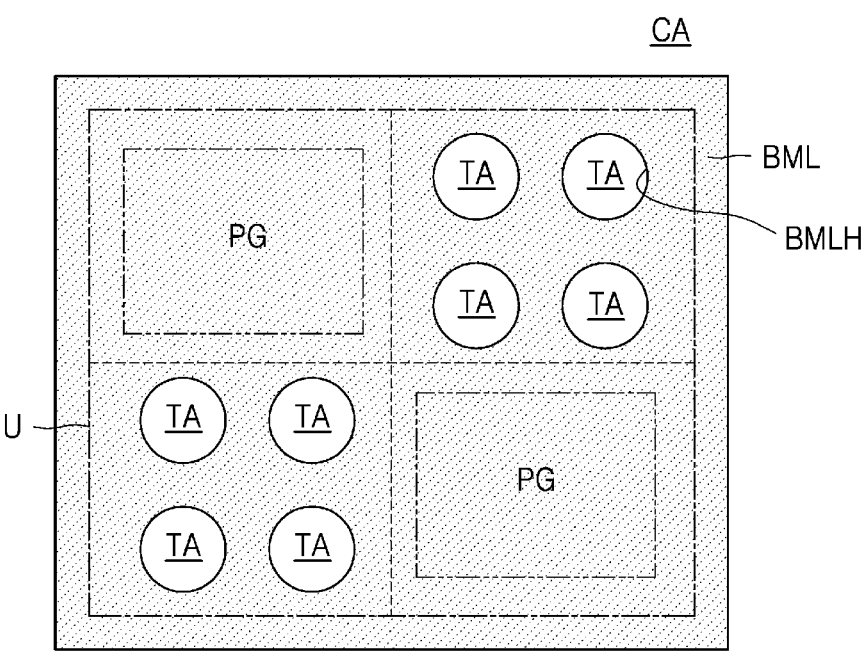

Referring to FIGS. 16D and 16E, a bottom-hole BMLH may have a substantially circular shape. In a case that the shape of a transmission area TA approximates to a circle, diffraction properties of light may be improved. Thus, in a case that a component disposed below the component area CA may be a camera, the transmission area TA may have a shape that approximates to a circle. The bottom-hole BMLH may be in the shape of a polygon approximating to a circle and having 8 or more sides, or may be an oval. Various modifications may be made to the bottom-hole BMLH. For example, a single bottom-hole BMLH or bottom-holes BMLH may be included between pixel groups PG.

Figure 16F:
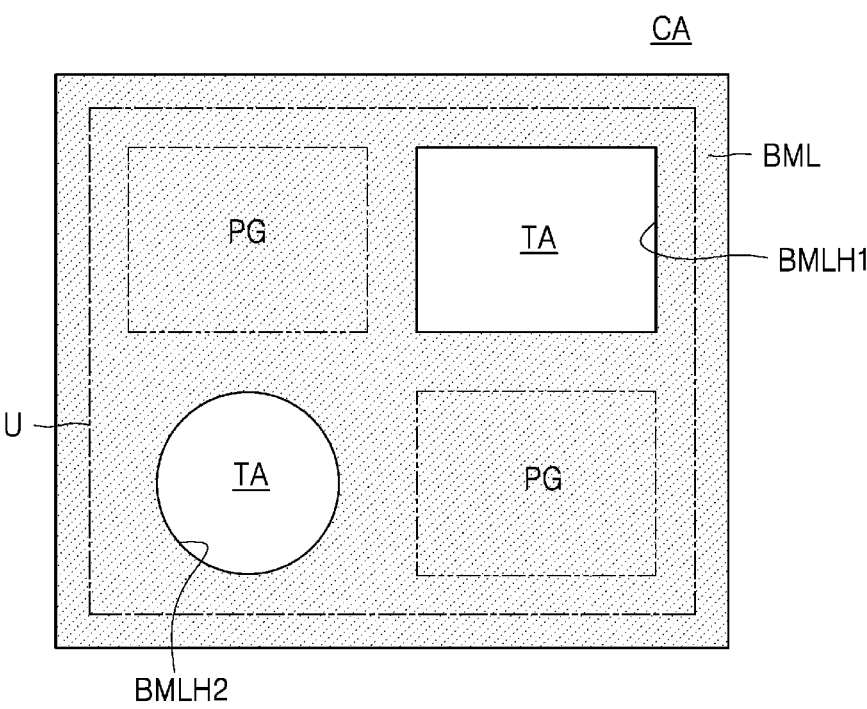

Referring to FIG. 16F, a bottom-hole BMLH may include a first bottom-hole BMLH1 and a second bottom-hole BMLH2. For example, the first bottom-hole BMLH1 may be rectangular, and the second bottom-hole BMLH2 may be circular.

Figure 16G:
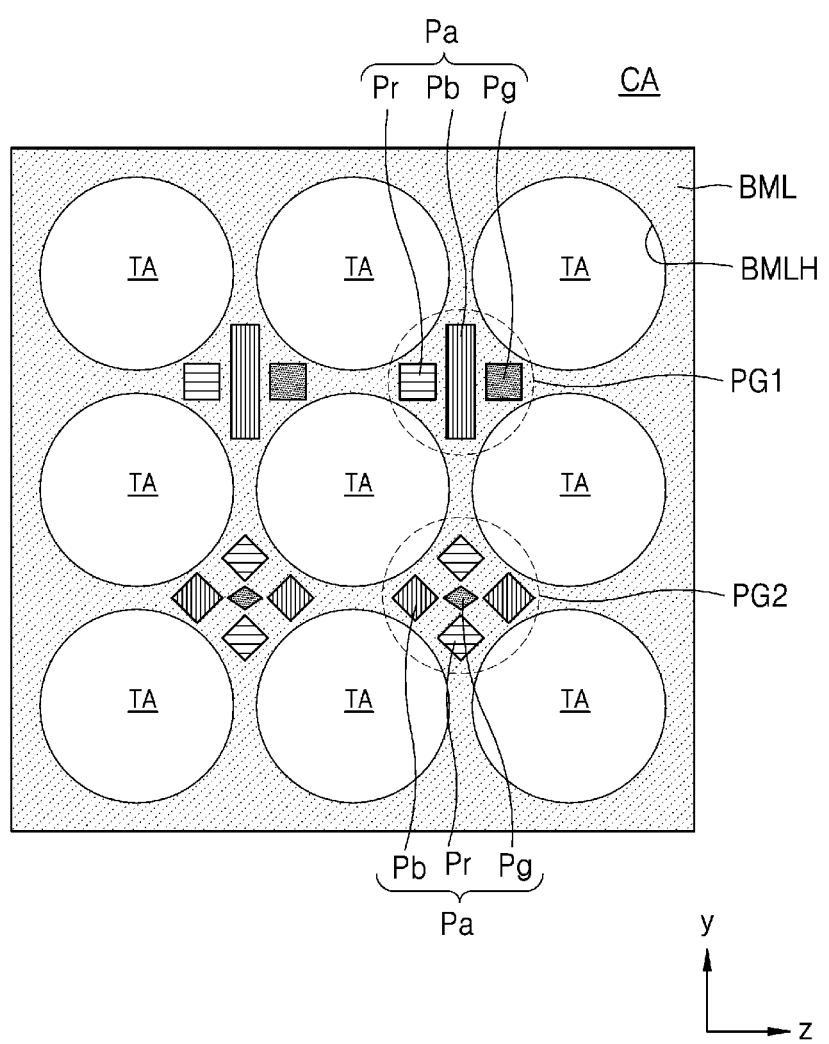
Figure 16H:
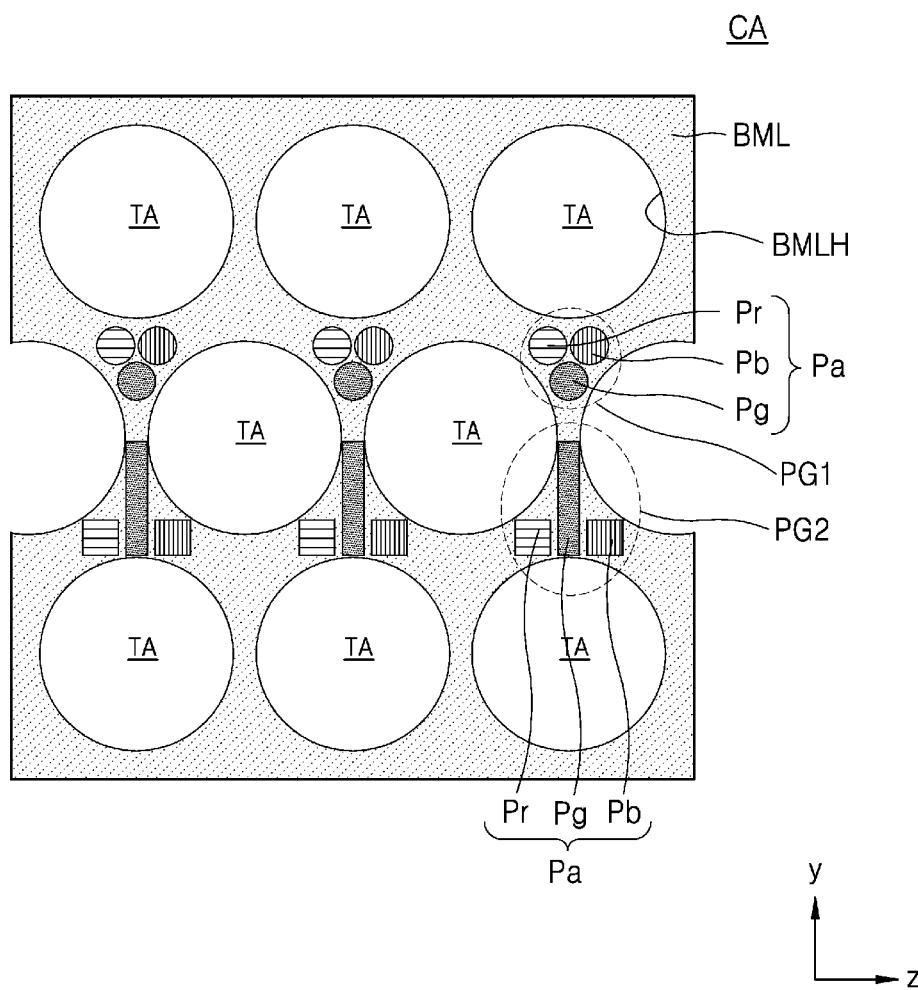

Referring to FIGS. 16G and 16H, bottom-holes BMLH may be arranged or disposed according to various methods. For example, as shown in FIG. 16G, bottom-holes BMLH may be arranged or disposed side by side both in the x direction and the y direction. Alternatively, as shown in FIG. 16H, bottom-holes BMLH may be arranged or disposed in a row in the x direction and may be arranged or disposed in a zigzag configuration in the y direction.

By considering this arrangement of the bottom-holes BMLH, the shapes of auxiliary subpixels Pa arranged or disposed in a pixel group PG may be selected. For example, a blue subpixel Pb from among the auxiliary subpixels Pa arranged or disposed in a first pixel group PG1 of FIG. 16G may be longer in the y direction than a red subpixel Pr and a green subpixel Pg arranged or disposed on both sides of the blue subpixel Pb. Alternatively, like auxiliary subpixels Pa arranged or disposed in a second pixel group PG2 of FIG. 16G, red subpixels Pr and blue subpixels Pb may be arranged or disposed in a substantially rhombus shape with a green subpixel Pg disposed at the center.

Referring to FIG. 16H, a red subpixel Pr, a green subpixel Pg, and a blue subpixel Pb included in a first pixel group PG1 may be arranged or disposed in a triangle shape, and a green subpixel Pg located or disposed at the center from among the auxiliary subpixels Pa included in a second pixel group PG2 may be arranged or disposed to be longer in the y direction than a red subpixel Pr and a blue subpixel Pb arranged or disposed on both sides of the green subpixel Pg.

Figure 17:
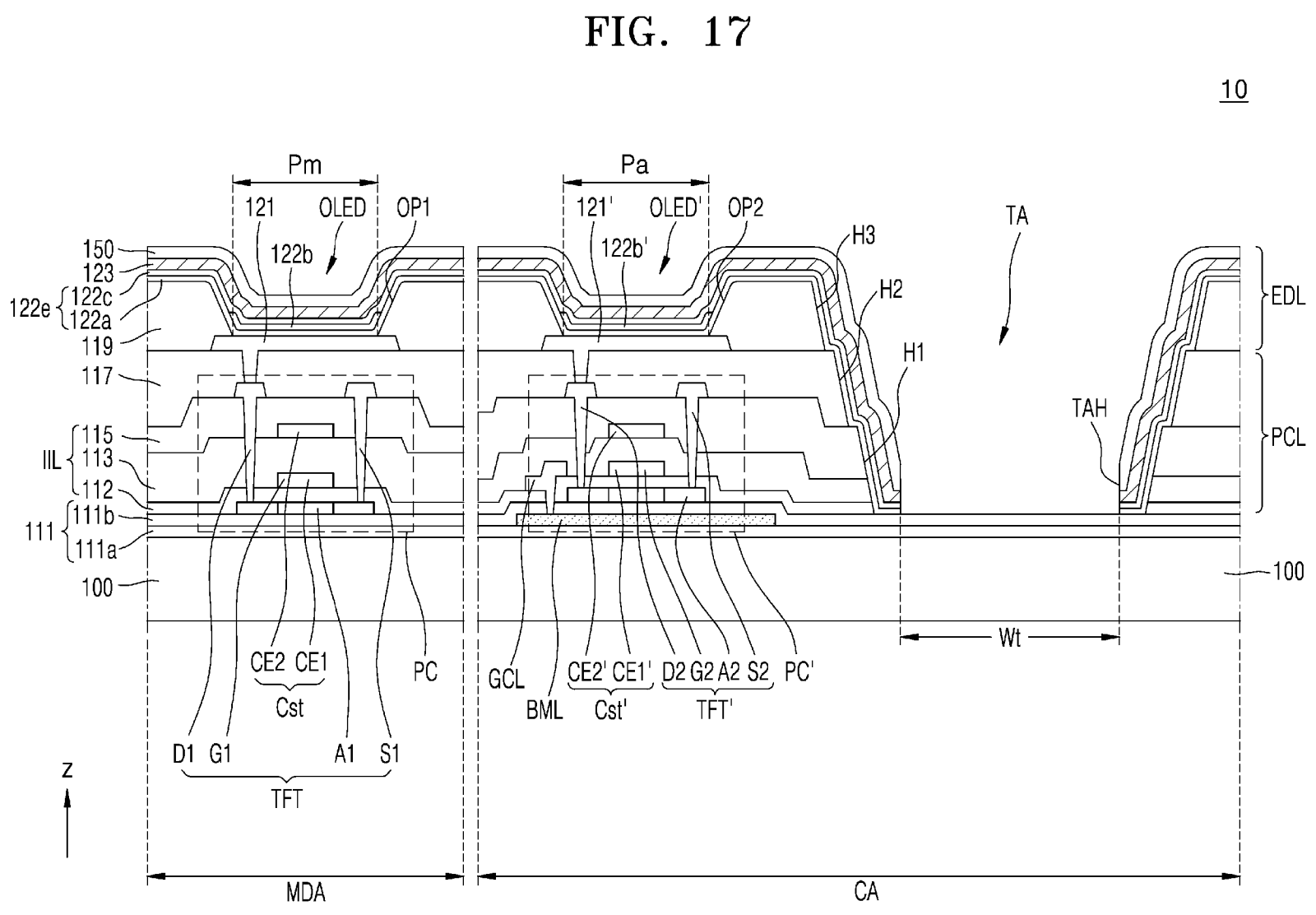

FIG. 17 is a schematic cross-sectional view of a portion or region of the display panel 10 according to an embodiment, for example, the main display area MDA and the component area CA.

Referring to FIG. 17, the display panel 10 may include the main display area MDA and the component area CA. A main subpixel Pm may be arranged or disposed in the main display area MDA, and an auxiliary subpixel Pa and a transmission area TA may be arranged or disposed in the component area CA. A main pixel circuit PC including a main thin-film transistor TFT and a main storage capacitor Cst, and a main organic light-emitting diode OLED as a display element electrically connected to the main pixel circuit PC, may be arranged or disposed in the main display area MDA. An auxiliary pixel circuit PC' including an auxiliary thin-film transistor TFT' and an auxiliary storage capacitor Cst', and an auxiliary organic light-emitting diode OLED' as a display element electrically connected to the auxiliary pixel circuit PC', may be arranged or disposed in the component area CA.

According to an embodiment, an organic light-emitting diode may be employed as a display element. However, according to an embodiment, an inorganic light-emitting diode or a quantum dot light-emitting diode may be employed as a display element.

A structure in which the components included in the display panel 10 are stacked will now be described. The display panel 10 may be a stack of a substrate 100, a buffer layer 111, a circuit layer PCL, and a display element layer EDL.

As described above, the substrate 100 may include an insulative material, such as glass, quartz, and polymer resin. The substrate 100 may be a rigid substrate or a flexible substrate that may be bendable, foldable, or rollable.

The buffer layer 111 may be positioned on the substrate 100 and may reduce or prevent infiltration of a foreign material, moisture, or ambient air from below the substrate 100 and may provide a flat surface on the substrate 100. The buffer layer 111 may include an inorganic material (such as oxide or nitride), an organic material, or an organic and inorganic compound, and may be a single layer or multiple layers of an inorganic material and an organic material. A barrier layer (not shown) may be between the substrate 100 and the buffer layer 111 in order to prevent infiltration of ambient air. According to an embodiment, the buffer layer 111 may include silicon oxide ($SiO_2$) or silicon nitride ($SiN_x$). The buffer layer 111 may include a first buffer layer 111a and a second buffer layer 111b, one of which is stacked on the other.

In the component area CA, a bottom metal layer BML may be between the first buffer layer 111a and the second buffer layer 111b. According to an embodiment, the bottom metal layer BML may be between the substrate 100 and the first buffer layer 111a. The bottom metal layer BML may be located or disposed below the auxiliary pixel circuit PC' and may prevent characteristics of the auxiliary thin-film transistor TFT' from degrading due to light emitted from, for example, a component. The bottom metal layer BML may prevent light that may be emitted from the component or the like or heads toward the component from being diffracted through a narrow gap between wires electrically connected to the auxiliary pixel circuit PC'. The bottom metal layer BML may not exist in the transmission area TA.

The bottom metal layer BML may be electrically connected to a wire GCL arranged or disposed on another layer, via a contact hole. The bottom metal layer BML may receive a static voltage or a signal from the wire GCL. For example, the bottom metal layer BML may receive a driving voltage ELVDD or a scan signal. Due to the bottom metal layer BML receiving a static voltage or a signal, the probability that electrostatic discharge occurs may be significantly reduced. The bottom metal layer BML may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). The bottom metal layer BML may be a single layer or multi-layer including the aforementioned materials.

The circuit layer PCL may be on the buffer layer 111, and may include the main and auxiliary pixel circuits PC and PC', a first gate insulating layer 112, a second gate insulating layer 113, an interlayer insulating layer 115, and a planarization layer 117. The main pixel circuit PC may include the main thin-film transistor TFT and the main storage capacitor Cst, and the auxiliary pixel circuit PC'' may include the auxiliary thin-film transistor TFT' and the auxiliary storage capacitor Cst'.

The main thin-film transistor TFT and/or the auxiliary thin-film transistor TFT' may be above the buffer layer 111. The main thin-film transistor TFT may include a first semiconductor layer A1, a first gate electrode G1, a first source electrode S1, and a first drain electrode D1, and the auxiliary thin-film transistor TFT' may include a second semiconductor layer A2, a second gate electrode G2, a second source electrode S2, and a second drain electrode D2. The main thin-film transistor TFT may be electrically connected to the main organic light-emitting diode OLED and may drive the main organic light-emitting diode OLED. The auxiliary thin-film transistor TFT' may be electrically connected to the auxiliary organic light-emitting diode OLED' and may drive the auxiliary organic light-emitting diode OLED'.

The first semiconductor layer A1 and the second semiconductor layer A2 may be on the buffer layer 111 and may include polysilicon. According to an embodiment, the first semiconductor layer A1 and the second semiconductor layer A2 may include amorphous silicon. According to an embodiment, the first and second semiconductor layers A1 and A2 may include oxide of at least one selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). The first and second semiconductor layers A1 and A2 may include a channel region, and a source region and a drain region doped with impurities.

The second semiconductor layer A2 may overlap the bottom metal layer BML, with the second buffer layer 111b therebetween. According to an embodiment, a width of the second semiconductor layer A2 may be less than a width of the bottom metal layer BML. Accordingly, in a case that projection is performed in a direction perpendicular to the substrate 100, the second semiconductor layer A2 may entirely overlap the bottom metal layer BML.

The first gate insulating layer 112 may cover or overlap the first and second semiconductor layers A1 and A2. The first gate insulating layer 112 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 112 may be a single layer or multi-layer including the aforementioned inorganic insulating materials.

The first gate electrode G1 and the second gate electrode G2 may be located or disposed above the first gate insulating layer 112 to overlap the first semiconductor layer A1 and the second semiconductor layer A2, respectively. The first and second gate electrodes G1 and G2 may include molybdenum (Mo), aluminum (Al), copper (Cu), or titanium (Ti), and may each be a single layer or multiple layers. For example, the first and second gate electrodes G1 and G2 may each be a single layer of Mo.

The second gate insulating layer 113 may cover or overlap the first gate electrode G1 and the second gate electrode G2. The second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The second gate insulating layer 113 may be a single layer or multi-layer including the aforementioned inorganic insulating materials.

A first upper electrode CE2 of the main storage capacitor Cst and a second upper electrode CE2' of the auxiliary storage capacitor Cst' may be above the second gate insulating layer 113.

In the main display area MDA, the first upper electrode CE2 may overlap the first gate electrode G1. The first gate electrode G1 and the first upper electrode CE2 overlapping each other, with the second gate insulating layer 113 therebetween, may constitute the main storage capacitor Cst. The first gate electrode G1 may be the first lower electrode CE1 of the main storage capacitor Cst.

In the component area CA, the second upper electrode CE2' may overlap the second gate electrode G2. The second gate electrode G2 and the second upper electrode CE2' overlapping each other, with the second gate insulating layer 113 therebetween, may constitute the auxiliary storage capacitor Cst'. The second gate electrode G2 may be the second lower electrode CE1' of the auxiliary storage capacitor Cst'.

The first and second upper electrodes CE2 and CE2' may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), and may each be a single layer or multi-layer including the aforementioned materials.

The interlayer insulating layer 115 may cover or overlap the first upper electrode CE2 and the second upper electrode CE2'. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like within the spirit and the scope of the disclosure. The interlayer insulating layer 115 may be a single layer or multi-layer including the aforementioned inorganic insulating materials.

In a case that the first gate insulating layer 112, the second gate insulating layer 113, and the interlayer insulating layer 115 are collectively referred to as an inorganic insulating layer IIL, the inorganic insulating layer IIL may have a first hole H1 corresponding to the transmission area TA. The first hole H1 may expose a portion of the upper surface of the buffer layer 111 or the substrate 100. The first hole H1 may be a result of overlapping of an opening of the first gate insulating layer 112, an opening of the second gate insulating layer 113, and an opening of the interlayer insulating layer 115 that correspond to the transmission area TA. These openings may be individually formed through separate processes, or may be simultaneously formed through the same process. In a case that these openings are formed through separate processes, the inner surface of the first hole H1 may not be smooth and may have steps such as a substantially staircase shape.

Alternatively, the inorganic insulating layer IIL may have a groove other than the first hole H1 exposing the buffer layer 111. Alternatively, the inorganic insulating layer IIL may not have the first hole H1 or groove corresponding to the transmission area TA. Because the inorganic insulating layer IIL generally may include an inorganic insulative material having a high light transmittance, even in a case that the inorganic insulating layer IIL does not have a hole or groove corresponding to the transmission area TA, the inorganic insulating layer IIL may have a sufficient transmittance, so that the component 40 of FIG. 2 may transmit/receive a sufficient amount of light.

The first and second source electrodes S1 and S2 and the first and second drain electrodes D1 and D2 are on the interlayer insulating layer 115. Each of the first and second source electrodes S1 and S2 and the first and second drain electrodes D1 and D2 may include a conductive material including Mo, Al, Cu, and Ti, and may be a multi-layer or single layer including the aforementioned materials. For example, each of the first and second source electrodes S1 and S2 and the first and second drain electrodes D1 and D2 may be a multi-layer of Ti/Al/Ti.

The planarization layer 117 may cover or overlap the first and second source electrodes S1 and S2 and the first and second drain electrodes D1 and D2. The planarization layer 117 may have a flat upper surface such that a first pixel electrode 121 and a second pixel electrode 121' that may be located or disposed thereon may be formed flat.

The planarization layer 117 may include an organic material or an inorganic material and may have a single layer structure or a multi-layer structure. The planarization layer 117 may include a commercial polymer such as benzocyclobutene (BCB), polyimide, hexamethyldisiloxane (HMDSO), polymethyl methacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or the like within the spirit and the scope of the disclosure. The planarization layer 117 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). In a case that the planarization layer 117 is formed, a layer may be formed, and then chemical and mechanical polishing may be performed on the upper surface of the layer to provide a flat upper surface.

The planarization layer 117 may have a second hole H2 to correspond to the transmission area TA. The second hole H2 may overlap the first hole H1. FIG. 17 illustrates the second hole H2 that may be larger than the first hole H1. According to an embodiment, the planarization layer 117 may cover or overlap an edge of the first hole H1 of the inorganic insulating layer IIL, and the second hole H2 may have a smaller area than the area of the first hole H1.

The planarization layer 117 may have a via hole via which one of the first source electrode S1 and the first drain electrode D1 of the main thin-film-transistor TFT is exposed, and the first pixel electrode 121 may contact the first source electrode S1 or the first drain electrode D1 via the via hole and may be electrically connected to the main thin-film-transistor TFT. The planarization layer 117 may include another opening via which one of the second source electrode S2 and the second drain electrode D2 of the second thin-film-transistor TFT' is exposed, and the second pixel electrode 121' may contact the second source electrode S2 or the second drain electrode D2 via the other opening and may be electrically connected to the auxiliary thin-film-transistor TFT'.

The first and second pixel electrodes 121 and 121' may include conductive oxide such as indium tin oxide (ITO), indium zinc oxide (IZO), zinc oxide (ZnO), indium oxide ($In_2O_3$), indium gallium oxide (IGO), or aluminum zinc oxide (AZO). Each of the first and second pixel electrodes 121 and 121' may include a reflection layer including, for example, silver (Ag), magnesium (Mg), aluminum (Al), platinum (Pt), palladium (Pd), gold (Au), nickel (Ni), neodymium (Nd), iridium (Ir), chromium (Cr), or a compound of these materials. For example, each of the first and second pixel electrodes 121 and 121' may have a structure including films including ITO, IZO, ZnO, or $In_2O_3$ above/below the aforementioned reflection layer. In this case, each of the first and second pixel electrodes 121 and 121' may have a stack structure of ITO/Ag/ITO.

A pixel defining layer 119 may be arranged or disposed on the planarization layer 117 to cover or overlap respective edges of the first pixel electrode 121 and the second pixel electrode 121', and may include a first opening OP1 and a second opening OP2 respectively exposing the center portions of the first pixel electrode 121 and the second pixel electrode 121'. The first opening OP1 and the second opening OP2 may define the sizes and shapes of the light-emission areas of the main and auxiliary organic light-emitting diodes OLED and OLED', namely, main and auxiliary subpixels Pm and Pa.

The pixel defining layer 119 may prevent an electric arc or the like from occurring on the edges of the first and second pixel electrodes 121 and 121' by increasing distances between the edges of the first and second pixel electrodes 121 and 121' and portions of an opposite electrode 123 on the first and second pixel electrodes 121 and 121'. The pixel defining layer 119 may be formed of an organic insulating material, such as polyimide, polyamide, acryl resin, benzocyclobutene, hexamethyldisiloxane (HMDSO), or phenol resin, via spin coating or the like within the spirit and the scope of the disclosure.

The pixel defining layer 119 may have a third hole H3 located or disposed in the transmission area TA. The third hole H3 may overlap the first hole H1 and the second hole H2. Due to the first through third holes H1 through H3, the light transmittance in the transmission area TA may improve. Although the buffer layer 111 continuously extends to correspond to the transmission area TA in FIG. 17, the buffer layer 111 may include a hole located or disposed in the transmission area TA. A portion of the opposite electrode 123 to be described later may be arranged or disposed on the inner surfaces of the first through third holes H1 through H3.

A first emission layer 122b and a second emission layer 122b' may be arranged or disposed within the first opening OP1 and the second opening OP2 of the pixel defining layer 119, respectively, to correspond to the first pixel electrode 121 and the second pixel electrode 121', respectively. The first emission layer 122b and the second emission layer 122b' may include a high molecular weight material or a low molecular weight material, and may emit red, green, blue, or white light.

An organic functional layer 122e may be above and/or below the first emission layer 122b and the second emission layer 122b'. The organic functional layer 122e may include a first functional layer 122a and/or a second functional layer 122c. The first functional layer 122a or the second functional layer 122c may be omitted.

The first functional layer 122a may be below the first emission layer 122b and the second emission layer 122b'. The first functional layer 122a may be a single layer or multiple layers including an organic material. The first functional layer 122a may be a hole transport layer (HTL) that may be a single layer. Alternatively, the first functional layer 122a may include a hole injection layer (HIL) and an HTL. The first functional layer 122a may be integrally provided to correspond to the main and auxiliary organic light-emitting diodes OLED and OLED' included in the main display area MDA and the component area CA.

The second functional layer 122c may be above the first emission layer 122b and the second emission layer 122b'. The second functional layer 122c may be a single layer or multiple layers including an organic material. The second functional layer 122c may include an electron transport layer (ETL) and/or an electron injection layer (EIL). The second functional layer 122c may be integrally provided to correspond to the main and auxiliary organic light-emitting diodes OLED and OLED' included in the main display area MDA and the component area CA.

The opposite electrode 123 may be disposed above the second functional layer 122c. The opposite electrode 123 may include a conductive material having a low work function. For example, the opposite electrode 123 may include a (semi)transparent layer including, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) or an alloy of these materials. Alternatively, the opposite electrode 123 may include a layer, such as ITO, IZO, ZnO, or $In_2O_3$, on the (semi)transparent layer including any of the above-described materials. The opposite electrode 123 may be integrally provided to correspond to the main and auxiliary organic light-emitting diodes OLED and OLED' included in the main display area MDA and the component area CA.

The layers ranging from the first pixel electrode 121 to the opposite electrode 123 arranged or disposed in the main display area MDA may constitute the main organic light-emitting diode OLED. The layers ranging from the second pixel electrode 121' to the opposite electrode 123 arranged or disposed in the component area CA may constitute the auxiliary organic light-emitting diode OLED'.

An upper layer 150 including an organic material may be on the opposite electrode 123. The upper layer 150 may be provided to protect the opposite electrode 123 and also increase light extraction efficiency. The upper layer 150 may include an organic material having a higher refractive index than the opposite electrode 123. Alternatively, the upper layer 150 may be a stack of layers having different refractive indexes. For example, the upper layer 150 may be provided by stacking a high refractive index layer, a low refractive index layer, and a high refractive index layer in this stated order. In this case, the high refractive index layer may have a refractive index of 1.7 or more, and the low refractive index layer may have a refractive index of 1.3 or less.

The upper layer 150 may additionally include lithium fluoride (LiF). Alternatively, the upper layer 150 may include an inorganic insulating material, such as silicon oxide ($SiO_2$) or silicon nitride ($SiN_x$).

The first functional layer 122a, the second functional layer 122c, the opposite electrode 123, and the upper layer 150 may include a transmission hole TAH corresponding to the transmission area TA. In other words, the first functional layer 122a, the second functional layer 122c, the opposite electrode 123, and the upper layer 150 may include openings corresponding to the transmission area TA, respectively. These openings may have substantially the same areas. For example, the area of the opening of the opposite electrode 123 may be substantially the same as that of the transmission hole TAH.

The transmission hole TAH corresponding to the transmission area TA may be understood as the transmission hole TAH overlapping the transmission area TA. In this case, the transmission hole TAH may have a smaller area than the first hole H1 included in the inorganic insulating layer IIL. To this end, FIG. 17 illustrates that a width Wt of the transmission hole TAH is less than a width of the first hole H1. The area of the transmission hole TAH may be defined as the area of a narrowest opening from among the openings that constitute the transmission hole TAH. The area of the first hole H1 may be defined as the area of a narrowest opening from among the openings that constitute the first hole H1.

A portion of the opposite electrode 123 does not exist in the transmission area TA due to the transmission hole TAH, and thus the light transmittance in the transmission area TA may significantly increase. The opposite electrode 123 including the transmission hole TAH may be formed using various methods. According to an embodiment, after a material used to form the opposite electrode 123 is deposited on the entire surface of the substrate 100, a portion of the deposited material that corresponds to the transmission area TA is removed via laser lift off, and thus the opposite electrode 123 having the transmission hole TAH may be formed. According to an embodiment, the opposite electrode 123 having the transmission hole TAH may be formed by metal self patterning (MSP). According to an embodiment, the opposite electrode 123 having the transmission hole TAH may be formed via a deposition method using a fine metal mask (FMM).

Figure 18A:
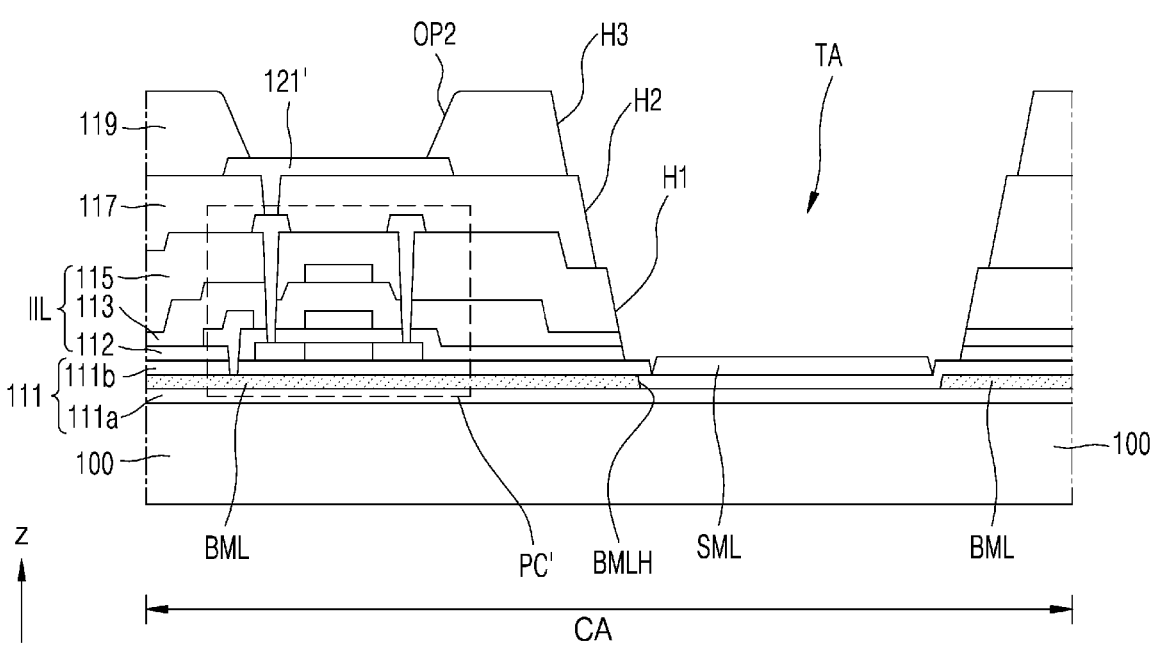
FIGS. 18A through 18C are schematic cross-sectional views illustrating a method of patterning an opposite electrode, according to an embodiment.
Figure 18B:
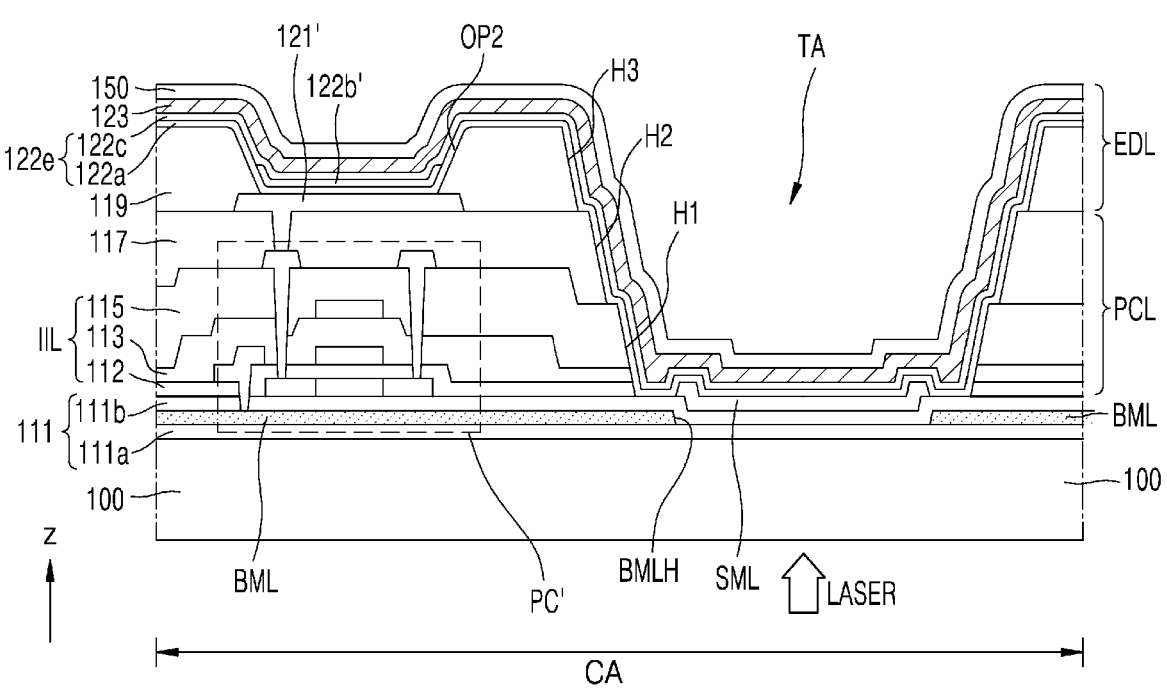
Figure 18C:
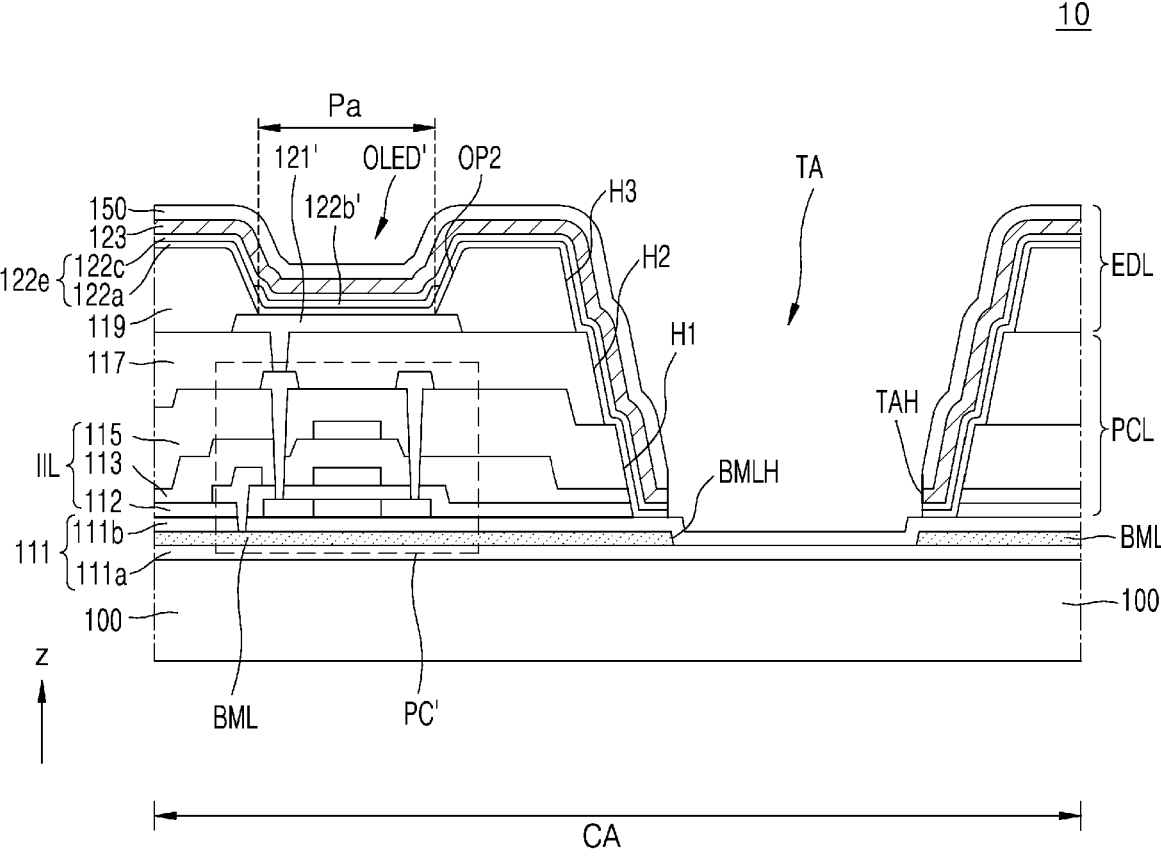

FIGS. 18A through 18C are schematic cross-sectional views illustrating a method of patterning an opposite electrode, according to an embodiment. In detail, FIGS. 18A through 18C illustrate opposite electrode patterning via a laser lift off method.

Referring to FIG. 18A, before the first functional layer 122a is formed, a sacrificial-metal layer SML is formed to overlap the transmission area TA. For example, the sacrificial-metal layer SML may be formed within the first hole H1 of the inorganic insulating layer IIL.

The sacrificial-metal layer SML may include metal, such as silver (Ag), aluminum (Al), platinum (Pt), palladium (Pd), gold (Au), nickel (Ni), molybdenum (Mo), or titanium (Ti). The sacrificial-metal layer SML may include a film formed of ITO, IZO, ZnO, or $In_2O_3$ above/below the aforementioned metal. According to an embodiment, the sacrificial-metal layer SML may be formed of the same or similar material as the first and second pixel electrodes 121 and 121' and at the same time when the first and second pixel electrodes 121 and 121' may be formed.

Next, as shown in FIG. 18B, the first functional layer 122a, the second functional layer 122c, the opposite electrode 123, and the upper layer 150 each extending in both the main display area MDA and the component area CA are sequentially formed on the sacrificial-metal layer SML.

Next, laser light is radiated from the lower surface of the substrate 100 to the sacrificial-metal layer SML arranged in the transmission area TA. In other words, the laser light may travel from the lower surface of the substrate 100 in a +z direction and may be radiated onto the lower surface of the sacrificial-metal layer SML.

According to an embodiment, the bottom metal layer BML may be arranged or disposed to correspond to the entire component area CA, and may include the bottom-hole BMLH corresponding to the transmission area TA. Accordingly, the bottom metal layer BML may prevent the laser light from reaching an area other than the transmission area TA. In this case, the bottom metal layer BML may have a thickness in a range of about 1000 Å to about 3000 Å. In a case that the bottom metal layer BML has a thickness that may be less than about 1000 Å, a void may be generated in the bottom metal layer BML by the laser light.

The laser light may have an IR wavelength. In a case that the laser light is IR light, because a transmittance rate with respect to the substrate 100 and the buffer layer 111 is no less than in a range of about 80 to about 90%, the laser light may efficiently reach the sacrificial-metal layer SML. Because the sacrificial-metal layer SML may include an opaque metal, the sacrificial-metal layer SML may absorb the laser light. Accordingly, thermal expansion occurs in the sacrificial-metal layer SML, and the sacrificial-metal layer SML irradiated with the laser light may be lifted off from the substrate 100 or the buffer layer 111.

Due to the sacrificial-metal layer SML being lifted off, respective portions of the first functional layer 122a, the second functional layer 122c, the opposite electrode 123, and the upper layer 150 that are above the sacrificial-metal layer SML may also be lifted off together with the sacrificial-metal layer SML. Thus, as shown in FIG. 18C, the transmission hole TAH constituted by the respective openings of the first functional layer 122a, the second functional layer 122c, the opposite electrode 123, and the upper layer 150 may be formed. In a case that the transmission hole TAH is formed using the laser lift off method, respective lateral surfaces of the first functional layer 122a, the second functional layer 122c, the opposite electrode 123, and the upper layer 150 that define the transmission hole TAH may be on the same plane. Alternatively, the respective openings of the first functional layer 122a, the second functional layer 222c, the opposite electrode 123, and the upper layer 150 may have the same areas.

Figure 19A:
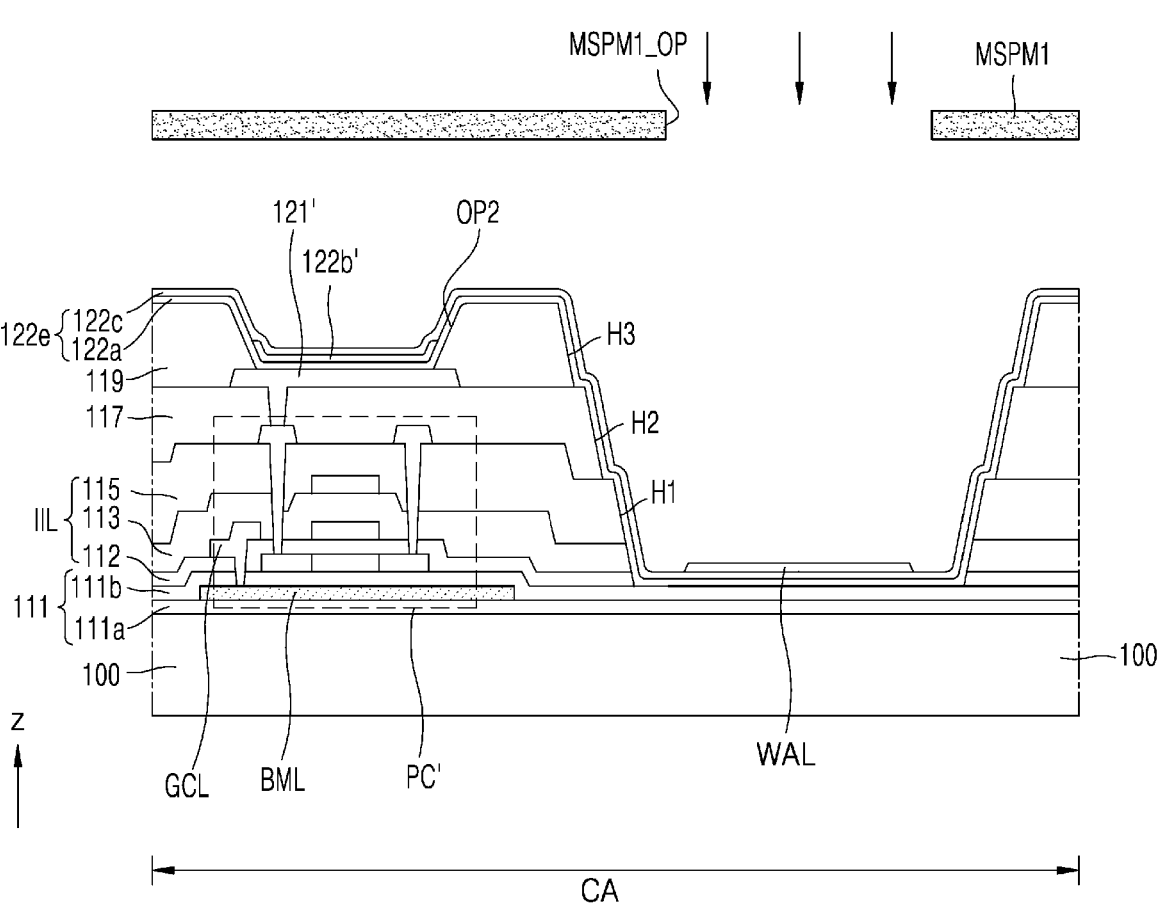
FIGS. 19A through 19C are schematic cross-sectional views illustrating a method of patterning an opposite electrode, and a display panel manufactured using the method, according to an embodiment.
Figure 19B:
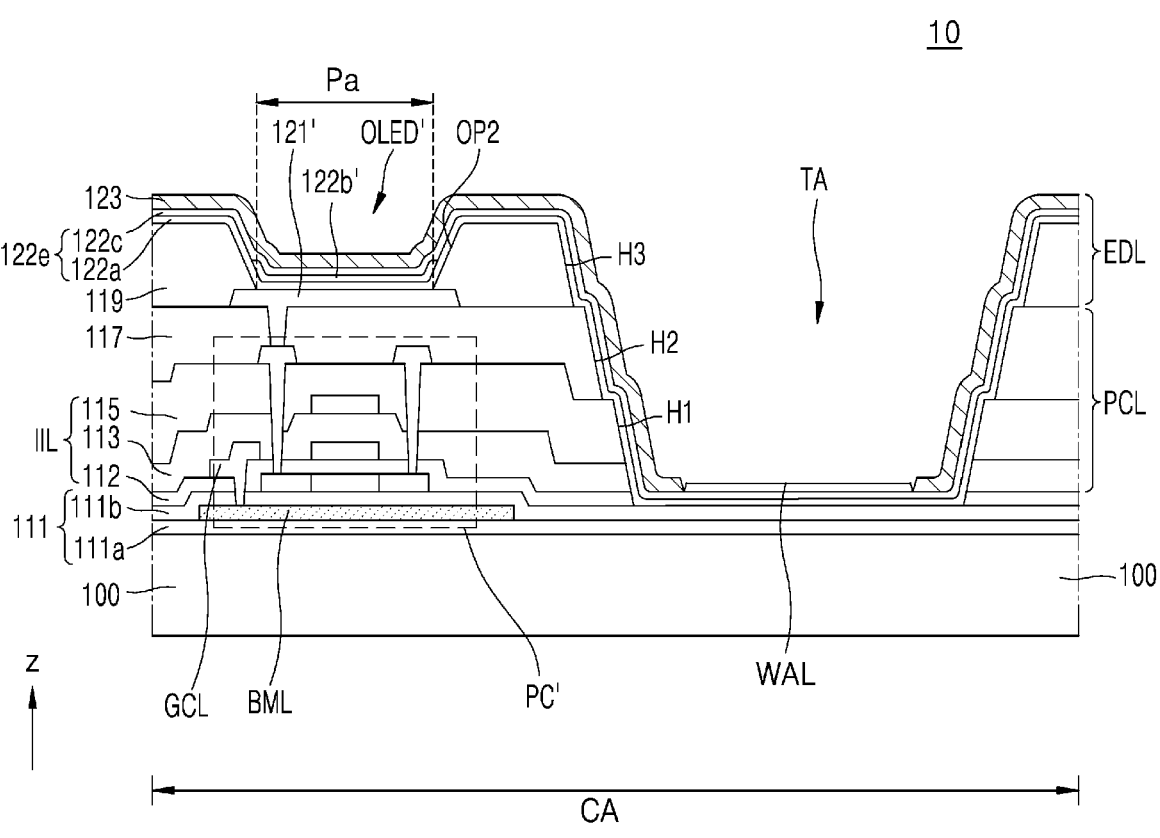
Figure 19C:
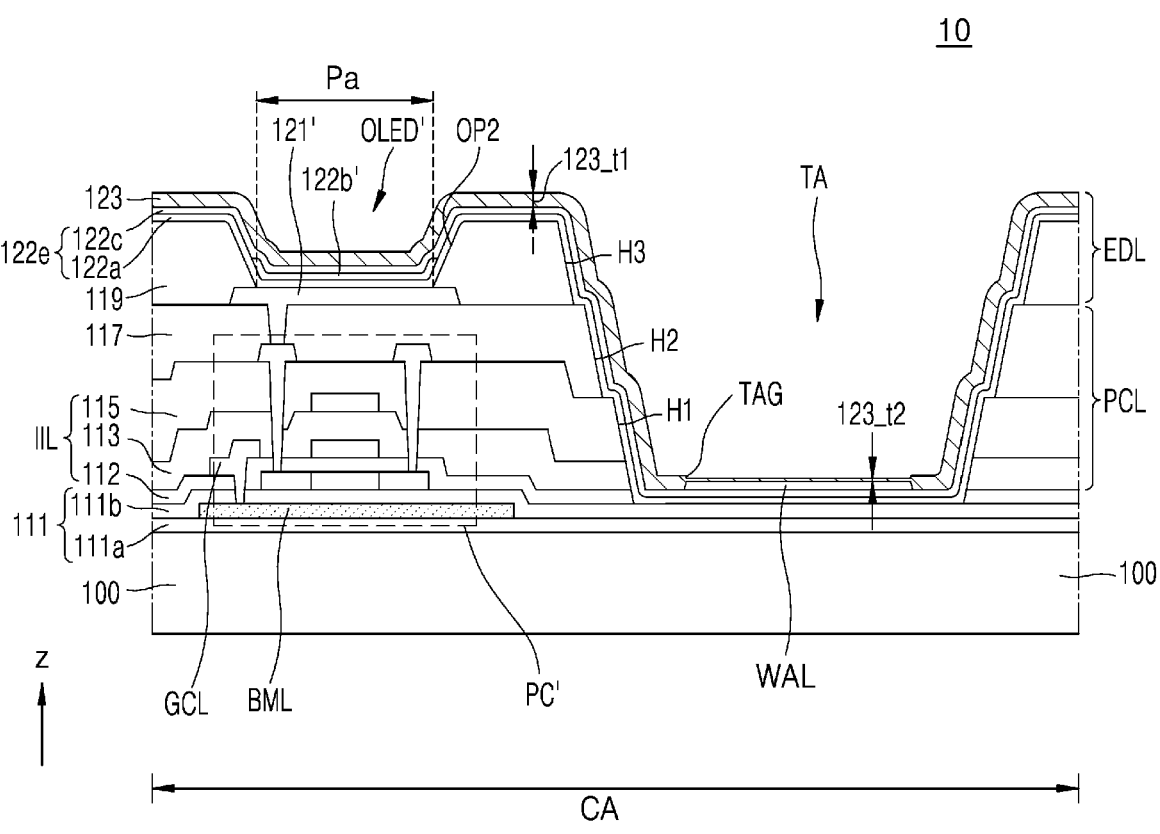

FIGS. 19A through 19C are schematic cross-sectional views illustrating a method of patterning an opposite electrode, and a display panel manufactured using the method, according to an embodiment. In detail, FIGS. 19A through 19C illustrate a metal self patterning (MSP) technique.

A deposition material used to form the opposite electrode 123 provides different layer-formation results according to surfaces on which the deposition material is deposited. For example, magnesium (Mg) from among the materials used to form the opposite electrode 123 is difficult to use to form a layer on an interface cleaned using some solvents such as MeOH respective interfaces of an HIL and an HTL that may be included in the first functional layer 122a, and Mg is also difficult to use to form a layer on the material used to form the pixel defining layer 119. This characteristic of Mg may be used in the MSP technique for patterning the opposite electrode 123.

Referring to FIG. 19A, before the opposite electrode 123 is formed, a weak adhesive layer WAL is formed to correspond to the transmission area TA. For example, the weak adhesive layer WAL may be formed on the upper surface of the second functional layer 122c, within the first hole H1 of the inorganic insulating layer IIL. The weak adhesive layer WAL may be formed to correspond to the transmission area TA, by using a mask MSPM1 having an opening MSPM1_OP to correspond to the transmission area TA.

The weak adhesive layer WAL may include a material having weak adhesion with respect to the opposite electrode 123, and thus no opposite electrodes 123 may be formed on the upper surface of the weak adhesive layer WAL or a very thin opposite electrode 123 may be formed on the upper surface of the weak adhesive layer WAL.

For example, the weak adhesive layer WAL may be formed using 8-quinolinolathorium (Liq), N, N-diphenyl-N, N-bis(9-phenyl-9H-carbazol-3-yl) biphenyl-4,4'-diamine (HT01), N (diphenyl-4-yl) 9,9-dimethyl-N-(4 (9-phenyl-9H-carbazol-3-yl)phenyl)-9H-fluorene-2-amine (HT211), 2-(4-(9,10-di(naphthalene-2-yl) anthracene-2-yl)phenyl)-1-phenyl-1H-benzo-[D]imidazole (LG201), or the like within the spirit and the scope of the disclosure.

Next, referring to FIG. 19B, the opposite electrode 123 may be formed in both the main display area MDA and the component area CA by using an open mask on the weak adhesive layer WAL.

Because a deposition material used to form the opposite electrode 123 has weak adhesion with respect to the weak adhesive layer WAL, no opposite electrodes may be formed on the upper surface of the weak adhesive layer WAL as shown in FIG. 19B, and the transmission hole TAH may be formed. Alternatively, as in FIG. 19C, the opposite electrode 123 may be formed very thinly above the weak adhesive layer WAL. In other words, a thickness 123_t2 of the opposite electrode 123 above the weak adhesive layer WAL may be very small compared with a thickness 123_t1 of the opposite electrode 123 that may be around the weak adhesive layer WAL. In this case, the opposite electrode 123 may have a transmission groove TAG corresponding to the transmission area TA.

According to an embodiment, the display panel 10 may include the weak adhesive layer WAL arranged or disposed in the transmission area TA, and the opposite electrode 123 having the transmission hole TAH or the transmission groove TAG each corresponding to the transmission area TA.

Figure 20A:
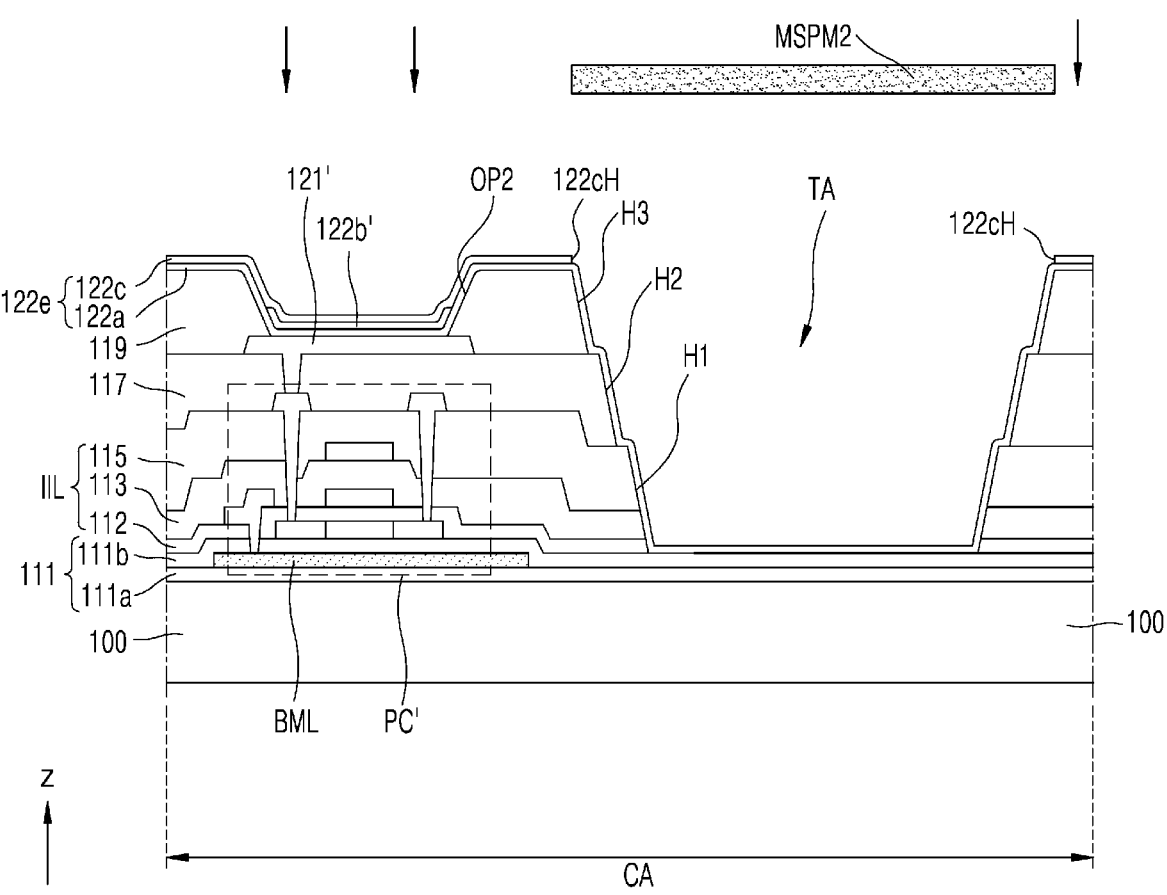
FIGS. 20A and 20B are schematic cross-sectional views illustrating a method of patterning an opposite electrode, according to an embodiment.
Figure 20B:
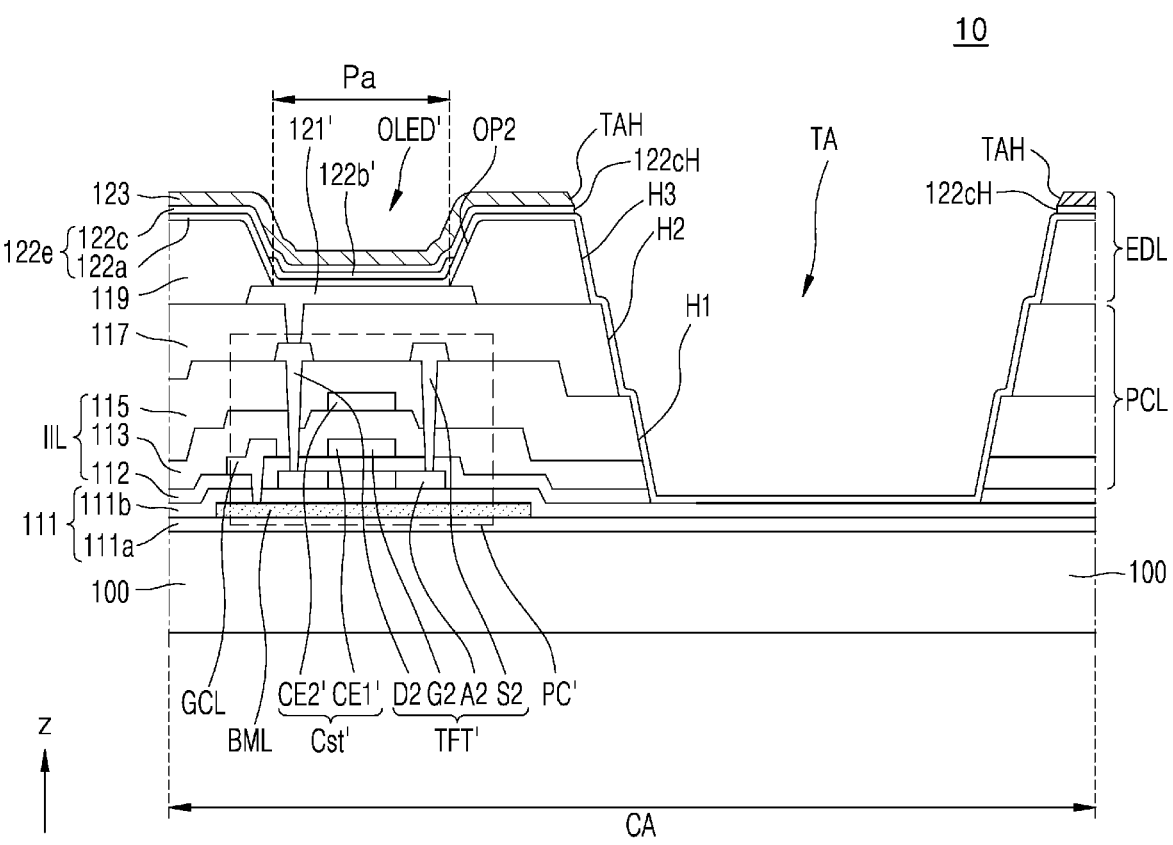

FIGS. 20A and 20B are schematic cross-sectional views illustrating a method of patterning an opposite electrode, according to an embodiment. FIGS. 20A and 20B illustrate an example of an MSP technique.

Referring to FIG. 20A, before an opposite electrode is formed, a second functional layer 122c having a hole 122cH corresponding to the transmission area TA is formed. The second functional layer 122c may be formed via a deposition process using a mask MSPM2 including a shielding portion corresponding to the transmission area TA.

Next, as shown in FIG. 20B, the opposite electrode 123 may be formed on the entire surface of the substrate 100 via deposition by using an open mask. Because the first functional layer 122a may include an HIL and/or an HTL, the first functional layer 122a may have weak adhesion with respect to the opposite electrode 123 formed above the first functional layer 122a. Accordingly, no opposite electrodes may be formed within the hole 122cH of the second functional layer 122c via which an upper surface of the first functional layer 122a is exposed, as shown in FIG. 20B, and the transmission hole TAH may be formed. Alternatively, a very thin opposite electrode may be arranged or disposed within the hole 122cH of the second functional layer 122c.

The display panel 10 according to an embodiment may include the first functional layer 122a continuously extending in the transmission area TA, the second functional layer 122c arranged or disposed above the first functional layer 122a and having the hole 122cH corresponding to the transmission area TA, and the opposite electrode 123 having the transmission hole TAH corresponding to the transmission area TA.

Figure 21A:
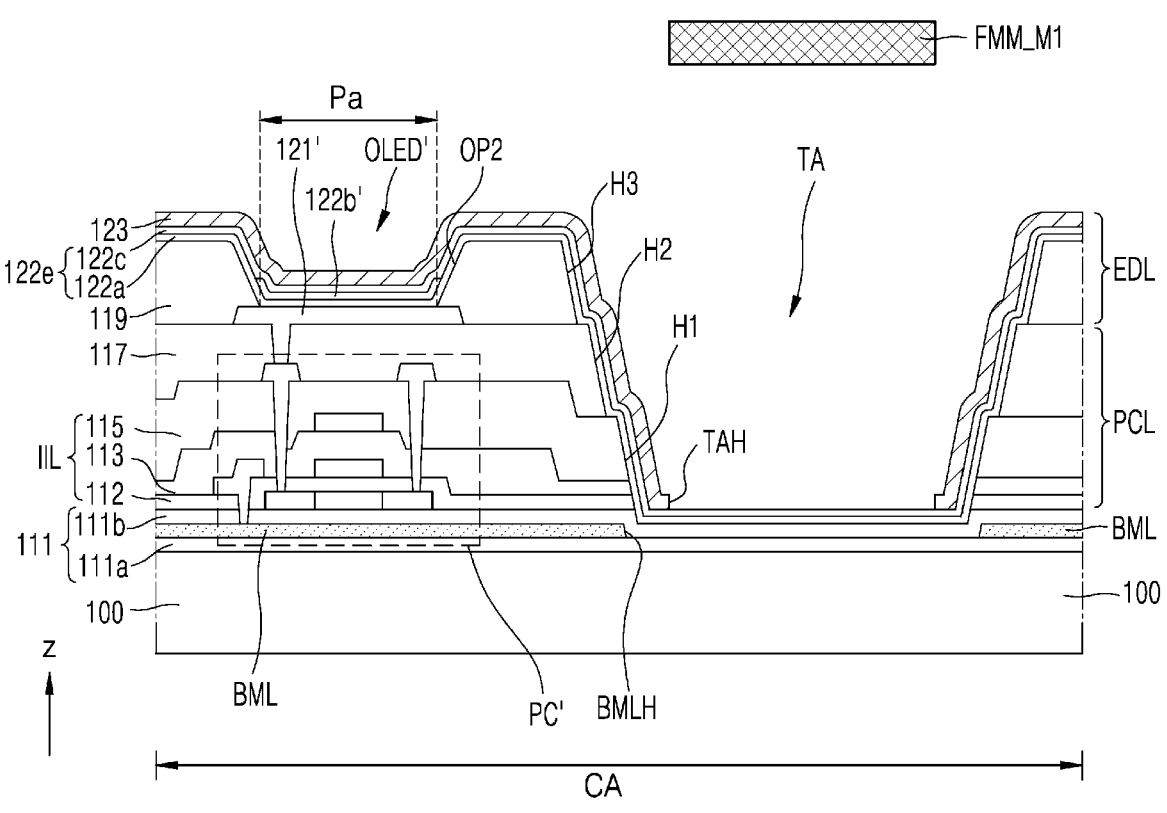
FIGS. 21A and 21B are schematic cross-sectional views illustrating a method of patterning an opposite electrode, according to an embodiment.
Figure 21B:
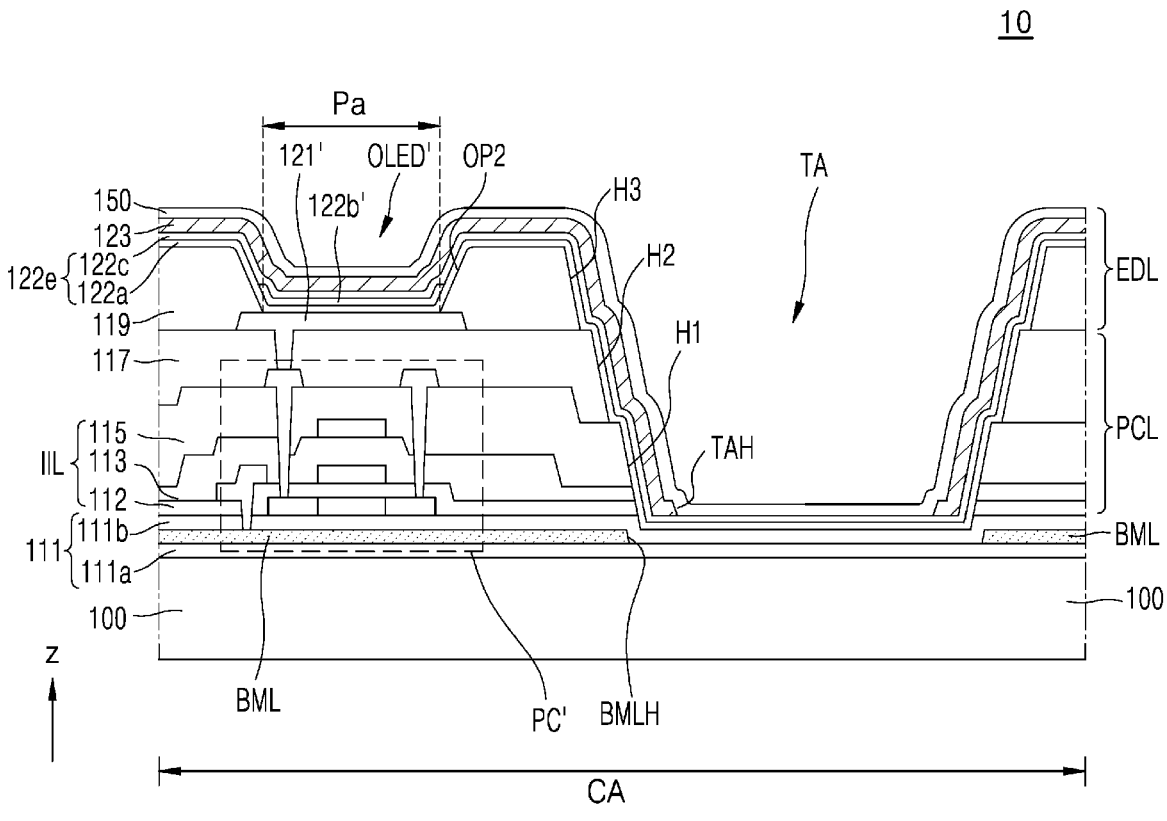

FIGS. 21A and 21B are schematic cross-sectional views illustrating a method of patterning an opposite electrode, according to an embodiment. In detail, FIGS. 21A and 21B illustrate an FMM patterning technique.

Referring to FIGS. 21A and 21B, after the functional layer 122e is formed, an FMM mask FMM_M1 including a shielding portion corresponding to the transmission area TA may be arranged or disposed relative to the substrate 100, and then the opposite electrode 123 is formed via deposition. Because the opposite electrode 123 may be formed using the FMM mask FMM_M1, the opposite electrode 123 may include the transmission hole TAH corresponding to the transmission area TA.

Next, the FMM mask FMM_M1 may be removed, and the upper layer 150 may be formed to correspond to the entire surface of the substrate 100. Accordingly, at least one of the first functional layer 122a, the second functional layer 122c, and the upper layer 150 may be arranged or disposed to correspond to the transmission area TA. In other words, at least one of the first functional layer 122a, the second functional layer 122c, and the upper layer 150 may be arranged or disposed within the transmission hole TAH.

Figure 22A:
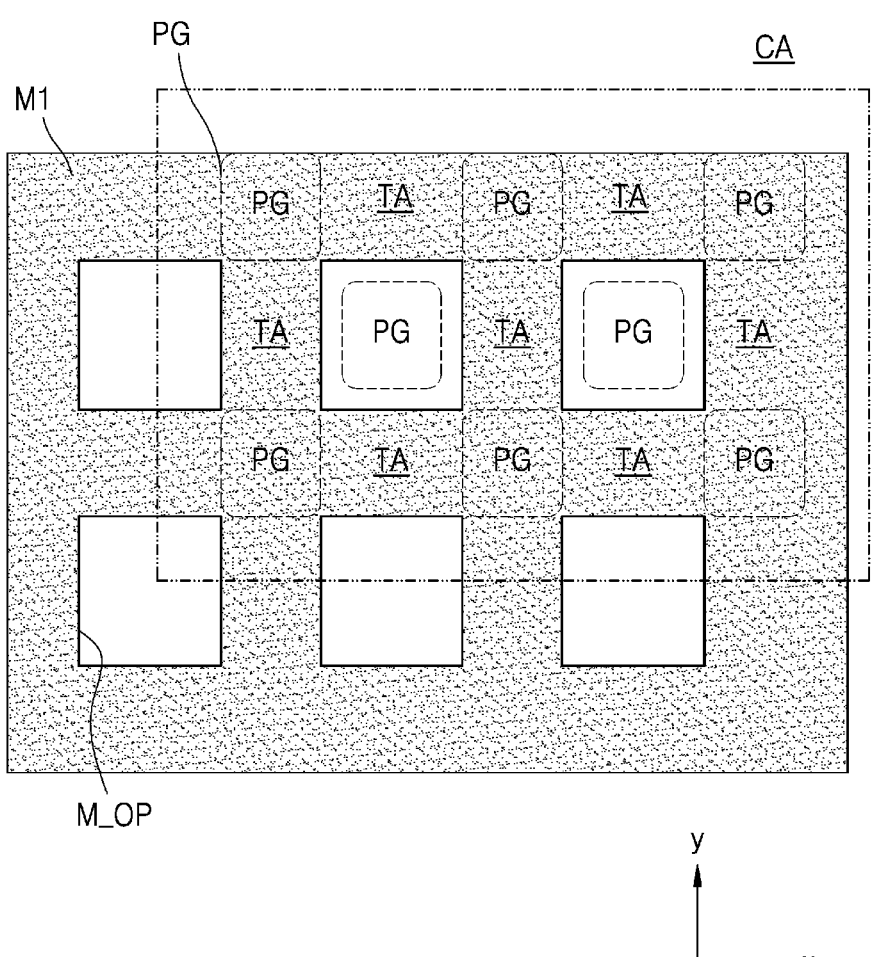
FIGS. 22A through 22C are plan views illustrating a method of patterning an opposite electrode, according to an embodiment.
Figure 22B:
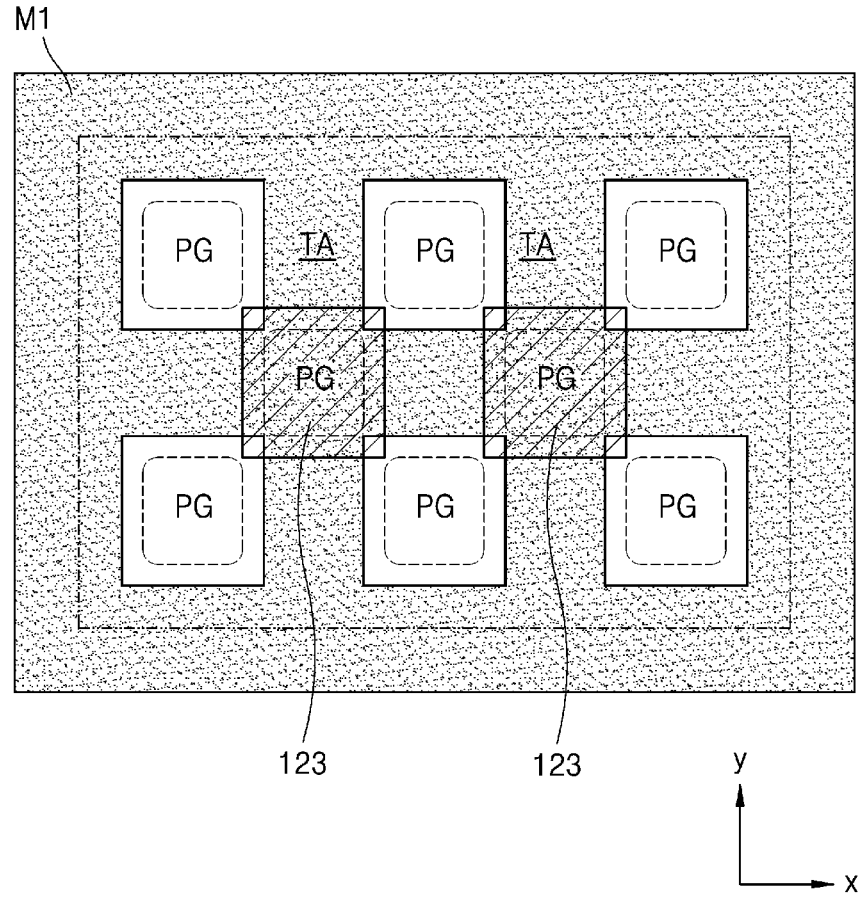
Figure 22C:
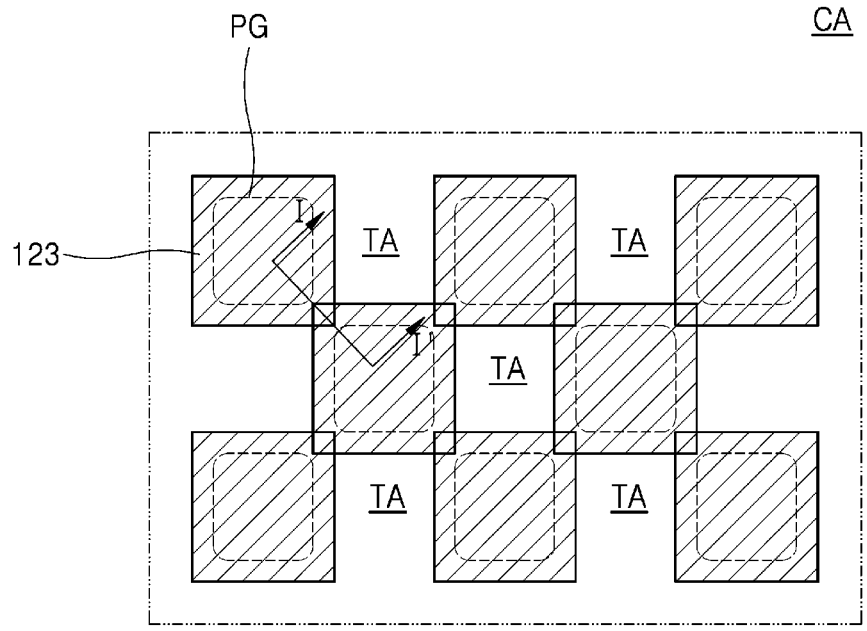
Figure 22C:
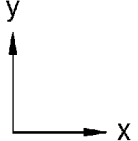
Figure 22D:
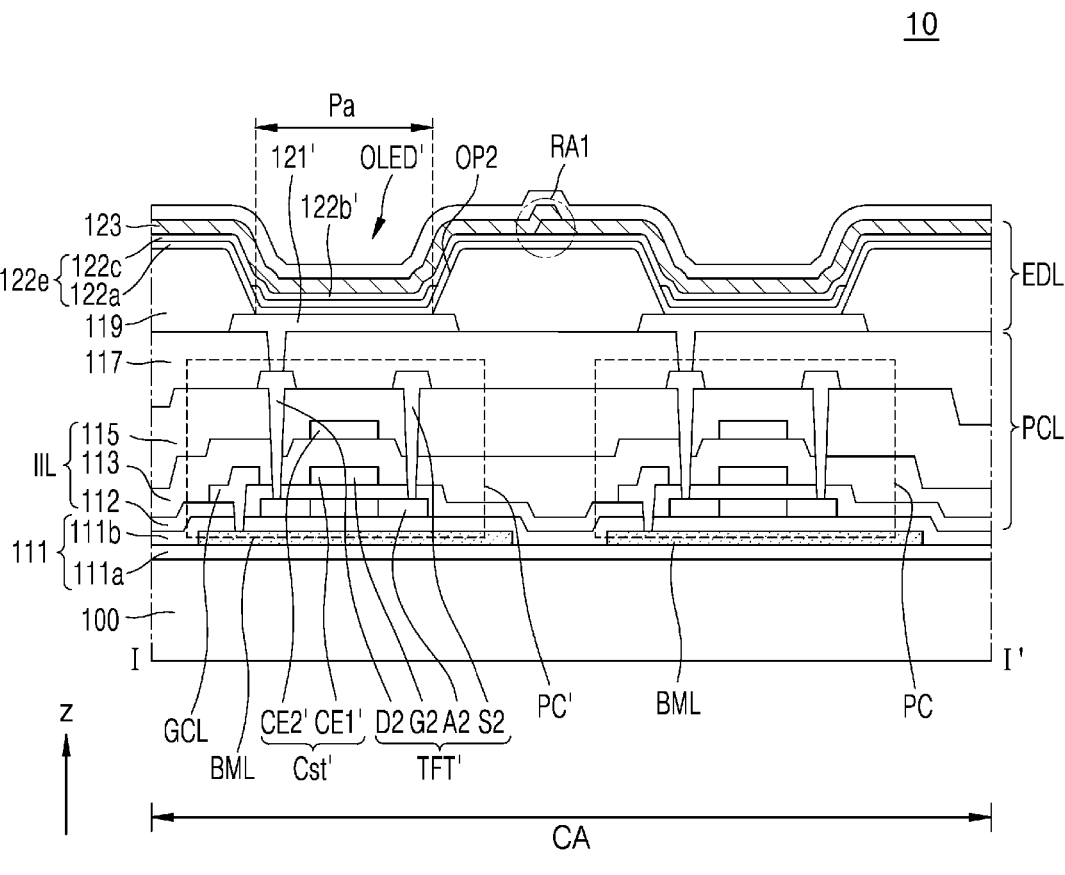
FIG. 22D is a schematic cross-sectional view of a portion of a display panel to which the manufacturing method of FIGS. 22A through 22C is applied.

FIGS. 22A through 22C are plan views illustrating a method of patterning an opposite electrode, according to an embodiment. In detail, FIGS. 22A through 22C illustrate an example of an FMM patterning technique. FIG. 22D is a schematic cross-sectional view of a portion or region of a display panel 10 to which the manufacturing method of FIGS. 22A through 22C is applied.

Referring to FIGS. 22A and 22B, a mask M1 for an opposite electrode may include mask openings M_OP spaced apart from each other. In FIGS. 22A and 22B, the mask openings M_OP may have the same shapes. However, the mask openings M_OP may include mask openings M_OP having different sizes and/or shapes. The mask openings M_OP may be spaced apart from each other at intervals of a certain or predetermined distance in the x direction and/or the y direction.

The mask M1 for an opposite electrode may be an FMM. The FMM may be manufactured by forming a hole in a metal plate and then extending the hole. Accordingly, each mask opening M_OP may be symmetrical about an axis in the first direction that traverse the mask opening, or about an axis in the second direction that traverse the mask opening.

Referring to FIG. 22A, after formation up to the second functional layer 122c of FIG. 17 on the substrate 100 is complete, the mask openings M_OP may be arranged or disposed to correspond to some or a predetermined number pixel groups PG.

Next, a deposition material used to form an opposite electrode 123 is discharged from a deposition source (not shown) and is primarily deposited on the second functional layer 122c to form a portion of the opposite electrode 123. At this time, only a portion of the opposite electrode 123 may be formed according to an arrangement of the mask openings M_OP of the mask M1.

Next, as shown in FIG. 22B, the mask M1 may be moved in the x direction and the y direction and may be arranged, and then the remaining portion of the opposite electrode 123 is formed via secondary deposition. The portion of the opposite electrode 123 formed during the secondary deposition may overlap and contact the portion of the opposite electrode 123 formed during the primary deposition. In FIG. 22B, after the primary deposition for the opposite electrode 123 is performed, the mask M1 is moved rightwards and upwards in a 45-degree direction and then the secondary deposition for the opposite electrode 123 is performed. However, embodiments are not limited thereto. For example, after the primary deposition for the opposite electrode 123 is performed, the mask M1 may be moved leftwards and downwards in a 45-degree direction and then the secondary deposition for the opposite electrode 123 may be performed.

According to this deposition method, as shown in FIG. 22C, the opposite electrode 123 may be provided or disposed in correspondence with the pixel groups PG, and the opposite electrode 123 may not be provided or disposed in the transmission area TA. Thus, the transmission area TA may have high transmittance.

According to an embodiment, the portion of the opposite electrode 123 formed during the first deposition and the portion of the opposite electrode 123 formed during the secondary deposition may overlap and contact each other. Accordingly, as shown in FIG. 22D, a thickness of the opposite electrode 123 may be greater in an overlapping area RAI than an area above the auxiliary organic light-emitting diode OLED'.

As described above, the opposite electrode 123 having the transmission hole TAH may be formed using the above-described laser lift off method, the above-described FMM patterning method, and/or the above-described MSP method. However, embodiments are not limited thereto. For example, the opposite electrode 123 having the transmission hole TAH may be formed using a combination of the above-described laser lift off method, the above-described FMM patterning method, and/or the above-described MSP method.

FIGS. 23A through 23E illustrate a method of patterning an opposite electrode by using an FMM patterning method and a laser lift off method.

Figure 23A:
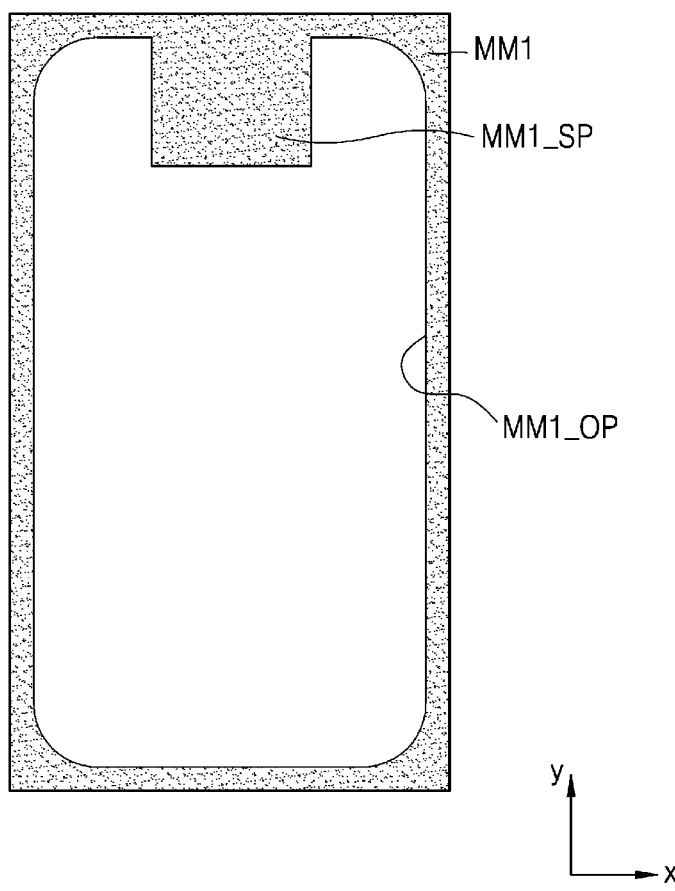
FIGS. 23A through 23E illustrates a method of patterning an opposite electrode, according to an embodiment.
Figure 23B:
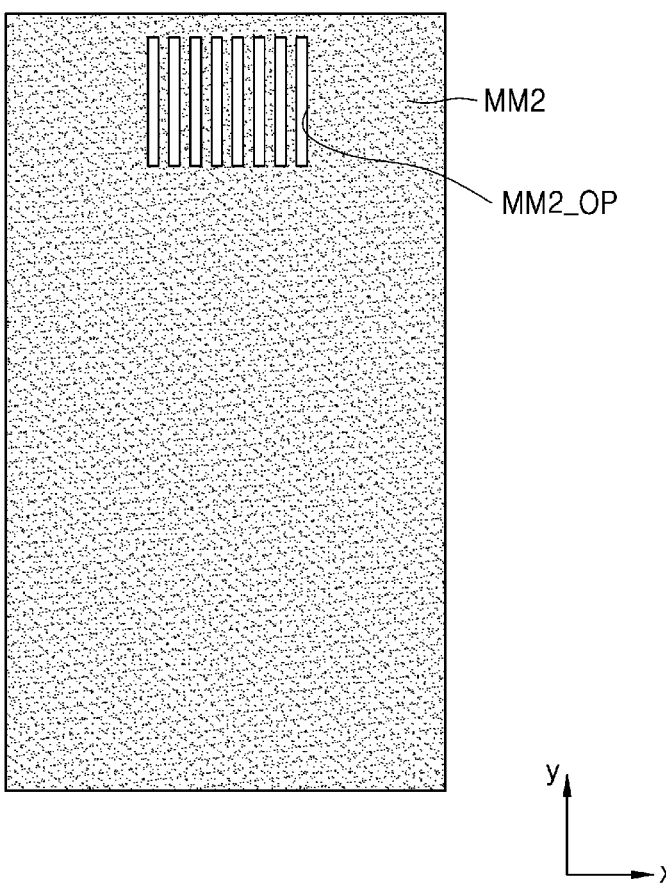

First, FIGS. 23A and 23B illustrate a first mask MM1 for opposite electrodes and a second mask MM2 for opposite electrodes that are applicable to an embodiment. The first mask MM1 may include a shielding portion MM1_SP shielding the component area CA and may include a first mask opening MM1_OP exposing the main display area MDA. The second mask MM2 may include second mask openings MM2_OP corresponding to a portion of the component area CA. According to an embodiment, each of the second mask openings MM2_OP may be in the shape of a rectangle having a longer side corresponding to a length of the component area CA in the y direction. The second mask openings MM2_OP may be arranged or disposed apart from each other in the x direction. According to an embodiment, each of the second mask openings MM2_OP may be in the shape of a rectangle having a longer side corresponding to a length of the component area CA in the x direction.

Figure 23C:
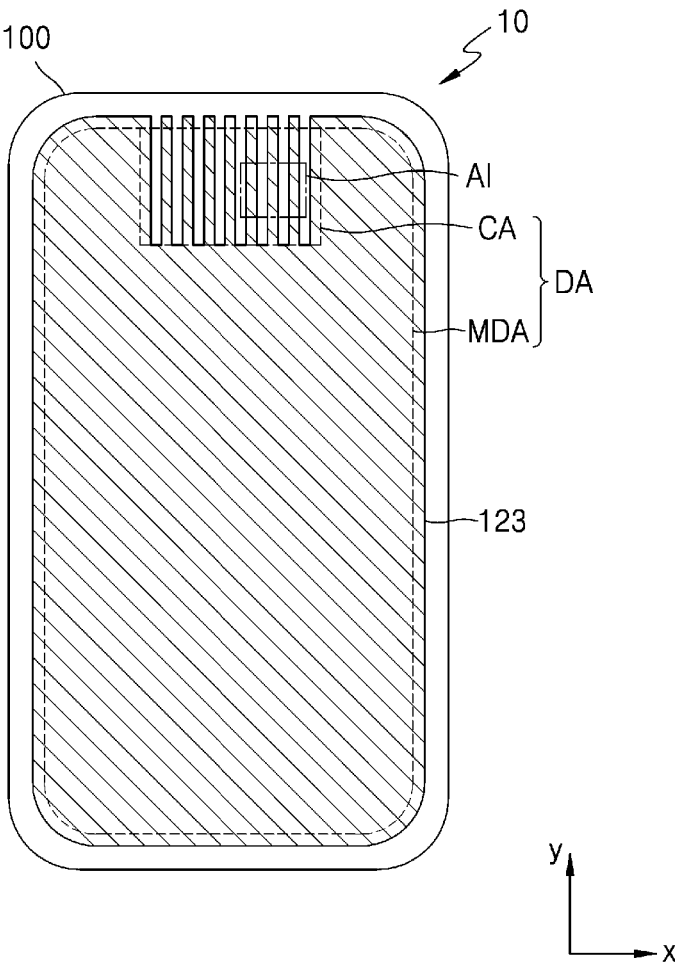
Figure 23D:
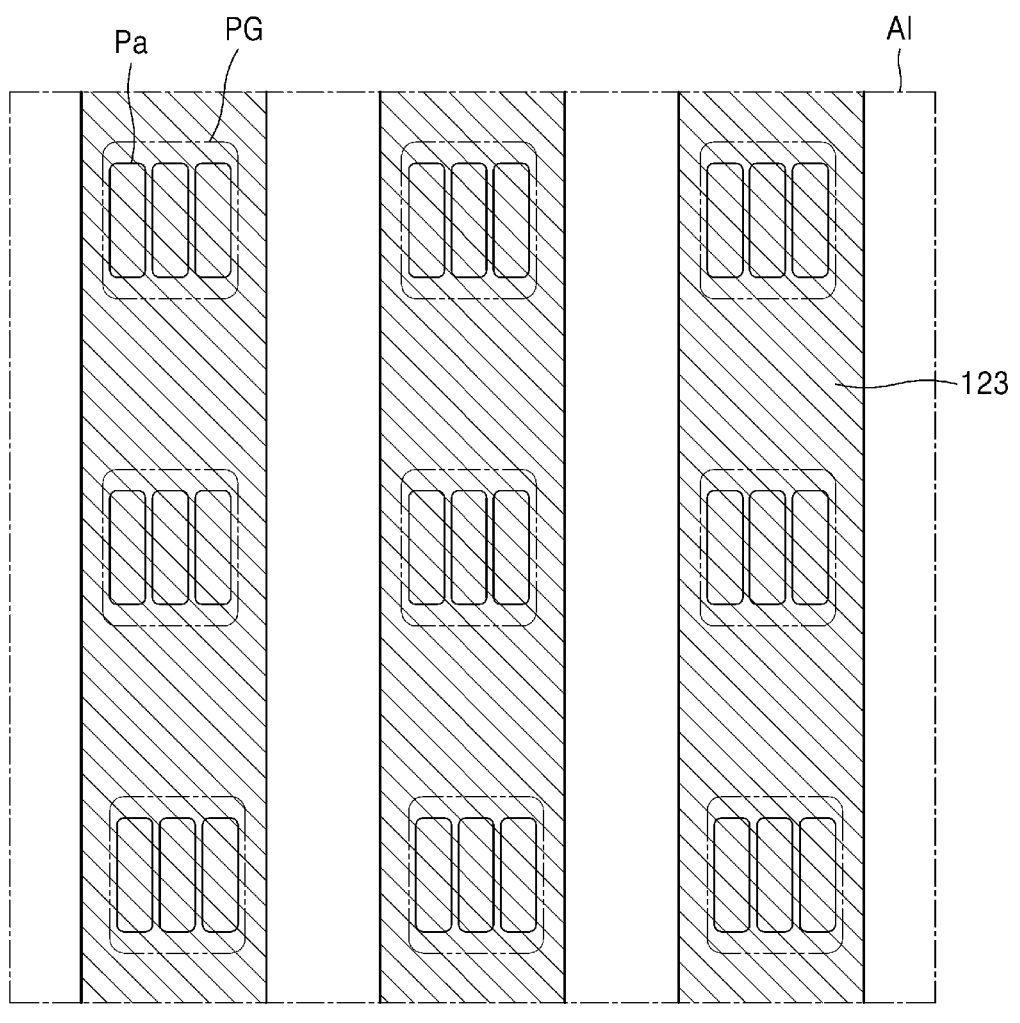

FIG. 23C is a plan view illustrating an opposite electrode 123 obtained by performing primary deposition by using the first mask MM1 and then performing secondary deposition by using the second mask MM2, and FIG. 23D is a magnified plan view of a portion AI of FIG. 23C.

Referring to FIGS. 23C and 23D, the opposite electrode 123 may be obtained via a deposition process to cover or overlap the main display area MDA and cover or overlap a portion of the component area CA. The opposite electrode 123 may be formed to cover or overlap pixel groups PG arranged or disposed in the y direction, according to the shapes of the second mask openings MM2_OP of the second mask MM2.

Figure 23E:
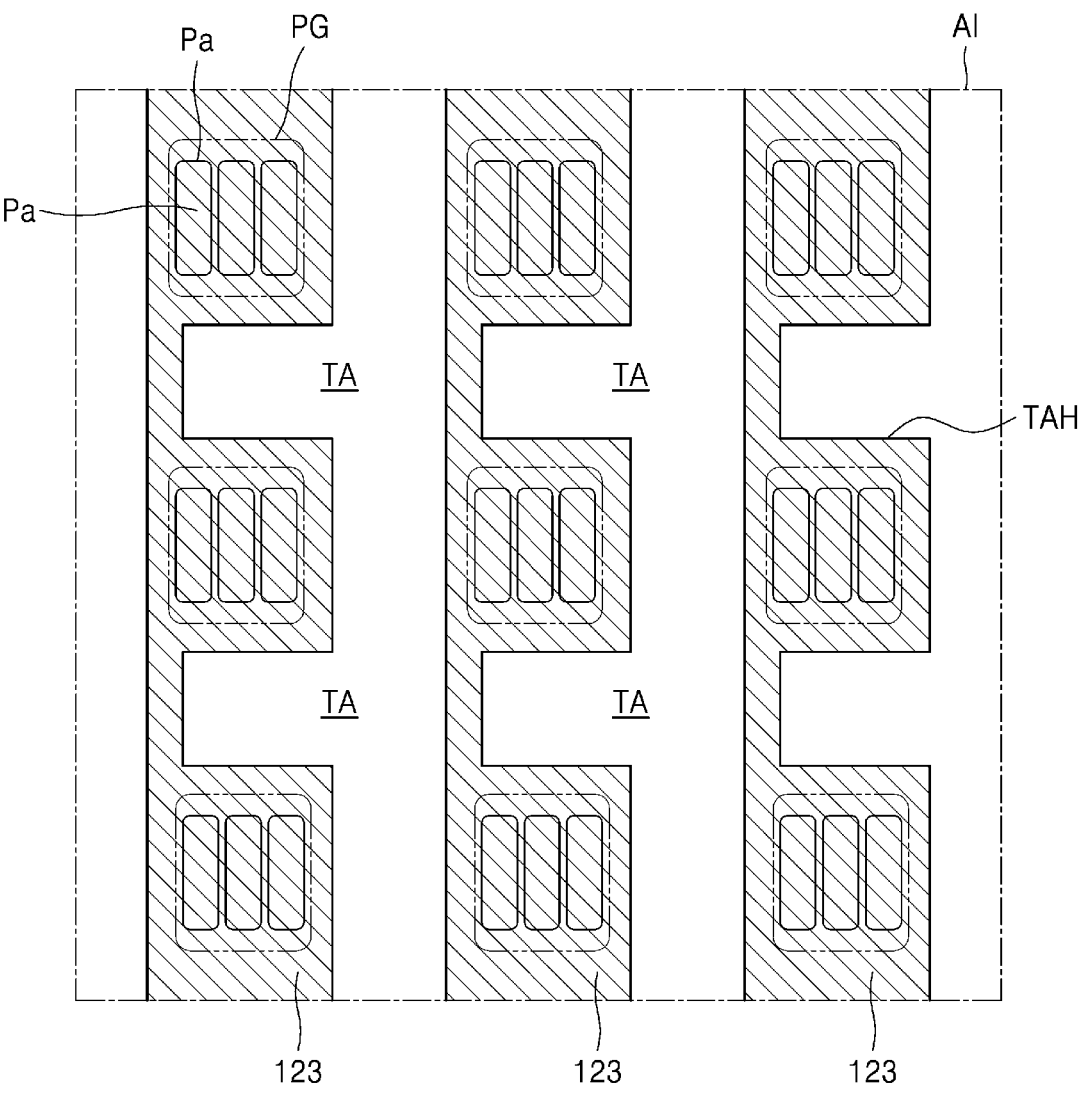

Next, as shown in FIG. 23E, the transmission hole TAH may be formed by removing a portion or region of the opposite electrode 123 formed in the component area CA by using the laser lift off method. Thus, the light transmittance of the transmission area TA may improve.

Figure 24:
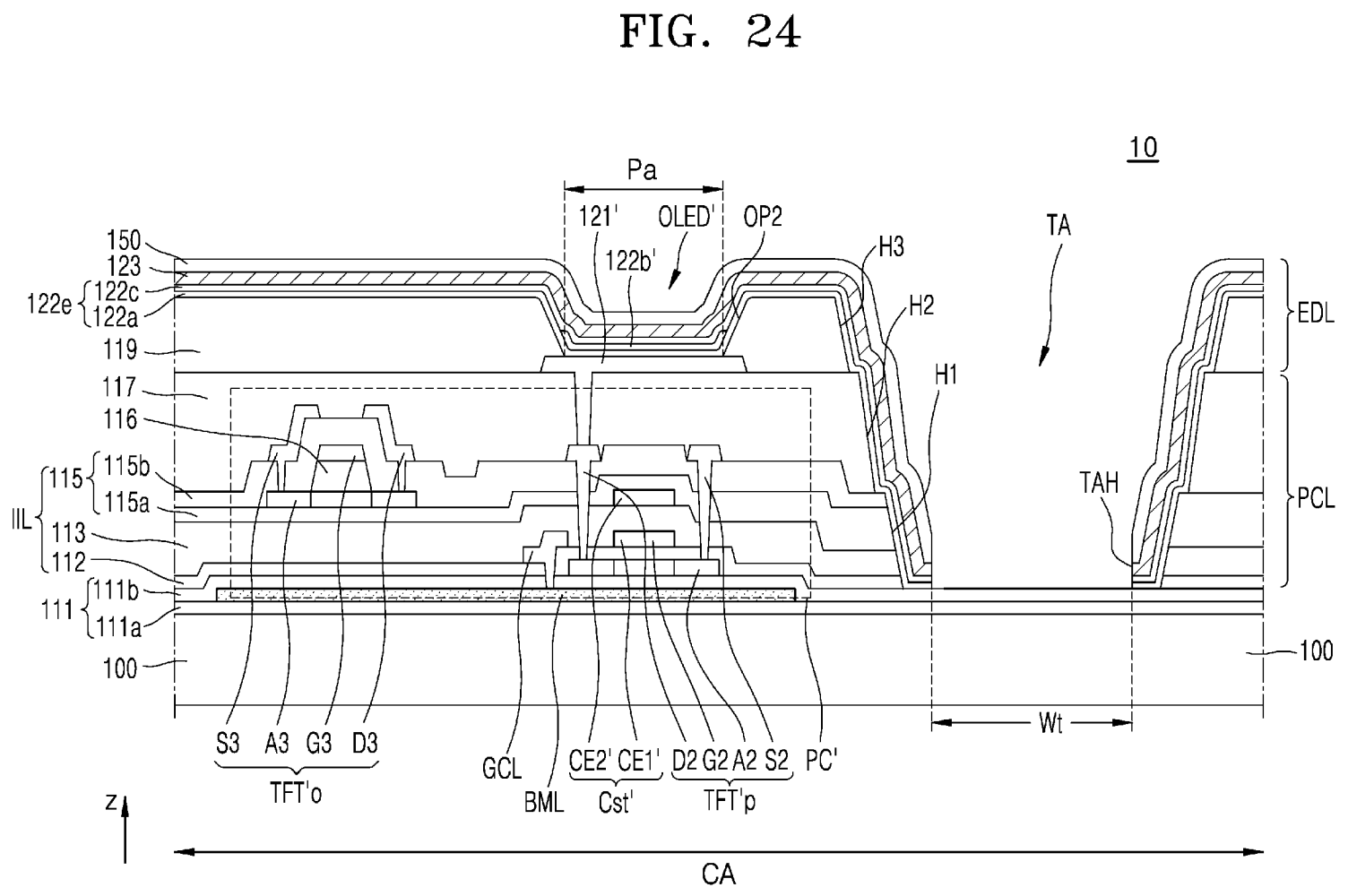

FIG. 24 is a schematic cross-sectional view of a portion or region of a display panel 10 according to an embodiment. The same reference numerals in FIGS. 17 and 24 denote the same elements, and thus repeated descriptions thereof are omitted.

The embodiment of FIG. 24 may be different from that of FIG. 17 in that an auxiliary pixel circuit PC' of the display panel 10 may include a thin-film transistor including an oxide semiconductor and a thin-film transistor including polysilicon. Although FIG. 24 illustrates only the component area CA, the above-described structure of the auxiliary pixel circuit PC' of the component area CA may be equally applied to a main pixel circuit PC of the main display area MDA.

Referring to FIG. 24, the pixel circuit PC' of the display panel 10 may include a first thin-film transistor TFT'p including a semiconductor layer A2 including polycrystalline silicon, and a second thin-film transistor TFT'o including a semiconductor layer A3 including an oxide semiconductor.

The first thin-film transistor TFT'p may include the second semiconductor layer A2, a second gate electrode G2, a second source electrode S2, and a second drain electrode D2. The first thin-film transistor TFT'p may be substantially the same as the auxiliary thin-film transistor TFT' described above with reference to FIG. 17, and the second semiconductor layer A2 of the first thin-film transistor TFT'p may include polycrystalline silicon.

A circuit layer PCL according to an embodiment may be different from the circuit layer PCL of FIG. 17 in that an interlayer insulating layer 115 may include a first interlayer insulating layer 115a and a second interlayer insulating layer 115.

The second thin-film transistor TFT'o may include the third semiconductor layer A3, a third gate electrode G3, a third source electrode S3, and a third drain electrode D3. The third semiconductor layer A3 may be on the first interlayer insulating layer 115a. In other words, the third semiconductor layer A3 and the second semiconductor layer A2 may be on different layers. The third semiconductor layer A3 may include a channel region, and a source region and a drain region respectively arranged or disposed on both sides of the channel region. According to an embodiment, the third semiconductor layer A3 may include an oxide semiconductor. For example, the third semiconductor layer A3 may include Zn oxide, In—Zn oxide, Ga—In—Zn oxide, or the like as a Zn oxide-based material. Alternatively, the third semiconductor layer A3 may include an In—Ga—Zn—O (IGZO), In—Sn—Zn—O (ITZO), or In—Ga—Sn—Zn—O (IGTZO) semiconductor containing a metal, such as In, Ga, or Sn, in ZnO.

The source region and the drain region of the third semiconductor layer A3 may be formed by making an oxide semiconductor be conductive by controlling the carrier concentration of an oxide semiconductor. For example, the source region and the drain region of the third semiconductor layer A3 may be formed by increasing the carrier concentration of an oxide semiconductor by performing plasma processing on the oxide semiconductor, the plasma processing using a hydrogen (H)-based gas, a fluorine (F)-based gas, or a combination thereof.

The third gate electrode G3 may overlap the channel region of the third semiconductor layer A3, and the third gate insulating layer 116 may be between the third semiconductor layer A3 and the third gate electrode G3. In other words, the third gate electrode G3 may be insulated from the third semiconductor layer A3 by the third gate insulating layer 116. The third gate insulating layer 116 may be patterned according to the shape of the third gate electrode G3.

The third gate insulating layer 116 may include an inorganic material including oxide or nitride. For example, the third gate insulating layer 116 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like within the spirit and the scope of the disclosure. The third gate electrode G3 may be on the third gate insulating layer 116, may include molybdenum (Mo), copper (Cu), titanium (Ti), or the like, and may be a single layer or multiple layers.

The second interlayer insulating layer 115 may cover or overlap the third gate electrode G3 of the third thin-film transistor TFT and may be on the upper surface of the substrate 100. The third source electrode S3 and the third drain electrode D3 may be above the second interlayer insulating layer 115.

The third source electrode S3 and the third drain electrode D3 may contact the source region and the drain region of the third semiconductor layer A3, respectively, via a contact hole that penetrates the second interlayer insulating layer 115. Each of the third source electrode S3 and the third drain electrode D3 may include a conductive material including Mo, Al, Cu, Ti, and other conductive materials, and may be a multi-layer or single layer including the aforementioned materials.

Because a thin-film transistor including a semiconductor layer including polycrystalline silicon has high reliability, a high-quality display panel may be realized by employing a driving thin-film transistor.

Because an oxide semiconductor has high carrier mobility and a low leakage current, a voltage drop may not be big even in a case that a driving time may be long. In other words, because a change in the color of an image according to a voltage drop is not big even during low frequency driving, low frequency driving is possible. Because an oxide semiconductor has a low leakage current as described above, the oxide semiconductor may be used in at least one of the thin-film transistors other than the driving thin-film transistor, thereby preventing current leakage and also reducing power consumption.

Figure 25:
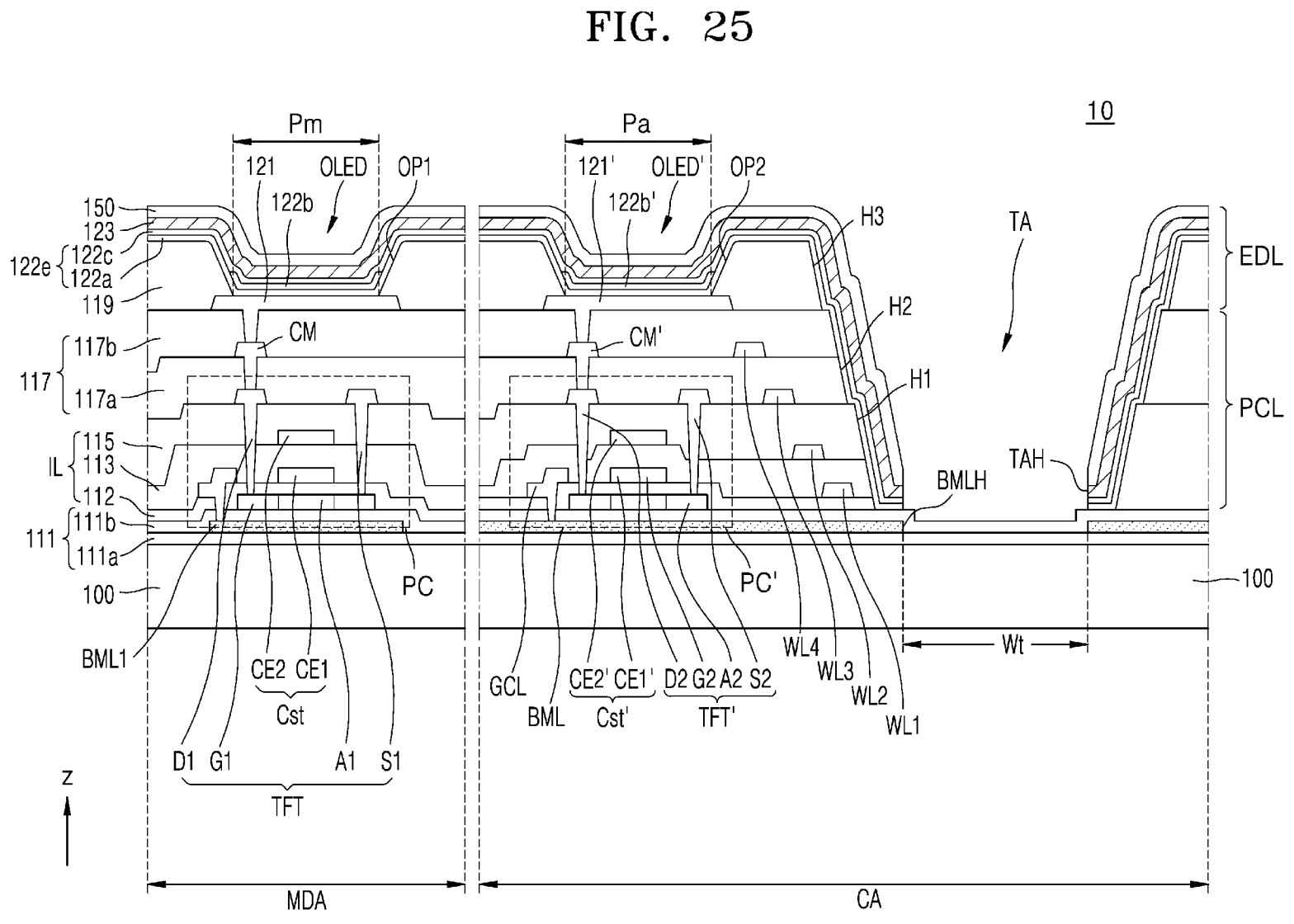

FIG. 25 is a schematic cross-sectional view of a portion or region of a display panel 10 according to an embodiment. The same reference numerals in FIGS. 17 and 25 denote the same elements, and thus repeated descriptions thereof are omitted.

The embodiment of FIG. 25 may be different from the embodiment of FIG. 17 in that a planarization layer 117 may include a first planarization layer 117a and a second planarization layer 117b, a first metal layer BML1 may be arranged or disposed in the main display area MDA, and a transmission area TA may be defined by the bottom hole BMLH of the bottom metal layer BML.

Referring to FIG. 25, a circuit layer PCL of the display panel 10 may include the first planarization layer 117a and the second planarization layer 117b. Accordingly, a conductive pattern such as a wire may be provided or disposed between the first planarization layer 117a and the second planarization layer 117b, and thus may be favorable to high integration.

The first planarization layer 117a may cover or overlap the main and auxiliary pixel circuits PC and PC'. The second planarization layer 117b may be on the first planarization layer 117a and may have a flat upper surface such that the first and second pixel electrodes 121 and 121' may be formed flat. Each of the first and second planarization layers 117a and 117b may include an organic material or an inorganic material and may have a single layer structure or a multi-layer structure. Each of the first and second planarization layers 117a and 117b may include a commercial polymer such as benzocyclobutene (BCB), polyimide, hexamethyldisiloxane (HMDSO), PMMA, or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or the like within the spirit and the scope of the disclosure. Each of the first and second planarization layers 117a and 117b may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like within the spirit and the scope of the disclosure. In a case that the first and second planarization layers 117a and 117b are formed, a layer may be formed, and then chemical and mechanical polishing may be performed on the upper surface of the layer to provide a flat upper surface to the layer.

The main and auxiliary organic light-emitting diodes OLED and OLED' are on the second planarization layer 117b. The first and second pixel electrodes 121 and 121' of the main and auxiliary organic light-emitting diodes OLED and OLED' may be electrically connected to the main and auxiliary pixel circuits PC and PC' via connecting electrodes CM and CM' arranged or disposed on the planarization layer 117.

The connecting electrodes CM and CM' may be disposed between the first and second planarization layers 117a and 117b. The connecting electrodes CM and CM' may include a conductive material including Mo, Al, Cu, Ti, and other conductive materials, and may be formed as a multi-layer or single layer including the aforementioned materials. For example, each of the connecting electrodes CM and CM' may be a multi-layer of Ti/Al/Ti.

The display panel 10 may include the first metal layer BML1 arranged or disposed in the main display area MDA. The first metal layer BML1 may be arranged or disposed between the substrate 100 and the main pixel circuit PC to correspond to the main thin-film transistor TFT of the main display area MDA. According to an embodiment, the first metal layer BML1 may be arranged or disposed to correspond to a portion of the main display area MDA. Alternatively, the first metal layer BML1 may be arranged or disposed to correspond to the entire main display area MDA. Alternatively, the first metal layer BML1 may be integral with the bottom metal layer BML of the component area CA. A static voltage or a signal may be applied to the first metal layer BML1, and thus damage to the main pixel circuit PC due to electrostatic discharge may be prevented.

The first metal layer BML1 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). The first metal layer BML1 may be a single layer or multi-layer including the aforementioned materials.

The bottom metal layer BML of the component area CA may correspond to the entire component area CA. In this case, the bottom metal layer BML may include the bottom-hole BMLH overlapping the transmission area TA. According to an embodiment, the shape and size of the transmission area TA may be defined by the shape and size of the bottom-hole BMLH.

The display panel 10 may include first, second, third, and fourth wires WL1, WL2, WL3, and WL4 arranged or disposed on different layers.

The first wire WL1 may be on the first gate insulating layer 112, which may be on the same layer on which the first and second gate electrodes G1 and G2 may be arranged or disposed, and may function as a scan line that transmits a scan signal to the main and auxiliary pixel circuits PC and PC'. Alternatively, the first wire WL1 may function as a light-emission control line.

The second wire WL2 may be on the second gate insulating layer 113, which is on the same layer on which the first and second upper electrodes CE2 and CE2' of the main and auxiliary storage capacitors Cst and Cst' are arranged or disposed, and may function as the scan line SL and/or the light-emission control line EL.

The third wire WL3 may be on the interlayer insulating layer 115 and may function as the data line DL transmitting a data signal to the main and auxiliary pixel circuits PC and PC". Alternatively, the third wire WL3 may function as a driving voltage line that transmits a driving voltage to the main and auxiliary pixel circuits PC and PC".

The fourth wire WL4 may be disposed on the planarization layer 117, which may be on the same layer on which the connecting electrodes CM and CM' may be arranged or disposed, and may function as the driving voltage line that may transmit a driving voltage to the main and auxiliary pixel circuits PC and PC' or the data line DL transmitting a data signal to the main and auxiliary pixel circuits PC and PC'.

Each of the first, second, third, and fourth wires WL1, WL2, WL3, and WL4 may include a conductive material including molybdenum (Mo), aluminum (Al), copper (Cu), and titanium (Ti), and may be formed as a multi-layer or single layer including the aforementioned materials. Alternatively, each of the first, second, third, and fourth wires WL1, WL2, WL3, and WL4 may include a transparent conductive material. The first, second, third, and fourth wires WL1, WL2, WL3, and WL4 may include the same material or may include different materials.

Figure 26:
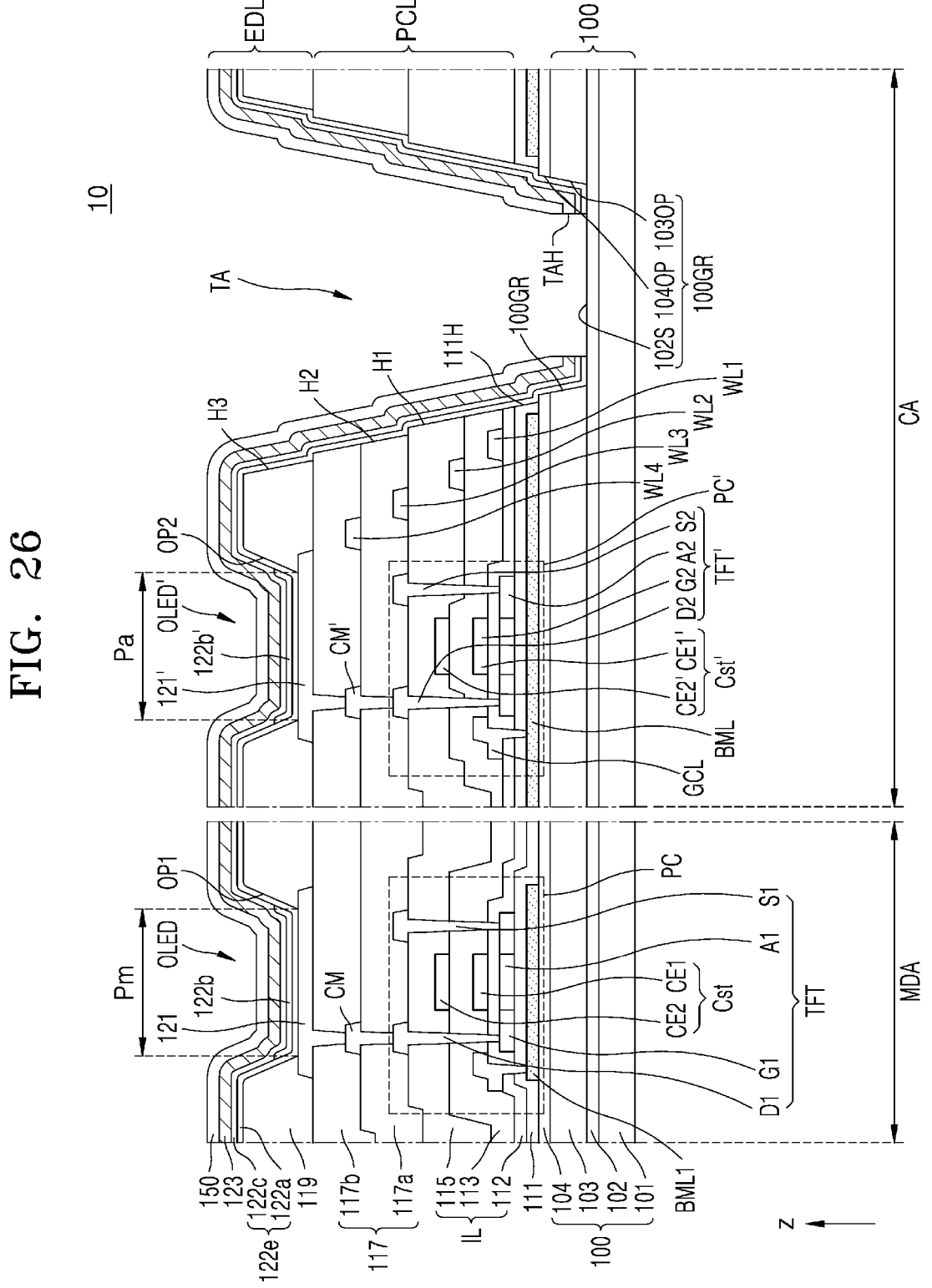
FIG. 26 is a schematic cross-sectional view of a portion or region of a display panel according to an embodiment.

FIG. 26 is a schematic cross-sectional view of a portion or region of a display panel 10 according to an embodiment. The same reference numerals in FIGS. 25 and 26 denote the same elements, and thus repeated descriptions thereof are omitted. The embodiment of FIG. 26 may be different from that of FIG. 25 in that a substrate 100 may have a groove 100GR corresponding to a transmission area TA.

Referring to FIG. 26, the substrate 100 of the display panel 10 may include a first base layer 101, a first inorganic barrier layer 102, a second base layer 103, and a second inorganic barrier layer 104 which may be sequentially stacked. Each of the first and second base layers 101 and 103 may include polymer resin as described above. Each of the first inorganic barrier layer 102 and the second inorganic barrier layer 104 may prevent the permeation of external impurities, and thus may include an inorganic material such as silicon oxide ($SiO_2$), silicon nitride ($SiN_x$), or silicon oxynitride (SiON) and may have a single layer structure or a multi-layer structure.

According to an embodiment, the substrate 100 may have the groove 100GR to correspond to the transmission area TA. The groove 100GR may correspond to the component area CA where a component 40 or the like may be arranged or disposed. The groove 100GR may mean an area or region in which a portion of the substrate 100 has been removed in a downward direction (−z direction) and a portion thereof remains. For example, the first base layer 101 and the first inorganic barrier layer 102 may be continuous over the transmission area TA. The second base layer 103 and the second inorganic barrier layer 104 may have openings 103OP and 104OP, respectively, corresponding to the transmission area TA. Due to this shape, the substrate 100 may include the groove 100GR. In other words, the groove 100GR of the substrate 100 may include the opening 104OP of the second inorganic barrier layer 104, the opening 103OP of the second base layer 103, and an upper surface 102S of the first inorganic barrier layer 102 exposed via the openings 104OP and 103OP.

The substrate 100 may include the groove 100GR in various shapes. For example, a portion of the upper surface (+z direction) of the first inorganic barrier layer 102 may be removed, whereas a lower surface (−z direction) of the second base layer 103 may remain without being removed. Due to the groove 100GR of the substrate 100, a thickness of the substrate 100 in the transmission area TA may decrease, and accordingly, the light transmittance in the transmission area TA may significantly increase. According to an embodiment, a buffer layer 111 may include a buffer hole 111H corresponding to the transmission area TA.

In the above-described embodiments, to increase the light transmittance of the transmission area TA, the substrate 100 may include a groove 100GR, or the buffer layer 111, the inorganic insulating layer IIL, the planarization layer 117, and the pixel defining layer 119 may respectively include the buffer hole 111H and the first through third holes H1 through H3 each corresponding to the transmission area TA. However, embodiments are not limited thereto.

Because the substrate 100, the buffer layer 111, the inorganic insulating layer IIL, the planarization layer 117, and the pixel defining layer 119 of the display panel 10 may include a material having a high light transmittance, the buffer hole 111H and the first through third holes H1 through H3 may not be included according to the types of the components 40 of FIG. 2 arranged or disposed below the component area CA.

FIGS. 27A through 27D are schematic cross-sectional views of respective portions of display panels 10 according to various embodiments. In detail, FIGS. 27A through 27D illustrate respective portions of component areas CA of the display panels 10 according to various embodiments.

Figure 27A:
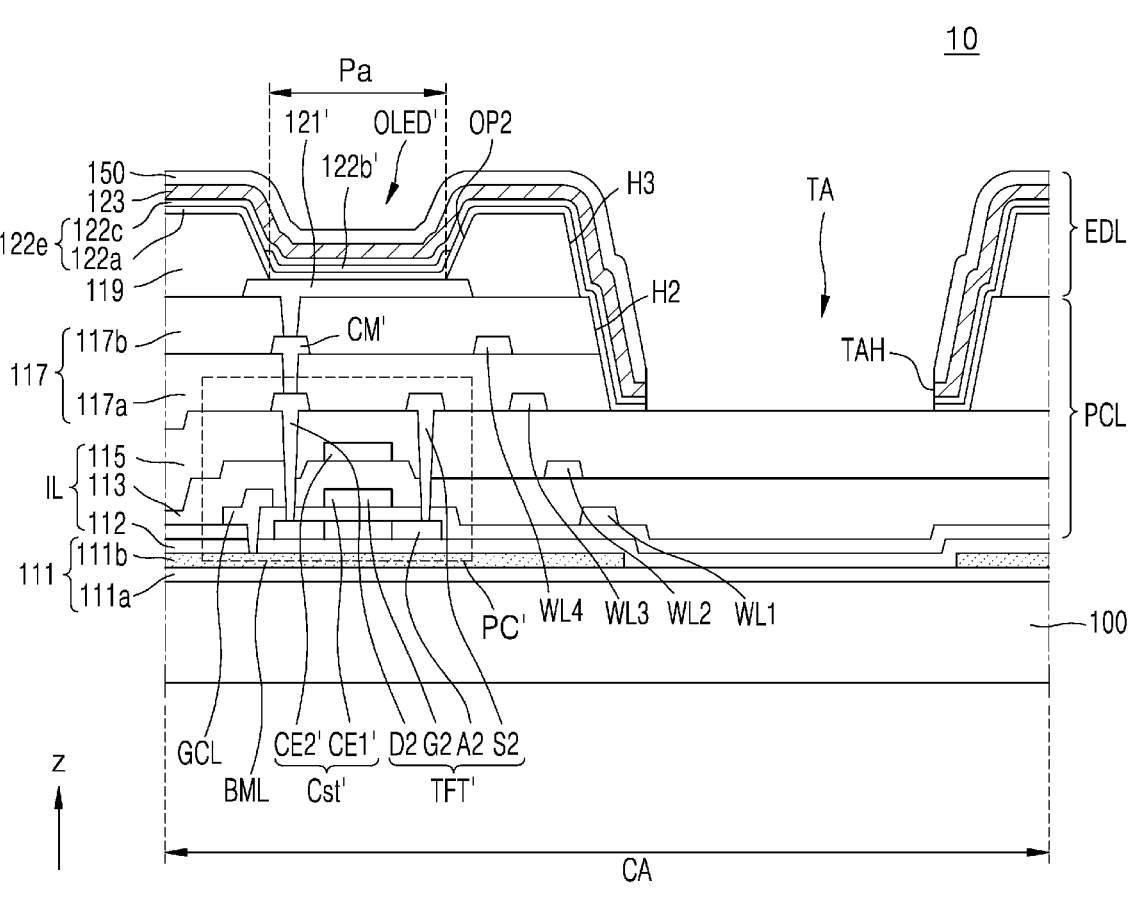
FIG. 27A is a schematic cross-sectional view of a portion or region of a display panel according to an embodiment.

Referring to FIG. 27A, an inorganic insulating layer IIL may continuously extend to correspond to a transmission area TA. Alternatively, at least one of a first gate insulating layer 112, a second gate insulating layer 113, and an interlayer insulating layer 115 of the inorganic insulating layer IIL may continuously extend to correspond to the transmission area TA. A planarization layer 117 and a pixel defining layer 119 may respectively include a second hole H2 and a third hole H3 exposing the upper surface of the inorganic insulating layer IIL, to correspond to the transmission area TA.

Figure 27B:
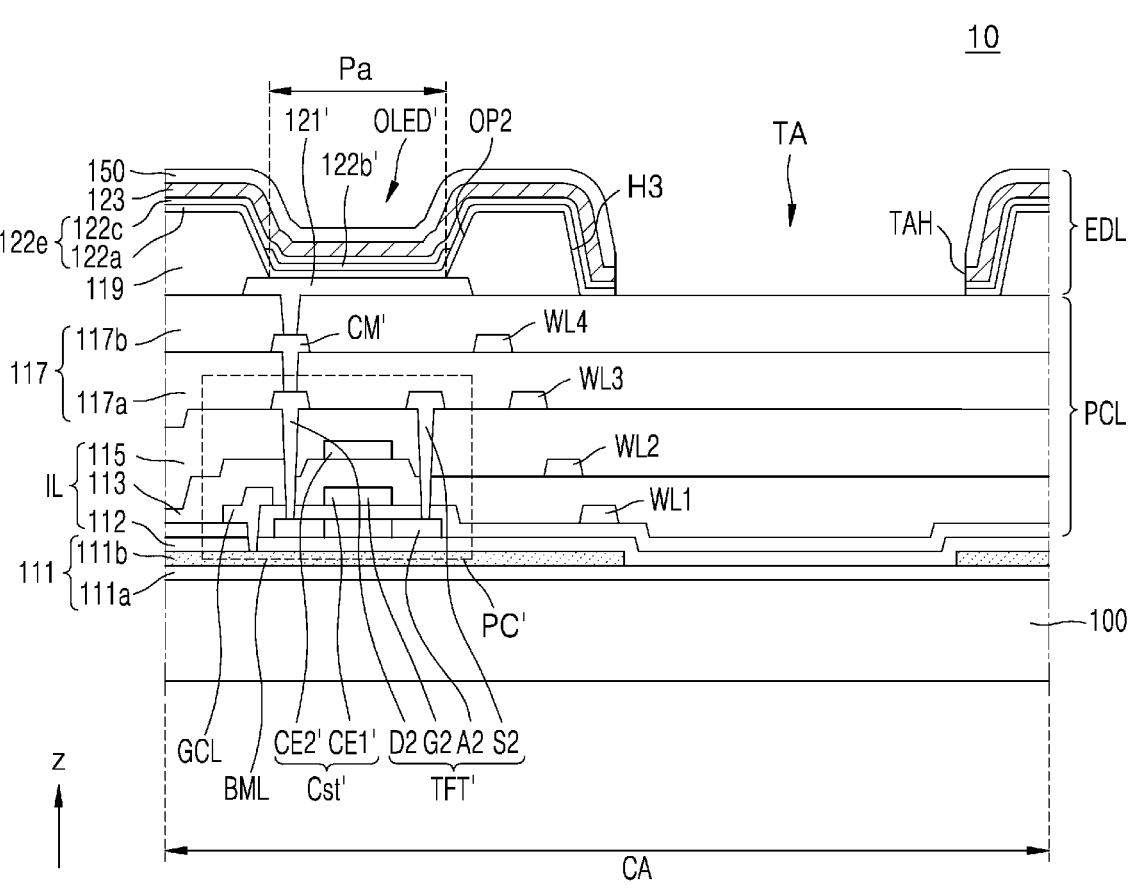
FIG. 27B is a schematic cross-sectional view of a portion or region of a display panel according to an embodiment.

Referring to FIG. 27B, the inorganic insulating layer IIL and the planarization layer 117 may continuously extend to correspond to the transmission area TA, and the pixel defining layer 119 may include the third hole H3 exposing the upper surface of the inorganic insulating layer IIL to correspond to the transmission area TA. Although not shown in FIG. 27B, the pixel defining layer 119 may also continuously extend to correspond to the transmission area TA.

Figure 27C:
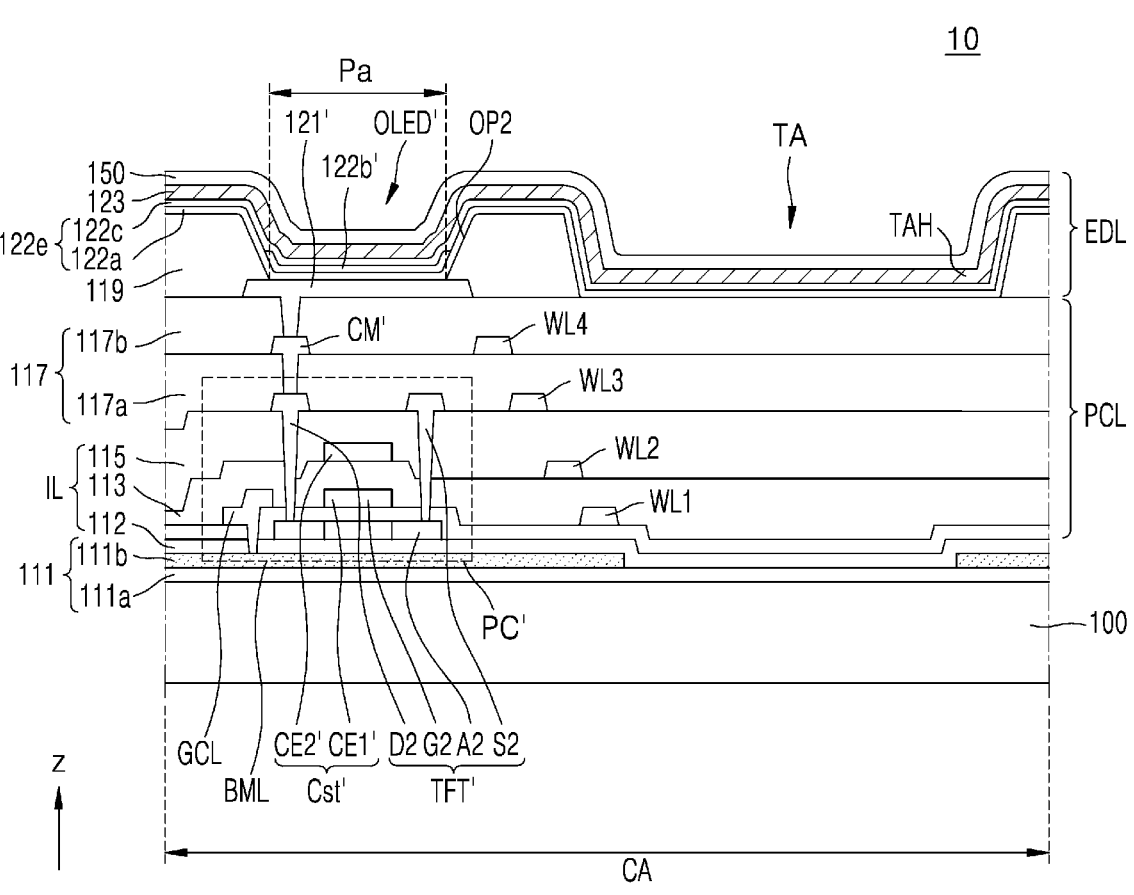
FIG. 27C is a schematic cross-sectional view of a portion or region of a display panel according to an embodiment.

Referring to FIG. 27C, an opposite electrode 123 may continuously extend to correspond to a transmission area TA. Because the opposite electrode 123 may include a material having a high light transmittance, even in a case that the opposite electrode 123 does not include transmission holes corresponding to the transmission area TA, the transmission area TA may have a certain or predetermined light transmittance.

Figure 27D:
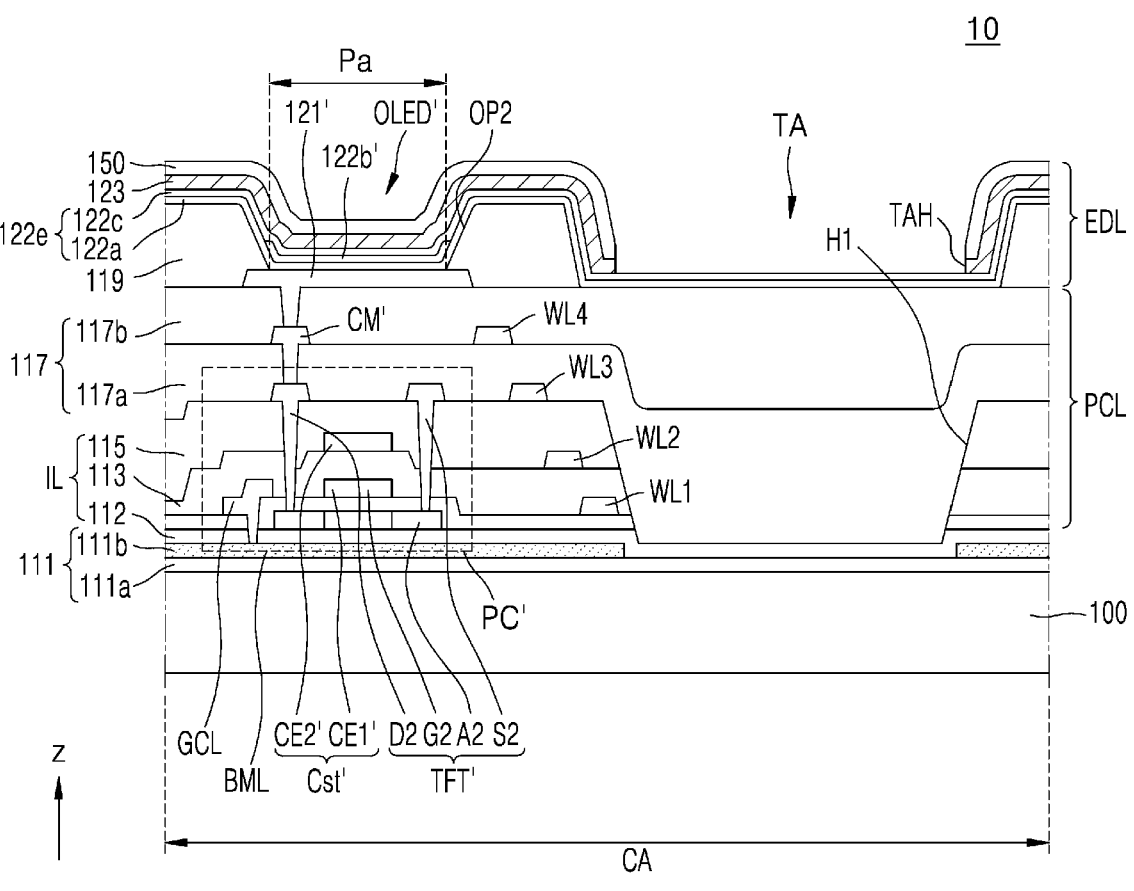
FIG. 27D is a schematic cross-sectional view of a portion or region of a display panel according to an embodiment.

Referring to FIG. 27D, an inorganic insulating layer IIL may include a first hole H1 corresponding to the transmission area TA, and a first planarization layer 117a and a second planarization layer 117b may fill the first hole H1. According to an embodiment, the first planarization layer 117a and the second planarization layer 117b may include a transparent organic material having a similar refractive index to the refractive indexes of the substrate 100 and the buffer layer 111. For example, the first planarization layer 117a and the second planarization layer 117b may include a siloxane-based organic material having a high light transmittance. Examples of the siloxane-based organic material may include hexamethyldisiloxane, octamethyltrisiloxane, decamethyltetrasiloxane, dodecamethylpentasiloxane, and polydimethylsiloxanes.

Due to the planarization layer 117, which may have a similar refractive index to the refractive indexes of the substrate 100 and the buffer layer 111, being arranged or disposed to correspond to the transmission area TA, a loss of the light transmittance of the transmission area TA due to a difference between the refractive indexes may be minimized.

Figure 28:
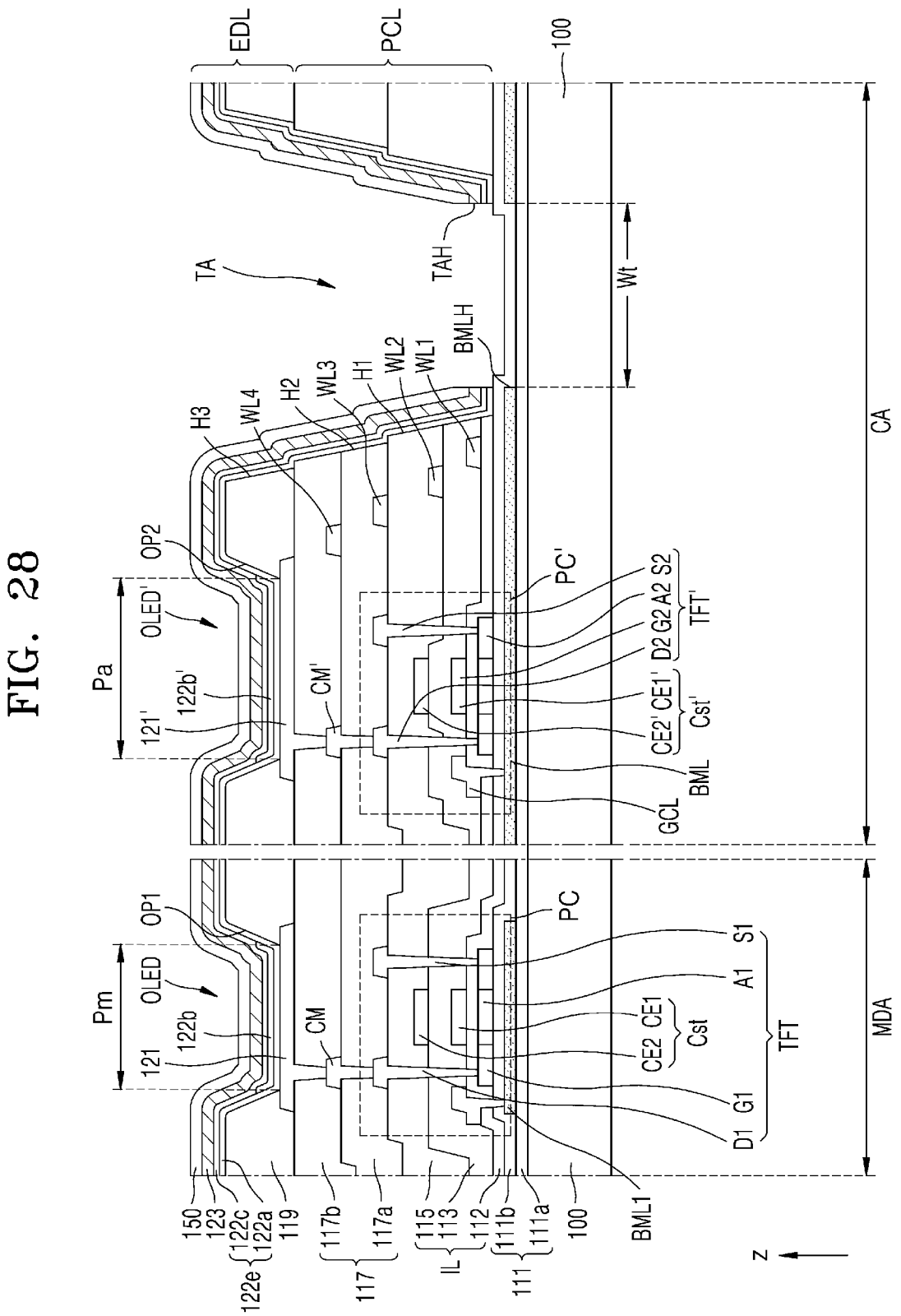
FIG. 28 is a schematic cross-sectional view of a portion or region of a display panel according to an embodiment.

FIG. 28 is a schematic cross-sectional view of a portion or region of a display panel according to an embodiment. The same reference numerals in FIGS. 24 and 28 denote the same elements, and thus repeated descriptions thereof are omitted.

Referring to FIG. 28, the size of an auxiliary subpixel Pa may be greater than that of a main subpixel Pm representing the same color as the auxiliary subpixel Pa. In other words, a second opening OP2 of the pixel defining layer 119 that defines the size of the auxiliary subpixel Pa may be larger than the first opening OP2 of the pixel defining layer 119 that defines the size of the main subpixel Pm.

Because the component area CA may include a transmission area TA, in a case that the auxiliary subpixel Pa has the same size as the main subpixel Pm and the same current is applied to the main and auxiliary organic light-emitting diodes OLED and OLED' realizing the main subpixel Pm and the auxiliary subpixel Pa, the brightness of the component area CA, taken as a whole, may be reduced. In a case that more current is applied to the auxiliary organic light-emitting diode OLED' arranged or disposed in the component area CA in order to compensate for the brightness of the component area CA, the auxiliary organic light-emitting diode OLED' may be easily degraded.

According to an embodiment, the auxiliary subpixels Pa in the component area CA have greater sizes than the main subpixels Pm representing the same color as the auxiliary subpixels Pa, thereby preventing degradation of the auxiliary organic light-emitting diodes OLED' and also compensating for the brightness of the component area CA. To this end, the component area CA may employ a pixel arrangement structure in which auxiliary subpixels Pa having large sizes may be included.

Figure 29A:
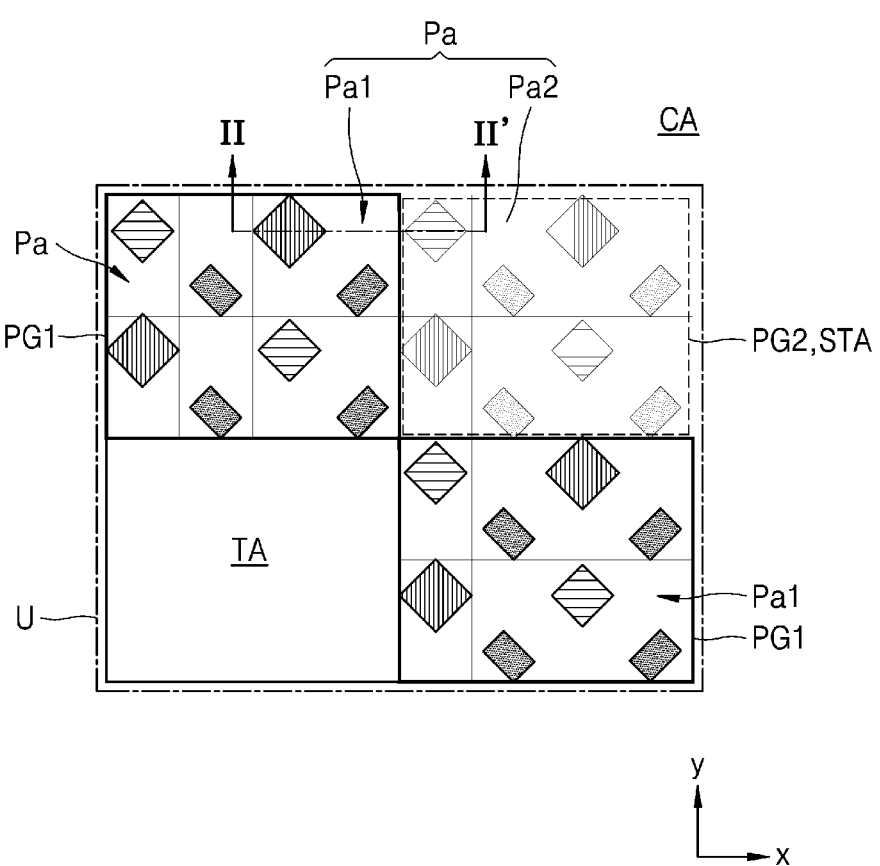
FIGS. 29A and 29B are schematic layout views illustrating pixel arrangement structures in a component area, according to an embodiment.
Figure 29B:
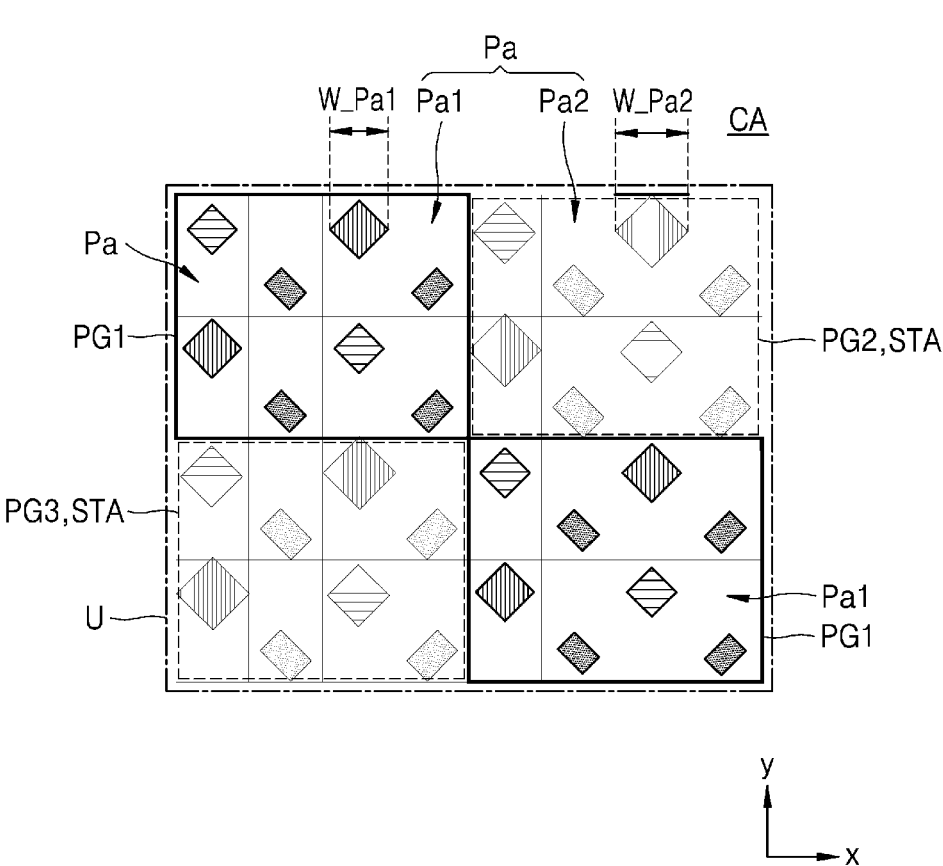

FIGS. 29A and 29B are schematic layout views illustrating pixel arrangement structures in the component area CA, according to an embodiment.

Referring to FIG. 29A, auxiliary subpixels Pa arranged or disposed in the component area CA may include first auxiliary subpixels Pa1 and second auxiliary subpixels Pa2 that are realized by display elements having different light transmittances. For example, a pixel electrode of a display element used to realize a first auxiliary subpixel Pa1 may include a reflective layer, and a pixel electrode of a display element used to realize a second auxiliary subpixel Pa2 may be included as a transparent electrode. Accordingly, an area in which a second pixel group PG2 including second auxiliary subpixels Pa2 may be arranged or disposed may be a semi-transmission area STA that may transmit a portion of light. In other words, the semi-transmission area STA may be defined as an area having a higher light transmittance than an area in which a first pixel group PG1 including first auxiliary subpixels Pa1 may be arranged or disposed, and having a lower light transmittance than a transmission area TA having no auxiliary subpixels arranged or disposed therein. Due to the second pixel group PG2 being arranged or disposed, the light transmittance of the component area CA may be secured and also resolution may increase.

In FIG. 29A, the transmission area TA may be arranged or disposed in the component area CA. However, in a case that the semi-transmission area STA may be arranged or disposed, no transmission areas TA may be included as in FIG. 29B. Shapes and a pixel arrangement structure of the second auxiliary subpixels Pa2 arranged or disposed in the semi-transmission area STA may vary. For example, the first auxiliary subpixels Pa1 may be arranged or disposed in a pentile structure, and the second auxiliary subpixels Pa2 may be arranged or disposed in a stripe structure.

Referring to FIG. 29B, auxiliary subpixels Pa arranged or disposed in the component area CA may include first auxiliary subpixels Pa1 and second auxiliary subpixels Pa2 that may be realized by display elements having different light transmittances. For example, a pixel electrode of a display element used to realize a first auxiliary subpixel Pa1 may include a reflective layer, and a pixel electrode of a display element used to realize a second auxiliary subpixel Pa2 may be included as a transparent electrode. In this case, a size W_Pa1 of a first auxiliary subpixel Pa1 may be less than a size W_Pa2 of a second auxiliary subpixel Pa2 representing the same color as the first auxiliary subpixel Pa1. Under the same condition, because the brightness of the second auxiliary subpixel Pa2 may be less than that of the first auxiliary subpixel Pa1, the brightnesses may be equalized by reducing the size of the first auxiliary subpixel Pa1. FIG. 29B may include the first pixel group PG1, the second pixel group PG2 and a third pixel group PG3.

Figure 30:
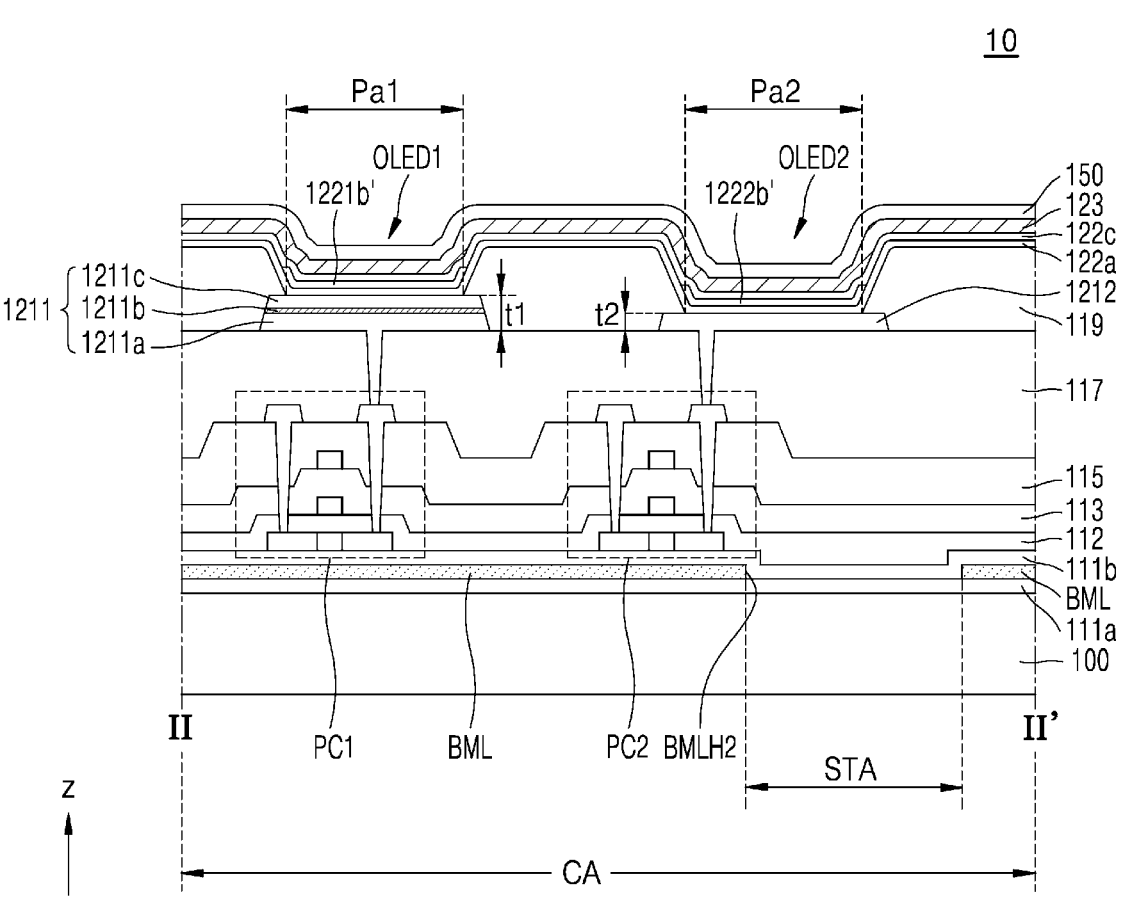
FIG. 30 is a schematic cross-sectional view taken along a line II-II' of FIG. 29A.

FIG. 30 is a schematic cross-sectional view of a component area CA according to an embodiment, and corresponds to a schematic cross-section taken along a line II-II' of FIG. 29A. The same reference numerals in FIGS. 17 and 30 denote the same elements, and thus repeated descriptions thereof are omitted.

Referring to FIG. 30, a first auxiliary subpixel Pa1 and a second auxiliary subpixel Pa2 may be arranged or disposed in the component area CA. The first auxiliary subpixel Pa1 may correspond to a light-emission area of a first organic light-emitting diode OLED1, and the second auxiliary subpixel Pa2 may correspond to a light-emission area of a second organic light-emitting diode OLED2.

The first organic light-emitting diode OLED1 may include a first pixel electrode 1211, a first functional layer 122a, a first emission layer 1221b', a second functional layer 122c, and an opposite electrode 123 that are sequentially stacked. The second organic light-emitting diode OLED2 may include a second pixel electrode 1212, the first functional layer 122a, a second emission layer 1222b', the second functional layer 122c, and the opposite electrode 123 that are sequentially stacked.

The first pixel electrode 1211 of the first organic light-emitting diode OLED1 may include a reflective layer 1211b. Because the first pixel electrode 1211 may include the reflective layer 1211b, light generated by the first emission layer 1221b' may be reflected by the reflective layer 1211b and emitted in an upward direction (+z direction) of the substrate 100. In other words, efficiency of emitted light in the upward direction of the substrate 100 may increase. According to an embodiment, the first pixel electrode 1211 may include a first transparent electrode layer 1211a, the reflective layer 1211b, and a second transparent electrode layer 1211c that are sequentially stacked.

The first transparent electrode layer 1211a and the second transparent electrode layer 1211c may include a transparent conductive oxide such as indium tin oxide (ITO), indium zinc oxide (IZO), zinc oxide (ZnO), indium oxide (In₂O₃), indium gallium oxide (IGO), or aluminum zinc oxide (AZO).

The reflective layer 1211b may include silver (Ag), magnesium (Mg), aluminum (Al), platinum (Pt), palladium (Pd), gold (Au), nickel (Ni), neodymium (Nd), iridium (Ir), chromium (Cr), or a compound of these materials.

The second pixel electrode 1212 of the second organic light-emitting diode OLED2 may include no reflective layers and may include a transparent conductive material. The second pixel electrode 1212 may include a transparent conductive oxide such as indium tin oxide (ITO), indium zinc oxide (IZO), zinc oxide (ZnO), indium oxide (In₂O₃), indium gallium oxide (IGO), or aluminum zinc oxide (AZO).

Because the second pixel electrode 1212 may include no reflective layers and may include a transparent conductive material, external light may be at least partially transmitted by the second pixel electrode 1212. In other words, a light/signal emitted by the component 40 or a light/signal incident upon the component 40 may pass through the second organic light-emitting diode OLED2. An area in which the second organic light-emitting diode OLED2 may be arranged or disposed may be referred to as a semi-transmission area STA. The semi-transmission area STA may be an area including a display element that may transmit light and may have a smaller light transmittance than the transmission area TA.

Because the second pixel electrode 1212 of the second organic light-emitting diode OLED2 may include no reflective layers, light generated by the second emission layer 1222b' may be emitted to the upper and lower sides of the substrate 100. Accordingly, a light emission rate of the second organic light-emitting diode OLED2 in the upward direction of the substrate 100 may be less than that of the first organic light-emitting diode OLED1 in the upward direction of the substrate 100. In other words, under the same condition, the brightness of the second auxiliary subpixel Pa2 may be less than that of the first auxiliary subpixel Pa1.

The second pixel electrode 1212 may be formed at the same time in a case that the first transparent electrode layer 1211a of the first pixel electrode 1211 is formed. Alternatively, a portion of the second pixel electrode 1212 may be formed when the first transparent electrode layer 1211a of the first pixel electrode 1211 may be formed, and the remaining portion thereof may be formed when the second transparent electrode layer 1211b of the first pixel electrode 1211 may be formed. Accordingly, a thickness t2 of the second pixel electrode 1212 may be less than a thickness t1 of the first pixel electrode 1211.

The first emission layer 1221b' of the first organic light-emitting diode OLED1 may emit light of the same color as the second emission layer 1222b' of the second organic light-emitting diode OLED2. Alternatively, the first emission layer 1221b' of the first organic light-emitting diode OLED1 may emit light of a different color from the second emission layer 1222b' of the second organic light-emitting diode OLED2.

The first organic light-emitting diode OLED1 may be driven by a first pixel circuit PC1, and the second organic light-emitting diode OLED2 may be driven by a second pixel circuit PC2. According to an embodiment, the second pixel circuit PC2 may be arranged or disposed to be minimally overlapped by the second pixel electrode 1212. The bottom metal layer BML may be arranged or disposed to be overlapped by the first pixel circuit PC1 and the second pixel circuit PC2. The bottom metal layer BML may include a bottom-hole BMLH2 corresponding to the semi-transmission area STA.

Figure 31:
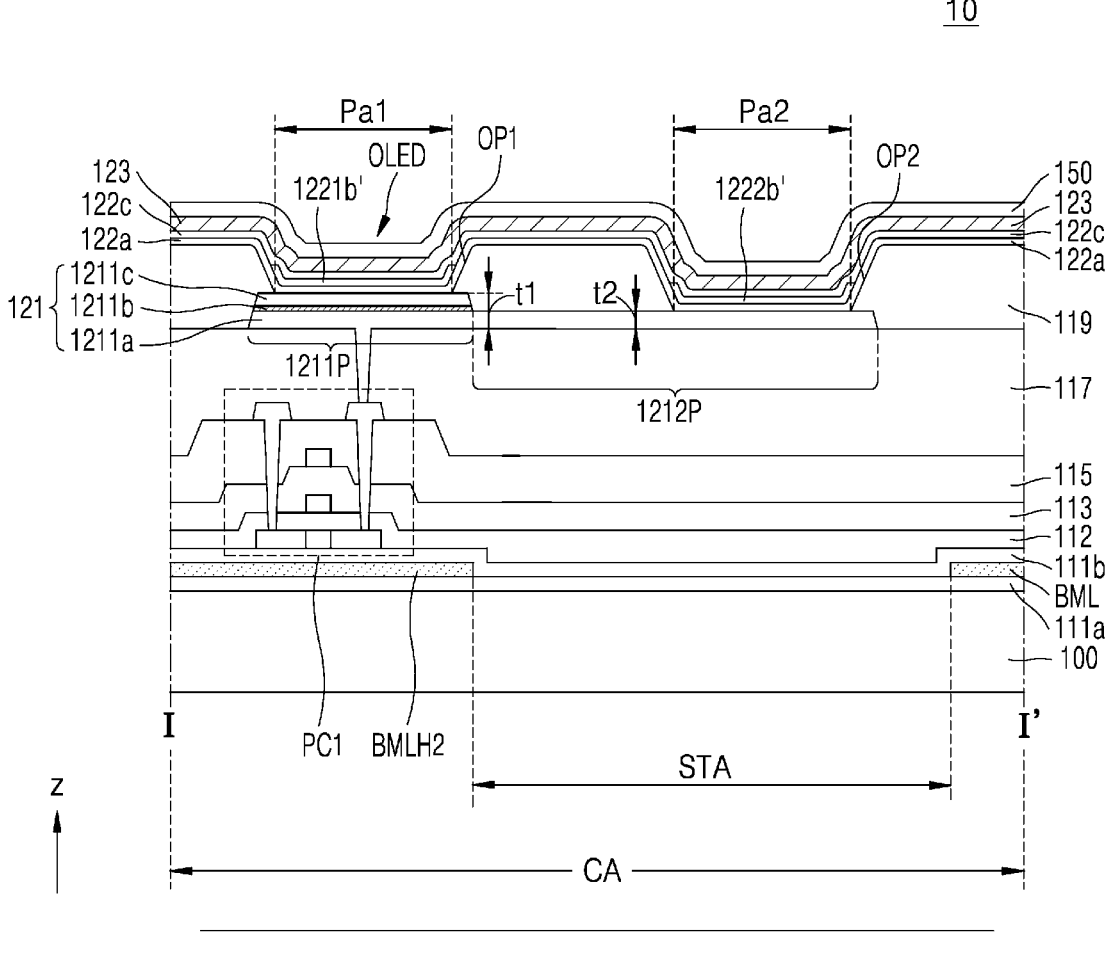
FIG. 31 is a schematic cross-sectional view of a portion or region of a display panel according to an embodiment.

FIG. 31 is a schematic plan view of a component area CA of a display panel 10 according to an embodiment. The same reference numerals in FIGS. 17 and 31 denote the same elements, and thus repeated descriptions thereof are omitted.

Referring to FIG. 31, one organic light-emitting diode OLED arranged or disposed in the component area CA may have two light-emission areas, and the two light-emission areas may correspond to the first auxiliary subpixel Pa1 and the second auxiliary subpixel Pa2, respectively.

According to an embodiment, a pixel electrode 121 of the organic light-emitting diode OLED may include a first pixel electrode unit 1211P having a reflective layer 1211b and a second pixel electrode unit 1212P including a transparent conductive material. A pixel defining layer 119 may include a first opening OP1 exposing the first pixel electrode unit 1211P and a second opening OP2 exposing the second pixel electrode unit 1212P, thereby defining the two light-emission areas.

A first emission layer 1221b' may be arranged or disposed within the first opening OP1, and a second emission layer 1222b' may be arranged or disposed within the second opening OP2. The first emission layer 1221b' may emit light of the same color as the second emission layer 1222b'. Alternatively, the first emission layer 1221b' may emit light of a different color from the second emission layer 1222b'.

The first pixel electrode unit 1211P may include a first transparent electrode layer 1211a, a reflective layer 1211b, and a second transparent electrode layer 1211c that are sequentially stacked. The second pixel electrode unit 1212P may be an extension of the first transparent electrode layer 1211a of the first pixel electrode unit 1211P. The second pixel electrode unit 1212P may include only the first transparent electrode layer 1211a, or may be a stack of the first transparent electrode layer 1211a and the second transparent electrode layer 1211c.

Because the second pixel electrode unit 1212P may include no reflective layers and may include a transparent conductive material, external light may be transmitted to a partial area of the organic light-emitting diode OLED. The second pixel electrode unit 1212P of the organic light-emitting diode OLED may be arranged or disposed in a semi-transmission area STA. A bottom metal layer BML may include a bottom-hole BMLH2 corresponding to the semi-transmission area STA.

Because the second pixel electrode unit 1212P of the organic light-emitting diode OLED may include no reflective layers, the brightness of the second auxiliary subpixel Pa2 may be less than that of the first auxiliary subpixel Pa1 under the same condition. A thickness t2 of the second pixel electrode unit 1212P may be less than a thickness t1 of the first pixel electrode unit 1211P. Because the first auxiliary subpixel Pa1 and the second auxiliary subpixel Pa2 are realized by a single organic light-emitting diode OLED, the first auxiliary subpixel Pa1 and the second auxiliary subpixel Pa2 may be driven simultaneously by a single pixel circuit PC.

Figure 32:
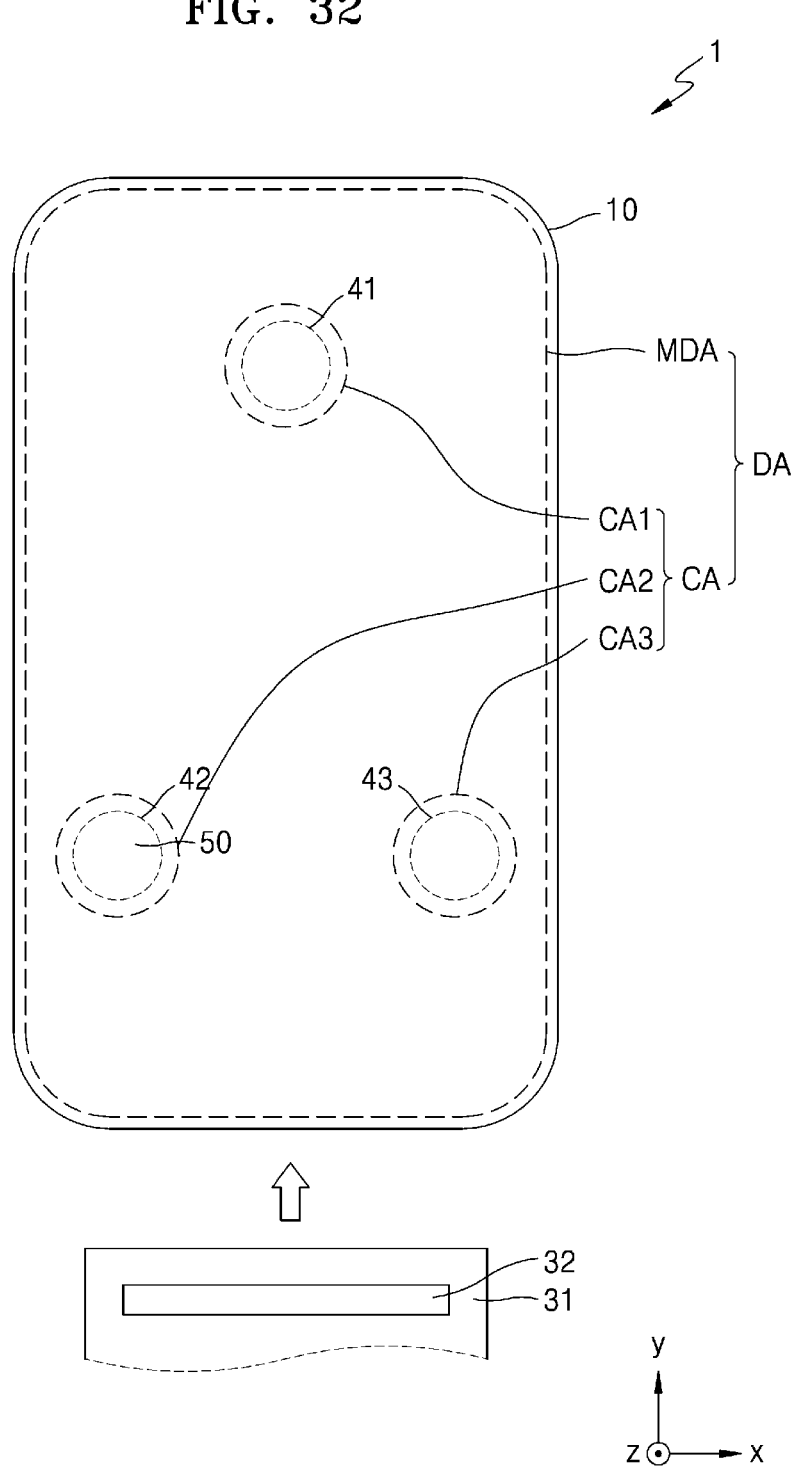
FIG. 32 is a plan view of a display panel and components arranged or disposed below the display panel, according to an embodiment.

FIG. 32 is a plan view of a display panel 10 and components arranged or disposed below the display panel 10, according to an embodiment.

Referring to FIG. 32, component areas CA may be included in the display area DA. Each component area CA may be substantially circular, and may be arranged or disposed inside the main display area MDA and thus may be surrounded by or be adjacent to the main display area MDA.

The component areas may be spaced apart from each other. For example, the component areas CA may include a first component area CA1 arranged or disposed in the center of an upper portion of the display panel 10, a second component area CA2 arranged or disposed in a left lower portion of the display panel 10, and a third component area CA3 arranged or disposed in a right lower portion of the display panel 10. First, second, and third components 41, 42, and 43 may be arranged or disposed below the display panel 10 to correspond to the first, second, and third component areas CA1, CA2, and CA3, respectively. The first, second, and third components 41, 42, and 43 may be cameras that capture images. In this case, because images may be captured at various angles, image compensation may be achieved based on images captured by the first, second, and third components 41, 42, and 43.

In a case that component areas CA are included, respective pixel arrangement structures and respective resolutions of the component areas CA may be different from each other. For example, the first through third component areas CA1 through CA3 may employ different pixel arrangement structures from among the pixel arrangement structures described above with reference to FIGS. 13A through 14F, FIG. 29A, and FIG. 29B. Alternatively, the first through third component areas CA1 through CA3 may be based on the same pixel arrangement structure but may include different resolutions. For example, respective base units of the first through third component areas CA1 through CA3 may include different numbers of auxiliary subpixels arranged or disposed therein.

Figure 33A:
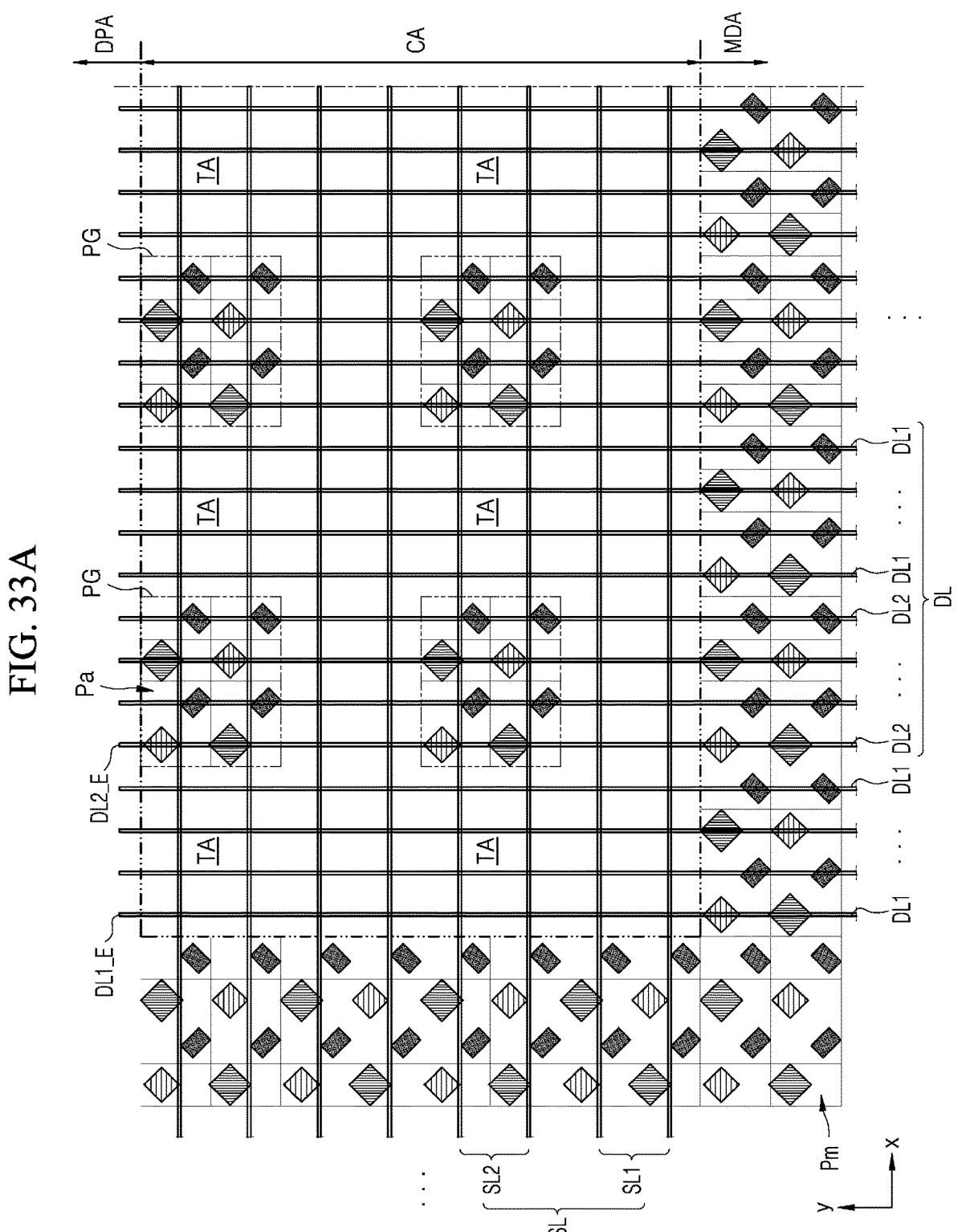
FIGS. 33A and 33B are schematic plan views illustrating arrangement relationships between sub-pixels and wires of a display panel according to an embodiment.
Figure 33B:
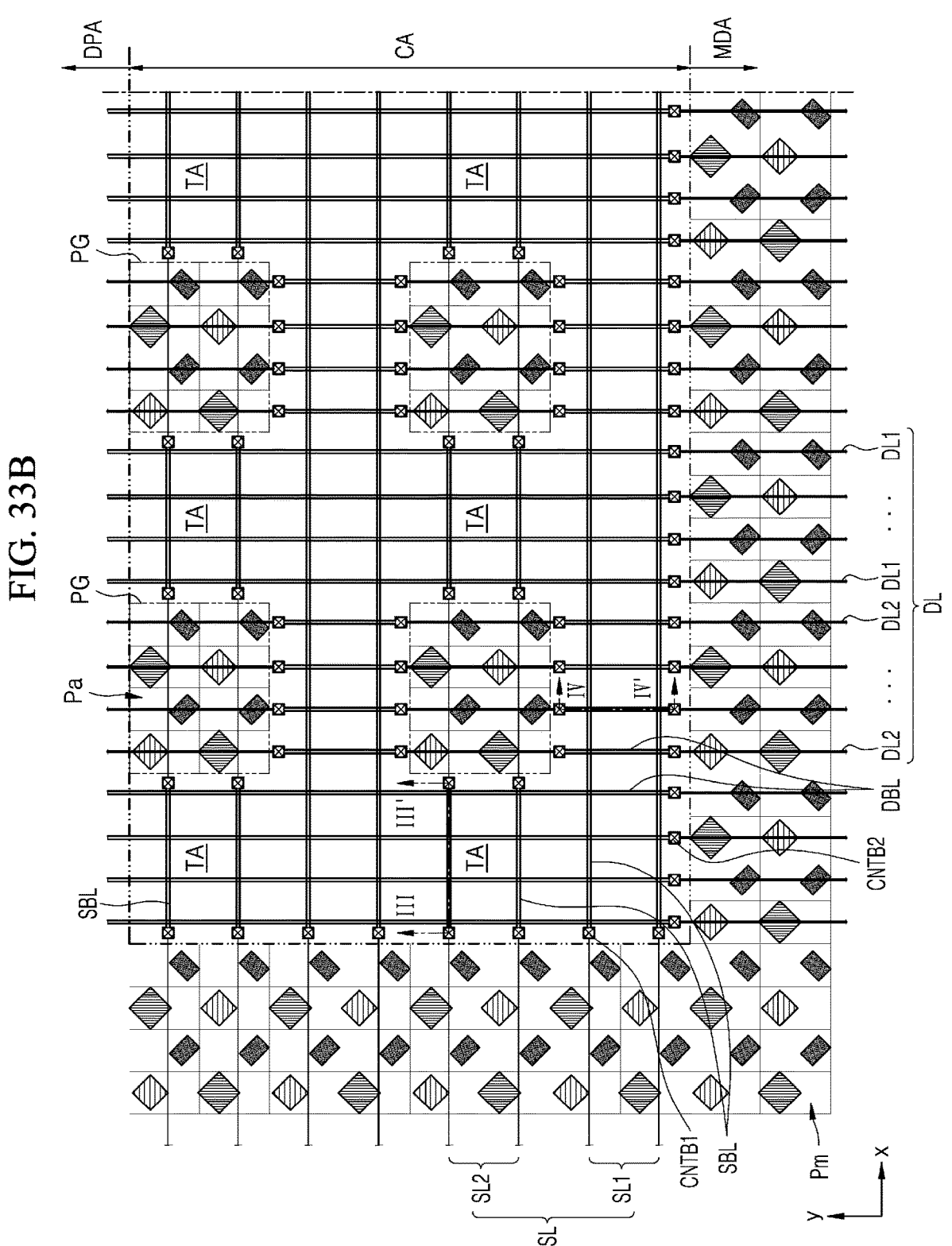

FIGS. 33A and 33B are schematic plan views illustrating arrangement relationships between sub-pixels and wires of a display panel according to an embodiment. Because these plan views illustrate only a portion of the display panel, more subpixels may be omitted. Because these plan views illustrate wires to facilitate description, more wires may also be omitted. Each of these plan views illustrates a component area CA and a main display area MDA and a peripheral area DPA located or disposed outside or adjacent to the component area CA.

The component area CA of FIGS. 33A and 33B may be a notch-type component area that may be inserted from a side of the display area DA into the center of the display area DA. However, an embodiment may also be applicable to a case where the component area CA may be a bar-type component area. In other words, the upper side of the component area CA may contact the peripheral area DPA and the lower side thereof may contact the main display area MDA. Although main and auxiliary subpixels Pm and Pa may be arranged or disposed in a pentile structure in FIGS. 33A and 33B, an embodiment may employ any of the above-described various pixel arrangement structures.

Referring to FIG. 33A, scan lines SL may each extend in the x direction and may transmit scan signals to the pixel circuits of main subpixels Pm and the pixel circuits of auxiliary subpixels Pa. Data lines DL may each extend in the y direction and may transmit data signals to the pixel circuits of the main subpixels Pm and the pixel circuits of the auxiliary subpixels Pa.

The scan lines SL may include first scan lines SL1 and second scan lines SL2. The first scan lines SL1 may each extend in the x direction and thus may electrically connect the pixel circuits of main subpixels Pm arranged or disposed on the same row within the main display area MDA to each other, but may not be electrically connected to the pixel circuits of the auxiliary subpixels Pa and may each extend over the transmission area TA of the component area CA. The second scan lines SL2 may each extend in the x direction and thus may electrically connect the pixel circuits of main subpixels Pm and the pixel circuits of auxiliary subpixels Pa arranged or disposed on the same row within the main display area MDA and the component area CA to each other.

The data lines DL may include first data lines DL1 and second data lines DL2. The first data lines DL1 may each extend in an approximate y direction and thus may electrically connect the pixel circuits of main subpixels Pm arranged or disposed on the same column within the main display area MDA to each other, and may each extend over the transmission area TA of the component area CA to the peripheral area DPA. An end DL1_E of each first data line DL1 may be located or disposed on an upper edge of the component area CA or in the peripheral area DPA.

The second data lines DL2 may each extend in the y direction and thus may electrically connect the pixel circuits of main subpixels Pm and the pixel circuits of auxiliary subpixels Pa arranged or disposed on the same column within the main display area MDA and the component area CA to each other. The data lines DL may be arranged or disposed on a different layer from the layer on which the scan lines SL may be arranged or disposed. According to an embodiment, the scan lines SL may be arranged or disposed on the same layer on which the first or second wire WL1 or WL2 of FIG. 25 may be arranged or disposed, and the data lines DL may be arranged or disposed on the same layer on which the third or fourth wire WL3 or WL4 of FIG. 25 may be arranged or disposed.

According to an embodiment, respective ends DL2_E of the second data lines DL2 may be at the same level as the respective ends DL1_E of the first data lines DL1. For example, the respective ends DL2_E of the second data lines DL2 may be located or disposed on an upper edge of the component area CA or in the peripheral area DPA, in order to include an electrical load of each second data line DL2 that may be the same level as that of each first data line DL1.

According to an embodiment, at least some or a predetermined number of the scan lines SL and the data lines DL may each extend over the transmission area TA. According to an embodiment, the scan lines SL and the data lines DL may include a transparent conductive material. For example, the scan lines SL and the data lines DL may include transparent conductive oxide such as indium tin oxide (ITO), indium zinc oxide (IZO), zinc oxide (ZnO), indium oxide ($In_2O_3$), indium gallium oxide (IGO), or aluminum zinc oxide (AZO). Because the wires arranged or disposed in the transmission area TA may include a transparent conductive material, the light transmittance of the transmission area TA may be maintained high.

According to an embodiment, at least some or a predetermined number of the scan lines SL and the data lines DL may each extend over the transmission area TA, but may include an opaque metal. The material included in the at least some or a predetermined number of scan lines SL and data lines DL may be appropriately selected by taking into account transmittance, according to the type of a component to be arranged or disposed to correspond to the component area CA.

In FIG. 33A, the scan lines SL and the data lines DL may each extend continuously over the main display area MDA and the component area CA. However, as shown in FIG. 33B, the scan lines SL and the data lines DL may be electrically connected to scan bridge lines SBL and data bridge lines DBL arranged or disposed on a different layer from the scan lines SL and the data lines DL, via contact holes CNTB1 and CNTB2 in some or a predetermined number of areas.

Figure 34:
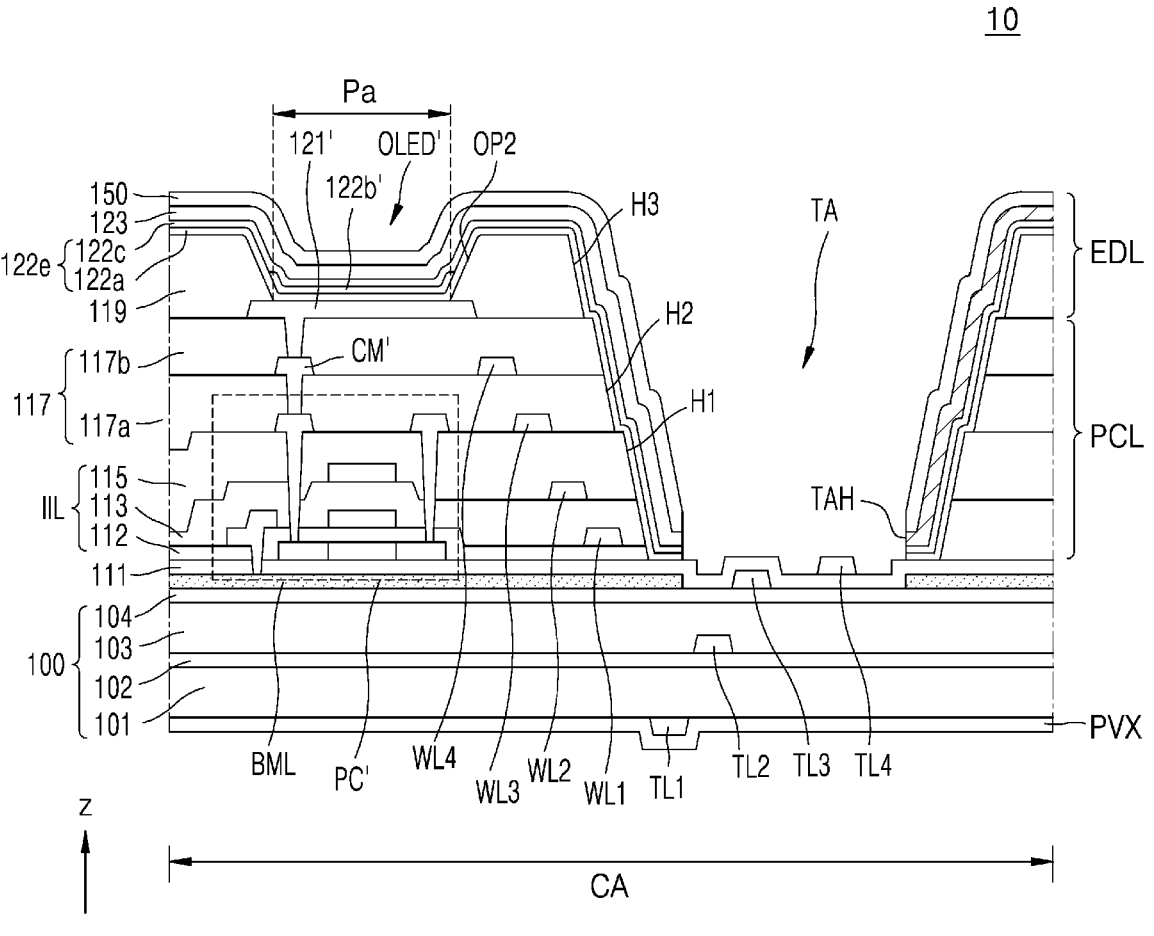
FIG. 34 is a schematic cross-sectional view of a display panel according to an embodiment, and illustrates wires arranged or disposed in a transmission area.

FIG. 34 is a schematic cross-sectional view of a display panel 10 according to an embodiment, and illustrates wires arranged or disposed in a transmission area. In detail, FIG. 34 illustrates the locations of transparent wires arranged or disposed in the transmission area TA in a case that the inorganic insulating layer IIL, the planarization layer 117, and the pixel defining layer 119 include the first through third holes H1 through H3 to correspond to the transmission area TA.

The substrate 100 of the display panel 10 may include the first base layer 101, the first inorganic barrier layer 102, the second base layer 103, and the second inorganic barrier layer 104 which are sequentially stacked.

A first transparent wire TL1 may be on a lower surface of the substrate 100. An inorganic protection layer PVX may be on the entire lower surface of the substrate 100 to cover or overlap the first transparent wire TL1. A second transparent wire TL2 may be between the first inorganic barrier layer 102 and the second base layer 103 of the substrate 100. A third transparent wire TL3 may be between the second inorganic barrier layer 104 and the buffer layer 111. A fourth transparent wire TL4 may be on the buffer layer 111.

The first through fourth transparent wires TL1 through TL4 may include conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

At least one of the first through fourth transparent wires TL1 through TL4 may function as a scan line SL or scan bridge line SBL that may transmit a scan signal, and another one thereof may function as a data line DL or data bridge line DBL that may transmit a data signal. In this case, the first through fourth transparent wires TL1 through TL4 may be electrically connected to the first through fourth wires WL1 through WL4 via contact holes.

According to an embodiment, the fourth transparent wire TL4 may be formed at the same time when the pixel electrode 121' is formed. The pixel electrode 121' may be a stack of a transparent conductive oxide and a reflective layer. For example, the pixel electrode 121' may be a stack structure of ITO/Ag/ITO.

Accordingly, ITO/Ag/ITO may be formed on the entire surface of the substrate 100 to form the pixel electrode 121' and the fourth transparent wire TL4, and the pixel electrode 121' of ITO/Ag/ITO and the fourth transparent wire TL4 of ITO may be formed via a process using a halftone mask or a slit mask.

Figure 35:
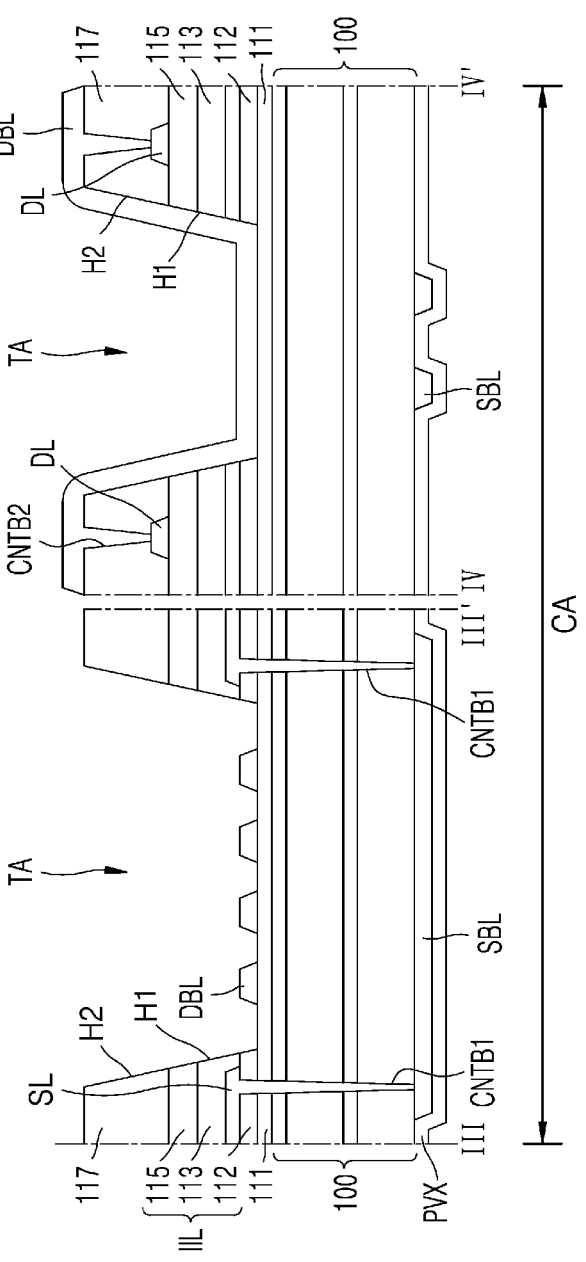
FIG. 35 is a schematic cross-sectional view of a display panel according to an embodiment, and illustrates schematic cross-sections taken along lines III-III' and IV-IV' of FIG. 33B.

FIG. 35 is a schematic cross-sectional view of a display panel according to an embodiment, and illustrates schematic cross-sections taken along lines III-III' and IV-IV' of FIG. 33B. In detail, FIG. 35 illustrates a structure in which a scan line SL and a data line DL may be electrically connected to bridge lines implemented as transparent wires.

Referring to FIG. 35, the scan line SL may be disposed on the first gate insulating layer 112, which may be the same layer on which the first wire WL1 of FIG. 34 may be arranged or disposed, around the transmission area TA, and a scan bridge line SBL may be disposed on the lower surface of the substrate 100, which may be disposed the same layer on which the first transparent wire TL1 may be arranged or disposed, to correspond to the transmission area TA. The scan line SL may be electrically connected to the scan bridge line SBL via the contact hole CNTB1 penetrating through the first gate insulating layer 112, the buffer layer 111, and the substrate 100.

The data line DL may be disposed on the interlayer insulating layer 115, which may be the same layer on which the third wire WL3 of FIG. 34 may be arranged or disposed, around the transmission area TA, and a data bridge line DBL may be on the same layer on which the fourth transparent wire TL4 may be arranged or disposed, to correspond to the transmission area TA. The data line DL may be electrically connected to the data bridge line DBL via the contact hole CNTB2 penetrating through the planarization layer 117, around the transmission area TA. The data bridge line DBL may be on a portion of the buffer layer 111 defined by the first hole H1 of the inorganic insulating layer IIL and the second hole H2 of the planarization layer 117, and the data bridge line DBL may be on the respective inner sidewalls of the first hole H1 of the inorganic insulating layer IIL and the second hole H2 of the planarization layer 117.

Although FIG. 35 illustrates that the scan bridge line SBL may be disposed on the same layer on which the first transparent wire TL1 may be arranged or disposed, and the data bridge line DBL may be on the same layer on which the fourth transparent wire TL4 may be arranged or disposed, embodiments are not limited thereto. For example, the scan bridge line SBL may be disposed on the same layer on which one of the second through fourth transparent wires TL2 through TL4 of FIG. 34 may be arranged or disposed, and the data bridge line DBL may be disposed on the same layer on which one of the first through third transparent wires TL1 through TL3 of FIG. 34 may be arranged or disposed.

Figure 36A:
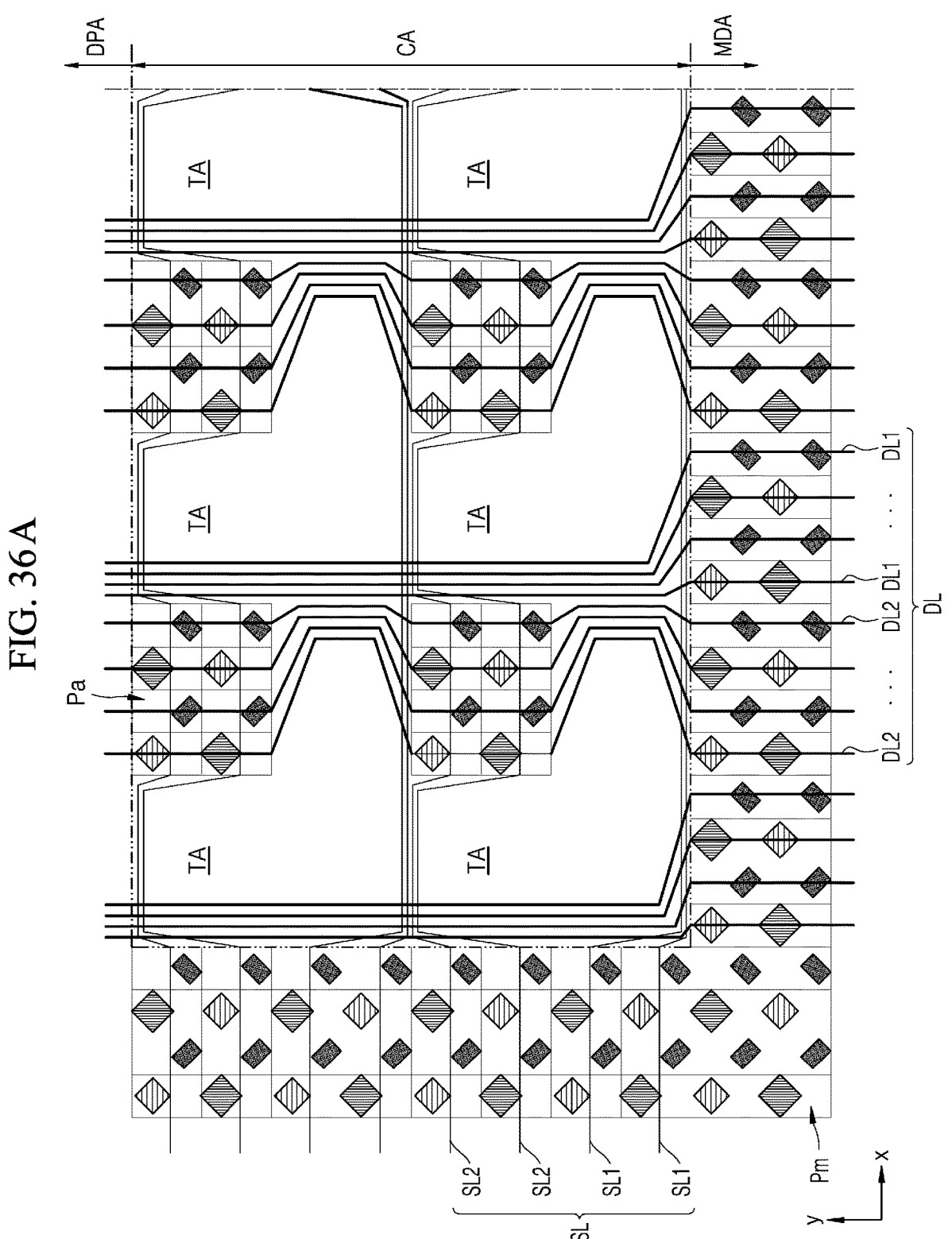
FIGS. 36A and 36B are schematic plan views illustrating arrangement relationships between sub-pixels and wires of a display panel according to an embodiment.
Figure 36B:
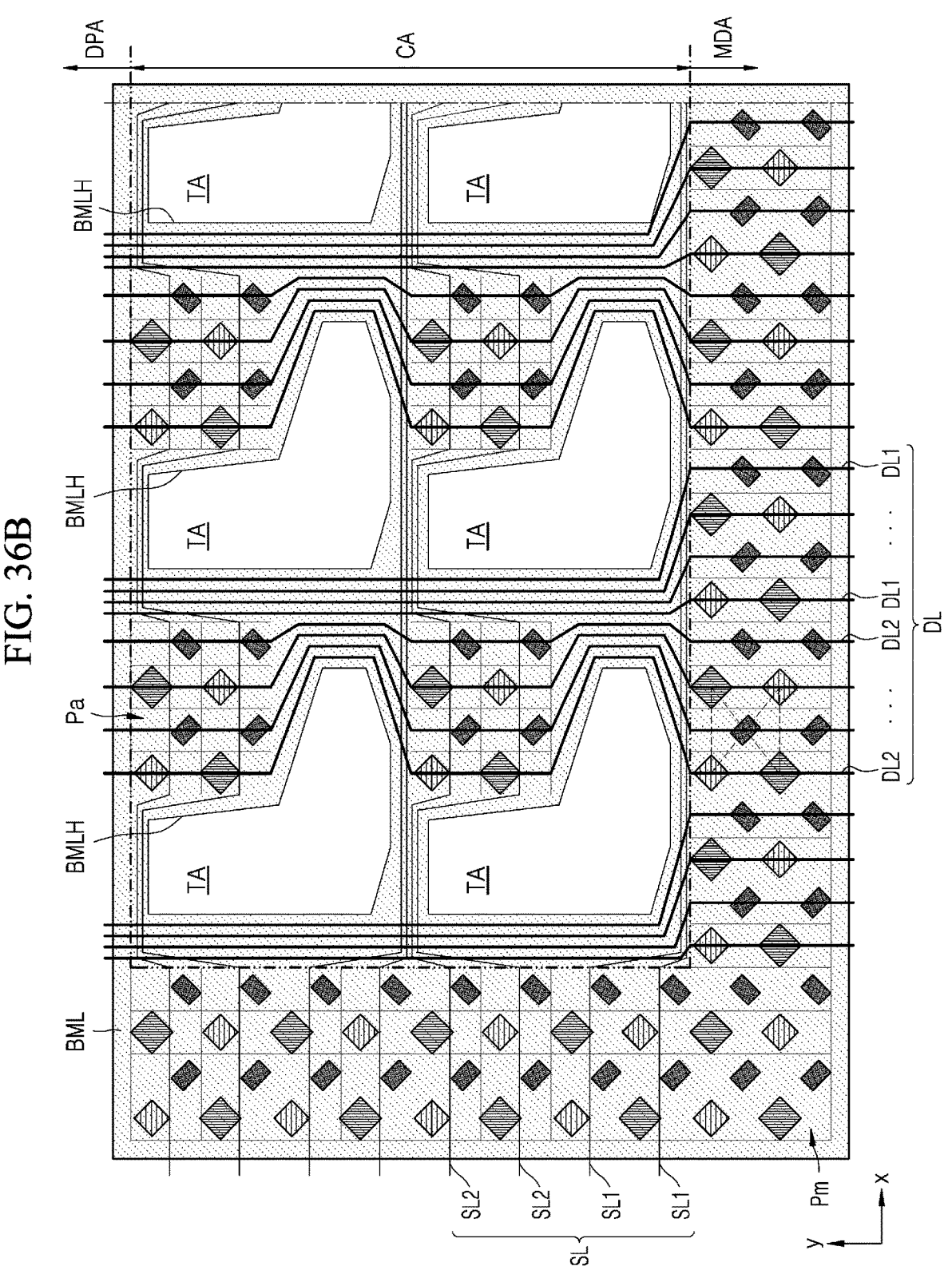

FIGS. 36A and 36B are schematic plan views illustrating arrangement relationships between sub-pixels and wires of a display panel according to an embodiment. Reference numerals in FIGS. 36A and 36B that are the same as the reference numerals in FIG. 33A denote the same elements, and thus repeated descriptions thereof are omitted.

Referring to FIG. 36A, scan lines SL and data lines DL arranged or disposed in the component area CA may not be at the center of the transmission area TA but may be biased on a side of the transmission area TA, in order to increase the light transmittance in the component area CA. To this end, the scan lines SL and the data lines DL arranged or disposed in the component area CA may be appropriately bent. Accordingly, an interval between scan lines SL passing between spaced-apart pixel groups PG may be less than that between scan lines SL passing the subpixels included in a pixel group PG. An interval between data lines DL passing between spaced-apart pixel groups PG may be less than that between data lines DL passing the subpixels included in a pixel group PG.

According to an embodiment, first data lines DL1 arranged or disposed between spaced-apart pixel groups PG may be biased on the left side, and second data lines DL2 arranged or disposed between spaced-apart pixel groups PG may be biased on the right side. According to an embodiment, first scan lines SL1 arranged or disposed between spaced-apart pixel groups PG may be biased on the lower side, and second scan lines SL2 arranged or disposed between spaced-apart pixel groups PG may be biased on the upper side.

According to this wire arrangement structure, the light transmittance of the transmission area TA and the light transmittance of the entire component area CA may improve. Because diffraction of light may occur with a decrease in the interval between the wires arranged or disposed in the component area CA, the bottom metal layer BML may be arranged or disposed to be overlapped by the wires arranged or disposed in the component area CA, as shown in FIG. 36B. According to an embodiment, the bottom metal layer BML may be arranged or disposed to correspond to the entire component area CA, and may include the bottom-hole BMLH corresponding to the transmission area TA. The shape of the bottom-hole BMLH may vary as described above with reference to FIGS. 16A through 16H.

Figure 37:
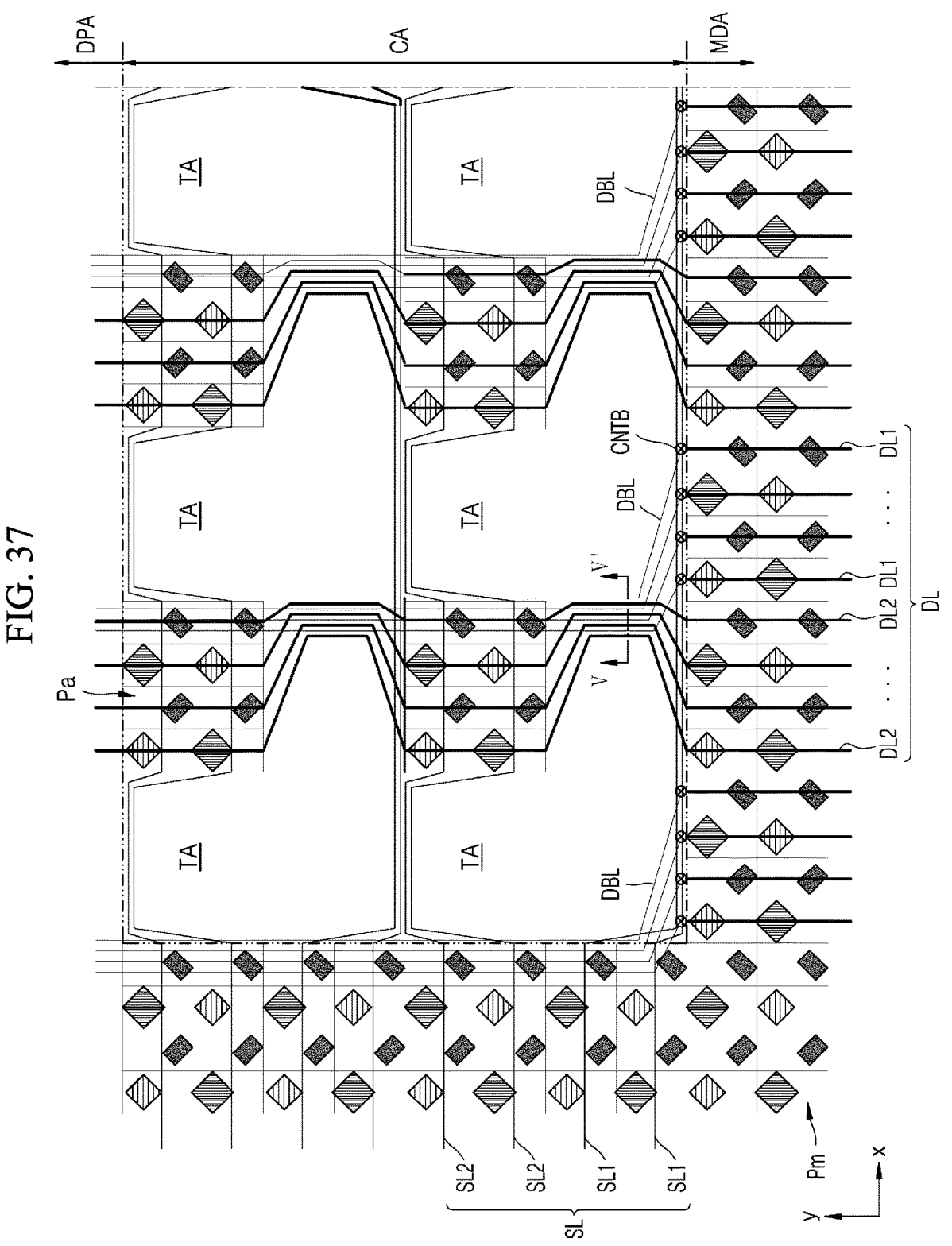
FIG. 37 is a schematic plan view illustrating an arrangement relationship between sub-pixels and wires of a display panel according to an embodiment.
Figure 38A:
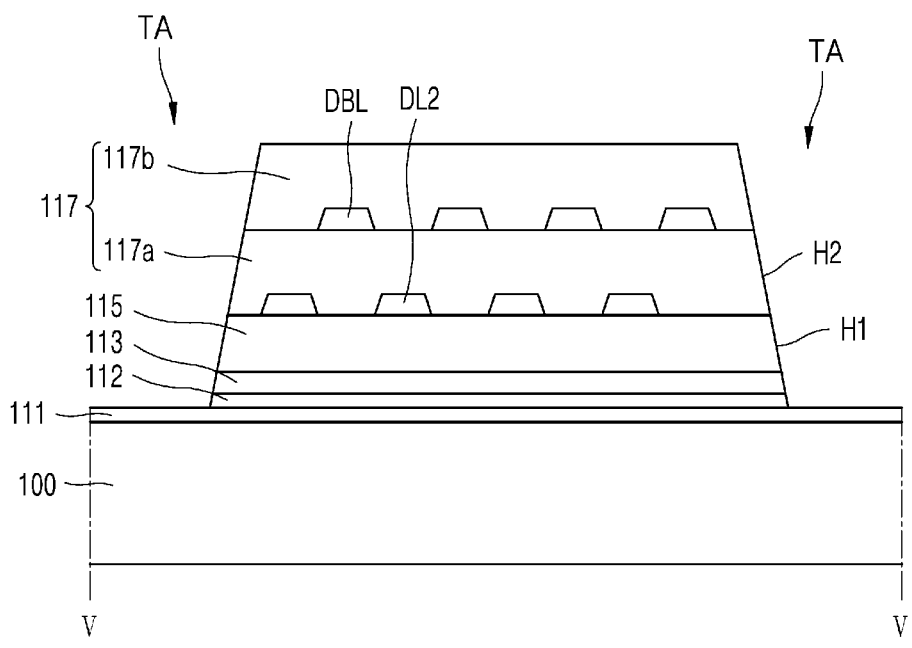
FIGS. 38A and 38B are schematic cross-sectional views taken along a line V-V' of FIG. 37.
Figure 38B:
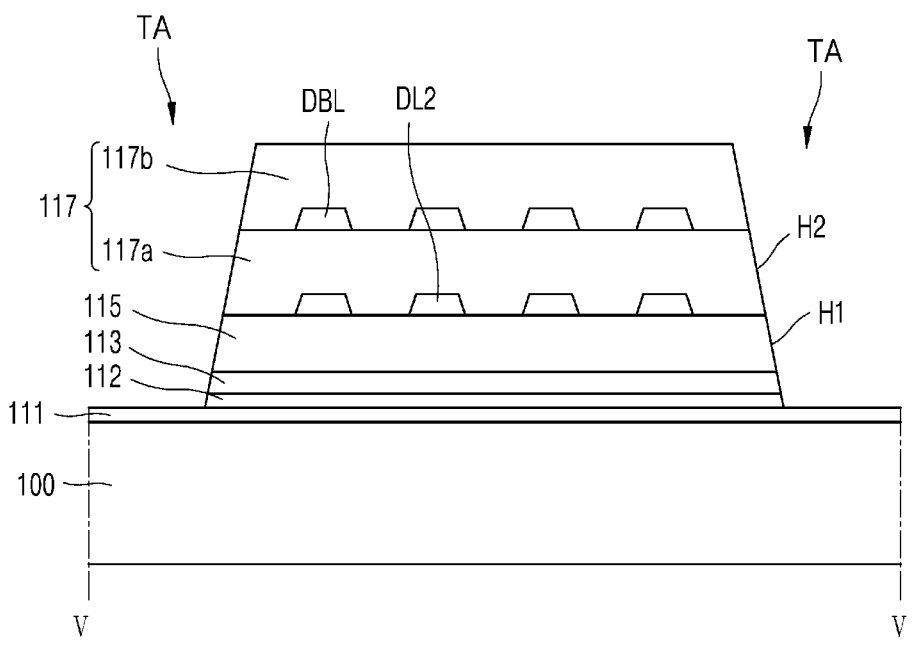

FIG. 37 is a schematic plan view illustrating an arrangement relationship between sub-pixels and wires of a display panel according to an embodiment. FIGS. 38A and 38B are schematic cross-sectional views taken along a line V-V' of FIG. 37. The same reference numerals in FIGS. 36A and 37 denote the same elements, and thus repeated descriptions thereof are omitted.

Referring to FIG. 37, each second data line DL2 may continuously extend from the main display area MDA to the component area CA, but each first data line DL1 may be electrically connected to each data bridge line DBL arranged or disposed on a different layer from the layer on which the first data line DL1 may be arranged or disposed, via a contact hole CNTB, on an edge of the component area CA. The second data lines DL2 may be arranged or disposed on a same layer on which the first data lines DL1 may be arranged or disposed.

Because the data bridge lines DBL may be arranged or disposed on a different layer from the layer on which the second data lines DL2 may be arranged or disposed, the data bridge lines DBL may be arranged or disposed adjacent to the second data lines DL2 or may overlap the second data lines DL2. For example, as shown in FIG. 38A, the data bridge lines DBL and the second data lines DL2 may alternate with each other in one direction. Alternatively, as shown in FIG. 38B, the data bridge lines DBL may overlap at least portions of the second data lines DL2.

Due to this structure, an area of the component area CA occupied by wires may be reduced, and thus the transmission area TA may be relatively expanded. Accordingly, the light transmittance of the component area CA may improve.

Figure 39:
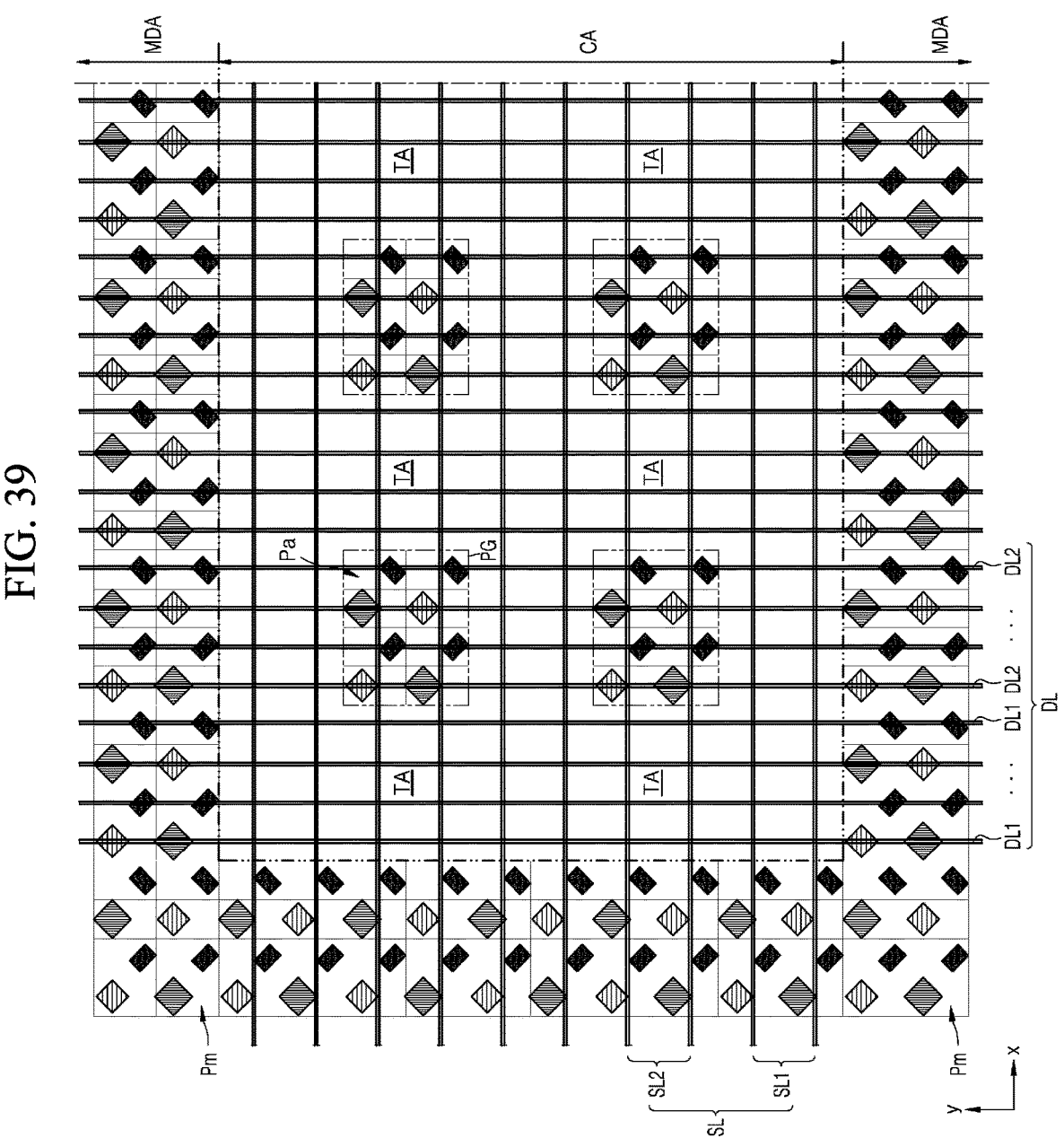
FIGS. 39 through 41 are schematic plan views illustrating arrangement relationships between sub-pixels and wires of a display panel, according to embodiments.
Figure 40:
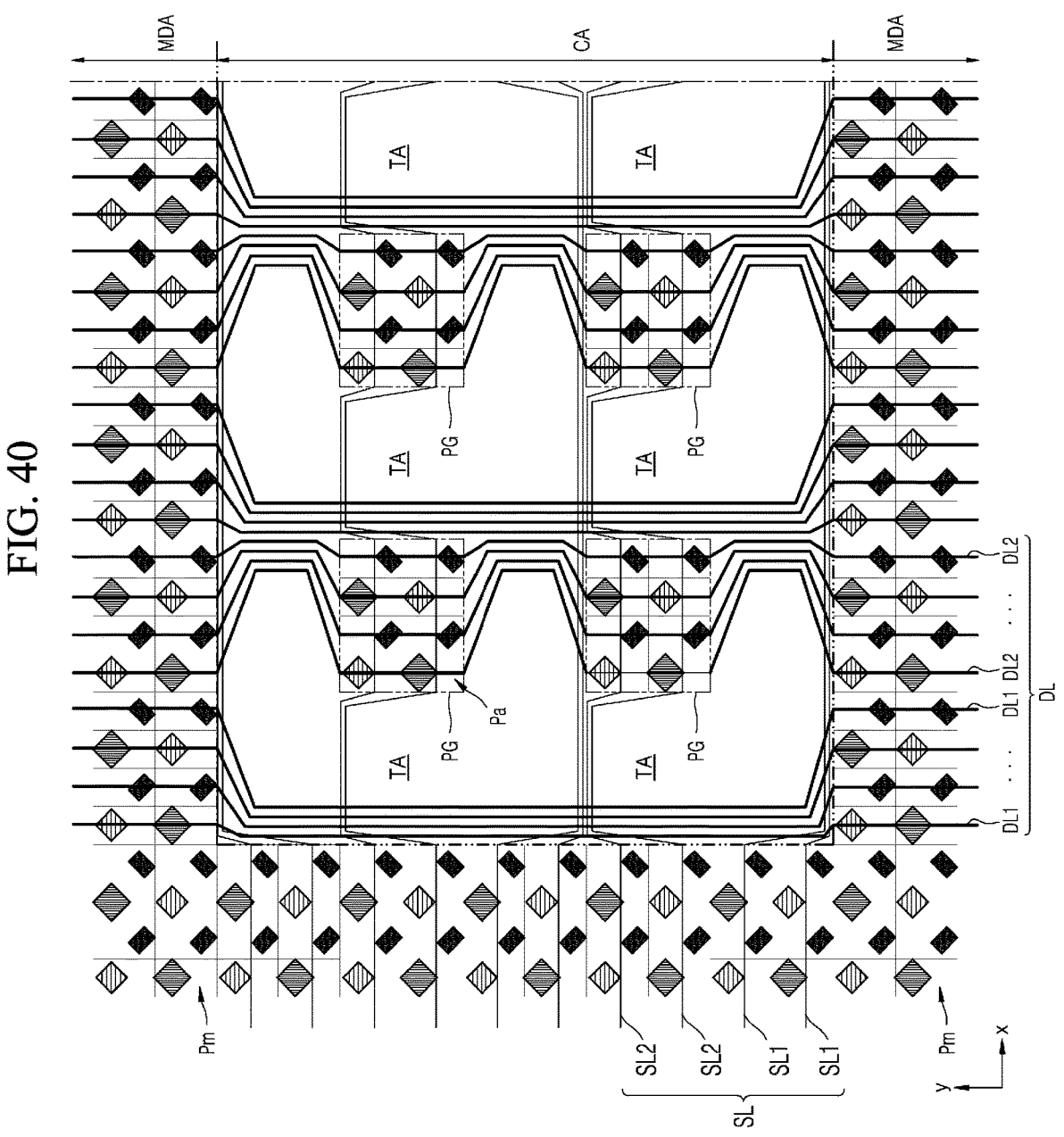
Figure 41:
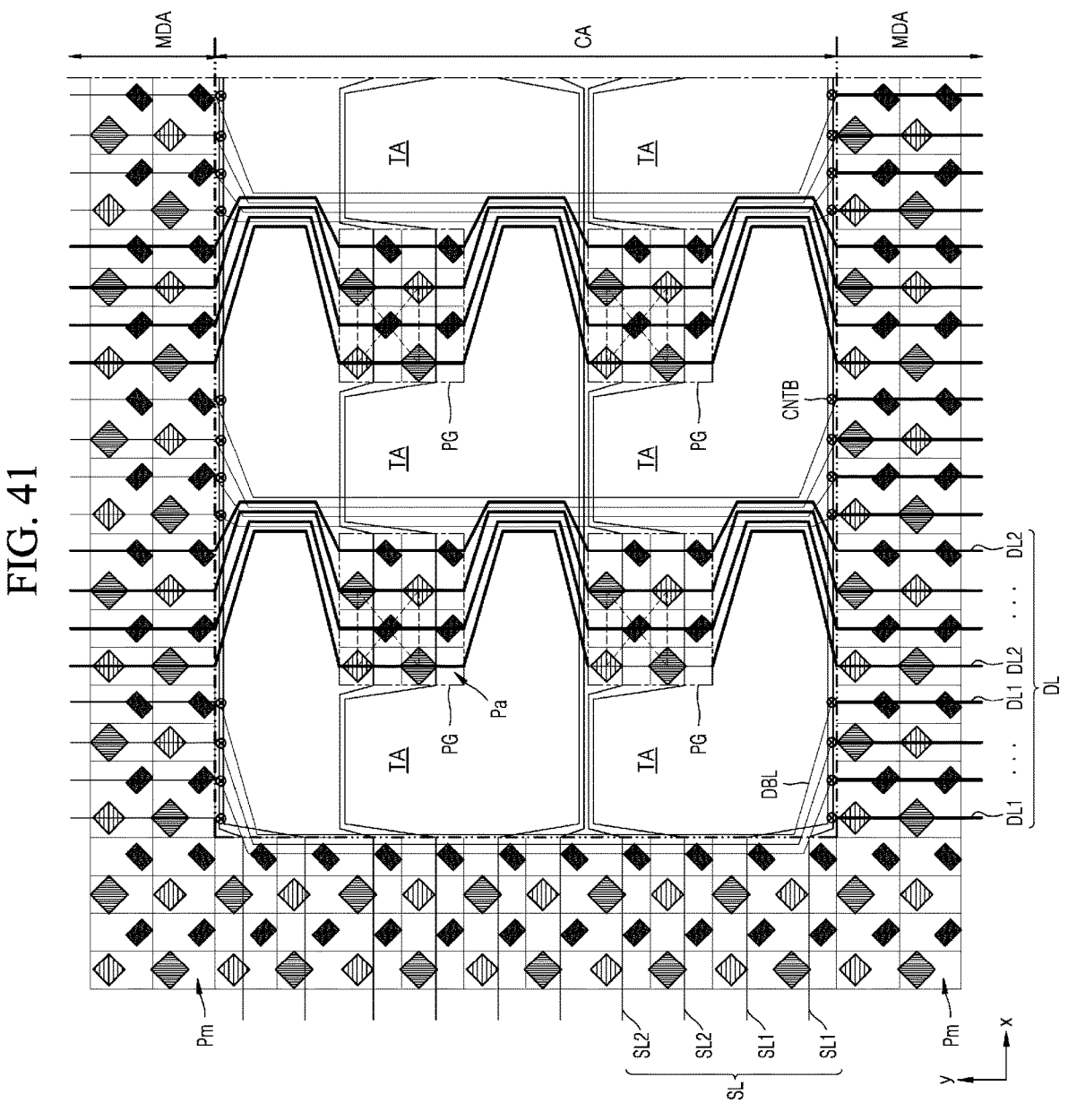

FIGS. 39 through 41 are schematic plan views illustrating arrangement relationships between sub-pixels and wires of a display panel, according to embodiments. Because these plan views illustrate a portion or region of the display panel, more subpixels may be omitted. Because these plan views illustrate wires necessary for description, more wires may also be omitted. These plan views illustrate a component area CA and a main display area MDA located or disposed outside the component area CA.

The component area CA of FIGS. 39 through 41 may be arranged or disposed inside the display area DA and surrounded by or be adjacent to the main display area MDA. In other words, the upper side and lower side of the component area CA may contact the main display area MDA. Although the auxiliary and main subpixels Pa and Pm may be arranged or disposed in a pentile structure in FIGS. 39 through 41, an embodiment may employ any of the above-described various pixel arrangement structures.

Referring to FIG. 39, scan lines SL may each extend in the x direction and may transmit scan signals to the pixel circuits of main subpixels Pm and the pixel circuits of auxiliary subpixels Pa. Data lines DL may each extend in the y direction and may transmit data signals to the pixel circuits of the main subpixels Pm and the pixel circuits of the auxiliary subpixels Pa.

The scan lines SL may include first scan lines SL1 and second scan lines SL2. The first scan lines SL1 may each extend in the x direction and thus may electrically connect the pixel circuits of main subpixels Pm arranged or disposed on the same row within the main display area MDA to each other, but may not be electrically connected to the pixel circuits of the auxiliary subpixels Pa and may each extend over the transmission area TA. The second scan lines SL2 may each extend in the x direction and thus may electrically connect the pixel circuits of main subpixels Pm and the pixel circuits of auxiliary subpixels Pa arranged or disposed on the same row within the main display area MDA and the component area CA to each other.

The data lines DL may include first data lines DL1 and second data lines DL2. The first data lines DL1 each may extend in an approximate y direction and thus electrically connect the pixel circuits of main subpixels Pm arranged or disposed on the same column to each other within a portion of the main display area MDA existing below the component area CA, and each traverses the transmission area Ta of the component area CA and electrically connects the pixel circuits of main subpixels Pm arranged or disposed on the same column to each other within a portion of the main display area MDA existing above the component area CA. The second data lines DL2 may each extend in the y direction and thus may electrically connect the pixel circuits of main subpixels Pm and the pixel circuits of auxiliary subpixels Pa arranged or disposed on the same column within the main display area MDA and the component area CA to each other. The data lines DL may be arranged or disposed on a different layer from the layer on which the scan lines SL may be arranged or disposed.

According to an embodiment, at least some or a predetermined number of the scan lines SL and the data lines DL may each extend over the transmission area TA. According to an embodiment, the scan lines SL and the data lines DL may include a transparent conductive material. For example, the scan lines SL and the data lines DL may include transparent conductive oxide such as indium tin oxide (ITO), indium zinc oxide (IZO), zinc oxide (ZnO), indium oxide ($In_2O_3$), indium gallium oxide (IGO), or aluminum zinc oxide (AZO). Because the wires traversing the transmission area TA include a transparent conductive material, the light transmittance of the transmission area TA may be maintained high.

According to an embodiment, at least some or a predetermined number of the scan lines SL and the data lines DL may each extend over the transmission area TA, but may include an opaque metal. The material included in the at least some or a predetermined number of scan lines SL and data lines DL may be appropriately selected by taking into account transmittance, according to the type of a component to be arranged or disposed to correspond to the component area CA.

Although the scan lines SL and the data lines DL may each extend continuously over the main display area MDA and the component area CA in FIG. 39, the scan lines SL and the data lines DL may be electrically connected to bridge lines arranged or disposed on a different layer from the scan lines SL and the data lines DL, in some or predetermined areas.

Referring to FIG. 40, scan lines SL and data lines DL arranged or disposed in the component area CA may not be at the center of the transmission area TA but may be biased on a side of the transmission area TA, in order to increase the light transmittance in the component area CA. To this end, the scan lines SL and the data lines DL arranged or disposed in the component area CA may be appropriately bent. Accordingly, an interval between scan lines SL passing between spaced-apart pixel groups PG may be less than that between scan lines SL passing the subpixels included in a pixel group PG. An interval between data lines DL passing between spaced-apart pixel groups PG may be less than that between data lines DL passing the subpixels included in a pixel group PG.

According to an embodiment, first data lines DL1 arranged or disposed between spaced-apart pixel groups PG may be biased on the left side, and second data lines DL2 arranged or disposed between spaced-apart pixel groups PG may be biased on the right side. According to an embodiment, first scan lines SL1 arranged or disposed between spaced-apart pixel groups PG may be biased on the lower side, and second scan lines SL2 arranged or disposed between spaced-apart pixel groups PG may be biased on the upper side.

According to this wire arrangement structure, the light transmittance of the transmission area TA and the light transmittance of the entire component area CA may improve. Because diffraction of light may occur with a decrease in the interval between wires arranged or disposed in the component area CA, a bottom metal layer may be arranged or disposed to be overlapped by the wires arranged or disposed in the component area CA.

Referring to FIG. 41, each second data line DL2 may continuously extend from the main display area MDA to the component area CA, but each first data line DL1 may be electrically connected to each data bridge line DBL arranged or disposed on a different layer from the layer on which the first and second data lines DL1 and D2 may be arranged or disposed, via a contact hole CNTB, on an edge of the component area CA.

Because the data bridge lines DBL may be arranged or disposed on a different layer from the layer on which the second data lines DL2 may be arranged or disposed, the data bridge lines DBL may be arranged or disposed adjacent to the second data lines DL2 or may overlap the second data lines DL2. Due to this structure, an area of the component area CA occupied by wires may be reduced, and thus the transmission area TA may be relatively expanded. Accordingly, the light transmittance of the component area CA may improve. Although not shown in the drawings, at least some or a predetermined number of the scan lines SL may be electrically connected to bridge lines arranged or disposed on a different layer from the layer on which the scan lines SL may be arranged or disposed.

Figure 42:
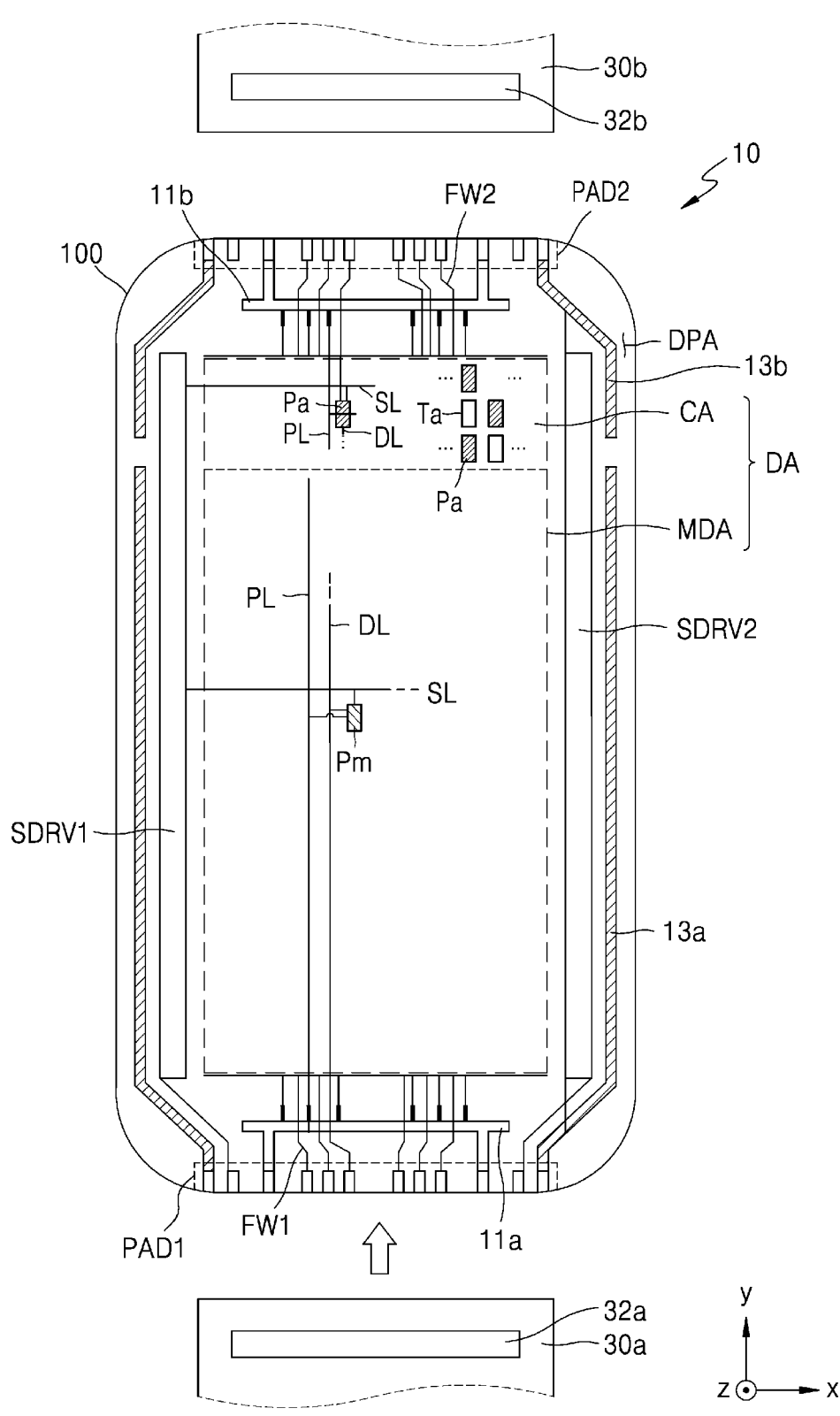
FIG. 42 is a schematic plan view of a display panel according to an embodiment.

FIG. 42 is a schematic plan view of a display panel 10 according to an embodiment. FIG. 42 may be different from FIG. 10 in that a main display area MDA and a component area CA respectively include a first display driving unit 32*a* and a second display driving unit 32*b*.

Referring to FIG. 42, various components that constitute the display panel 10 may be arranged or disposed on a substrate 100. The substrate 100 may include a display area DA and a peripheral area PDA surrounding or adjacent to the display area DA. The display area DA may include a main display area MDA on which a main image or images may be displayed, and a component area CA which may include a transmission area TA and on which an auxiliary image or images may be displayed. The auxiliary image may form a single entire image together with the main image, and may be an image independent from the main image.

Main subpixels Pm may be arranged or disposed in the main display area MDA, and auxiliary subpixels Pa may be arranged or disposed in the component area CA.

Pixel circuits that drive the main and auxiliary subpixels Pm and Pa may be electrically connected to outer circuits arranged or disposed in the peripheral area DPA, respectively. A first scan driving circuit SDRV1, a second scan driving circuit SDRV2, a first terminal unit PAD1, a second terminal unit PAD2, a first driving voltage supply line 11*a*, a second driving voltage supply line 11*b*, a first common voltage supply line 13*a*, and a second common voltage supply line 13*b* may be arranged or disposed in the peripheral area DPA.

The first scan driving circuit SDRV1 and the second scan driving circuit SDRV2 may apply scan signals, via scan lines SL, to the pixel circuits that drive the main and auxiliary subpixels Pm and Pa, respectively.

The first terminal unit PAD1 may be arranged or disposed on a side of the substrate 100. The first terminal unit PAD1 may be exposed without being covered or overlapped by an insulating layer, and may be electrically connected to a first display circuit board 30*a*. The first display driving unit 32*a* may be on the first display circuit board 30*a*. According to an embodiment, the first display driving unit 32*a* may be disposed on the peripheral area DPA of the display panel 10. The first display driving unit 32*a* may generate a data signal, a first driving voltage, a first common voltage, and the like that may be transmitted to the pixel circuits that may drive the main subpixels Pm arranged or disposed in the main display area MDA.

The first display driving unit 32*a* may generate control signals that are transmitted to the first scan driving circuit SDRV1 and the second scan driving circuit SDRV2. The first display driving unit 32*a* may supply the first driving voltage to the first driving voltage supply line 11*a*, and may supply the first common voltage to the first common voltage supply line 13*a*. The first driving voltage may be applied to the pixel circuits of the main subpixels Pm via a driving voltage line PL electrically connected to the first driving voltage supply line 11*a*, and the first common voltage may be electrically connected to the first common voltage supply line 13*a* and may be applied to the opposite electrodes of the display elements of the main subpixels Pm. The first display driving unit 32a may generate a data signal, and the generated data signal may be transmitted to the pixel circuits of the main subpixels Pm via first fanout wires FW1 and data lines DL electrically connected to the first fanout wires FW1.

The second terminal unit PAD2 may be arranged or disposed on another side of the substrate 100. The second terminal unit PAD2 may be exposed without being covered or overlapped by an insulating layer, and may be electrically connected to a second display circuit board 30b. The second display driving unit 32b may be on the second display circuit board 30b. According to an embodiment, the second display driving unit 32b may be on the peripheral area DPA of the display panel 10. The second display driving unit 32b may generate at least one of a data signal, a second driving voltage, and a second common voltage that may be transmitted to the pixel circuits that may drive the auxiliary subpixels Pa arranged or disposed in the component area CA.

The second display driving unit 32b may supply the second driving voltage to the second driving voltage supply line 11b, and may supply the second common voltage to the second common voltage supply line 13b. The second driving voltage may be applied to the pixel circuits of the auxiliary subpixels Pa via a driving voltage line PL electrically connected to the second driving voltage supply line 11b, and the second common voltage may be electrically connected to the second common voltage supply line 13b and may be applied to the opposite electrodes of the display elements of the auxiliary subpixels Pa. The second display driving unit 32b may generate a data signal, and the generated data signal may be transmitted to the pixel circuits of the auxiliary subpixels Pa via second fanout wires FW2 and data lines DL electrically connected to the second fanout wires FW2.

According to an embodiment, the second driving voltage provided by the second display driving unit 32b may be different from the first driving voltage provided by the first display driving unit 32a, and the second common voltage provided by the second display driving unit 32b may be different from the first common voltage provided by the first display driving unit 32a.

Because the number of auxiliary subpixels per unit area of the component area CA may be less than the number of main subpixels per unit area of the main display area MDA, when the same driving voltage and the same common voltage may be applied to the main display area MDA and the component area CA, the brightness of the component area CA may be small. According to an embodiment, the second display driving unit 32b driving the component area CA may be separately employed, and thus the brightness of the component area CA may be controlled.

According to an embodiment, due to the employment of the second display driving unit 32b driving the component area CA, the auxiliary subpixels Pa of the component area CA may not be driven while the components 40 of FIG. 2 below the component area CA are being driven, and thus noise caused by driving the auxiliary subpixels Pa may be reduced.

In FIG. 42, the second display circuit board 30b may be included. However, according to an embodiment, the second display circuit board 30b may not be included. In this case, the second terminal unit PAD2 may not be included either. The second display driving unit 32b may be arranged or disposed in the peripheral area DPA of the display panel 10 or may be arranged or disposed on the first display circuit board 30a. In this way, various modifications may be made.

Figure 43:
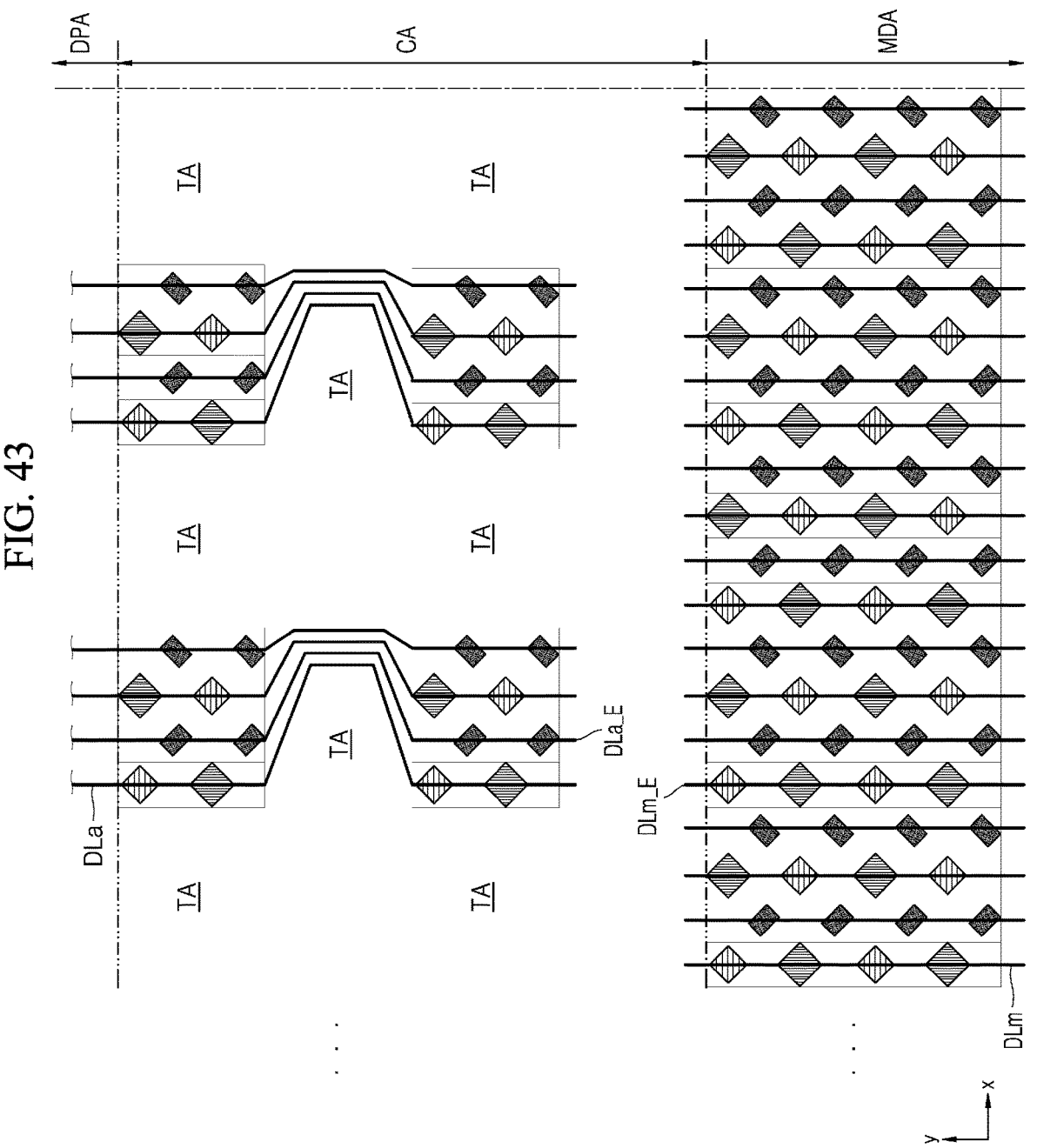
FIG. 43 is a schematic plan view illustrating an arrangement relationship between sub-pixels and wires of a display panel according to an embodiment.

FIG. 43 is a schematic plan view illustrating an arrangement relationship between sub-pixels and wires of a display panel according to an embodiment. FIG. 43 mainly describes main and auxiliary data lines DLm and DLa arranged or disposed in the component area CA and the main display area MDA around the component area CA in a case that the component area CA may be separately driven.

The component area CA of FIG. 43 may be of a bar-type. In other words, the upper side of the component area CA may contact the peripheral area DPA and the lower side thereof may contact the main display area MDA.

Referring to FIG. 43, the main data lines DLm may each extend in the +y direction within the main display area MDA, and may be electrically connected to the pixel circuits of the main subpixels Pm. The main data lines DLm may transmit first data signals generated by the first display driving unit 32a of FIG. 42 to the pixel circuits of the main subpixels Pm. The main data lines DLm may be arranged or disposed in approximately straight lines within the main display area MDA.

The auxiliary data lines DLa may each extend in the −y direction within the component area CA, and may be electrically connected to the pixel circuits of the auxiliary subpixels Pa. The auxiliary data lines DLa may transmit second data signals generated by the second display driving unit 32b of FIG. 42 to the pixel circuits of the auxiliary subpixels Pa. The auxiliary data lines DLa may be arranged or disposed to be biased on a side in a case that traversing the transmission area TA, in order to improve the transmittance of the transmission area TA. Accordingly, the auxiliary data lines DLa may be appropriately bent.

According to an embodiment, because the main subpixels Pm and the auxiliary subpixels Pa are driven by separate display driving units, the main data lines DLm and the auxiliary data lines DLa may not be connected to each other. In other words, respective ends DLm_E of the main data lines DLm may face respective ends DLa_E of the auxiliary data lines DLa and may be spaced apart therefrom.

Although not shown in FIG. 43, driving voltage lines that transmit driving voltages may also be separately included in the component area CA and the main display area MDA, like the main and auxiliary data lines DLm and DLa, and may have a similar aspect to the main and auxiliary data lines DLm and DLa.

Figure 44:
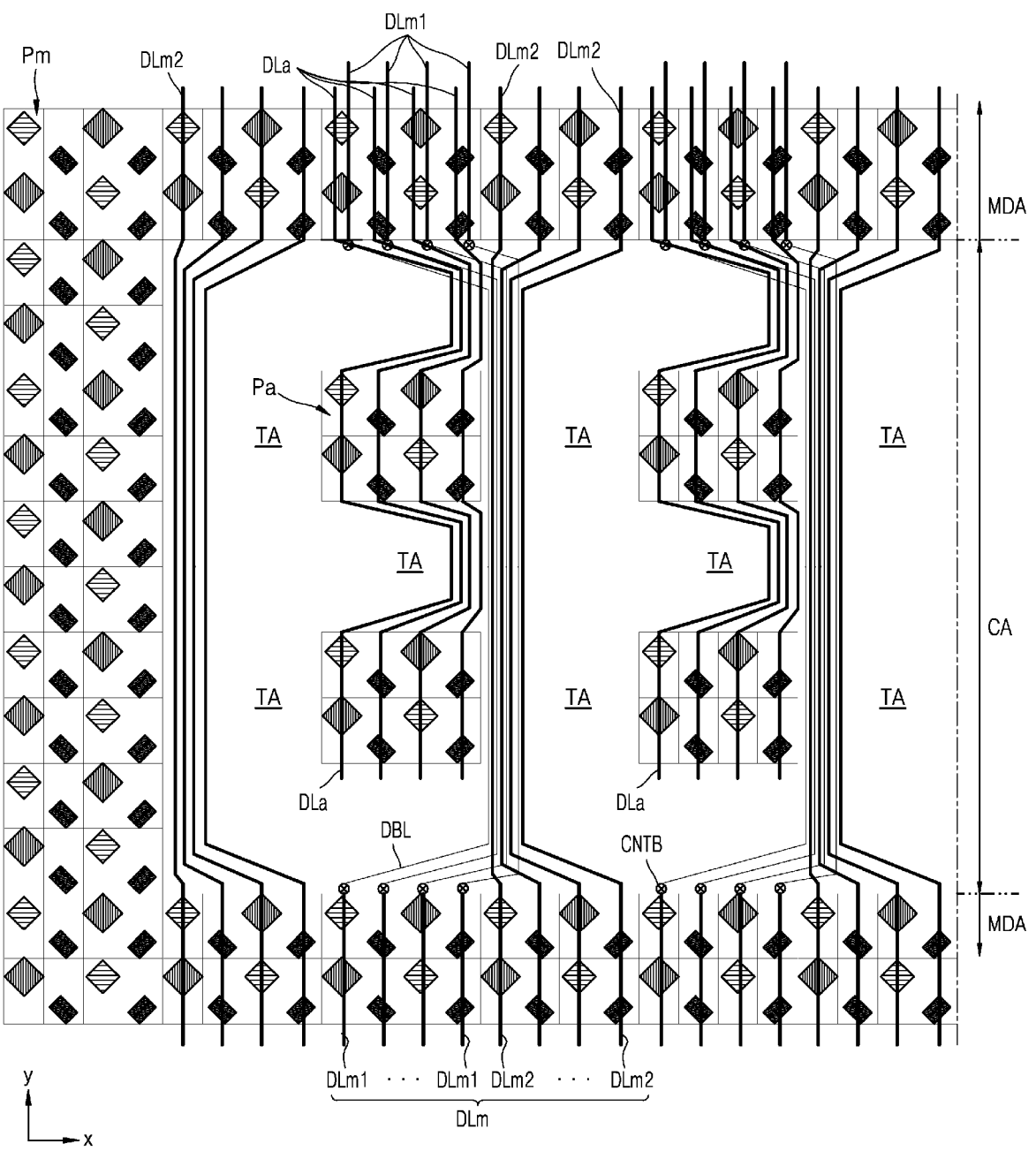
FIG. 44 is a schematic plan view illustrating an arrangement relationship between sub-pixels and wires of a display panel according to an embodiment.

FIG. 44 is a schematic plan view illustrating an arrangement relationship between sub-pixels and wires of a display panel according to an embodiment. FIG. 44 mainly describes data lines arranged or disposed in the component area CA and the main display area MDA around the component area CA in a case that the component area CA may be separately driven. The component area CA of FIG. 44 may be surrounded by or be adjacent to the main display area MDA. In other words, both the upper side and lower side of the component area CA may contact the main display area MDA.

Referring to FIG. 44, first main data lines DLm1 and second main data lines DLm2 may be arranged or disposed in the main display area MDA. The first main data lines DLm1 and the second main data lines DLm2 may transmit the first data signals generated by the first display driving unit 32a of FIG. 42 to the pixel circuits of the main subpixels Pm.

The first main data lines DLm1 may be discontinuous around the component area CA, and may be electrically connected to bridge lines DBL arranged or disposed on a different layer from the first main data lines DLm1 via contact holes CNTB. The second main data lines DLm2 may traverse the transmission area TA of the component area CA and may be electrically connected to the pixel circuits of the main subpixels Pm arranged or disposed above and below the component area CA. The second main data lines DLm2 may be disposed on the same layer on which the first main data lines DLm1 may be arranged or disposed. For example, the second main data lines DLm2 and the first main data lines DLm1 may be on the interlayer insulating layer 115, which may be the same layer on which the third wire WL3 of FIG. 25 may be arranged or disposed. The bridge lines DBL may be disposed on the first planarization layer 117a, which may be the same layer on which the fourth wire WL4 of FIG. 25 may be arranged or disposed.

The bridge lines DBL and the second main data lines DLm may be appropriately bent and biased on a side of each pixel group PG, to secure a transmittance of the transmission area TA. Because the bridge lines DBL and the second main data lines DLm are on different layers, the bridge lines DBL and the second main data lines DLm may be adjacent to each other or at least partially overlap each other in a case that traversing the component area CA. Thus, the transmittance of the transmission area TA may improve.

The auxiliary data lines DLa may each extend in the −y direction within the component area CA, and may be electrically connected to the pixel circuits of the auxiliary subpixels Pa. The auxiliary data lines DLa may transmit the second data signals generated by the second display driving unit 32b of FIG. 42 to the pixel circuits of the auxiliary subpixels Pa. The auxiliary data lines DLa may be arranged or disposed to be biased on a side in a case that traversing the transmission area TA, in order to improve the transmittance of the transmission area TA. Accordingly, the auxiliary data lines DLa may be appropriately bent.

According to an embodiment, the auxiliary data lines DLa may be disposed on the same layer on which the first main data lines DLm1 and the second main data lines DLm2 may be arranged or disposed. However, embodiments are not limited thereto. For example, the auxiliary data lines DLa may be disposed on the same layer on which the bridge lines DBL may be arranged or disposed.

The auxiliary data lines DLa may be arranged or disposed in a portion of the main display area MDA located or disposed above the component area CA, but the auxiliary data lines DLa may not be electrically connected to the pixel circuits of the main subpixels Pm. Respective ends of the auxiliary data lines DLa may be within the component area CA. The respective ends of the auxiliary data lines DLa may face respective ends of the first main data lines DLm and may be spaced apart from each other.

Figure 45:
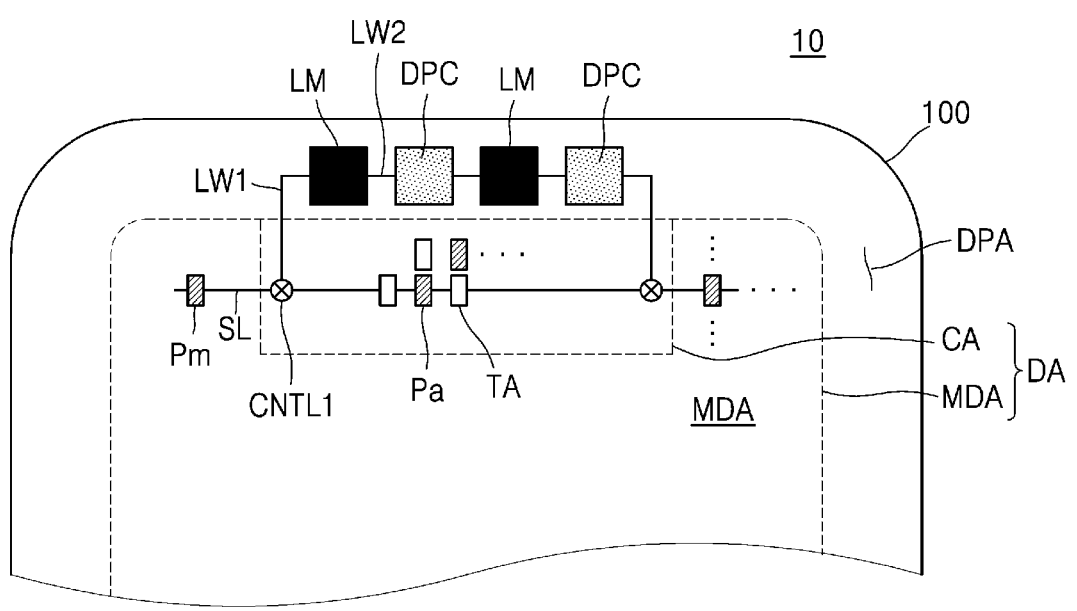
FIG. 45 is a schematic plan view of a display panel 10 according to an embodiment.

FIG. 45 is a schematic plan view of a display panel 10 according to an embodiment. FIG. 45 mainly describes a load matching unit LM and/or a dummy pixel circuit DPC arranged or disposed on the display panel 10.

Referring to FIG. 45, the display panel 10 may include a display area DA including a main display area MDA and a component area CA, and a peripheral area DPA outside or adjacent to the display area DA. The load matching unit LM and/or the dummy pixel circuit DPC may be arranged or disposed in the peripheral area DPA near the component area CA. Although the component area CA of FIG. 44 may be of a notch type, the shape of the component area CA is not limited thereto.

The load matching unit LM and/or the dummy pixel circuit DPC may be arranged or disposed in the peripheral area DPA near the component area CA and may be electrically connected to the pixel circuits of the main subpixels Pm arranged or disposed in the main display area MDA via a first load connection line LW1. For example, the first load connection line LW1 may be electrically connected to a scan line SL traversing a main subpixel Pm, via a contact hole CNTL1. According to an embodiment, the first load connection line LW1 may include the same or similar material as that included in the bottom metal layer BML of FIG. 17 and may be arranged or disposed on the same layer on which the bottom metal layer BML of FIG. 17 may be arranged or disposed. Because a portion of a scan line SL that traverses the component area CA may be electrically connected to the pixel circuit of an auxiliary subpixel Pa, the first load connection line LW1 may be a conductive layer arranged or disposed on a different layer from the layer on which the scan line SL may be arranged or disposed.

Because the number of auxiliary subpixels Pa per unit area of the component area CA may be less than the number of main subpixels Pm per unit area of the main display area MDA, a load applied to a scan line SL traversing the component area CA may be different from a load applied to a scan line SL traversing only the main display area MDA. Accordingly, brightness non-uniformity may occur in the display area DA. According to an embodiment, the employment of the load matching unit LM and/or the dummy pixel circuit DPC may make the electrical load of the entire display area DA uniform, thereby securing brightness uniformity.

Load matching units LM and/or dummy pixel circuits DPC may be included, and the load matching units LM and/or the dummy pixel circuits DPC may be electrically connected to each other via a second load connection line LW2. Due to the load matching units LM and/or the dummy pixel circuits DPC being electrically connected to each other, an equipotential area may be expanded to thereby prevent the display area DA from being damaged by static electricity.

In FIG. 45, the load matching unit LM and/or the dummy pixel circuit DPC may be arranged or disposed in the peripheral area DPA of the display panel 10. However, according to an embodiment, the load matching unit LM and/or the dummy pixel circuit DPC may be provided or disposed on a separate dummy panel and may be electrically connected to the display panel 10. The peripheral area DPA having the load matching unit LM and/or the dummy pixel circuit DPC arranged or disposed therein may be bent.

Figure 46:
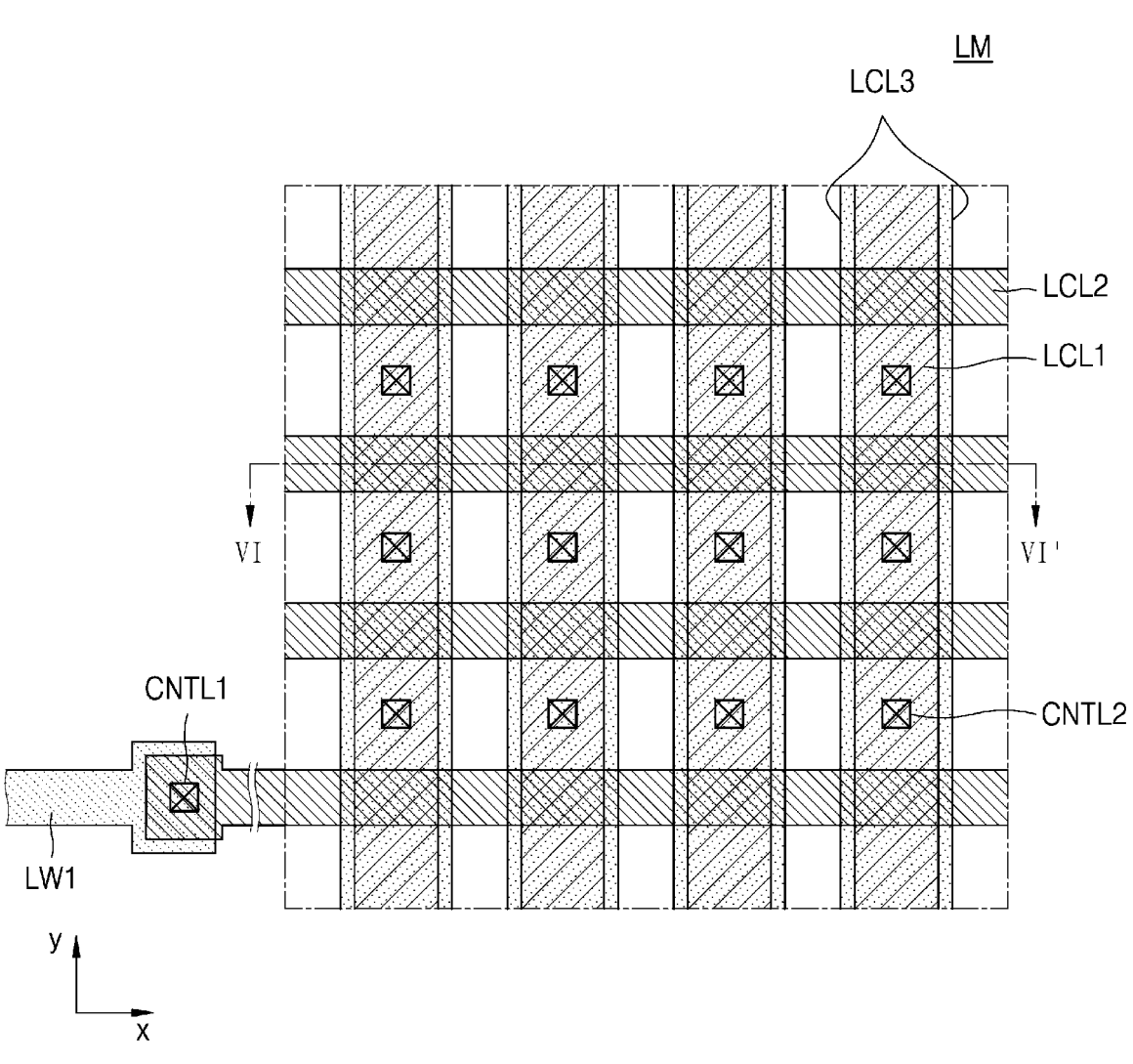
FIG. 46 is a schematic plan view of a load matching unit of a display panel according to an embodiment.
Figure 47:
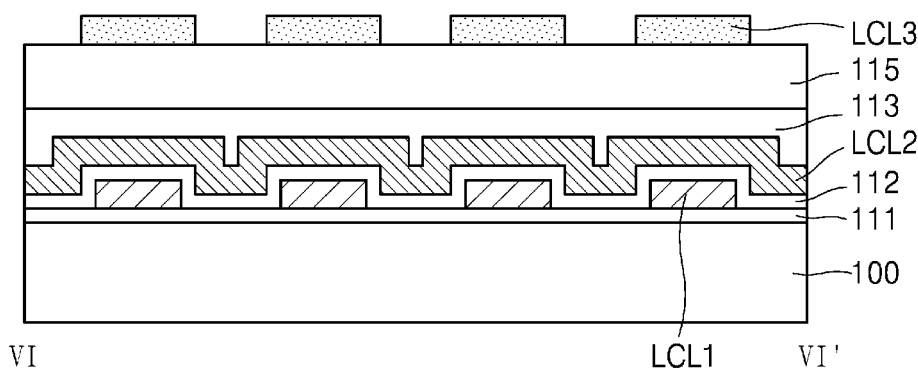
FIG. 47 is a schematic cross-sectional view taken along a line VI-VI' of FIG. 46.

FIG. 46 is a schematic plan view of a load matching unit LM of a display panel according to an embodiment, and FIG. 47 is a schematic cross-sectional view taken along a line VI-VI' of FIG. 46.

Referring to FIGS. 46 and 47, the load matching unit LM may include a first load conductive layer LCL1, a second load conductive layer LCL2 arranged or disposed above the first load conductive layer LCL1, and a third load conductive layer LCL3 arranged or disposed above the second load conductive layer LCL2. The first gate insulating layer 112, the second gate insulating layer 113, and the interlayer insulating layer 115 may be disposed between the first through third load conductive layers LCL1 through LCL3.

According to an embodiment, the first load conductive layer LCL1 may include the same or similar material as that included in the semiconductor layer A1 of FIG. 17 and may be arranged or disposed on the same layer on which the semiconductor layer A1 of FIG. 17 may be arranged or disposed. The second load conductive layer LCL2 may include the same or similar material as that included in the gate electrode G1 of FIG. 17 and may be arranged or disposed on the same layer on which the gate electrode G1 of FIG. 17 may be arranged or disposed. The third load conductive layer LCL3 may include the same or similar material as that included in the source electrode S1 or the drain electrode D1 of FIG. 17 and may be arranged or disposed on the same layer on which the source electrode S1 or the drain electrode D1 of FIG. 17 may be arranged or disposed.

The first load conductive layer LCL1 may be electrically connected to the third load conductive layer LCL3 via a contact hole CNTL2. The second load conductive layer LCL2 may be electrically connected to the first load connection line LW1 via a contact hole CNTL1. The third load conductive layer LCL3 may be electrically connected to a driving voltage line and receive a static voltage. The load matching unit LM may form an electrical load such as a capacitor, due to the arrangement of the first through third load conductive layers LCL1 through LCL3.

According to an embodiment, the first through third load conductive layers LCL1 through LCL3 may each be patterned and extend in the x direction or the y direction. In other words, the first through third load conductive layers LCL1 through LCL3 may be conductive lines spaced apart from each other and each extending in one direction.

Referring to FIG. 46, the first load conductive layer LCL1 may extend in the +y direction, and the second load conductive layer LCL2 may extend in the +x direction. The first load conductive layer LCL1 and the second load conductive layer LCL2 may intersect with each other in a lattice shape.

The third load conductive layer LCL3 may be on the second load conductive layer LCL2. As shown in FIG. 47, the third load conductive layer LCL3 may extend in the +y direction like the first load conductive layer LCL1, and may overlap the first load conductive layer LCL1. According to an embodiment, the third load conductive layer LCL3 may be patterned in one direction like the first load conductive layer LCL1. In FIG. 46, the third load conductive layer LCL3 is patterned in the +y direction like the first load conductive layer LCL1. However, according to other embodiments, the third load conductive layer LCL3 may be patterned in the +x direction.

According to an embodiment, the load matching unit LM may include no first load conductive layers LCL1. According to an embodiment, the third load conductive layer LCL3 of the load matching unit LM may not be patterned and may be integrally provided or disposed over the entire area of the load matching unit LM.

Figure 48:
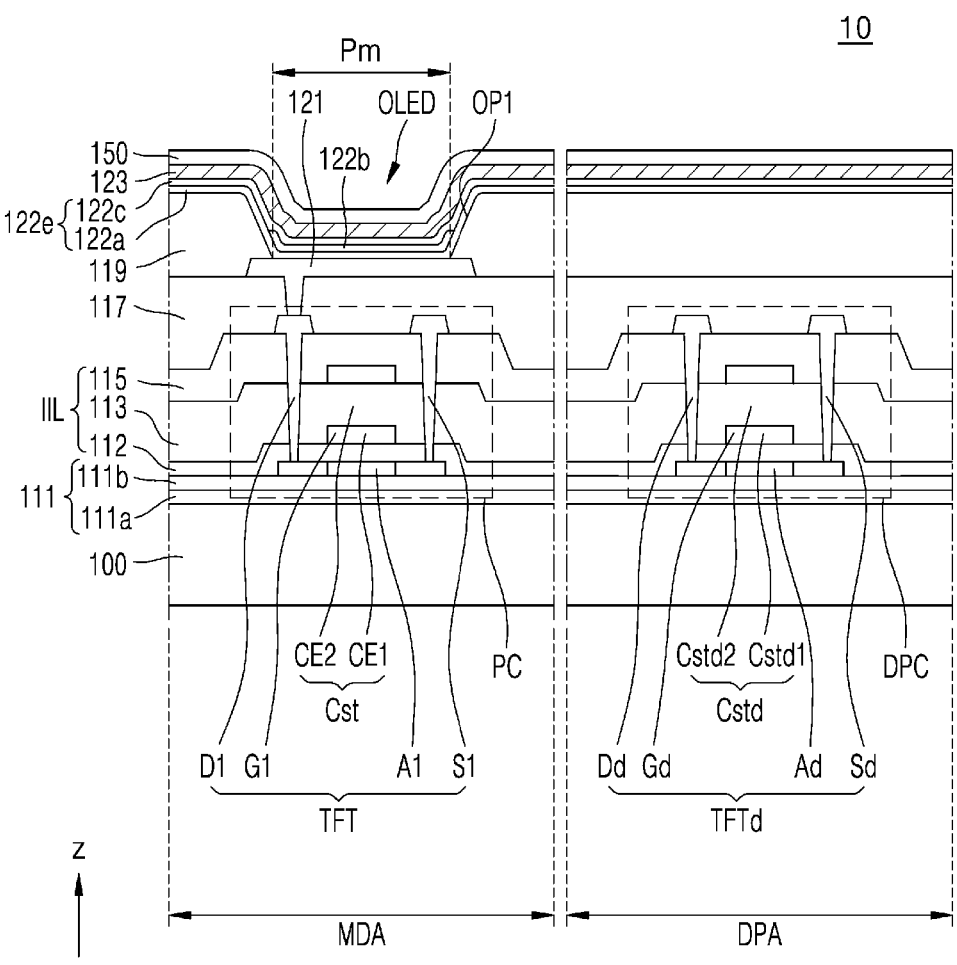
FIG. 48 is a schematic cross-sectional view of a portion or region of a display panel according to an embodiment.

FIG. 48 is a schematic cross-sectional view of a portion or region of a display panel 10 according to an embodiment. FIG. 48 mainly describes a dummy pixel circuit DPC arranged or disposed in the peripheral area DPA of the display panel 10.

Referring to FIG. 48, a main pixel circuit PC and a main organic light-emitting diode OLED as a display element may be arranged or disposed in the main display area MDA of the display panel 10. The dummy pixel circuit DPC may be arranged or disposed in the peripheral area DPA of the substrate 10. The dummy pixel circuit DPC may be a component to adjust an electrical load, similar to the load matching unit LM of FIG. 45, and may not be connected to a display element.

The dummy pixel circuit DPC may include a dummy thin-film transistor TFTd and a dummy storage capacitor Cstd. The dummy thin-film transistor TFTd may include a dummy semiconductor layer Ad, a dummy gate electrode Gd, a dummy source electrode Sd, and a dummy drain electrode Dd. The dummy storage capacitor Cstd may include a dummy lower electrode Cstd1 and a dummy upper electrode Cstd2.

The dummy pixel circuit DPC may include thin-film transistors. According to an embodiment, the dummy pixel circuit DPC may have the same or similar structure as the main pixel circuit PC.

The dummy pixel circuit DPC may be electrically connected to a scan line, a data line, and a driving voltage line arranged or disposed in the main display area MDA. For example, the dummy gate electrode Gd of the dummy thin-film transistor TFTd may be electrically connected to the scan line arranged or disposed in the main display area MDA.

The functional layer 122c, the opposite electrode 123, and the upper layer 150 may be arranged or disposed above the dummy pixel circuit DPC. Because the functional layer 122e, the opposite electrode 123, and the upper layer 150 may each extend over the entire display panel by using an open mask, it may be favorable, in respect of a process, to arrange the functional layer 122e, the opposite electrode 123, and the upper layer 150 to correspond to the dummy pixel circuit DPC.

Figure 49:
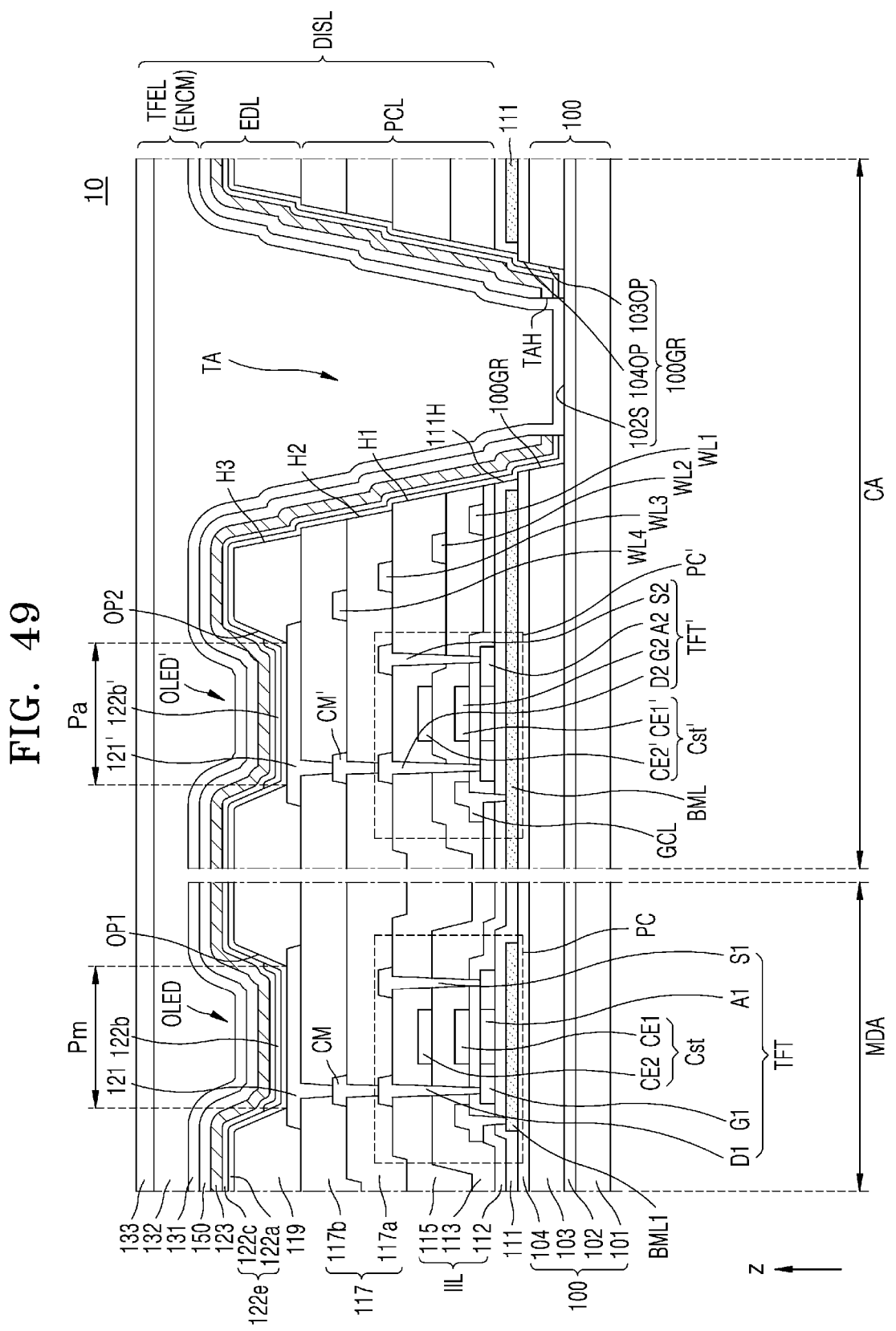
FIG. 49 is a schematic cross-sectional view of a portion or region of a display panel according to an embodiment.

FIG. 49 is a schematic cross-sectional view of a display panel 10 according to an embodiment. FIG. 49 mainly describes a case where a thin-film encapsulation layer TFEL arranged or disposed as the encapsulation member ENCM may be applied to the embodiment of FIG. 26.

Referring to FIG. 49, the thin-film encapsulation layer TFEL may be arranged or disposed as the encapsulation member ENCM, above the display element layer EDL of the display panel 10. In other words, the main organic light-emitting diode OLED and the auxiliary organic light-emitting diode OLED' may be sealed by the thin-film encapsulation layer TFEL. The thin-film encapsulation layer TFEL may be located or disposed on the upper layer 150. The thin-film encapsulation layer TFEL may prevent infiltration of external moisture or foreign materials into the main organic light-emitting diode OLED and the auxiliary organic light-emitting diode OLED'.

The thin-film encapsulation layer TFEL may include at least one inorganic encapsulation layer and at least one organic encapsulation layer. With regard to this, FIG. 49 illustrates that the thin-film encapsulation layer TFEL may be a stack of the first inorganic encapsulation layer 131, the organic encapsulation layer 132, and the second inorganic encapsulation layer 133. According to an embodiment, the number of organic encapsulation layers, the number of inorganic encapsulation layers, and the order in which organic encapsulation layers and inorganic encapsulation layers are stacked may be modified.

The first inorganic encapsulation layer 131 and the second inorganic encapsulation layer 133 may include at least one inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), and may be formed by chemical vapor deposition (CVD). The organic encapsulation layer 132 may include a polymer-based material. Examples of the polymer-based material may include a silicon-based resin, an acryl-based resin, an epoxy-based resin, polyimide, and polyethylene.

The first inorganic encapsulation layer 131, the organic encapsulation layer 132, and the second inorganic encapsulation layer 133 may each be integrally provided to cover or overlap the main display area MDA and the component area CA. Accordingly, the first inorganic encapsulation layer 131, the organic encapsulation layer 132, and the second inorganic encapsulation layer 133 may be arranged or disposed within the transmission hole TAH.

As shown in FIG. 49, in a case that the substrate 100 may include the groove 100GR to correspond to the transmission area TA, the first inorganic encapsulation layer 131 may be disposed within the groove 100GR of the substrate 100. The first inorganic encapsulation layer 131 may directly contact the upper surface 102S of the first inorganic barrier layer 102 of the substrate 100.

According to an embodiment, the organic encapsulation layer 132 may be integrally provided to cover or overlap the main display area MDA and the component area CA, but may not exist in the transmission area TA. In other words, the organic encapsulation layer 132 may include an opening corresponding to the transmission area TA. In this case, the first inorganic encapsulation layer 131 and the second inorganic encapsulation layer 133 may contact each other within the transmission hole TAH.

Figure 50:
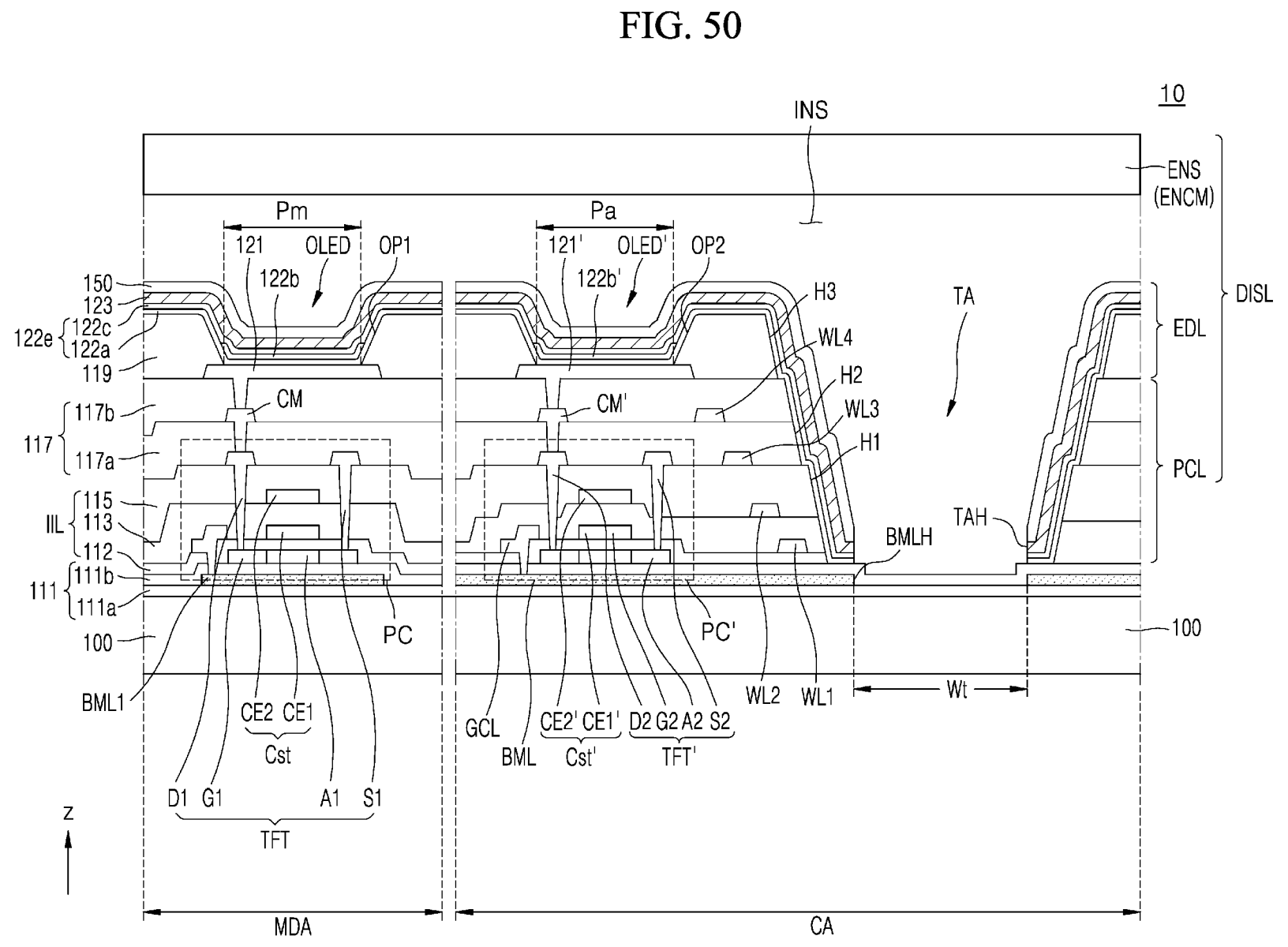

FIG. 50 is a schematic cross-sectional view of a portion or region of a display apparatus according to an embodiment. FIG. 50 mainly describes a case where the encapsulation substrate ENS as the encapsulation member ENCM may be applied to an embodiment of FIG. 25.

Referring to FIG. 50, the encapsulation substrate ENS may be arranged or disposed as the encapsulation member ENCM above the display element layer EDL of the display panel 10. The main organic light-emitting diode OLED and the auxiliary organic light-emitting diode OLED' may be sealed by the encapsulation substrate ENS. The substrate 100 and the encapsulation substrate ENS may be coupled with each other by frit or a sealant in a peripheral area.

The substrate 100 may include a glass material and the encapsulation substrate ENS may also include a glass material. Each of the substrate 100 and the encapsulation substrate ENS may include a glass substrate. An internal space INS may be defined between the substrate 100 and the encapsulation substrate ENS and may include an air layer. Alternatively, the internal space INS may include a transparent material layer. The transparent material layer may include a transparent material having a similar refractive index to the refractive indexes of the substrate 100 and the encapsulation substrate ENS. Examples of the transparent material may include various liquid transparent materials. Examples of the transparent material may include epoxy, urethane acrylate, epoxy acrylate or resin based on silicones (for example, bisphenol A type epoxy, cycloaliphatic epoxy resin, phenyl silicone resin or rubber, acrylic epoxy resin, aliphatic urethane acrylate, or other materials within the spirit and the scope of the disclosure). Alternatively, the transparent material may be a material selected from silicones or silicone oils having no phase changes in the temperature range of about −40 (C) to about 100 (C) and having a volume change rate of less than about 5% (for example, hexamethyldisiloxane, octamethyltrisiloxane, decamethyltetrasiloxane, dodecamethylpentasiloxane, and polydimethylsiloxanes).

Figure 51A:
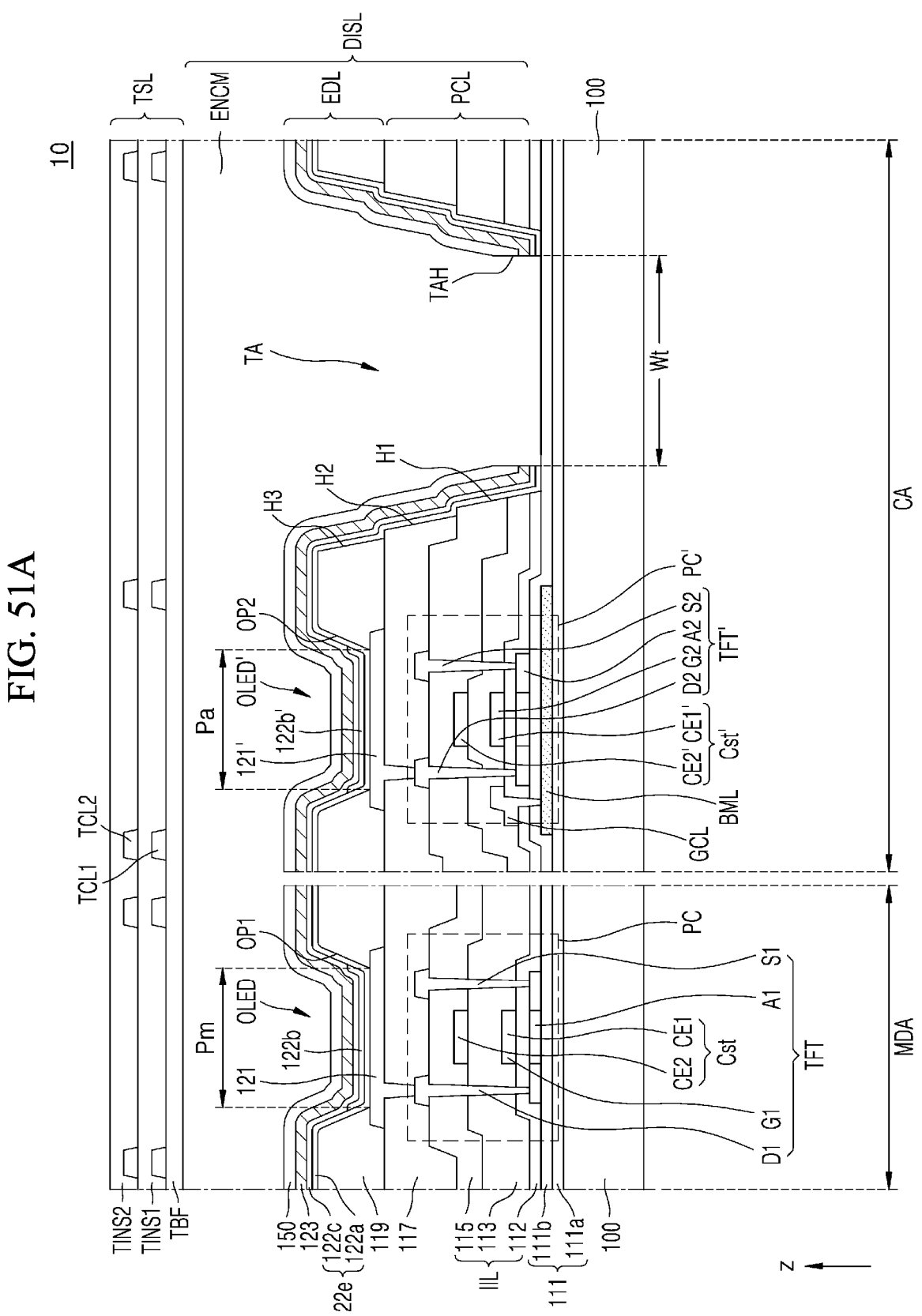
FIG. 51A is a schematic cross-sectional view of a portion or region of a display panel according to an embodiment.
Figure 51B:
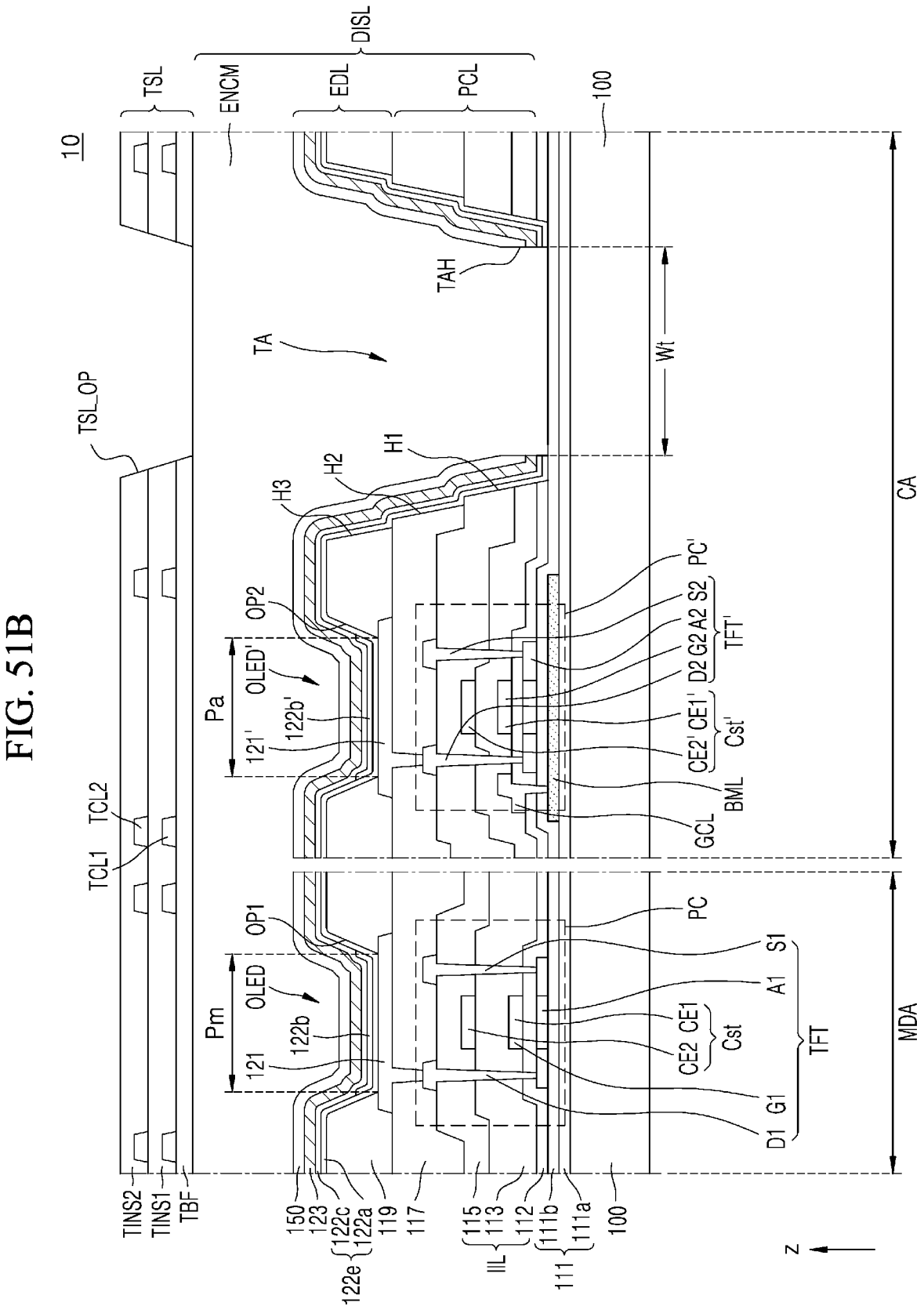
FIG. 51B is a schematic cross-sectional view of a portion or region of a display panel according to an embodiment.
Figure 51C:
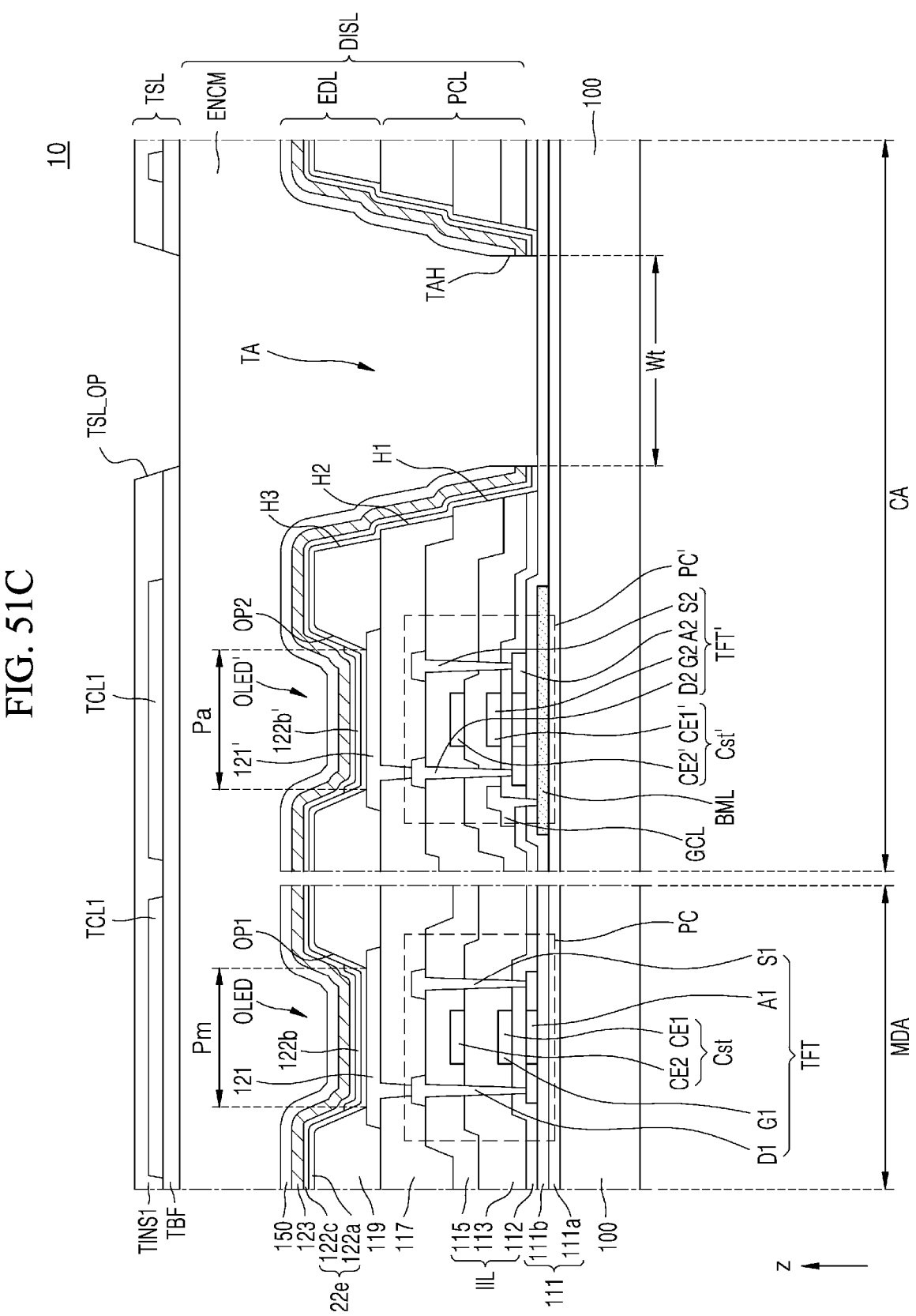
FIG. 51C is a schematic cross-sectional view of a portion or region of a display panel according to an embodiment.

FIGS. 51A through 51C are schematic cross-sectional views of display apparatuses according to embodiments. FIGS. 51A through 51C mainly describe cases where touch screen layers TSL are applied to the embodiment of FIG. 17, respectively.

Referring to FIG. 51A, the display panel 10 may include the touch screen layer TSL arranged or disposed above the display layer DISL. The touch screen layer TSL may be disposed above the encapsulation member ENCM. The encapsulation member ENCM may be the thin-film encapsulation layer TFEL described above with reference to FIG. 49 or the encapsulation substrate ENS described above with reference to FIG. 50. In a case that the touch screen layer TSL is disposed on the encapsulation substrate ENS, the touch screen layer TSL may be provided or disposed on a separate support substrate and then may be attached to the encapsulation substrate ENS by an adhesive such as an OCA.

The touch screen layer TSL may have a structure in which a first touch conductive layer TCL1, a first touch insulating layer TINS1, a second touch conductive layer TCL2, and a second touch insulating layer TINS2 are sequentially stacked. The touch screen layer TSL may include a touch buffer layer TBF.

According to an embodiment, the second touch conductive layer TCL2 may serve as a touch electrode that senses contact or non-contact, and the first touch conductive layer TCL1 may serve as a connection unit that connects, in one direction, the second touch conductive layer TCL2 in the form of a pattern.

According to an embodiment, both the first touch conductive layer TCL1 and the second touch conductive layer TCL2 may serve as the touch electrode. For example, the first touch insulating layer TINS1 may include a via hole that exposes an upper surface of the first touch conductive layer TCL1, and the first touch conductive layer TCL1 and the second touch conductive layer TCL2 may be electrically connected to each other via the via hole. As such, due to the use of the first touch conductive layer TCL1 and the second touch conductive layer TCL2, resistance of the touch electrode may decrease, and thus a response speed of the touch screen layer TSL may improve.

According to an embodiment, the touch electrode may have a mesh structure such that light emitted from the main and auxiliary organic light-emitting diodes OLED and OLED' is transmitted. Accordingly, the first touch conductive layer TCL1 and the second touch conductive layer TCL2 may be arranged or disposed to not overlap the light-emission areas of the main and auxiliary organic light-emitting diodes OLED and OLED'.

Each of the first touch conductive layer TCL1 and the second touch conductive layer TCL2 may be a single layer or multiple layers including a highly-conductive material. For example, each of the first touch conductive layer TCL1 and the second touch conductive layer TCL2 may be a single layer or multiple layers including a conductive material including aluminum (Al), copper (Cu), molybdenum (Mo), and/or titanium (Ti). The transparent conductive layer may include a transparent conductive oxide such as indium tin oxide (ITO), indium zinc oxide (IZO), zinc oxide (ZnO), or indium tin zinc oxide (ITZO). Alternatively, the transparent conductive layer may include a conductive polymer (for example, poly-(3,4)-ethylene-dihydroxy thiophene (PE-DOT)), metal nano wires, graphene, or the like within the spirit and the scope of the disclosure. According to an embodiment, the first touch conductive layer TCL1 may include molybdenum (Mo), and the second touch conductive layer TCL2 may have a stack structure of Ti/Al/Ti.

Each of the first touch insulating layer TINS1 and the second touch insulating layer TINS2 may include an inorganic material or an organic material. The inorganic material may be at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride. The organic material may be at least one of acryl-based resin, methacryl-based resin, polyisoprene, vinyl-based resin, epoxy-based resin, urethane-based resin, cellulose-based resin, and perylene-based resin.

In a case that the thin-film encapsulation layer TFEL of FIG. 49 is used as the encapsulation member ENCM, the touch buffer layer TBF may be included between the thin-film encapsulation layer TFEL and the touch screen layer TSL. The touch buffer layer TBF may be directly on the thin-film encapsulation layer TFEL. The touch buffer layer TBF may prevent damage to the thin-film encapsulation layer TFEL and may block an interference signal that may be generated while the touch screen layer TSL is being driven. The touch buffer layer TBF may include an inorganic insulating material such as silicon oxide ($SiO_2$), silicon nitride ($SiN_x$), or silicon oxynitride ($SiON$), and may be a single layer or multiple layers. In FIG. 51A, the touch screen layer TSL does not include either openings or grooves corresponding to the transmission area TA. Because insulating layers included in the touch screen layer TSL generally include an inorganic insulative material having a high light transmittance, even in a case that the touch screen layer TSL does not have an opening or groove corresponding to the transmission area TA, the touch screen layer TSL may have a sufficient transmittance, so that the components 40 of FIG. 2 may transmit/receive a sufficient amount of light.

According to an embodiment, referring to FIG. 51B, the touch screen layer TSL may include a touch opening TSL_OP corresponding to the transmission area TA of the component area CA. The touch opening TSL_OP may be a stack of an opening of the touch buffer layer TBF, an opening of the first touch insulating layer TINS1, and an opening of the second touch insulating layer TINS2 all arranged or disposed to correspond to the transmission area TA. In a case that these openings may be formed through separate processes, the inner surface of the touch opening TSL_OP may not be smooth and may have steps such as a staircase shape. Due to the touch screen layer TSL including the touch opening TSL_OP corresponding to the transmission area TA, the light transmittance of the transmission area TA may more improve. In contrast, the touch screen layer TSL may have a groove that does not expose the upper surface of the thin-film encapsulation layer TFEL.

Referring to FIG. 51C, the touch screen layer TSL may have a structure in which a first touch conductive layer TCL1 and a first touch insulating layer TINS1 are sequentially stacked. The touch screen layer TSL may include a touch buffer layer TBF. In other words, the touch screen layer TSL may include no second touch conductive layers TCL2. In this case, the first touch conductive layer TCL1 may be used as a self capacitance type touch electrode. The first touch conductive layer TCL1 may overlap at least respective portions of the main and auxiliary organic light-emitting diodes OLED and OLED'.

Figure 52:
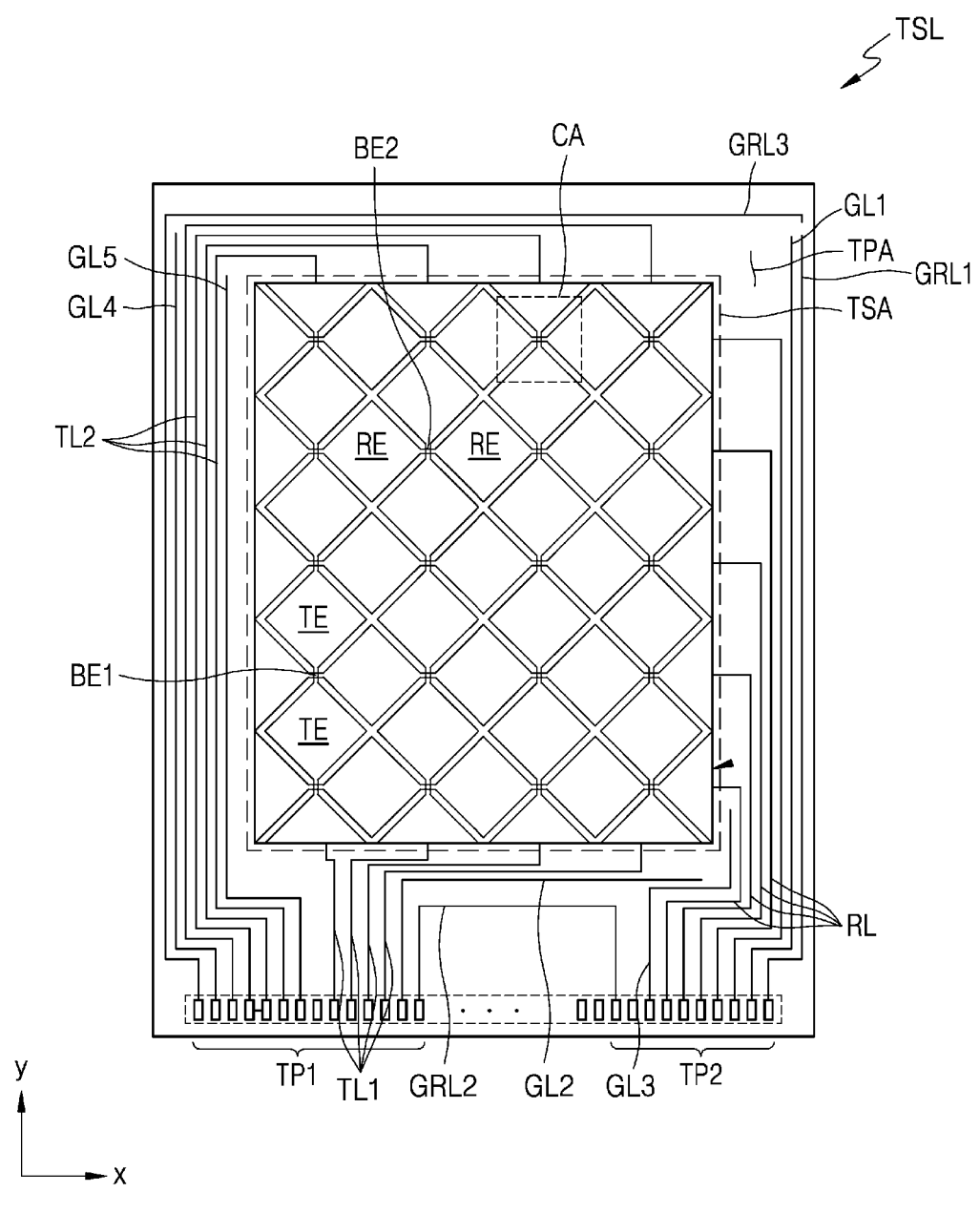
FIG. 52 is a plan view of a touch screen layer of a display panel according to an embodiment.

FIG. 52 is a plan view of a touch screen layer TSL of a display panel according to an embodiment.

In FIG. 52, touch electrodes TE and RE of the touch screen layer TSL include two types of electrodes, for example, driving electrodes TE and sensing electrodes RE, and the touch screen layer TSL may be driven according to a mutual capacitance method in which a driving signal may be applied to the driving electrodes TE and then voltages charged in mutual capacitances are sensed by the sensing electrodes RE. For convenience of explanation, FIG. 52 illustrates only the touch electrodes TE and RE, touch wires TL and RL, first and second touch pads TP1 and TP2, first through fifth guard wires GL1 through GL5, and first through third ground wires GRL1 through GRL3.

According to an embodiment, portions of the touch screen layer TSL respectively corresponding to the main display area MDA and the component area CA may be both driven according to the mutual capacitance method. Accordingly, touch electrodes TE and RE arranged or disposed in the main display area MDA may be electrically connected to touch electrodes TE and RE arranged or disposed in the component area CA.

Referring to FIG. 52, the touch screen layer TSL may include a touch sensing area TSA for sensing a user's touch, and a touch peripheral area TPA around the touch sensing area TSA. The touch sensing area TSA may overlap the display area DA of the display layer DISL, and the touch peripheral area TPA may overlap the peripheral area DPA of the display layer DISL.

The touch electrodes TE and RE may include first touch electrodes TE and second touch electrodes RE. In the embodiment of FIG. 52, the first touch electrodes TE are the driving electrodes TE and the second touch electrodes are the sensing electrodes RE. Although each of the driving electrodes TE and the sensing electrodes RE has a rhombus planar shape in FIG. 52, embodiments are not limited thereto.

The sensing electrodes RE may be arranged or disposed in the first direction (x direction) and may be electrically connected to each other. The driving electrodes TE may be arranged or disposed in the second direction (y direction) intersecting the first direction (x direction) and may be electrically connected to each other. The driving electrodes TE and the sensing electrodes RE may be spaced apart from each other. The driving electrodes TE may be arranged or disposed side by side in the second direction (y direction). At crossing areas of the sensing electrodes RE and the driving electrodes TE, two driving electrodes TE adjacent to each other in the second direction (y direction) may be electrically connected to each other via a first connecting electrode BE1, and two sensing electrodes RE adjacent to each other in the first direction (x direction) may be electrically connected to each other via a second connecting electrode BE2.

The touch wires TL and RL may be arranged or disposed in the touch peripheral area TPA. The touch wires TL and RL may include sensing wires RL electrically connected to the sensing electrodes RE, and first driving wires TL1 and second driving wires TL2 electrically connected to the driving electrodes TE.

Sensing electrodes RE arranged or disposed in an end portion of the touch sensing area TSA may be electrically connected to the sensing wires RL. For example, as shown in FIG. 52, sensing electrodes RE arranged or disposed in a left end portion of the touch sensing area TSA from among the sensing electrodes RE electrically connected to each other in the first direction (x direction) may be electrically connected to the sensing wires RL. The sensing wires RL may be electrically connected to the second touch pads TP2.

Driving electrodes TE arranged or disposed in an end portion of the touch sensing area TSA may be electrically connected to the first driving wires TL1, and driving electrodes TE arranged or disposed in another end portion of the touch sensing area TSA may be electrically connected to the second driving wires TL2. For example, as shown in FIG. 52, driving electrode TE arranged or disposed in a lower end portion of the touch sensing area TSA from among the driving electrodes TE electrically connected to each other in the second direction (y direction) may be electrically connected to the first driving wire TL1, and driving electrode TE arranged or disposed in an upper end portion of the touch sensing area TSA from among the driving electrodes TE electrically connected to each other in the second direction (y direction) may be electrically connected to the second driving wire TL2. The second driving wires TL2 may each traverse the right side of the touch sensing area TSA and extend to the upper side of the touch sensing area TSA and may be electrically connected to the driving electrodes TE. The first driving wires TL1 and the second driving wires TL2 may be electrically connected to the first touch pads TP1.

The first guard wire GL1 may be arranged or disposed outside an outermost sensing wire RL from among the sensing wires RL. The first ground wire GRL1 may be outside the first guard wire GL1. As shown in FIG. 52, the first guard wire GL1 may be on the right side of a rightmost sensing wire RL from among the sensing wires RL, and the first ground wire GRL1 may be on the right side of the first guard wire GL1.

The second guard wire GL2 may be between an innermost sensing wire RL from among the sensing wires RL and a rightmost first driving wire TL1 from among the first driving wires TL1. As shown in FIG. 52, the innermost sensing wire RL from among the sensing wires RL may be a leftmost sensing wire RL from among the sensing wires RL. The second guard wire GL2 may be between the rightmost first driving wire TL1 from among the first driving wires TL1 and the second ground wire GRL2.

The third guard wire GL3 may be between the innermost sensing wire RL from among the sensing wires RL and the second ground wire GRL2. The second ground wire GRL2 may be connected to a rightmost first touch pad TP1 from among the first touch pads TP1 and a leftmost second touch pad TP2 from among the second touch pads TP2.

The fourth guard wire GL4 may be arranged or disposed outside an outermost second driving wire TL2 from among the second driving wires TL2. As shown in FIG. 52, the fourth guard wire GL4 may be arranged or disposed on the left side of a leftmost second driving wire TL2 from among the second driving wires TL2.

The third ground wire GRL3 may be outside the fourth guard wire GL4. As shown in FIG. 52, the fourth guard wire GL4 may be on the left side of a leftmost and uppermost second driving wire TL2 from among the second driving wires TL2, and the third ground wire GRL3 may be on the left side of the fourth guard wire GL4.

The fifth guard wire GL5 may be arranged or disposed inside an innermost second driving wire TL2 from among the second driving wires TL2. As shown in FIG. 52, the fifth guard wire GL5 may be disposed between a rightmost second driving wire TL2 from among the second driving wires TL2 and the sensing electrodes RE.

The first ground wire GRL1, the second ground wire GRL2, and the third ground wire GRL3 may have different levels of static voltages or the same level of static voltage. The first guard wire GL1, the second guard wire GL2, the third guard wire GL3, the fourth guard wire GL4, and the fifth guard wire GL5 may have different levels of static voltages or the same level of static voltage.

Figure 53:
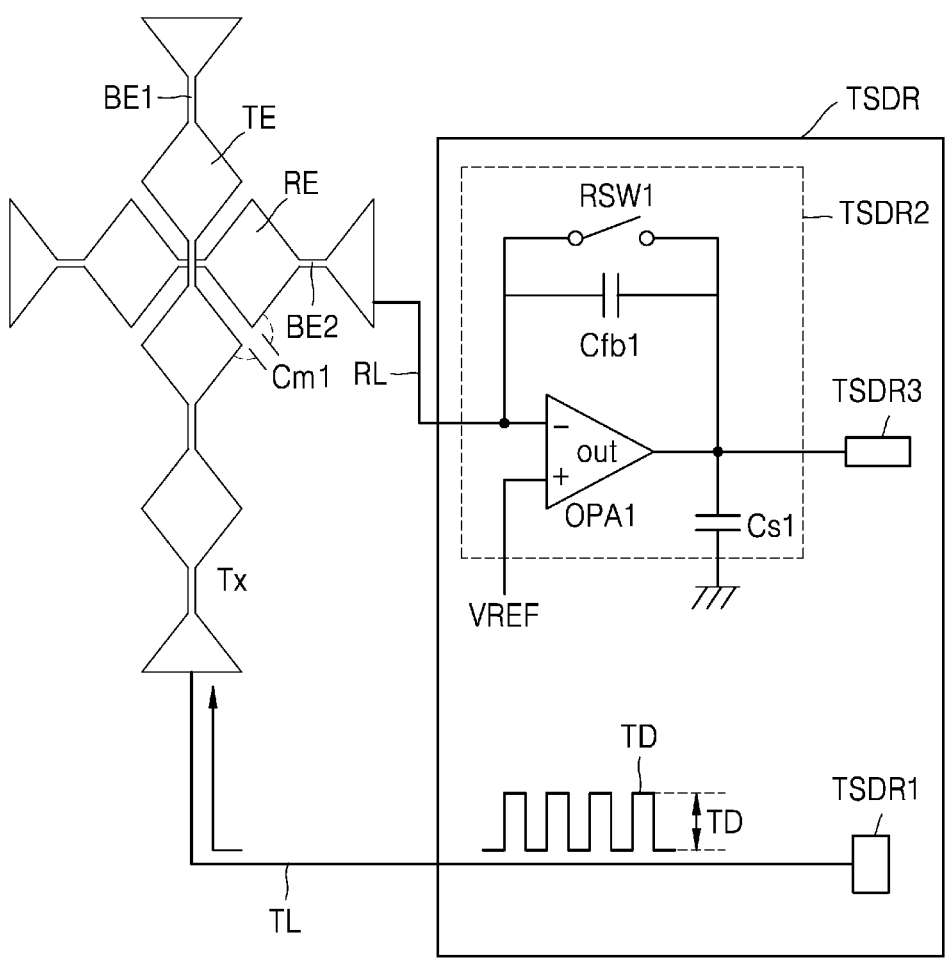
FIG. 53 illustrates an example of a touch sensor driving unit connected to touch electrodes.

FIG. 53 illustrates an example of a touch sensor driving unit connected to touch electrodes.

For convenience of explanation, FIG. 53 illustrates only driving electrodes TE arranged or disposed in one column and electrically connected to each other in the second direction (y direction) and sensing electrodes RE arranged or disposed in one row and electrically connected to each other in the first direction (x direction).

Referring to FIG. 53, a touch sensor driving unit TSDR may include a driving signal output unit TSDR1, a first sensor sensing unit TSDR2, and a first analog to digital converter (ADC) TSDR3.

The driving signal output unit TSDR1 may output a touch driving signal TD to the driving electrodes TE via a driving wire TL. The touch driving signal TD may include pulses. The driving signal output unit TSDR1 may output the touch driving signal TD to the driving wires TL in a preset sequence. For example, the driving signal output unit TSDR1 may sequentially output the touch driving signal TD to the driving electrodes TE from driving electrodes TE arranged or disposed in a left portion of the touch sensing area TSA of FIG. 52 to driving electrodes TE arranged or disposed in a right portion of the touch sensing area TSA.

The first sensor sensing unit TSDR2 senses a voltage charged in a first mutual capacitance Cm1 via a sensing wire RL electrically connected to the sensing electrodes RE. As shown in FIG. 53, the first mutual capacitance Cm1 may be formed between a driving electrode TE and a sensing electrode RE.

The first sensor sensing unit TSDR2 may include a first operational amplifier OPA1, a first feedback capacitor Cfb1, and a first reset switch RSW1. The first operational amplifier OPA1 may include a first input terminal (−), a second input terminal (+), and an output terminal (out). The first input terminal (−) of the first operational amplifier OPA1 may be electrically connected to the sensing wire RL, an initializing voltage VREF may be supplied to the second input terminal (+) of the first operational amplifier OPA1, and the output terminal (out) of the first operational amplifier OPA1 may be electrically connected to a first storage capacitor Cs1. The first storage capacitor Cs1 may be electrically connected between the output terminal (out) of the first operational amplifier OPA1 and ground and stores an output voltage of the first operational amplifier OPA1. The first feedback capacitor Cfb1 and the first reset switch RSW1 may be electrically connected in parallel between the first input terminal (−) and the output terminal (out) of the first operational amplifier OPA1. The first reset switch RSW1 may control a connection between both ends of the first feedback capacitor Cfb1. When the first reset switch RSW1 is turned on and thus the both ends of the first feedback capacitor Cfb1 may be connected to each other, the first feedback capacitor Cfb1 may be reset.

The output voltage Vout1 of the first operational amplifier OPA1 may be defined as in Equation 1.

$$Vout1 = \frac{Cm1 \times Vt1}{Cfb1} \qquad \text{[Equation 1]}$$

In Equation 1, "Vout1" indicates the output voltage of the first operational amplifier OPA1, "Cm1" indicates a first mutual capacitance, "Cfb1" indicates the capacitance of a first feedback capacitor, and "Vt1" indicates a voltage charged in the first mutual capacitance Cm1.

The first ADC TSDR3 may convert the output voltage Vout1 stored in the first storage capacitor Cs1 into first digital data and may output the first digital data. Accordingly, the touch screen layer TSL may determine whether there is a user's touch, by sensing the voltages charged in first mutual capacitances Cm1.

Figure 54:
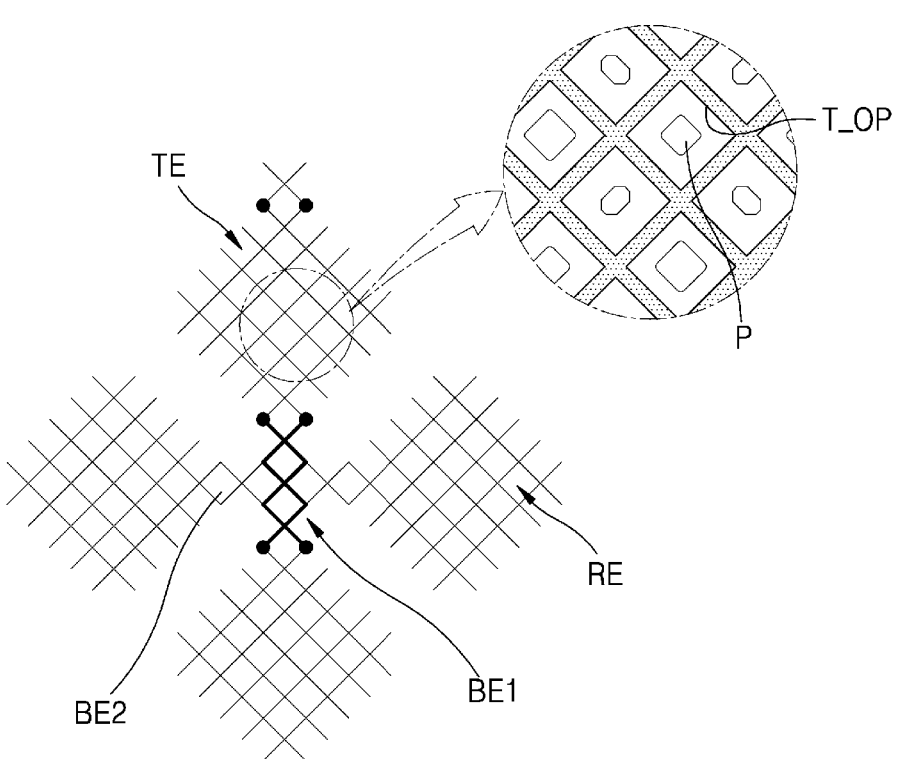
FIG. 54 is a magnified plan view of a touch sensing area of a touch screen layer according to an embodiment.

FIG. 54 is a magnified plan view of a touch sensing area of a touch screen layer according to an embodiment.

For convenience of explanation, FIG. 54 illustrates only two sensing electrodes RE adjacent to each other in the first direction (x direction) and two driving electrodes TE adjacent to each other in the second direction (y direction).

Each of the driving electrodes TE and the sensing electrodes RE may have a rectangular planar shape, but embodiments are not limited thereto. As shown in FIG. 54, the driving electrodes TE, the sensing electrodes RE, the first connecting electrodes BE1, and the second connecting electrodes BE2 may each have a mesh structure when viewed in a plan view.

The driving electrodes TE, the sensing electrodes RE, and the second connecting electrodes BE2 may be included as the second touch conductive layer TCL2 of FIG. 51A having a mesh pattern, and the first connecting electrodes BE1 may be included as the first touch conductive layer TCL1 of FIG. 51A having a mesh pattern. According to an embodiment, the driving electrodes TE, the sensing electrodes RE, and the second connecting electrodes BE2 may be included as the first touch conductive layer TCL1 of FIG. 51A having a mesh pattern, and the first connecting electrodes BE1 may be included as the second touch conductive layer TCL2 of FIG. 51A having a mesh pattern.

The first touch conductive layer TCL1 and the second touch conductive layer TCL2 may include openings T_OP. The openings T_OP may overlap the subpixels P of the display panel 10.

The sensing electrodes RE may be electrically connected to each other via the second connecting electrodes BE2 arranged or disposed on the same layer on which the sensing electrodes RE may be arranged or disposed. For example, the sensing electrodes RE may include the same or similar material as that included in the second connecting electrodes BE2 and may be integral with the second connecting electrodes BE2.

The driving electrodes TE may be electrically connected to each other by the first connecting electrodes BE1 provided or disposed on a different layer from the layer on which the driving electrodes TE may be provided or disposed. The driving electrodes TE may be electrically connected to the first connecting electrodes BE1 via the contact hole provided or disposed in the first touch insulating layer TINS1.

Figure 55:
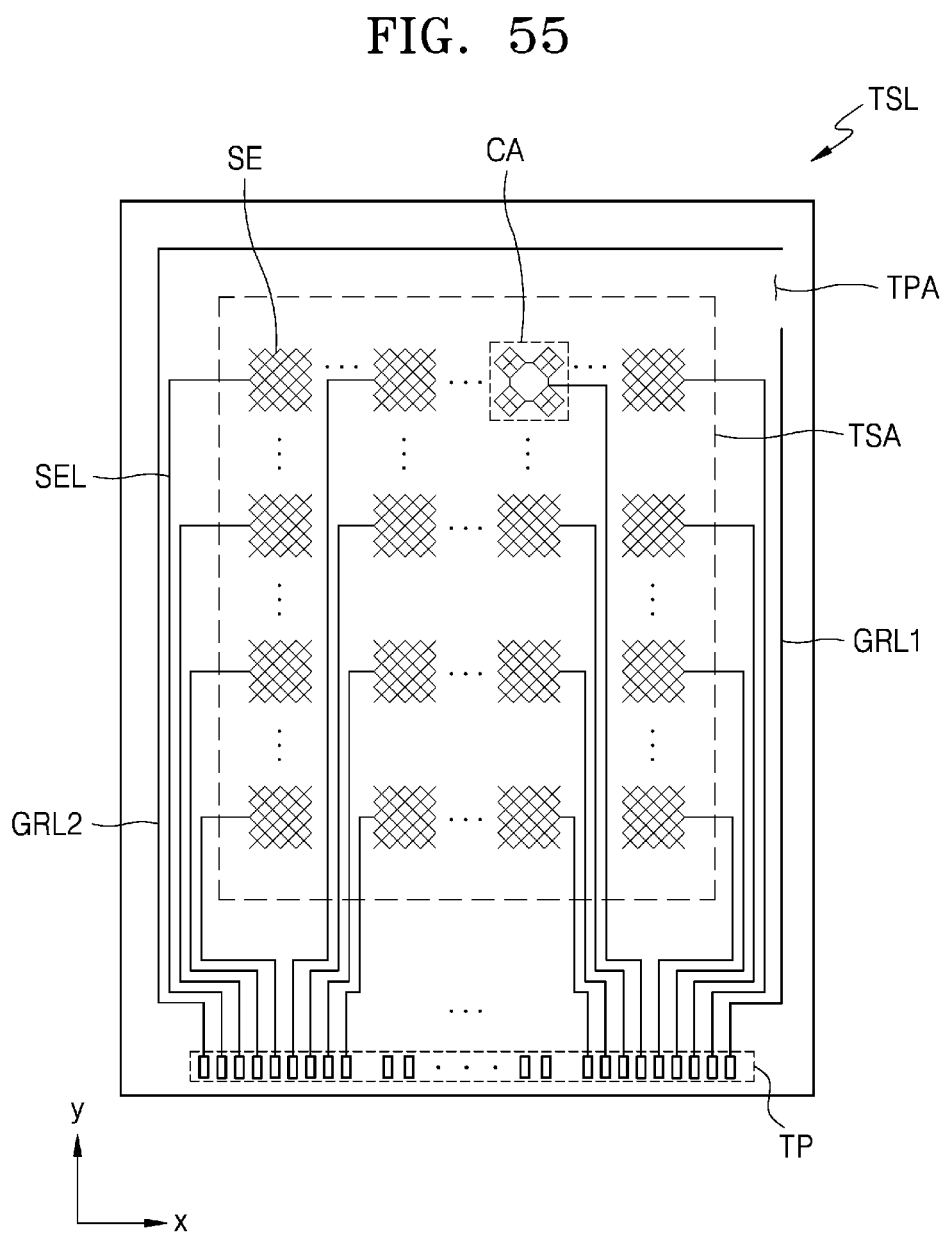

FIG. 55 is a plan view of a touch screen layer TSL of a display panel according to an embodiment.

In FIG. 55, touch electrodes SE of the touch screen layer TSL include one type of electrode, and the touch screen layer TSL is driven using a one-layer self capacitance method of applying a driving signal to the touch electrodes SE and then sensing voltages charged in the self capacitances of the touch electrodes SE. For convenience of explanation, FIG. 55 illustrates only the touch electrodes SE, touch wires SEL, touch pads TP, and first and second ground wires GRL1 and GRL2.

According to an embodiment, portions of the touch screen layer TSL respectively corresponding to the main display area MDA and the component area CA may be both driven according to a self capacitance method.

Referring to FIG. 55, the touch electrodes SE may be electrically separated from each other. The touch electrodes SE may be spaced apart from each other. The touch electrodes SE may be electrically connected to the touch wires SEL, respectively. Although each of the touch electrodes SE include a mesh pattern in FIG. 55, the touch electrodes SE may include no mesh patterns.

The touch wires SEL may be arranged or disposed in the touch sensing area TSA and the touch peripheral area TPA. The touch wires SEL may be arranged or disposed in a portion of the touch peripheral area TPA that may be on a side of the touch sensing area TSA. The touch wires SEL may be electrically connected to the touch electrodes SE, respectively. Each of the touch wires SEL may be arranged or disposed on a side of touch electrodes SE.

A ground voltage may be applied to the first ground wire GRL1 and the second ground wire GRL2. The first ground wire GRL1 may be arranged or disposed in a portion of the touch peripheral area TPA that may be on the left side of the touch sensing area TSA. The second ground wire GRL2 may be arranged or disposed in a portion of the touch peripheral area TPA that may be on the right side of the touch sensing area TSA and a portion of the touch peripheral area TPA that may be on the upper side of the touch sensing area TSA. A guard wire may be arranged or disposed in the touch peripheral area TPA.

Figure 56:
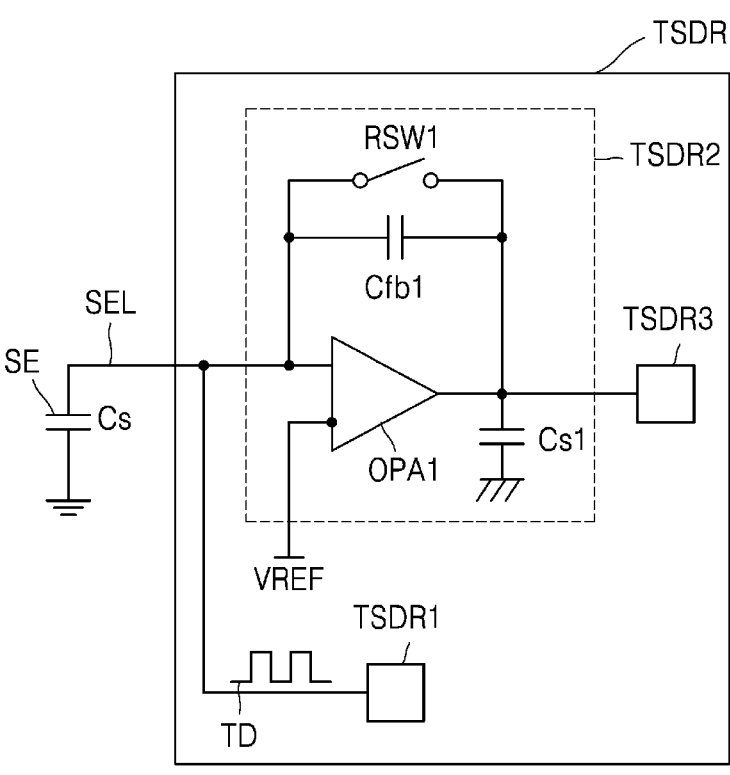
FIG. 56 is a circuit diagram of a touch sensor driving unit connected to each of the touch electrodes of FIG. 55.

FIG. 56 is a circuit diagram of a touch sensor driving unit connected to each of the touch electrodes SE of FIG. 55. For convenience of explanation, FIG. 56 illustrates a touch sensor driving unit TSDR connected to a touch electrode SE.

Referring to FIG. 56, the touch sensor driving unit TSDR may include a driving signal output unit TSDR1, a first sensor sensing unit TSDR2, and a first ADC TSDR3.

The driving signal output unit TSDR1 may output a touch driving signal TD to the touch electrode SE via touch wires SEL. The touch driving signal TD may include pulses. The driving signal output unit TSDR1 may output the touch driving signal TD to the touch wires SEL in a preset sequence.

The first sensor sensing unit TSDR2 senses a voltage charged in a mutual capacitance Cs via the touch wire SEL electrically connected to the touch electrode SE. As shown in FIG. 56, the self capacitance Cs may be formed between the touch electrode SE and another electrode overlapped by the touch electrode SE.

The first sensor sensing unit TSDR2 may include a first operational amplifier OPA1, a first feedback capacitor Cfb1, and a first reset switch RSW1. The first operational amplifier OPA1, the first feedback capacitor Cfb1, and the first reset switch RSW1 of the first sensor sensing unit TSDR2 are substantially the same as those described above with reference to FIG. 53. The first storage capacitor Cs1 may be electrically connected between the output terminal (out) of the first operational amplifier OPA1 and ground and may store an output voltage of the first operational amplifier OPA1.

The first ADC TSDR3 may convert the output voltage Vout1 stored in the first storage capacitor Cs1 into first digital data and may output the first digital data. As such, in the self capacitance method, the self capacitance Cs of the touch electrode SE is charged according to the touch driving signal TD and then a voltage charged in the self capacitance Cs is sensed. Thus, it may be determined whether there is a user's touch.

Figure 57:
FIG. 57 is a plan view of a touch screen layer of a display panel according to an embodiment.

FIG. 57 is a plan view of a touch screen layer TSL of a display panel according to an embodiment.

FIG. 57 explains a case where a portion or region of the touch screen layer TSL is driven according to the mutual capacitance method and a portion thereof is driven according to the self capacitance method. For convenience of explanation, FIG. 57 illustrates only some or a predetermined number of touch electrodes SE, RE, and TE, some or a predetermined number of wires SEL, TL, and RL, and touch pads TP.

According to an embodiment, a portion of the touch screen layer TSL corresponding to the main display area MDA may be driven according to the mutual capacitance method and a portion of the touch screen layer TSL corresponding to the component area CA may be according to the self capacitance method.

The portion of the touch screen layer TSL corresponding to the main display area MDA may include the driving electrodes TE and the sensing electrode RE. The sensing electrodes RE may be arranged or disposed in the first direction (x direction) and may be electrically connected to each other. The driving electrodes TE may be arranged or disposed in the second direction (y direction) intersecting the first direction (x direction) and may be electrically connected to each other. The driving electrodes TE and the sensing electrodes RE may be spaced apart from each other. The driving electrodes TE may be arranged or disposed side by side in the second direction (y direction). At crossing areas of the sensing electrodes RE and the driving electrodes TE, two driving electrodes TE adjacent to each other in the second direction (y direction) may be electrically connected to each other via a first connecting electrode BE1, and two sensing electrodes RE adjacent to each other in the first direction (x direction) may be electrically connected to each other via a second connecting electrode BE2.

The driving electrodes TE and the sensing electrodes RE may be electrically connected to driving wires TL and sensing wire RL arranged or disposed in the touch peripheral area TPA, respectively. The driving wires TL and the sensing wires RL may be electrically connected to the touch pads TP and may transmit or receive signals to or from sensor driving units electrically connected to the touch pads TP. In this case, based on a change in the capacitances between the driving electrodes TE and the sensing electrodes RE arranged or disposed in the main display area MDA, it may be determined whether there is a user's touch.

The component area CA may include touch electrodes SE spaced apart from each other. Each of the touch electrodes SE may be electrically connected to a touch wire SEL. The touch wires SEL may be electrically connected to the touch pads TP and may transmit or receive signals to or from the sensor driving units connected to the touch pads TP. In this case, it may be determined whether there is a user's touch, by sensing voltages charged in the self capacitances Cs of the touch electrodes SE arranged or disposed in the component area CA.

By arranging driving electrodes and sensing electrodes even in the component area CA, existence or absence of a user's touch may be sensed using the mutual capacitance method. However, because the component area CA may include the transmission area TA, in a case that the driving electrodes and the sensing electrodes are arranged or disposed apart from each other by a large distance in order to secure the transmittance of the transmission area TA, it may be difficult to sense a change in the capacitances between the driving electrodes and the sensing electrodes.

According to an embodiment, because the component area CA employs a structure for sensing existence or absence of a user's touch according to the self capacitance method, a minimum number of touch electrodes may be arranged or disposed in the transmission area TA. Thus, the transmittance of the transmission area TA may improve.

Figure 58:
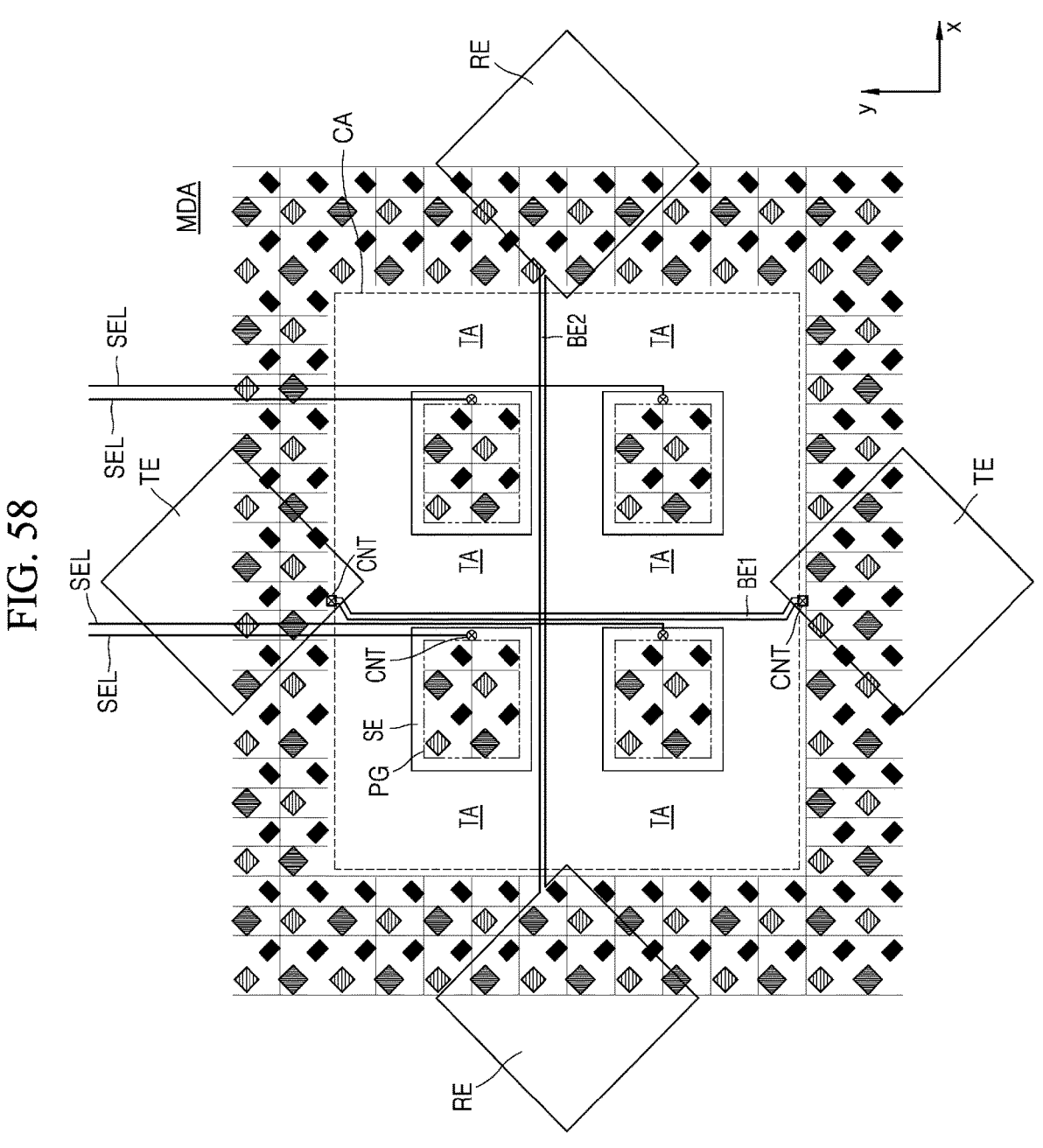
FIGS. 58 and 59 are magnified plan views of respective portions of touch screen layers, according to embodiments.
Figure 59:
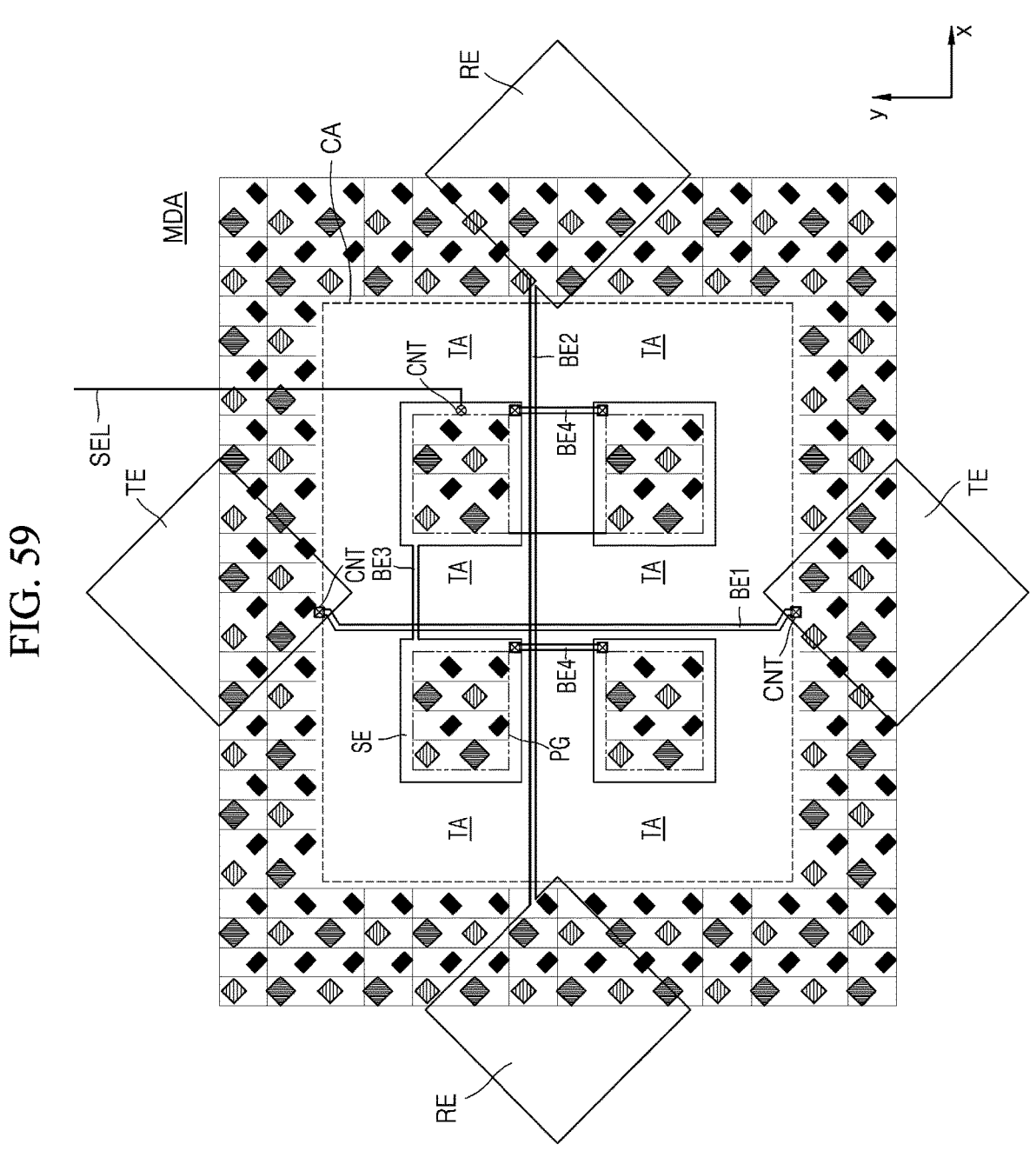

FIGS. 58 and 59 are magnified plan views of respective portions of touch screen layers TSL, according to embodiments. In detail, FIGS. 58 and 59 are magnified plan views of the component area CA and the main display area MDA around the component area CA. FIGS. 58 and 59 illustrate only some or a predetermined number of driving electrodes TE and some or a predetermined number of sensing electrodes RE, and more touch electrodes may be omitted.

Referring to FIGS. 58 and 59, the sensing electrodes RE may be arranged or disposed in the x direction within the main display area MDA, the driving electrodes TE may be arranged or disposed in the y direction within the main display area MDA. The sensing electrodes RE arranged or disposed on the left and right sides of the component area CA may be electrically connected to each other via a second connecting electrode BE2. The second connecting electrode BE2 may extend across the component area CA in the x direction. The second connecting electrode BE2 may be arranged or disposed on the same layer on which the sensing electrodes RE may be arranged or disposed, and may be integral with the sensing electrodes RE.

The driving electrodes TE arranged or disposed on the upper and lower sides of the component area CA may be electrically connected to each other via a first connecting electrode BE1. The first connecting electrode BE1 may extend across the component area CA in the y direction. The first connecting electrode BE1 may be disposed on a different layer from the layer on which the driving electrodes TE may be arranged or disposed, and may be electrically connected to the driving electrodes TE via a contact hole CNT.

The first connecting electrode BE1 and the second connecting electrode BE2 may not be arranged or disposed at the center of the transmission area TA in order to secure transmittance of the transmission area TA, and may be biased toward pixel groups PG in the component area CA. According to an embodiment, the first connecting electrode BE1 and the second connecting electrode BE2 may be arranged or disposed to overlap wires, for example, scan lines and data lines, electrically connecting the pixel circuits of the component area CA. Alternatively, the first connecting electrode BE1 and the second connecting electrode BE2 may be arranged or disposed to overlap a bottom metal layer.

As shown in FIG. 58, touch electrodes SE respectively corresponding to pixel groups PG may be arranged or disposed in the component area CA. Alternatively, as shown in FIG. 59, a single touch electrode SE may be arranged or disposed to correspond to pixel groups PG.

The touch electrodes SE may be electrically connected to the touch wires SEL, respectively. The touch wires SEL may be on a different layer from the layer on which the touch electrodes SE may be arranged or disposed. Accordingly, the touch wires SEL may be electrically connected to the touch electrodes SE via the contact holes CNT. The touch wires SEL may not be arranged or disposed at the center of the transmission area TA in order to secure transmittance of the transmission area TA, and may be biased toward pixel groups PG in the component area CA. According to an embodiment, the touch wires SEL may be arranged or disposed to overlap wires, for example, scan lines and data lines, electrically connecting the pixel circuits of the component area CA. Alternatively, the touch wires SEL may be arranged or disposed to overlap the bottom metal layer BML.

As shown in FIG. 59, in a case that a single touch electrode SE may be arranged or disposed to correspond to pixel groups PG, respective areas of the single touch electrode SE respectively corresponding to the pixel groups PG may be electrically connected to each other via a third connecting electrode BE3 and fourth connecting electrodes BE4. In other words, the single touch electrode SE may include an opening corresponding to the transmission area TA. The third connecting electrode BE3 may be arranged or disposed on the same layer on which the touch electrode SE may be arranged or disposed, and the fourth connecting electrodes BE4 may be arranged or disposed on a different layer from the layer on which the touch electrode SE may be arranged or disposed and may be electrically connected to the touch electrode SE via the contact hole CNT.

According to an embodiment, the driving electrodes TE, the sensing electrodes RE, the touch electrodes SE, the second connecting electrode BE2, and the third connecting electrode BE3 may be included as the second touch conductive layer TCL2 of FIG. 51A. The first connecting electrode BE1, the fourth connecting electrodes BE4, and the touch wires SEL each extending in the y direction may be included as the first touch conductive layer TCL1 of FIG. 51A. The driving electrodes TE, the sensing electrodes RE, and the touch electrodes SE may each have a mesh structure. Alternatively, at least some or a predetermined number of the driving electrodes TE, the sensing electrodes RE, and the touch electrodes SE may each may have no mesh structures and may have a substantially rectangular shape in a plan view. In this case, the driving electrodes TE, the sensing electrodes RE, and the touch electrodes SE may include a transparent conductive material.

Figure 60:
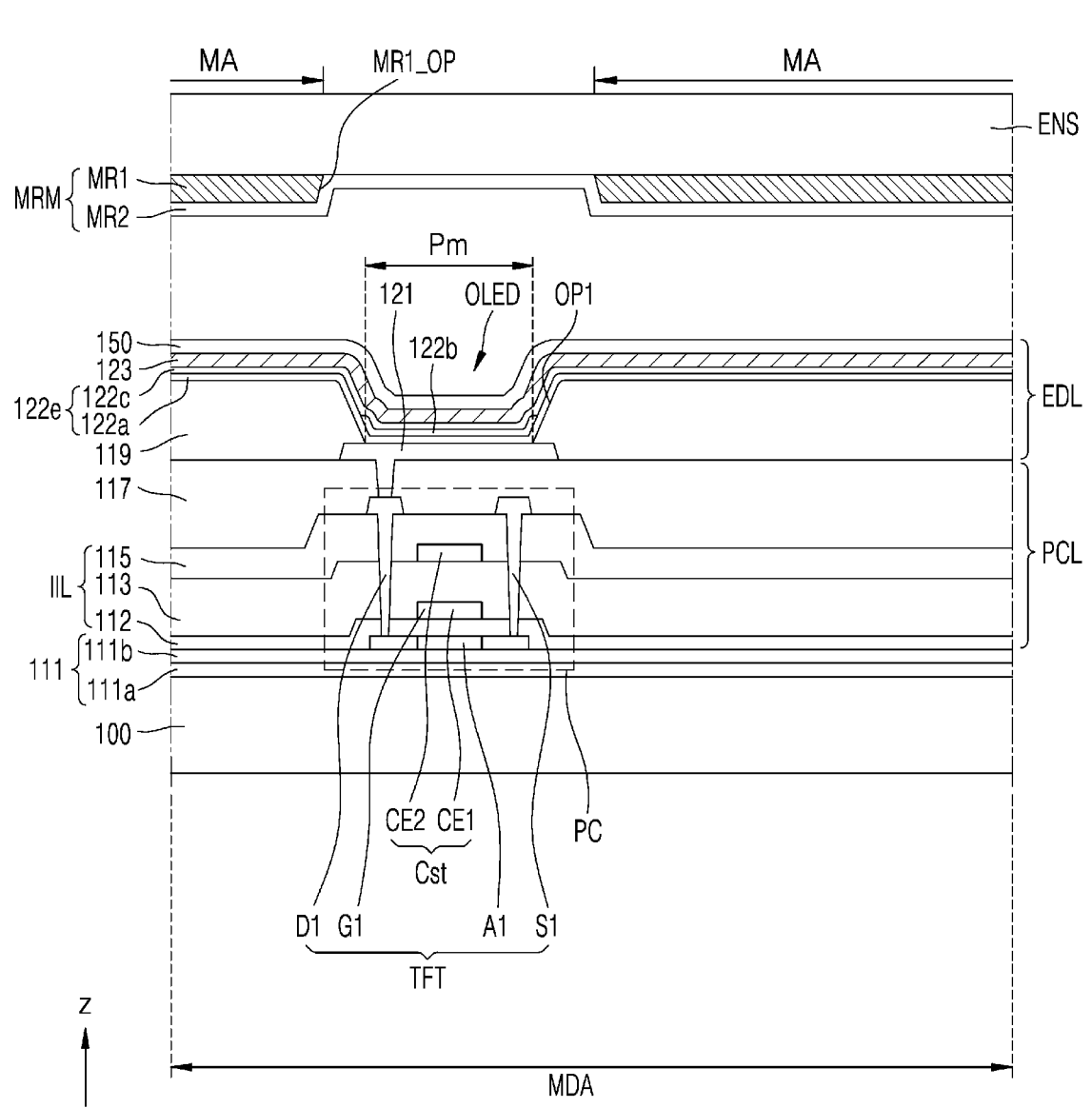
FIGS. 60 through 62 are schematic cross-sectional views of respective portions of display panels according to embodiments.
Figure 61:
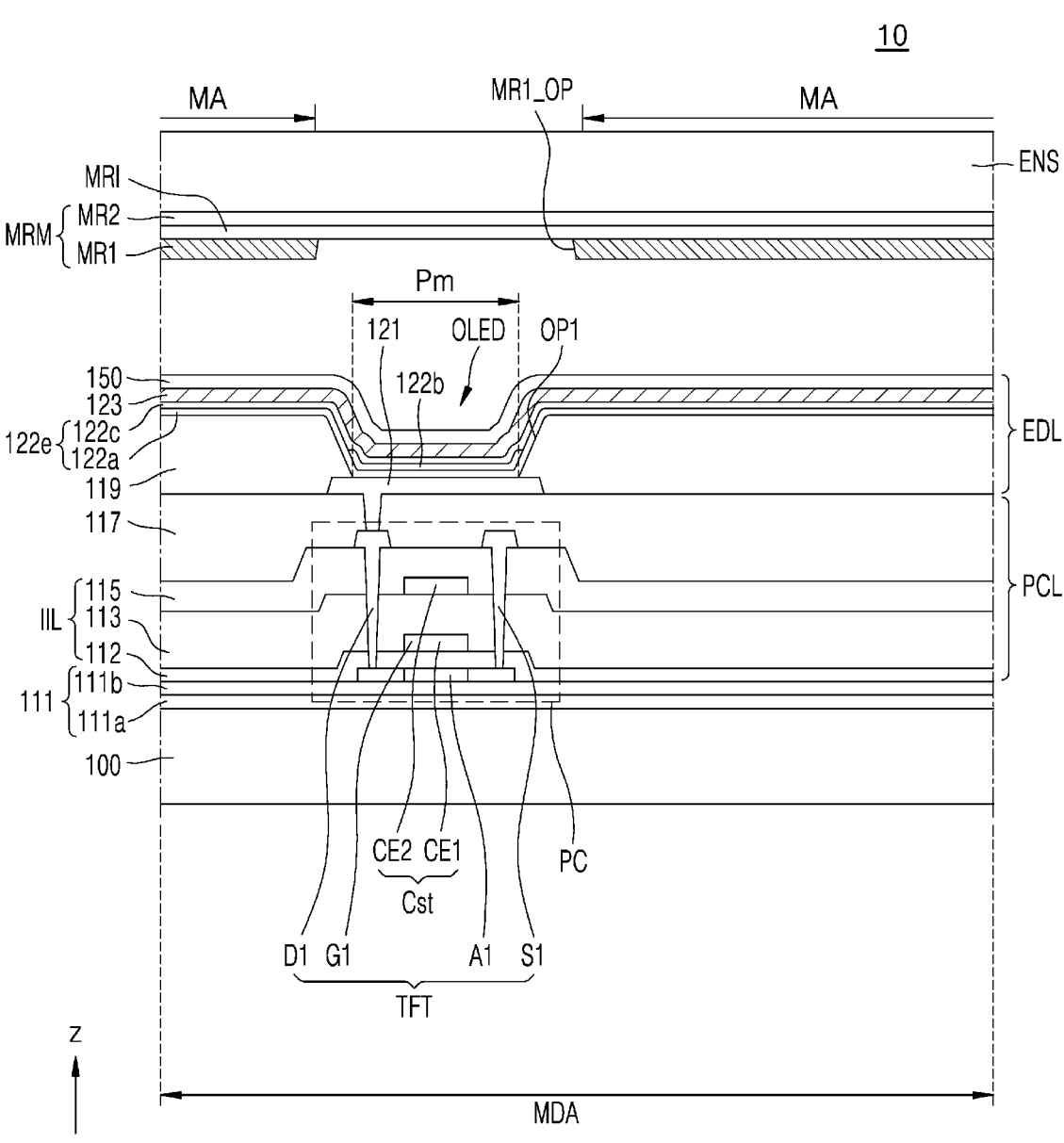
Figure 62:
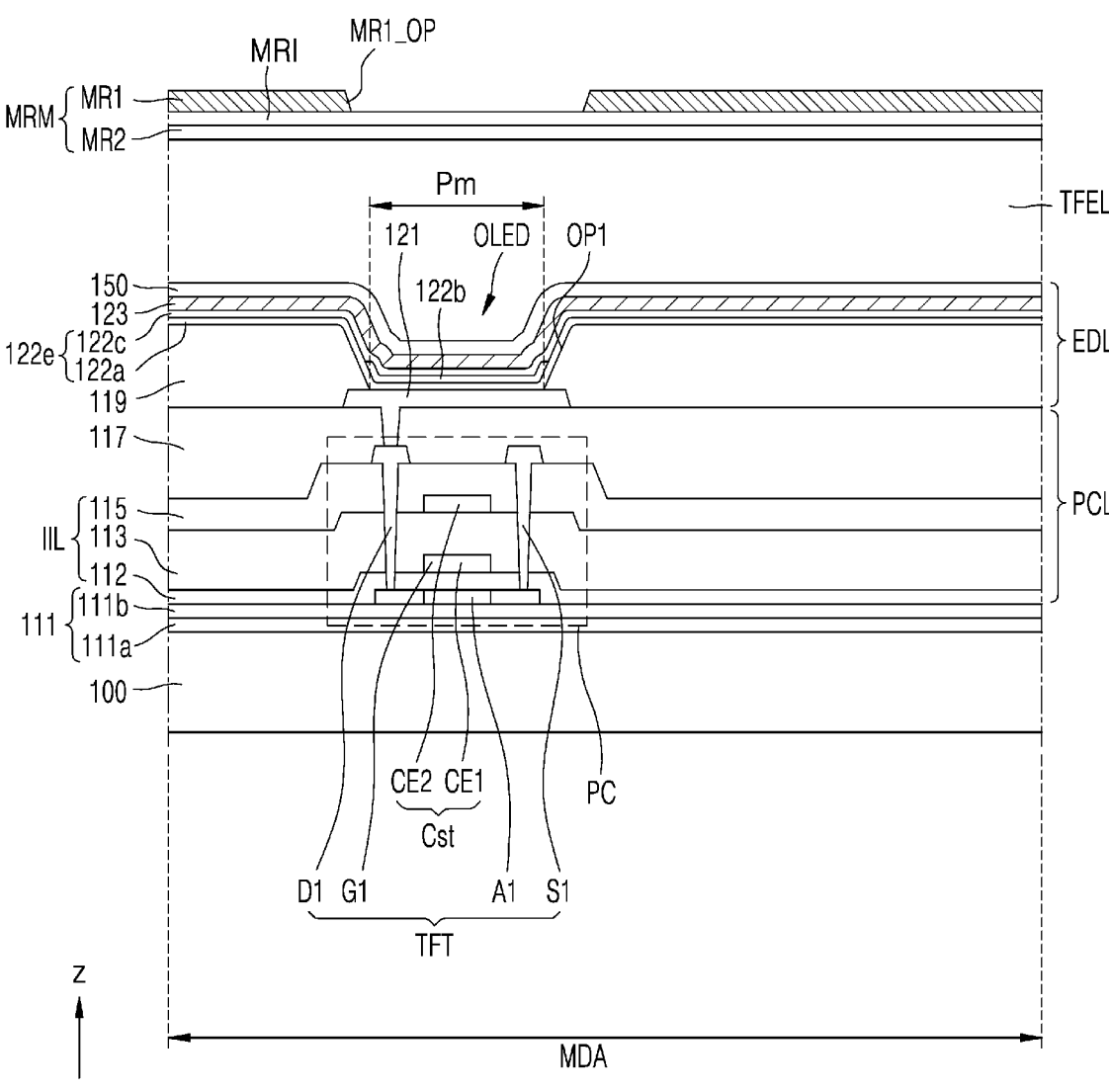

FIGS. 60 through 62 are schematic cross-sectional views of respective portions of display panels 10 according to embodiments. FIGS. 60 through 62 mainly describe inclusion of a mirror area MA in the main display area MDA of a display panel 10. Reference numerals in FIGS. 60 through 62 that are the same as the reference numerals in FIG. 17 denote the same elements, and thus repeated descriptions thereof are omitted.

Referring to FIG. 60, the display panel 10 may include a mirror member MRM, and the main display area MDA of the display panel 10 may include the mirror area MA. The mirror area MA may reflect light incident from the outside of the display panel 10. The display panel 10 may perform a mirror function by including the mirror member MRM. The mirror member MRM may be on one surface of the encapsulation substrate ENS. The mirror member MRM may include a first mirror layer MR1 and a second mirror layer MR2.

The first mirror layer MR1 may be arranged or disposed on a surface of the encapsulation substrate ENS, and may include an opening MR1_OP corresponding to the light-emission areas of main organic light-emitting diodes OLED. Alternatively, the first mirror layer MR1 may be arranged or disposed to correspond to the mirror area MA arranged or disposed on a side of the light-emission areas of display elements, for example, the main organic light-emitting diodes OLED. The first mirror layer MR1 may include, for example, aluminum (Al), chrome (Cr), silver (Ag), iron (Fc), platinum (Pt), mercury (Hg), nickel (Ni), tungsten (W), vanadium (V), or molybdenum (Mo), and may be a single layer or multiple layers.

The second mirror layer MR2 may be arranged or disposed on the first mirror layer MR1 and a surface of the encapsulation substrate ENS, and may be located or disposed within the mirror area MA and the opening MR1_OP of the first mirror layer MR1. The second mirror layer MR2 may be included to reduce irregular reflection that may occur in the opening MR1_OP of the first mirror layer MR1. The second mirror layer MR2 may include aluminum (Al), chrome (Cr), silver (Ag), iron (Fc), platinum (Pt), mercury (Hg), nickel (Ni), tungsten (W), vanadium (V), and molybdenum (Mo), or conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

Reflectance of the first mirror layer MR1 may be higher than reflectance of the second mirror layer MR2. The second mirror layer MR2 may have a smaller thickness than a thickness of the first mirror layer MR1. Because the first mirror layer MR1 may be located or disposed only in the mirror area MA and may have a relatively high reflectance, the first mirror layer MR1 may increase the reflectance of the mirror area MA. Because the second mirror layer MR2 may be located or disposed in the entire main display area MDA and may have a relatively low reflectance and a small thickness, the second mirror layer MR2 may transmit light emitted from the main organic light-emitting diodes OLED.

Referring to FIG. 61, a mirror insulating layer MR1 may be between the second mirror layer MR2 and the first mirror layer MR1 of the mirror member MRM. The second mirror layer MR2, the mirror insulating layer MR1, and the first mirror layer MR1 may be sequentially arranged or disposed on one surface of the encapsulation substrate ENS.

The second mirror layer MR2 may be arranged or disposed in the light-emission area of the main organic light-emitting diode OLED and the mirror area MA, and the first mirror layer MR1 may be arranged or disposed in the mirror area MA. The first mirror layer MR1 may include an opening MR1_OP corresponding to the light-emission area of the main organic light-emitting diode OLED. Reflectance of the first mirror layer MR1 may be higher than reflectance of the second mirror layer MR2.

According to an embodiment, the second mirror layer MR2 may function as a touch electrode of a touch screen layer of self capacitance type. However, embodiments are not limited thereto. The first mirror layer MR1 may function as a touch electrode of a touch screen layer of self capacitance type. Both the first mirror layer MR1 and the second mirror layer MR2 may function as a touch electrode of a touch screen layer of self capacitance type.

In a case that the second mirror layer MR2 functions as a touch electrode of a touch screen layer of self capacitance type, the second mirror layer MR2 may be patterned to have a certain or a predetermined size. The second mirror layer MR2 may include transparent conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

A case where the encapsulation substrate ENS may be applied as the encapsulation member of the display panel 10 has been described above with reference to FIGS. 60 and 61. However, even in a case that a thin-film encapsulation layer may be applied as the encapsulation member of the display panel 10, the mirror member MRM may be applied.

Referring to FIG. 62, a mirror member MRM may be over the thin-film encapsulation layer TFEL of the display panel 10. The mirror member MRM may include a first mirror layer MR1 and a second mirror layer MR2, and a mirror insulating layer MR1 may be between the first mirror layer MR1 and the second mirror layer MR2.

The first mirror layer MR1 may have a higher reflectance than the second mirror layer MR2, and the first mirror layer MR1 may include an opening MR1_OP to correspond to the light-emission area of the main organic light-emitting diode OLED. The first mirror layer MR1 may be disposed in the mirror area MA, and the second mirror layer MR2 may be arranged or disposed to correspond to the mirror area MA and the light-emission area of the main organic light-emitting diode OLED.

The second mirror layer MR2, the mirror insulating layer MR1, and the first mirror layer MR1 may be sequentially stacked above the thin-film encapsulation layer TFEL. According to an embodiment, the second mirror layer MR2 may function as a touch electrode of a touch screen layer of self capacitance type. However, embodiments are not limited thereto. The first mirror layer MR1 may function as a touch electrode of a touch screen layer of self capacitance type. Both the first mirror layer MR1 and the second mirror layer MR2 may function as a touch electrode of a touch screen layer of self capacitance type.

In a case that the second mirror layer MR2 functions as a touch electrode of a touch screen layer of self capacitance type, the second mirror layer MR2 may be patterned to have a certain or a predetermined size. The second mirror layer MR2 may include transparent conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

Figure 63:
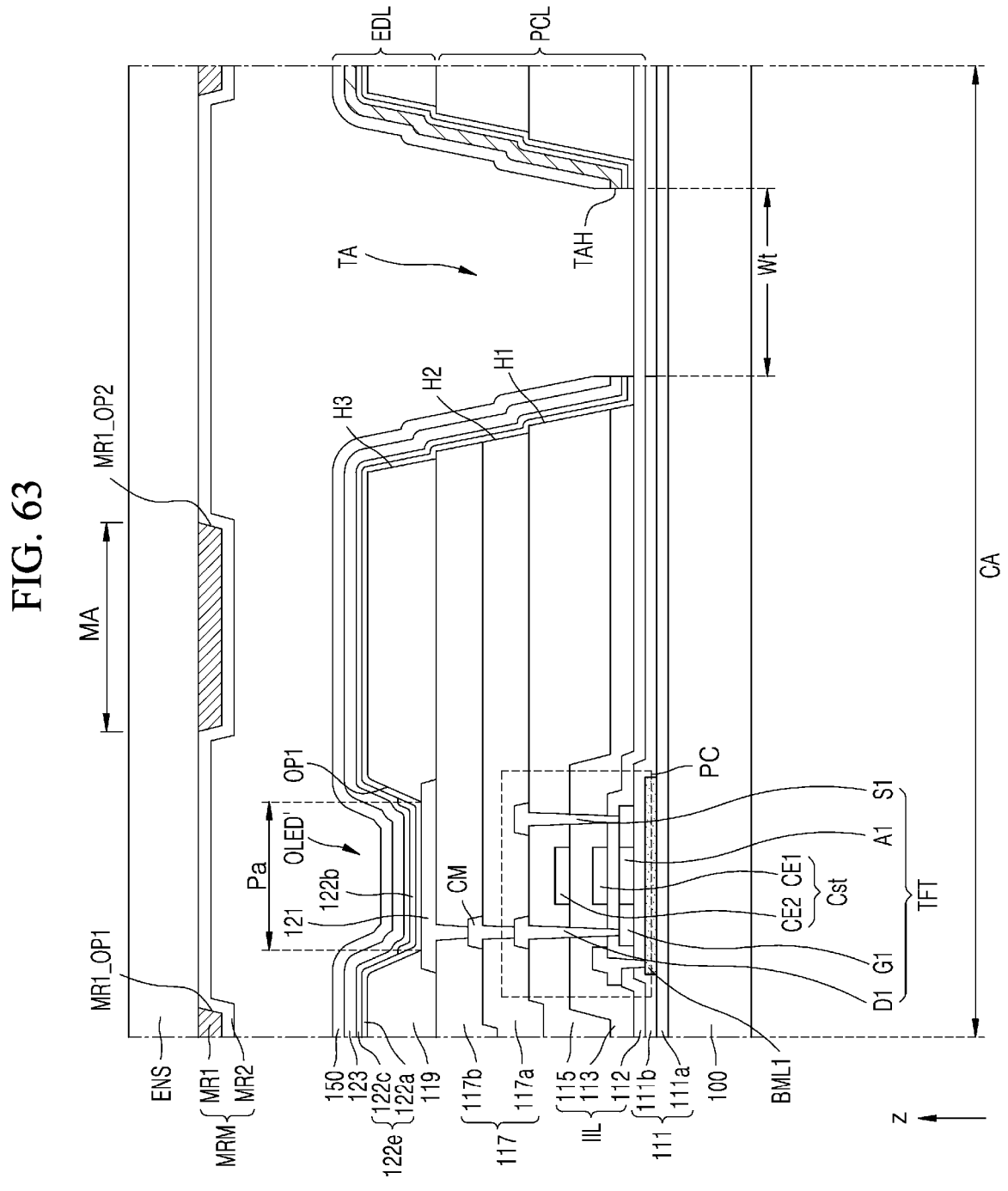
FIGS. 63 and 64 are schematic cross-sectional views of respective portions of display panels according to embodiments.
Figure 64:
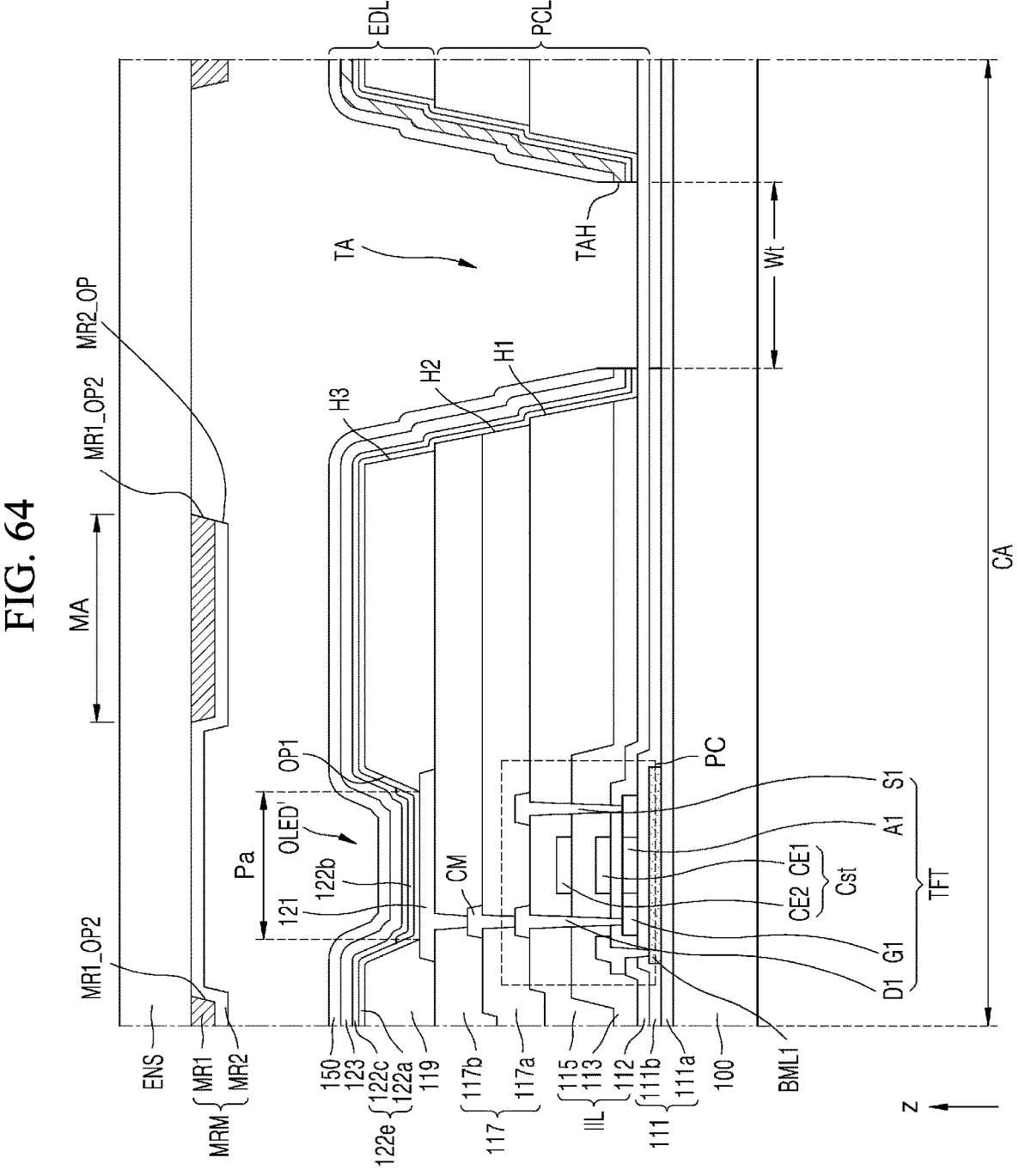

FIGS. 63 and 64 are schematic cross-sectional views of respective portions of display panels 10 according to embodiments. FIGS. 63 and 64 mainly describe inclusion of a mirror area MA in the component area CA of a display panel 10. Reference numerals in FIGS. 63 and 64 that are the same as the reference numerals in FIG. 17 denote the same elements, and thus repeated descriptions thereof are omitted.

Referring to FIG. 63, the display panel 10 may include a mirror member MRM, and the component area CA of the display panel 10 may include the mirror area MA. The mirror member MRM may be on one surface of the encapsulation substrate ENS, and the mirror member MRM may include a first mirror layer MR1 and a second mirror layer MR2.

The first mirror layer MR1 may be arranged or disposed on a surface of the encapsulation substrate ENS, and may include an opening MR1_OP1 corresponding to the light-emission areas of auxiliary organic light-emitting diodes OLED' and an openings MR1_OP2 corresponding to the transmission area TA.

The second mirror layer MR2 may be arranged or disposed on the first mirror layer MR1 and a surface of the encapsulation substrate ENS, and may be located or disposed in the mirror area MA and the openings MR1_OP1 and MR1_OP2 of the first mirror layer MR1. The second mirror layer MR2 may be included to reduce irregular reflection that may occur in the openings MR1_OP1 and MR1_OP2 of the first mirror layer MR1.

Reflectance of the first mirror layer MR1 may be higher than reflectance of the second mirror layer MR2. The second mirror layer MR2 may have a smaller thickness than a thickness of the first mirror layer MR1. Because the first mirror layer MR1 may be located or disposed only in the mirror area MA and may have a relatively high reflectance, the first mirror layer MR1 may increase the reflectance of the mirror area MA. Because the second mirror layer MR2 may be located or disposed in the entire component area CA and may have a relatively low reflectance and a small thickness, the second mirror layer MR2 may transmit light emitted from the auxiliary organic light-emitting diodes OLED' to the outside, and may transmit light that may be incident upon the components 40 of FIG. 2 arranged or disposed below the component area CA.

Although the second mirror layer MR2 may be located or disposed on the entire component area CA in FIG. 63, embodiments are not limited thereto. As shown in FIG. 64, the second mirror layer MR2 may have an opening MR2_OP corresponding to the transmission area TA. Because no display elements may be arranged or disposed in the transmission area TA, small irregular reflection due to display elements may occur. Accordingly, the inclusion of the opening MR2_OP corresponding to the transmission area TA in the second mirror layer MR2 may improve transmittance of the transmission area TA.

Although not shown in the drawings, in the component area CA, an insulating layer may be between the first mirror layer MR1 and the second mirror layer MR2. Although a case where the encapsulation substrate ENS may be applied as the encapsulation member ENCM of the display panel 10 has been described above with reference to FIGS. 63 and 64, embodiments are not limited thereto. A mirror member is applicable to a component area of a display panel 10 including a thin-film encapsulation layer as the encapsulation member ENCM.

Figure 65:
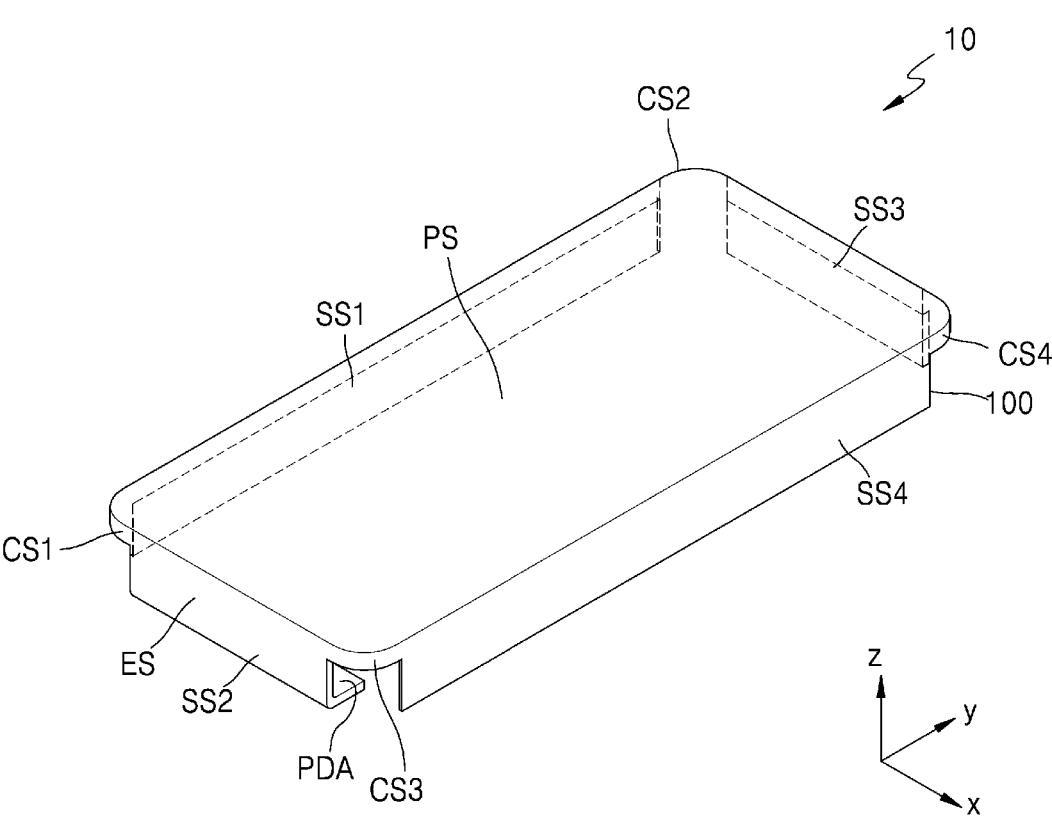
FIG. 65 is a perspective view of a display panel according to an embodiment.
Figure 66:
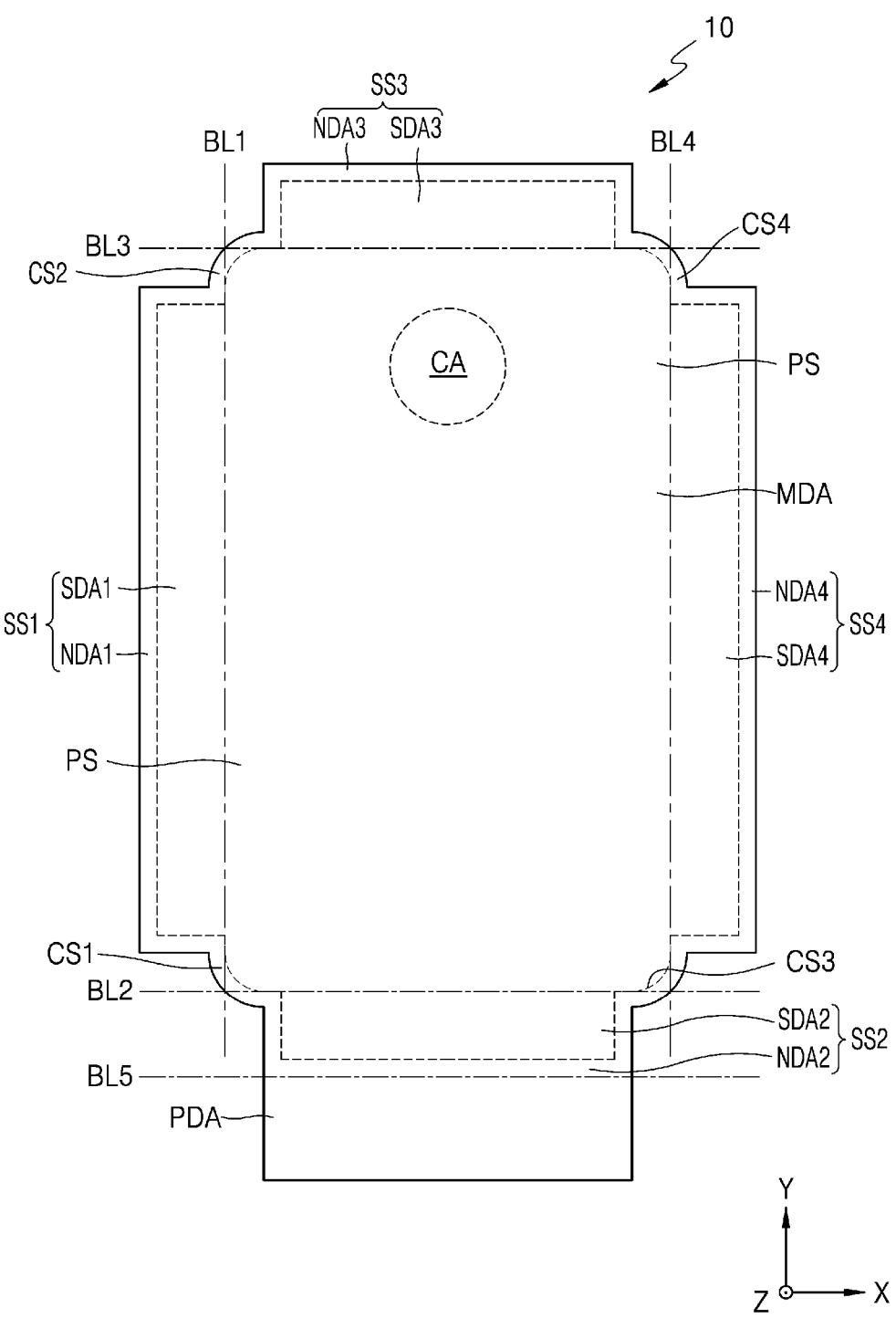
FIG. 66 is an unfolded view of a display panel according to an embodiment.
Figure 67:
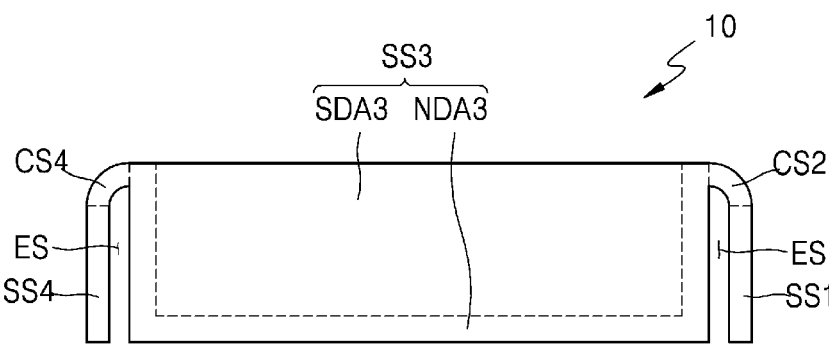
FIG. 67 is a front view of an example of the display panel of FIG. 65.
Figure 67:
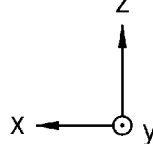
Figure 68:
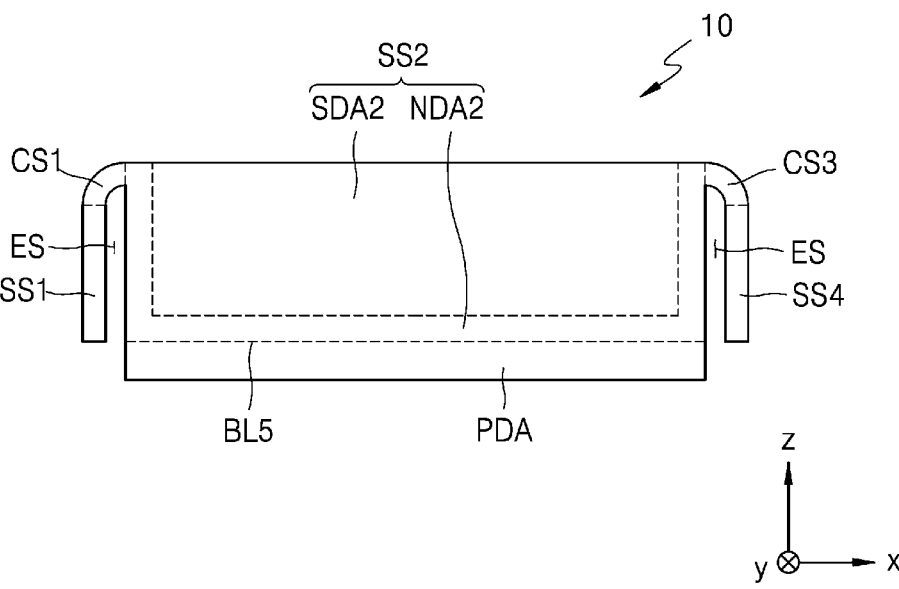
FIG. 68 is a rear view of an example of the display panel of FIG. 65.
Figure 69:
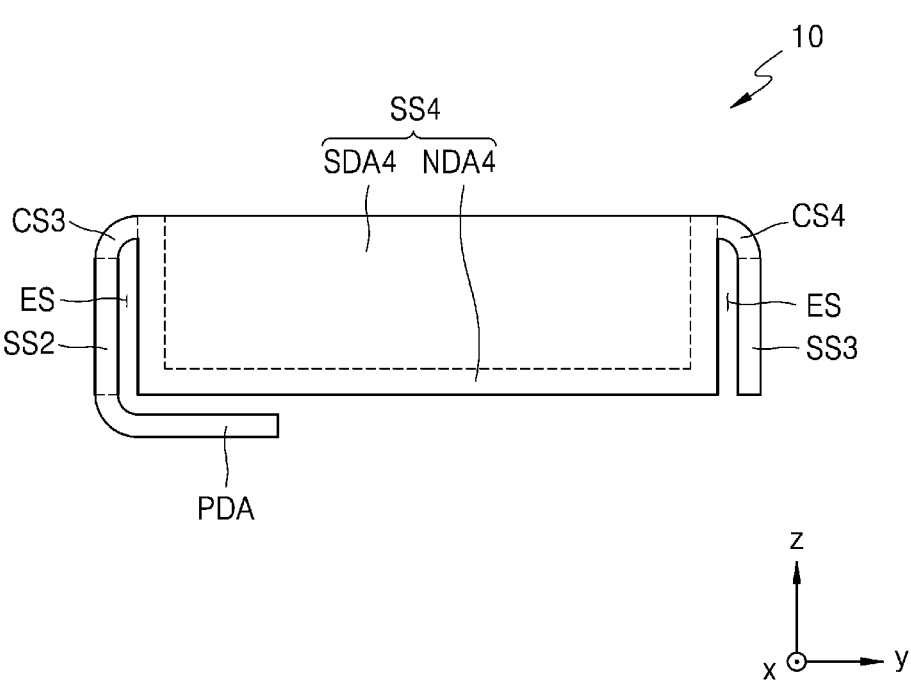
FIG. 69 is a side view of an example of the display panel of FIG. 65.

FIG. 65 is a perspective view of a display panel 10 according to an embodiment. FIG. 66 is an unfolded view of the display panel 10 according to an embodiment. FIG. 67 is a front view of an example of the display panel 10 of FIG. 65. FIG. 68 is a rear view of an example of the display panel 10 of FIG. 65. FIG. 69 is a side view of an example of the display panel 10 of FIG. 65. FIGS. 65 through 69 mainly describe a 4-side edge display in which an image is displayed on an upper surface portion of a display panel and four side surface portions extending from the upper surface portion of the display panel.

Referring to FIGS. 65 through 69, the display panel 10 may include a substrate 100 having an upper surface portion PS, a first side surface portion SS1, a second side surface portion SS2, a third side surface portion SS3, a fourth side surface portion SS4, a first corner portion CS1, a second corner portion CS2, a third corner portion CS3, and a fourth corner portion CS4.

The upper surface portion PS may be a surface that may not bent but may be flat. The upper surface portion PS may be a surface substantially in the form of a rectangle having a shorter edge in the first direction (x direction) and a longer edge in the second direction (y direction). A corner of the upper surface portion PS where the shorter edge and the longer edge meet may be bent with a certain or predetermined curvature. The upper surface portion PS may be an upper surface of the display panel 10.

The first side surface portion SS1 may extend from a first side of the upper surface portion PS. The first side surface portion SS1 may extend from a left side of the upper surface portion PS. The first side surface portion SS1 may be bent at a first bending line BL1. The first bending line BL1 may be a boundary between the upper surface portion PS and the first side surface portion SS1. The first side surface portion SS1 may be a surface in the form of a rectangle having a shorter edge in the third direction (z direction) and a longer edge in the second direction (y direction) according to a plan view. The first side surface portion SS1 may be a left side surface of the display panel 10.

The second side surface portion SS2 may extend from a second side of the upper surface portion PS. The second side surface portion SS2 may extend from a lower side of the upper surface portion PS. The second side surface portion SS2 may be bent at a second bending line BL2. The second bending line BL2 may be a boundary between the upper surface portion PS and the second side surface portion SS2. The second side surface portion SS2 may be a surface in the form of a rectangle having a shorter edge in the third direction (2 direction) and a longer edge in the first direction (x direction) according to a plan view. The second side surface portion SS2 may be a lower side surface of the display panel 10.

The third side surface portion SS3 may extend from a third side of the upper surface portion PS. The third side surface portion SS3 may extend from an upper side of the upper surface portion PS. The third side surface portion SS3 may be bent at a third bending line BL3. The third bending line BL3 may be a boundary between the upper surface portion PS and the third side surface portion SS3. The third side surface portion SS3 may be a surface in the form of a rectangle having a shorter edge in the third direction (2 direction) and a longer edge in the first direction (x direction) according to a plan view The third side surface portion SS3 may be an upper side surface of the display panel 10.

The fourth side surface portion SS4 may extend from a fourth side of the upper surface portion PS. The fourth side surface portion SS4 may extend from a right side of the upper surface portion PS. The fourth side surface portion SS4 may be bent at a fourth bending line BL4. The fourth bending line BL4 may be a boundary between the upper surface portion PS and the fourth side surface portion SS4. The fourth side surface portion SS4 may be a surface in the form of a rectangle having a shorter edge in the third direction (z direction) and a longer edge in the second direction (y direction) according to a plan view. The fourth side surface portion SS4 may be a right side surface of the display panel 10.

The first corner portion CS1 may be between the first side surface portion SS1 and the second side surface portion SS2. A width of the first corner portion CS1 may be less than a width of the first side surface portion SS1 and a width of the second side surface portion SS2. Therefore, an empty space or aperture or cavity ES may be provided between a portion of the first side surface portion SS1 and a portion of the second side surface portion SS2.

The second corner portion CS2 may be between the first side surface portion SS1 and the third side surface portion SS3. A width of the second corner portion CS2 may be less than the width of the first side surface portion SS1 and a width of the third side surface portion SS3. Therefore, an empty space or aperture or cavity ES may be provided between a portion of the first side surface portion SS1 and a portion of the third side surface portion SS3.

The third corner portion CS3 may be between the second side surface portion SS2 and the fourth side surface portion SS4. A width of the third corner portion CS3 may be less than the width of the second side surface portion SS2 and a width of the fourth side surface portion SS4. Therefore, an empty space or aperture or cavity ES may be provided between a portion of the second side surface portion SS2 and a portion of the fourth side surface portion SS4.

The fourth corner portion CS4 may be between the third side surface portion SS3 and the fourth side surface portion SS4. A width of the fourth corner portion CS4 may be less than the width of the third side surface portion SS3 and the width of the fourth side surface portion SS4. Therefore, an empty space or aperture or cavity ES may be provided between a portion of the third side surface portion SS3 and a portion of the fourth side surface portion SS4.

A pad area PDA may extend from a side of the second side surface portion SS2. The pad area PDA may be bent at a fifth bending line BL5. The fifth bending line BL5 may be a boundary between the second side surface portion SS2 and the pad area PDA. The pad area PDA may be a surface in the form of a rectangle having a shorter edge in the second direction (y direction) and a longer edge in the first direction (x direction) according to a plan view. The pad area PDA may be a lower surface of the display panel 10 that may be opposite to the upper surface of the display panel 10.

The upper surface portion PS may include a main display area MDA on which a main image may be displayed. The upper surface portion PS may include no non-display areas, and thus the entire upper surface portion PS may be the main display area MDA. A component area CA may be arranged or disposed in the upper surface portion PS. Although the component area CA may be surrounded by or be adjacent to the main display area MDA in FIG. 66, the component area CA may employ any of the various arrangements and various shapes described above with reference to FIGS. 8A through 8I.

The first side surface portion SS1 may include a first sub-display area SDA1 displaying a first sub-image, and a first non-display area NDA1. As shown in FIG. 66, the first non-display area NDA1 may be on an upper edge, a left edge, and a lower edge of the first side surface portion SS1. The first sub-display area SDA1 may extend from a left side of the main display area MDA. The first sub-display area SDA1 may be an area of the first side surface portion SS1 except for the first non-display area NDA1.

The second side surface portion SS2 may include a second sub-display area SDA2 displaying a second sub-image, and a second non-display area NDA2. As shown in FIG. 66, the second non-display area NDA2 may be on a left edge, a lower edge, and a right edge of the second side surface portion SS2. The second sub-display area SDA2 may extend from a lower side of the main display area MDA. The second sub-display area SDA2 may be an area of the second side surface portion SS2 except for the second non-display area NDA2.

The third side surface portion SS3 may include a third sub-display area SDA3 displaying a third sub-image, and a third non-display area NDA3. As shown in FIG. 66, the third non-display area NDA3 may be on a left edge, an upper edge, and a right edge of the third side surface portion SS3. The third sub-display area SDA3 may extend from an upper side of the main display area MDA. The third sub-display area SDA3 may be an area of the third side surface portion SS3 except for the third non-display area NDA3.

The fourth side surface portion SS4 may include a fourth sub-display area SDA4 displaying a fourth sub-image, and a fourth non-display area NDA4. As shown in FIG. 66, the fourth non-display area NDA4 may be on an upper edge, a right edge, and a lower edge of the fourth side surface portion SS4. The fourth sub-display area SDA4 may extend from a right side of the main display area MDA. The fourth sub-display area SDA4 may be an area of the fourth side surface portion SS4 except for the fourth non-display area NDA4.

Although the first corner portion CS1, the second corner portion CS2, the third corner portion CS3, and the fourth corner portion CS4 may be non-display areas in FIGS. 65 through 69, embodiments are not limited thereto. A portion of the first corner portion CS1, a portion of the second corner portion CS2, a portion of the third corner portion CS3, and a portion of the fourth corner portion CS4 may be display areas on which an image is displayed. In this case, the portion of the first corner portion CS1, the portion of the second corner portion CS2, the portion of the third corner portion CS3, and the portion of the fourth corner portion CS4 may extend from the main display area MDA.

Figure 70A:
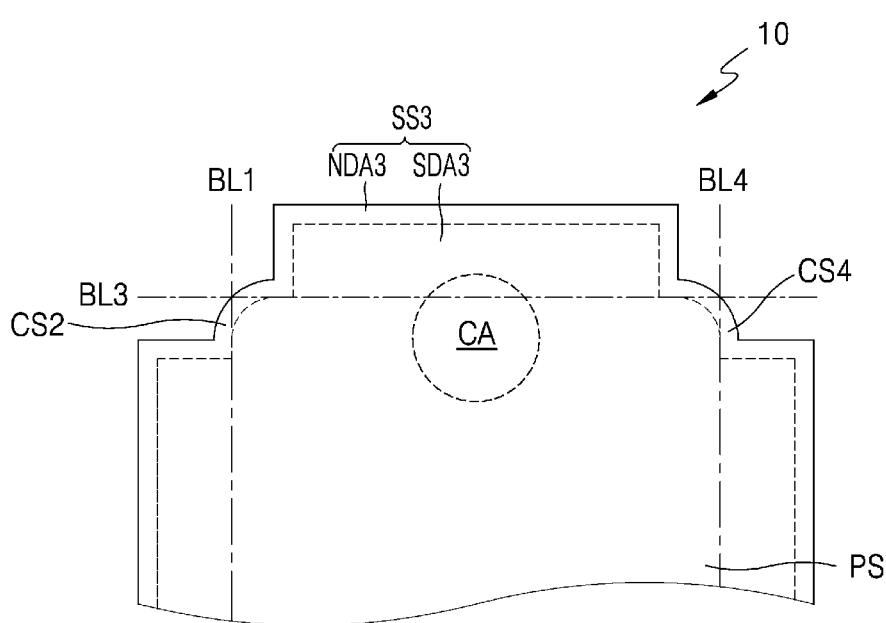
FIG. 70A is an unfolded view of a portion or region of a display panel according to an embodiment.
Figure 70B:
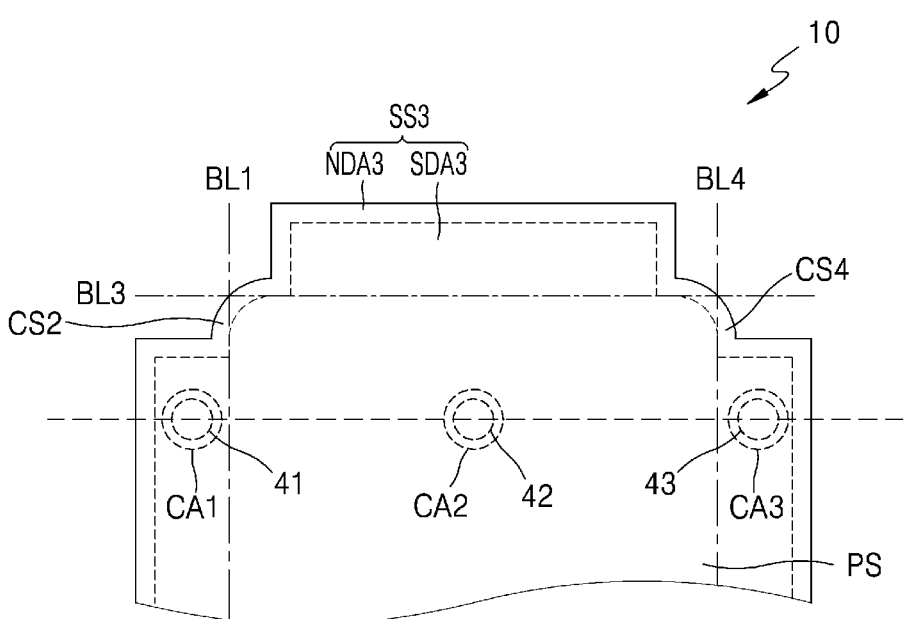
FIG. 70B is an unfolded view of a portion or region of a display panel according to an embodiment.

FIGS. 70A and 70B are unfolded views of a portion of a display panel according to an embodiment. The embodiment of FIGS. 70A and 70B may be different from the embodiment of FIG. 66 in that a component area CA may be arranged or disposed in a side surface portion of the display panel 10.

Referring to FIG. 70A, the component area CA may be disposed on a boundary between the upper surface portion PS of the display panel 10 and the third side surface portion SS3. Accordingly, the component area CA may be surrounded by or be adjacent to a portion of the main display area MDA and a portion of the third sub-display area SDA3. The component area CA may overlap the third bending line BL3 and thus may be on a bent area. Likewise, the component area CA may overlap the first bending line BL1, the second bending line BL2, and/or the fourth bending line BL4.

Greater reflection by external light may occur in a bent area of the display panel 10 than in other areas thereof. Accordingly, in a case that the component area CA may be arranged or disposed in the bent area of the display panel 10, visibility of the component area CA may be reduced. Because resolution of the component area CA may be less than resolution of the main display area MDA, it may be favorable that a user does not visually recognize the resolution difference.

Referring to FIG. 70B, the component area CA may include a first component area CA1 arranged or disposed in the first side surface portion SS1, a second component area CA2 arranged or disposed in the upper surface portion PS, and a third component area CA3 arranged or disposed in the fourth side surface portion SS4.

The first component area CA1, the second component area CA2, and the third component area CA3 may be aligned in a straight line in the unfolded view of the display panel 10. A first component 41 may be arranged or disposed below the first component area CA1, a second component 42 may be arranged or disposed below the second component area CA2, and a third component 43 may be arranged or disposed below the third component area CA3. In a case that the first through third components 41 through 43 are cameras, the above-described arrangement thereof may enable image capturing at various angles. For example, even in a case that a user does not move the display panel 10, panoramic imaging may be possible.

Figure 71:
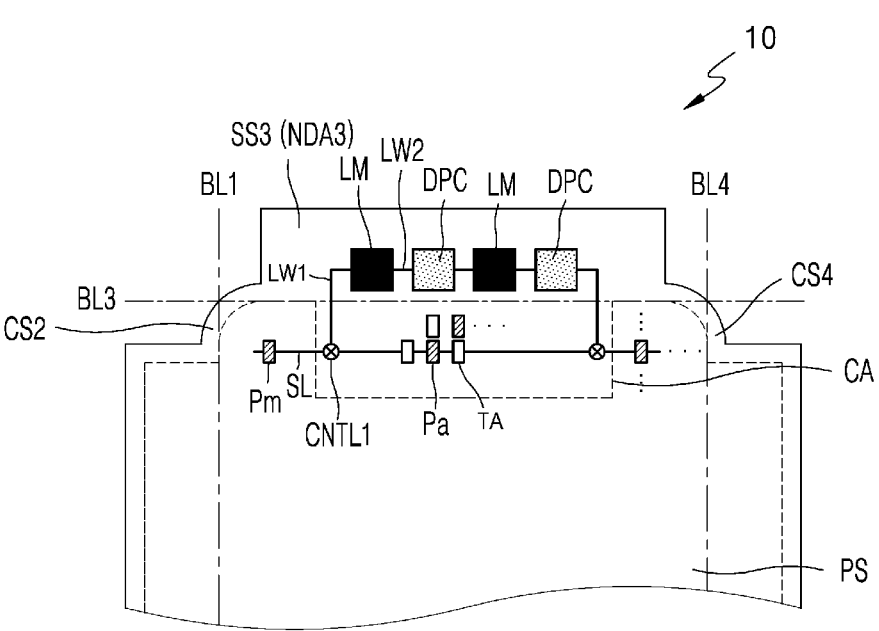
FIG. 71 is an unfolded view of a portion or region of a display panel according to an embodiment.

FIG. 71 is an unfolded view of a portion or region of a display panel 10 according to an embodiment. The embodiment of FIG. 71 may be different from the embodiment of FIG. 66 in that a side surface portion of the display panel 10 does not display an image.

Referring to FIG. 71, the third side surface portion SS3 may include no sub-display areas, and may include only the third non-display area NDA3. The component area CA may be in the upper surface portion PS but may be adjacent to the third side surface portion SS3. Accordingly, a load matching unit LM and/or a dummy pixel circuit DPC to which the component area CA may be connected may be arranged or disposed in the third side surface portion SS3 adjacent to the component area CA.

The load matching unit LM and/or the dummy pixel circuit DPC may be arranged or disposed in the peripheral area DPA near the component area CA and may be electrically connected to the pixel circuits of the main subpixels Pm arranged or disposed in the main display area MDA via the first load connection line LW1. For example, the first load connection line LW1 may be electrically connected to a scan line SL traversing a main subpixel Pm, via a contact hole CNTL1. According to an embodiment, the first load connection line LW1 may include the same or similar material as that included in the bottom metal layer BML of FIG. 17 and may be arranged or disposed on the same layer on which as the bottom metal layer BML of FIG. 17 may be arranged or disposed. Because a portion of a scan line SL that traverses the component area CA may be electrically connected to the pixel circuit of an auxiliary subpixel Pa, the first load connection line LW1 may be included as a conductive layer arranged or disposed on a different layer from the layer on which the scan line SL may be arranged or disposed.

Because the number of auxiliary subpixels Pa per unit area of the component area CA may be less than the number of main subpixels Pm per unit area of the main display area MDA, a load applied to a scan line SL traversing the component area CA may be different from a load applied to a scan line SL traversing only the main display area MDA. Accordingly, brightness non-uniformity may occur in the display area DA. According to an embodiment, the employment of the load matching unit LM and/or the dummy pixel circuit DPC may make the electrical load of the entire display area DA uniform, thereby securing brightness uniformity.

Load matching units LM and/or dummy pixel circuits DPC may be included, and the load matching units LM and/or the dummy pixel circuits DPC may be electrically connected to each other via the second load connection line LW2. Due to the load matching units LM and/or the dummy pixel circuits DPC being electrically connected to each other, an equipotential area may be expanded to thereby prevent the display area DA from being damaged by static electricity.

Figure 72:
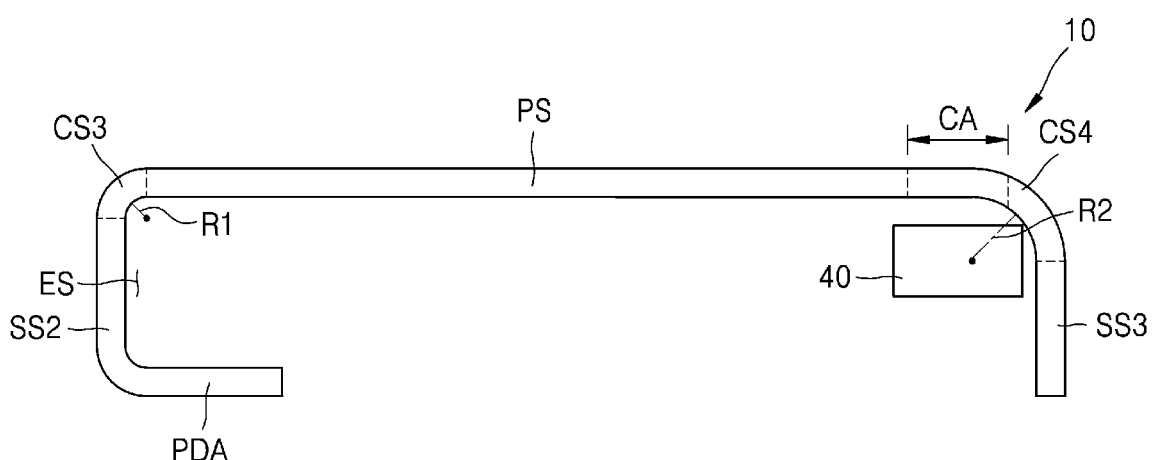
FIG. 72 is a schematic cross-sectional view of a portion or region of a display panel according to an embodiment.

FIG. 72 is a schematic cross-sectional view of a portion or region of a display panel 10 according to an embodiment. The embodiment of FIG. 72 may be different from the embodiment of FIG. 69 in that a second side surface portion and a third side surface portion of a display panel are bent from an upper surface portion of the display panel with different curvatures.

Referring to FIG. 72, the component area CA may be disposed in the upper surface portion PS but may be adjacent to the third side surface portion SS3. Because the component 40 may be overlappingly arranged or disposed below the component area CA, a radius of curvature of the third side surface portion SS3 may be changed according to the size of the component 40. According to an embodiment, a radius of curvature R2 with which the third side surface portion SS3 to which the component 40 may be adjacent may be bent from the upper surface portion PS may be greater than a radius of curvature R1 with which the second side surface portion SS2 may be bent from the upper surface portion PS.

Likewise, the radius of curvature R2 with which the third side surface portion SS3 to which the component 40 may be adjacent may be bent from the upper surface portion PS may be greater than a radius of curvature with which the first side surface portion SS1 is bent from the upper surface portion PS or a radius of curvature with which the fourth side surface portion SS4 is bent from the upper surface portion PS.

Figure 73A:
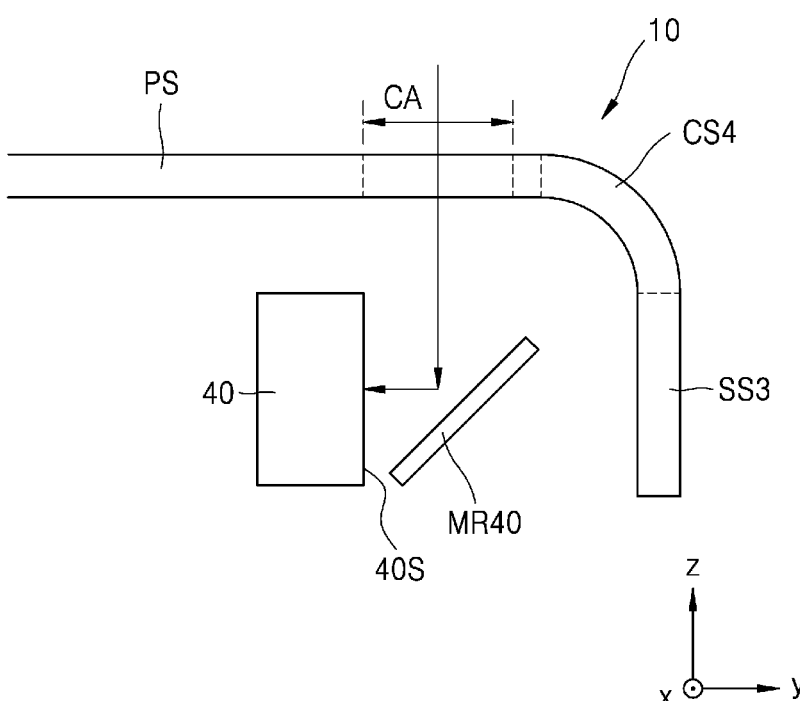
FIGS. 73A through 73C are schematic cross-sectional views illustrating positional relationships between a display panel according to an embodiment and a component arranged or disposed below the display panel.
Figure 73B:
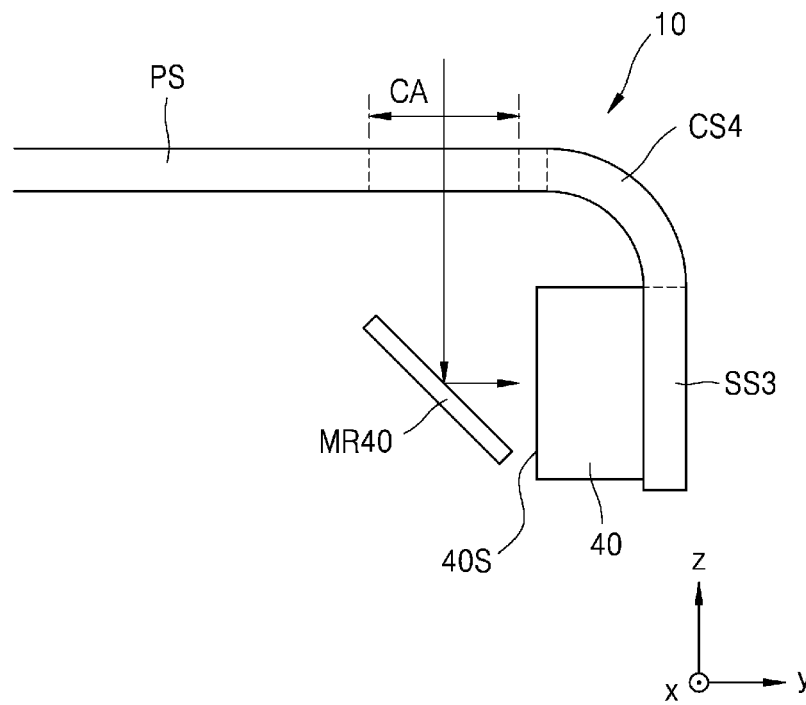
Figure 73C:
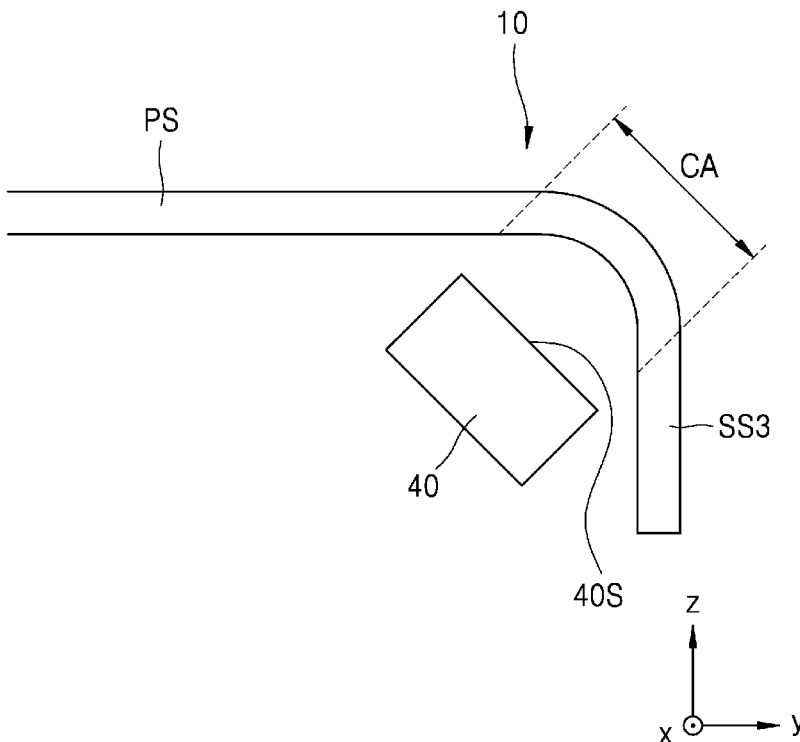

FIGS. 73A through 73C are schematic cross-sectional views illustrating positional relationships between a display panel 10 according to an embodiment and a component arranged or disposed below the display panel 10. FIGS. 73A through 73C illustrate a portion or region of the display panel 10 of FIG. 69.

Referring to FIG. 73A, the component area CA of the display panel 10 may be disposed in the upper surface portion PS of the display panel 10, and the component area CA may be adjacent to the third side surface portion SS3. In this case, due to the size of the component 40, a light-receiving surface 40S of the component 40 may be difficult to face the component area CA. In this case, the light-receiving surface 40S of the component 40 may be arranged or disposed to face the third side surface portion SS3, and a reflection mirror MR40 that changes a light path may be arranged or disposed in front of the light-receiving surface 40S of the component 40.

Referring to FIG. 73B, the component area CA of the display panel 10 may be in the upper surface portion PS of the display panel 10, and the component 40 may be attached to a lower surface of the third side surface portion SS3. In this case, the light-receiving surface 40S of the component 40 may be arranged or disposed to face an opposite direction (−y direction) to the direction toward the third side surface portion SS3, and the reflection mirror MR40 that changes a light path may be arranged or disposed in front of the light-receiving surface 40S of the component 40.

Referring to FIG. 73C, the component area CA of the display panel 10 may extend over the upper surface portion PS and the third side surface portion SS3 of the display panel 10. In this case, the light-receiving surface 40S of the component 40 may face the component area CA between the upper surface portion PS and the third side surface portion SS3. The light-receiving surface 40S of the component 40 may be arranged or disposed at various angles with respect to the upper surface portion PS.

Figure 74:
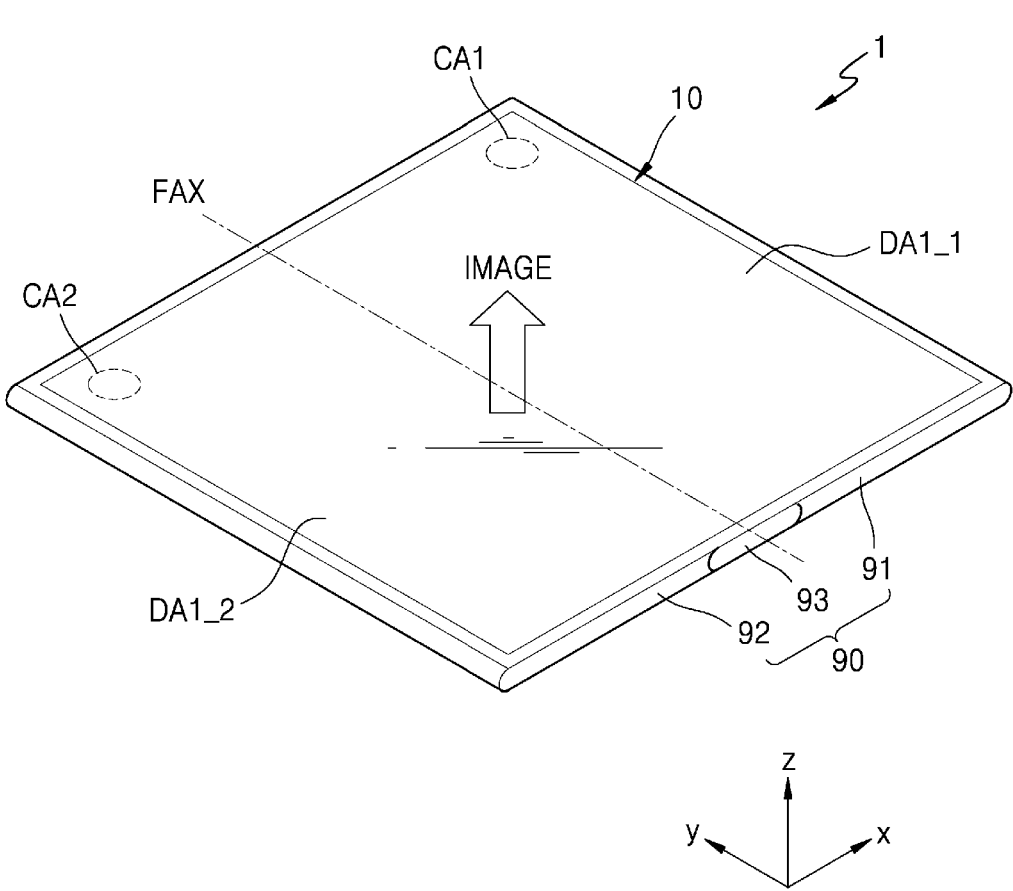
FIG. 74 is a schematic perspective view of a display apparatus according to an embodiment.
Figure 75:
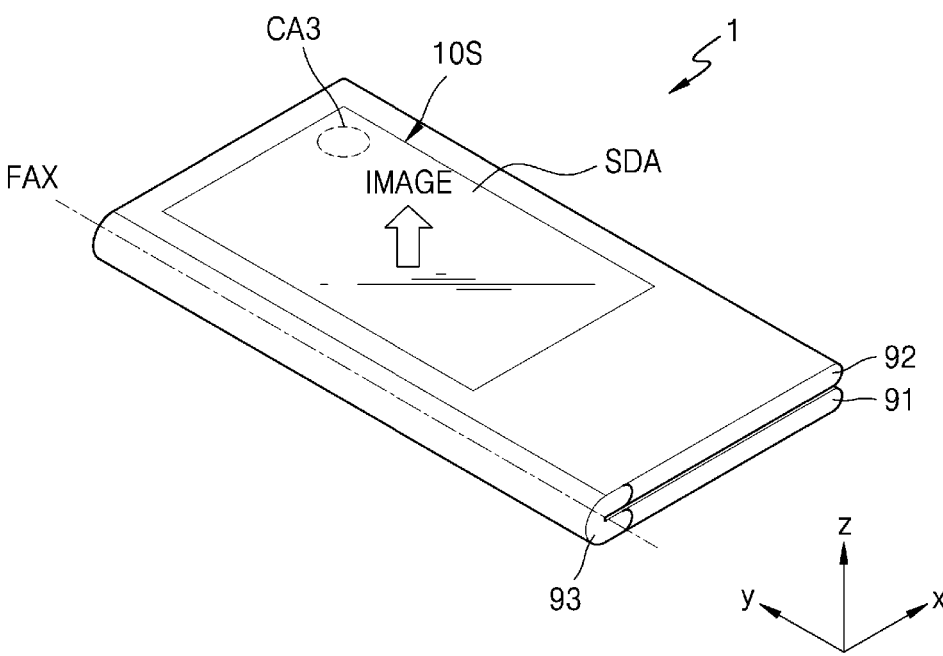
FIG. 75 illustrates a state in which the display apparatus of FIG. 74 is folded.

FIG. 74 is a schematic perspective view of a display apparatus 1 according to an embodiment. FIG. 75 illustrates a state in which the display apparatus 1 of FIG. 74 is folded.

Referring to FIG. 74, the display apparatus 1 may include a lower cover 90 and a display panel 10. The lower cover 90 may include a first portion 91 and a second portion 92 that may support the portions of the display panel 10. The lower cover 90 may be folded about a folding axis FAX between the first portion 91 and the second portion 92. According to an embodiment, a third portion 93 between the first portion 91 and the second portion 92 may have a hinge structure.

The display panel 10 may include a display area including a main display area and a component area. The display panel 10 may be folded together with the lower cover 90, and portions of the display area of the first display panel 10 folded about the folding axis FAX, which may extend across the display area, may face each other. For convenience of explanation, the portions of the display area, which may be a screen area, arranged or disposed on both sides of the folding axis FAX will now be referred to as a first display area DA1_1 and a second first display area DA1_2. A first component area CA1 may be in the first display area DA1_1, and a second component area CA2 may be in the second first display area DA1_2.

The display apparatus 1 may be folded about the folding axis FAX. In this case, the first display area DA1_1 and the second first display area DA1_2 of the display panel 10 may face each other. The first component area CA1 arranged or disposed inside the first display area DA1_1 and the second component area CA2 arranged or disposed inside the second first display area DA1_2 may be arranged or disposed to face each other. In other words, in a case that the display apparatus 1 is folded, the first component area CAL and the second component area CA2 may overlap each other.

The display apparatus 1 may include a sub display panel 10S that may display an image in a different direction from the direction in which an image surface, for example, the display area, of the display panel 10 displays an image. Referring to FIG. 75, the sub display panel 10S in the folded display apparatus 1 may display an image through a display area exposed in a different direction from the display panel 10 (hereinafter, referred to as a sub display area SDA). The sub display panel 10S may be supported by a portion of the lower cover 90, for example, the second portion 92.

A third component area CA3 may be inside the sub display area of the sub display panel 10S. In a case that the display apparatus 1 is folded, the third component area CA3 may overlap the first and second component areas CA1 and CA2.

Figure 76:
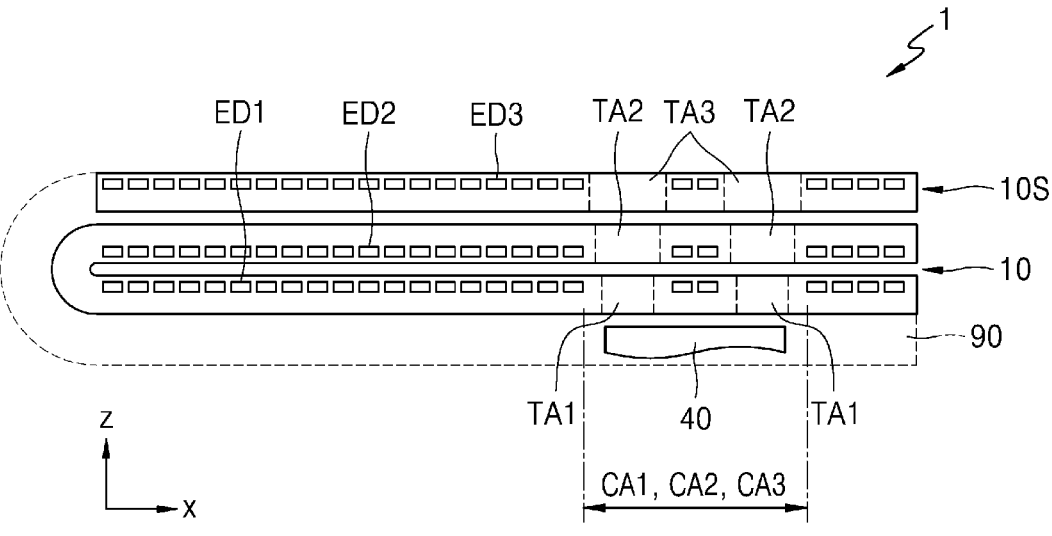
FIG. 76 is a schematic cross-sectional view of a state in which the display apparatus of FIG. 75 is folded.

FIG. 76 is a schematic cross-sectional view of the folded display apparatus 1 of FIG. 75, and FIGS. 77A through 77C illustrate first through third component areas CA1 through CA3 according to an embodiment, respectively.

Referring to FIG. 76, in a case that the display apparatus 1 is folded, the first through third component areas CA1 through CA3 may overlap each other, and the component 40 may be arranged or disposed below the first through third component areas CA1 through CA3. In other words, in a case that the display apparatus 1 is folded, the first component area CA1, the second component area CA2, and the third component area CA3 may be sequentially stacked over the component 40.

The first component area CA1 may include first transmission areas TA1, and the second component area CA2 may include second transmission areas TA2. The third component area CA3 may include third transmission areas TA3. The third transmission areas TA3 may overlap the second transmission areas TA2 and the first transmission areas TA1.

According to an embodiment, to reduce interference of light being emitted from the component 40 or traveling toward the component 40, the entire area of the third transmission area TA3 may be equal to or greater than that of the second transmission area TA2, and the entire area of the second transmission area TA2 may be equal to or greater than that of the first transmission area TA1. To express this, FIG. 76 illustrates that a width of the first transmission area TA1 is less than that of the second transmission area TA2 and a width of the second transmission area TA2 is less than that of the third transmission area TA3.

Figure 77A:
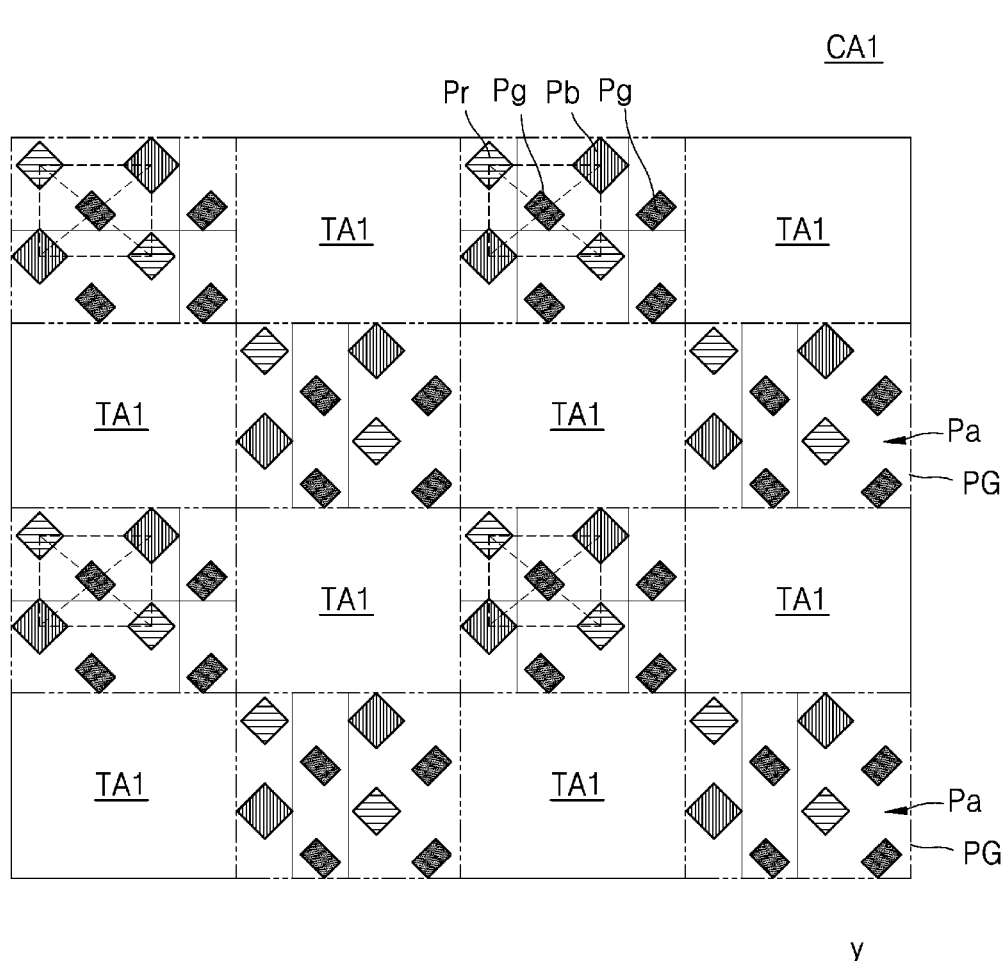
FIGS. 77A through 77C illustrate first through third component areas according to an embodiment.
Figure 77B:
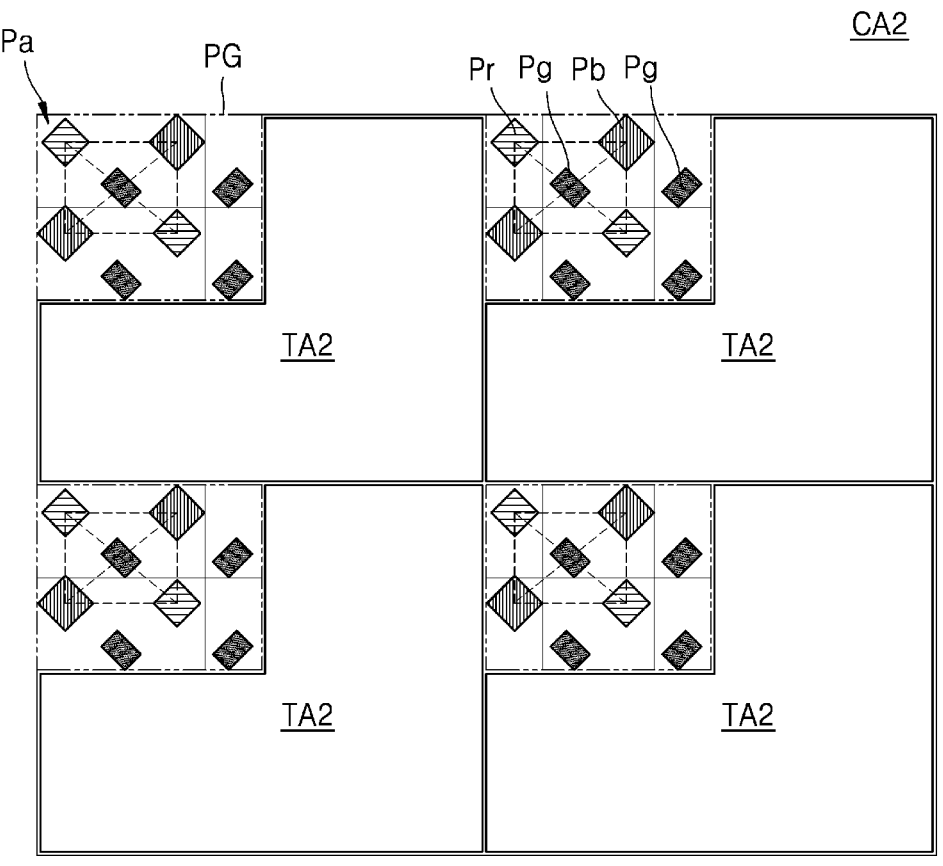
Figure 77B:
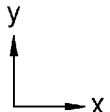
Figure 77C:
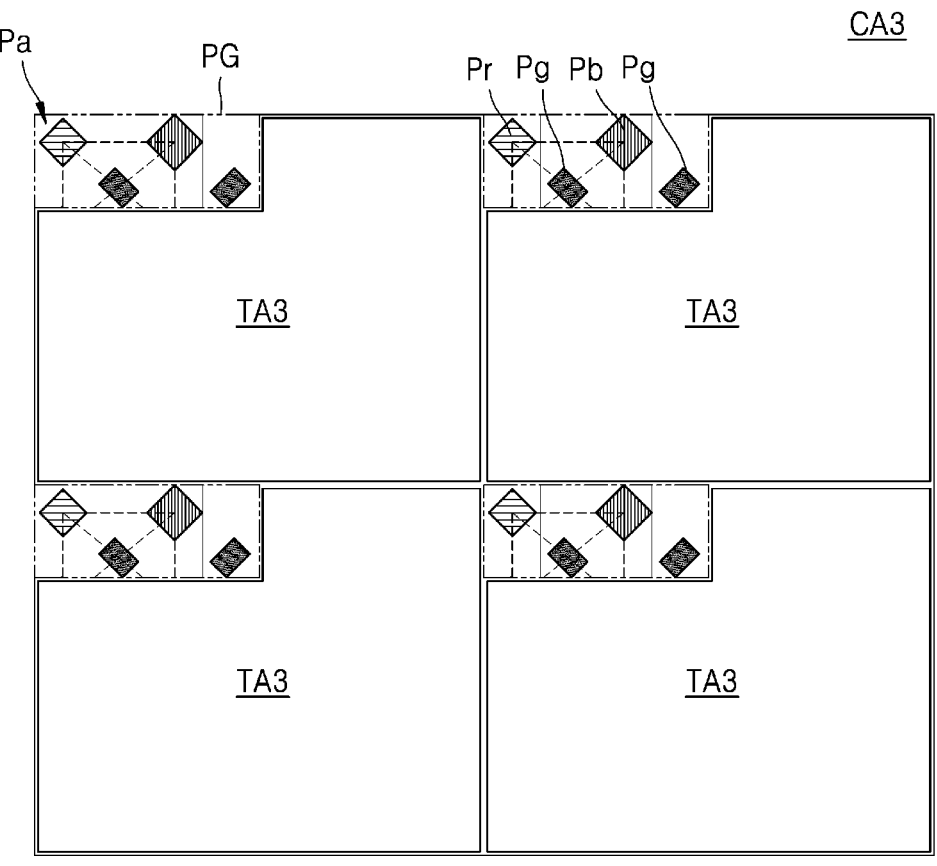

Referring to FIGS. 77A through 77C, the area of the first transmission areas TA1 of the first component area CA1 may be about half that of the first component area CA1. In the first component area CA1, subpixels Pa may be arranged or disposed in a ½ pentile structure.

The second transmission areas TA2 of the second component area CA2 may have an area of about ¾ the area of the second component area CA2. In the second component area CA2, subpixels Pa may be arranged or disposed in a ¼ pentile structure.

The third transmission areas TA3 of the third component area CA3 may have an area of about ⅞ the area of the third component area CA3. In the third component area CA3, subpixels Pa may be arranged or disposed in a ⅛ pentile structure.

According to this configuration, in a case that the first through third component areas CA1 through CA3 overlap each other, because the first through third transmission areas TA1 through TA3 may be arranged or disposed to overlap each other, light that may be emitted from the component 40 or travel toward the component 40 may proceed without being interrupted.

Figure 78:
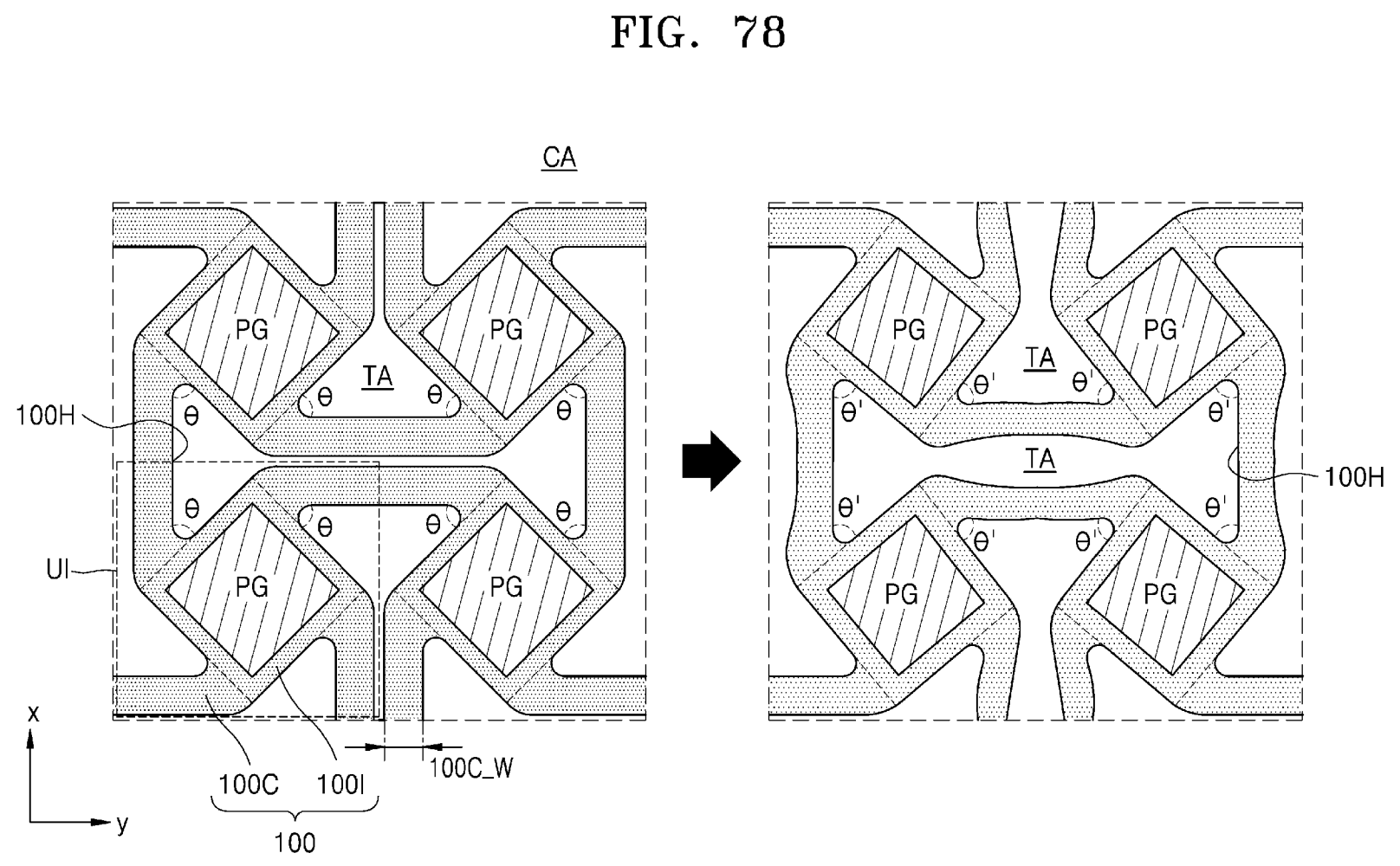

FIG. 78 is a schematic plan view of a component area of a display panel according to an embodiment. FIG. 78 mainly describes a structure in which at least a portion or region of the display panel may be deformed.

Referring to FIG. 78, according to an embodiment, a substrate 100 may include a flexible material. For example, the substrate 100 may include a material that may be easily bent, folded, or rolled. The flexible material used to form the flexible substrate 100 may be ultra-thin glass, metal, or plastic. In a case that the substrate 100 may include plastic, the substrate 100 may contain polyimide (PI). According to an embodiment, the substrate 100 may include an electro-active polymer or a piezoelectric ceramic.

The substrate 100 may include islands 100I spaced apart from one another, connection units 100C connecting the islands 100I to one another, and through holes 100H penetrating the substrate 100 between the connection units 100C.

The islands 100I may be arranged or disposed apart from one another. For example, the islands 100I may be repeated in the first direction (x direction) and the second direction (y direction) different from the first direction (x direction) to thereby constitute a planar lattice pattern. For example, the first direction (x direction) and the second direction (y direction) may meet at right angles. As another example, the first direction (x direction) and the second direction (y direction) may meet at acute or obtuse angles.

Pixel groups PG may be arranged or disposed on the islands 100I, respectively. Each pixel group PG may include auxiliary subpixels as described above, and the auxiliary subpixels may be implemented by display elements such as organic light-emitting diodes.

The connection units 100C may connect the islands 100I to one another. In detail, four connection units 100C may be connected to each of the islands 100I, four connection units 100C connected to one island 100I may extend in different directions to be adjacent to the one island 100I, and thus the four connection units 100C may be respectively connected to another four islands 100I surrounding the one island 100I. The islands 100I and the connection units 100C may at least partially include the same or similar material and may be connected to each other. The islands 100I and the connection units 100C may be integral with each other.

The through holes 100H may penetrate through the sub-strate 100. The through holes 100H may provide separation areas between the islands 100I, reduce the weight of the substrate 100, and improve the flexibility of the substrate 100. In a case that the substrate 100 may be deformed, the shapes of the through holes 100H may change, and thus stress generation during deformation of the substrate 100 may be effectively reduced. Thus, abnormal deformation of the substrate 100 may be prevented, and durability of the substrate 100 may improve.

The through holes 100H may be formed by removing one area of the substrate 100 via etching, laser radiation, or the like within the spirit and the scope of the disclosure. As another example, the substrate 100 may be manufactured to include the through holes 100H during the manufacture of the substrate 100. The through holes 100H may be formed in the substrate 100 in various ways, and a method of forming the through holes 100H is not limited. According to an embodiment, the through holes 100H may correspond to the transmission areas TA of the component area CA.

Hereinafter, a unit UI, which is the basic unit of the substrate 100, is set, and a structure of the substrate 100 will be described in more detail with reference to the unit UI.

The unit UI may be repeated in the first direction (x direction) and the second direction (y direction). In other words, the substrate 100 may be understood as being a combination of units UI repeated in the first direction (x direction) and the second direction (y direction). Each unit UI may include an island 100I and at least one connection unit 100C connected to the island 100I. Four connection units 100C may be connected to one island 100I.

The islands 100I of two adjacent units UI may be spaced apart from each other, and connection units 100C of the two adjacent units UI may be connected to each other. A connection unit 100C included in a unit UI may be referred to as a partial region of the connection unit 100C that may be located or disposed within the unit UI or may be referred to as the whole of a connection unit 100C between two adjacent islands 100I that may connect the two adjacent islands 100I to each other.

Four adjacent units UI among the units UI may form closed loops between the four units UI, and the closed curves may define a through hole 100H, which may be an empty space, aperture or cavity. The through hole 100H may be formed by removing one region of the substrate 100, and may improve the flexibility of the substrate 100 and reduce stress that may be generated in a case that the substrate 100 may be deformed.

Two adjacent units UI among the units UI may be symmetrical to each other. In detail, as shown in FIG. 78, one unit UI may be symmetrical to another unit UI adjacent to the one unit UI in the second direction (y direction), about an axis of symmetry that may be parallel to the first direction (x direction), and at the same time may be symmetrical to another unit UI adjacent to the one unit UI in the first direction (x direction), about an axis of symmetry that may be parallel to the second direction (y direction).

An angle between a direction in which a connection unit 100C may extend and a lateral surface of an island 100I to which the connection unit 100C may be connected may be an acute angle. For example, an angle $\theta$ between the first direction (x direction) in which a connection unit 100C extends and a lateral surface of an island 100I to which the connection unit 100C is connected may be an acute angle. For example, in a case that each island 100I is substantially quadrilateral and may be arranged or disposed such that four corners thereof may be arranged or disposed to face the first direction (x direction) and the second direction (y direction), the connection units 100C may be connected to the island 100I at regions adjacent to the four corners and may extend in a direction parallel to the second direction (y direction) or the first direction (x direction). In other words, the connec-tion units 100C connected to the corners facing the first direction (x direction) may face the second direction (y direction) or an opposite direction (−y direction) to the second direction (y direction), and the connection units 100C connected to the corners facing the second direction (y direction) may face the first direction (x direction) or an opposite direction (−x direction) to the first direction (x direction). Thus, lateral surfaces of two adjacent islands 100I connected to one connection unit 100C may respec-tively make acute angles with the direction in which the connection unit 100C extends, and accordingly the islands 100I may be densely arranged or disposed and the areas of the through holes 100H may be maximized by minimizing the lengths of the connection units 100C. The substrate 100 may have an elongation property such as being stretchable or otherwise being elongated.

In a case that an external force may be applied to the substrate 100, all of the angles formed by the connection units 100C and the lateral surfaces of the islands 100I to which the connection units 100C are connected increase ($\theta<\theta'$), and thus the through holes 100H, namely, the trans-mission areas TA, may be enlarged. Accordingly, intervals between the islands 100I may increase, and thus the sub-strate 100 may be elongated both in the first direction (x direction) and the second direction (y direction) and thus the shape of the substrate 100 may change two-dimensionally or three-dimensionally.

Because a width 100C_W of each connection unit 100C is smaller than a width of one edge of each island 1011, a shape change for achieving the above-described angle increase (θ<θ') while an external force may be applied to the substrate 100 may mainly occur in the connection units 100C, and the shapes of the islands 100I may not change even during elongation of the substrate 100. Accordingly, the pixel groups PG arranged or disposed on the islands 100I may be stably sustained even in a case that the substrate 100 elongates.

Because stress concentrates on connecting portions of the connection units 100C connected to the lateral surfaces of the islands 100I during elongation of the substrate 100, the connecting portions of the connection units 100C may include curved surfaces in order to prevent tearing or the like of the connection units 100C due to the concentration of the stress.

Although a case where the substrate 100 may include the islands 100I, a connection units 100C, and the through holes 100H to correspond to the component area CA has been focused on and described with reference to FIG. 78, the structure of FIG. 78 may be applicable to the main display area MDA.

Figure 79A:
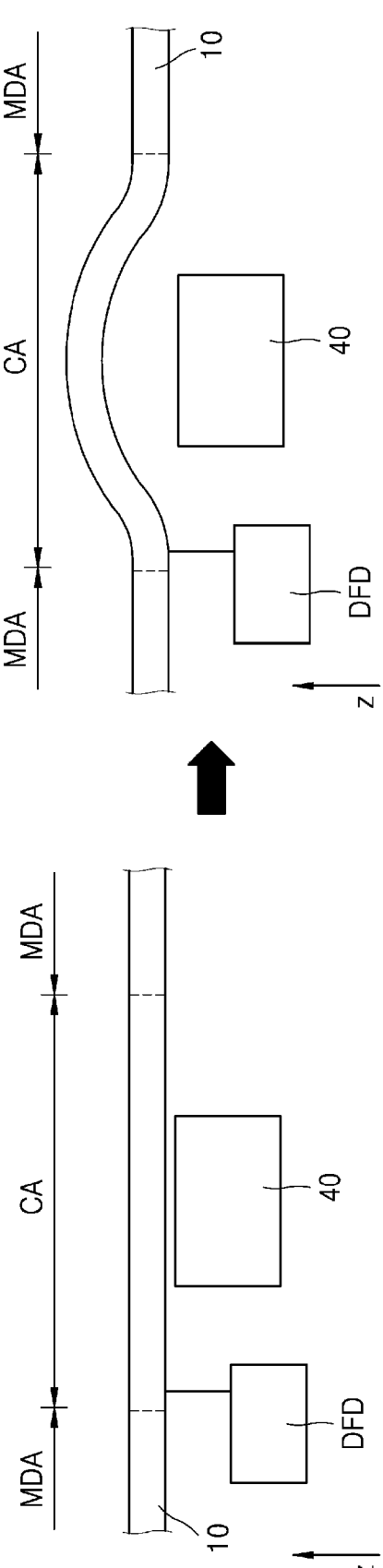
FIGS. 79A and 79B are schematic cross-sectional views illustrating different shapes of a deformed display panel of FIG. 78, according to embodiments.
Figure 79B:
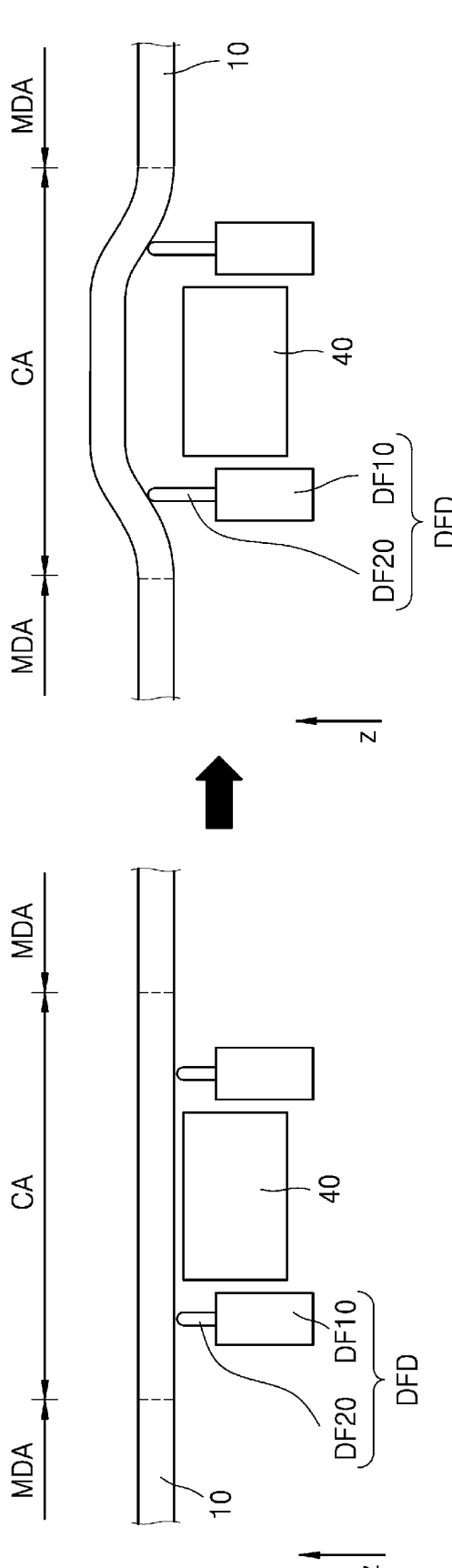

FIGS. 79A and 79B are schematic cross-sectional views illustrating different shapes of the deformed display panel 10 of FIG. 78, according to embodiments.

Referring to FIG. 79A, the component area CA of the display panel 10 may protrude in the third direction (z direction) due to an operation of a deformation driving unit DFD. According to an embodiment, the substrate 100 of FIG. 78 of the display panel 10 may include electroactive polymer. In this case, when a voltage is supplied to the substrate 100 of the display panel 10, the substrate 100 of the display panel 10 may be deformed. The substrate 100 of the display panel 10 may be deformed to protrude in the third direction (z direction). Due to the deformation of the substrate 100 of the display panel 10, the area of an outer surface of the display panel 10 arranged or disposed in the component area CA may increase, and thus the transmission areas TA of FIG. 78 may be enlarged.

Referring to FIG. 79B, the deformation driving unit DFD may include an actuator DF10 and a driving pin DF20 that may be controlled by the actuator DF10. The actuator DF10 may control a movement of the driving pin DF20 in a vertical direction. As the driving pin DF20 moves in the third direction (z direction), the substrate 100 may protrude in the third direction (z direction). Thus, the transmission areas TA may be enlarged.

The enlargement of the transmission area TA means an increase in the amount of light that may be emitted by the component 40 below the component area CA to the outside or that reaches the component 40 from the outside. In a case that the component 40 may be an imaging device, the component 40 may obtain a high-quality image.

In a case that the component 40 is not driven, the deformation driving unit DFD may not operate. In this case, the display panel 10 may be maintained flat. In a case that the component 40 is driven, the deformation driving unit DFD is driven, and thus the component area CA of the display panel 10 may protrude and the transmission areas TA may be enlarged.

Figure 80:
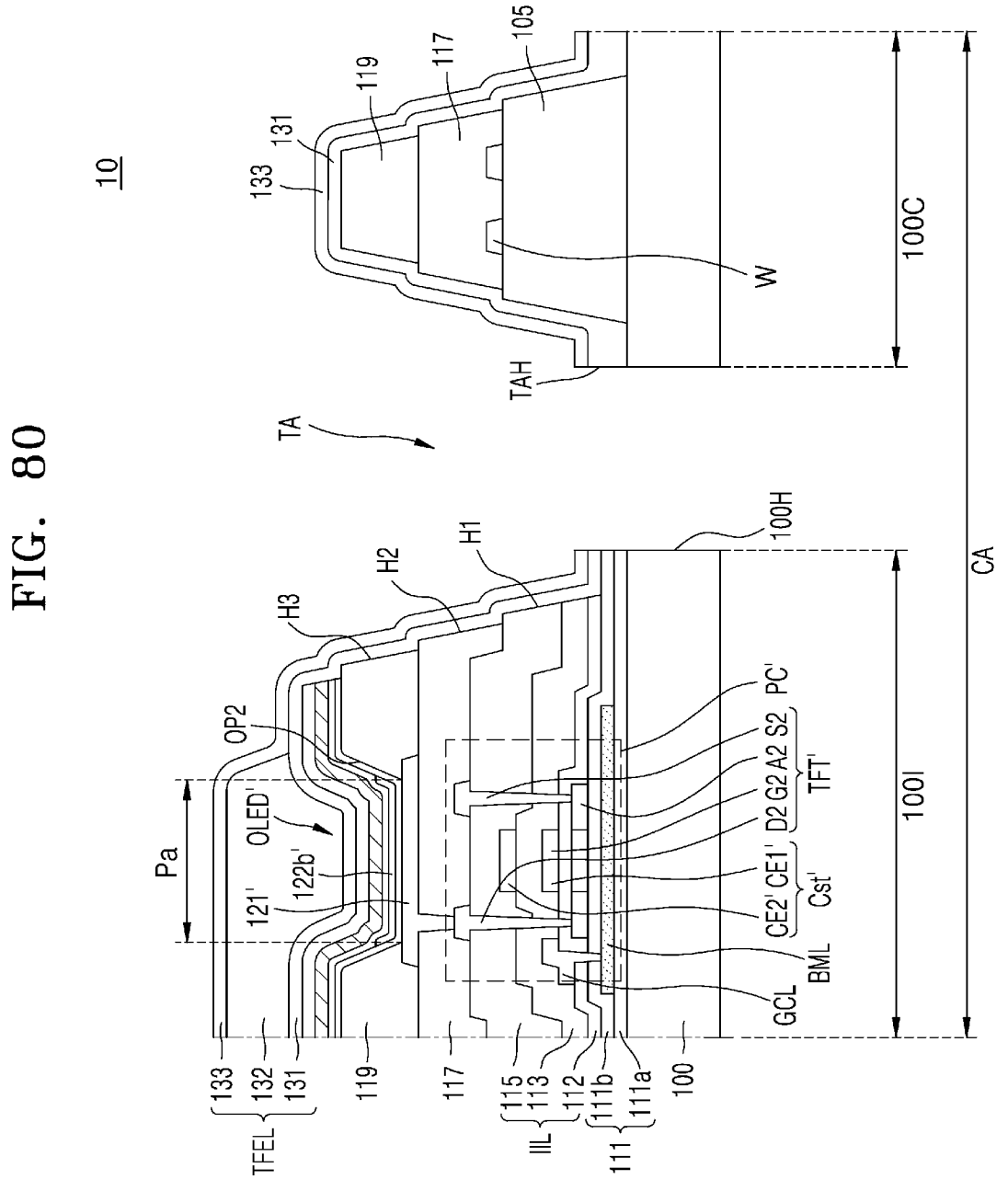
FIG. 80 is a schematic cross-sectional view of a portion or region of the display panel of FIG. 78.

FIG. 80 is a schematic cross-sectional view of a portion or region of the display panel 10 of FIG. 78. The same reference numerals in FIGS. 17 and 80 denote the same elements, and thus repeated descriptions thereof are omitted.

Referring to FIG. 80, an auxiliary pixel circuit PC' including an auxiliary thin-film transistor TFT' and an auxiliary storage capacitor Cst' both arranged or disposed on the substrate 100, and an auxiliary organic light-emitting diode OLED' as a display element electrically connected to the auxiliary pixel circuit PC' may be arranged or disposed in the component area CA of the display panel 10, and a thin-film encapsulation layer TFEL encapsulating the aforementioned components may be arranged or disposed. An auxiliary organic light-emitting diode OLED' may be arranged or disposed on an island 100I of the substrate 100, and wires W may be arranged or disposed on a connection unit 100C that connects islands 100I.

To correspond to the island 100I, the thin-film encapsulation layer TFEL may include a first inorganic encapsulation layer 131, a second inorganic encapsulation layer 133, and an organic encapsulation layer 132 between the first inorganic encapsulation layer 131 and the second inorganic encapsulation layer 133. The organic encapsulation layer 132 may be included to correspond to each of the islands 100I. In other words, the organic encapsulation layer 132 may be arranged or disposed on the island 100I, and may not be arranged or disposed on the connection unit 100C. Accordingly, the first inorganic encapsulation layer 131 and the second inorganic encapsulation layer 133 may contact each other outside the organic encapsulation layer 132, and thus may individually encapsulate the pixel groups PG.

As such, because the thin-film encapsulation layer TFEL may include the first inorganic encapsulation layer 131, the organic encapsulation layer 132, and the second inorganic encapsulation layer 133, even in a case that the thin-film encapsulation layer TFEL cracks due to this multi-layer structure, this crack may not be connected between the first inorganic encapsulation layer 131 and the organic encapsulation layer 132 or between the organic encapsulation layer 132 and the second inorganic encapsulation layer 133. Accordingly, formation of a path via which external moisture, oxygen, or the like permeates into the pixel groups PG may be prevented or minimized. The second inorganic encapsulation layer 133 may contact the first inorganic encapsulation layer 131 at an edge of the organic encapsulation layer 132 so that the organic encapsulation layer 132 may not be exposed to the outside.

A step compensation layer 105 may be arranged or disposed on the connection unit 100C of the substrate 100. Because the connection unit 100C of the substrate 100 may have a smaller width than the island 100I, the connection unit 100C of the substrate 100 may be weak with respect to a stress that may be generated during deformation of the shape of the display panel 10. Accordingly, at least one of the buffer layer 111, the first gate insulating layer 112, the second gate insulating layer 113, and the interlayer insulating layer 115 each including an inorganic insulating layer may not be arranged or disposed above the connection unit 100C of the substrate 100.

For example, the buffer layer 111, the first gate insulating layer 112, the second gate insulating layer 113, and the interlayer insulating layer 115 may be removed from above the connection unit 100C by using a process such as etching, and instead the step compensation layer 105 including an organic material may be provided.

Because the wires W transmitting a voltage or a signal to the pixel circuit PC' may be arranged or disposed above the step compensation layer 105, in a case that the wires W lead to the island 100I, the step compensation layer 105 may prevent generation of a height difference between the wires W and the island 100I and also may absorb a stress that may be applied to the wires W.

The step compensation layer 105 may include an organic insulating material, such as polyimide, polyamide, acryl resin, benzocyclobutene, hexamethyldisiloxane (HMDSO), or phenol resin. The step compensation layer 105 may be a single layer or multi-layer including such an organic insulating material.

The wires W above the step compensation layer 105 may include the same or similar material as that included in the source electrode S2 or drain electrode D2 of the auxiliary thin-film transistor TFT' arranged or disposed in the island 100I. Alternatively, the wires W above the step compensation layer 105 may include the same or similar material as that included in the gate electrode G2 of the auxiliary thin-film transistor TFT'. The wires W may be wires that transmit a voltage or a signal to the pixel circuit PC'.

The wires W may be covered with or overlapped by the planarization layer 117 and/or the pixel defining layer 119. The first inorganic encapsulation layer 131 and the second inorganic encapsulation layer 133 may be stacked above the pixel defining layer 119.

Figure 81:
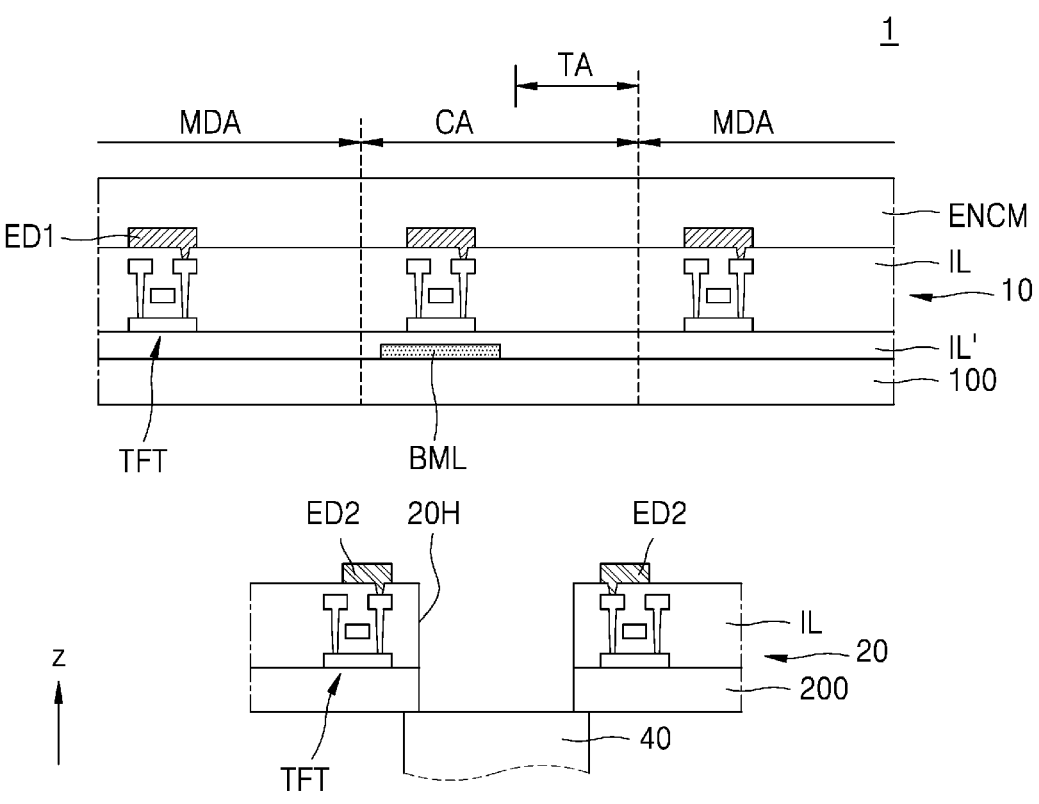
FIGS. 81 and 82 are schematic cross-sectional views of respective portions of display apparatuses according to embodiments.
Figure 82:
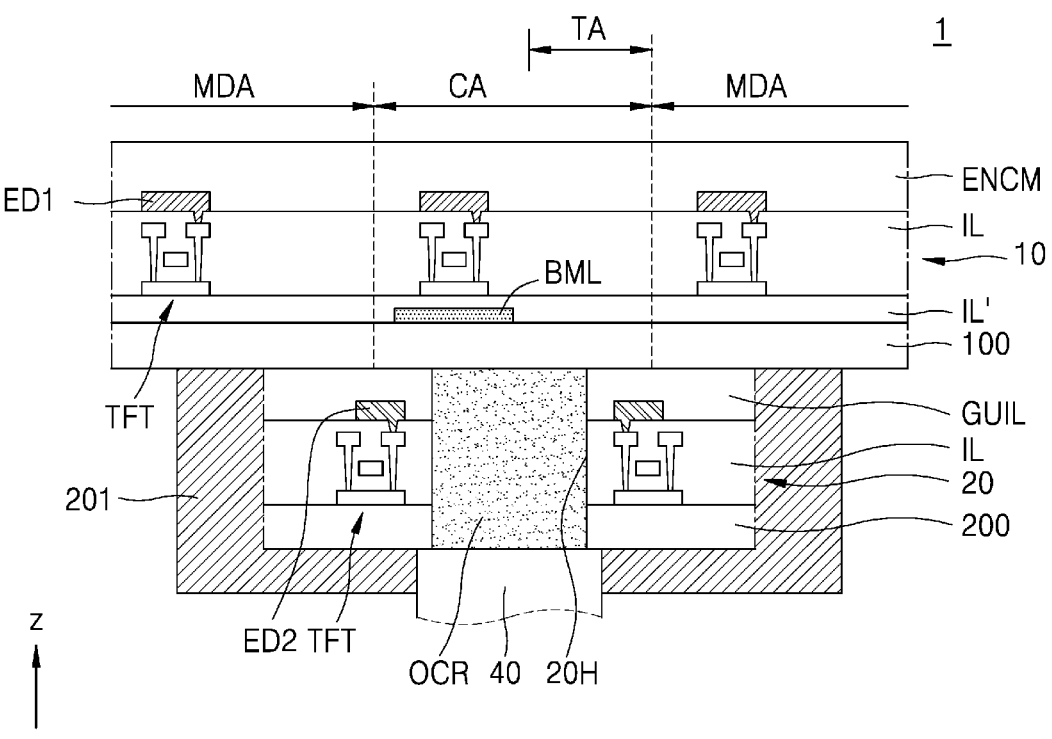
Figure 83:
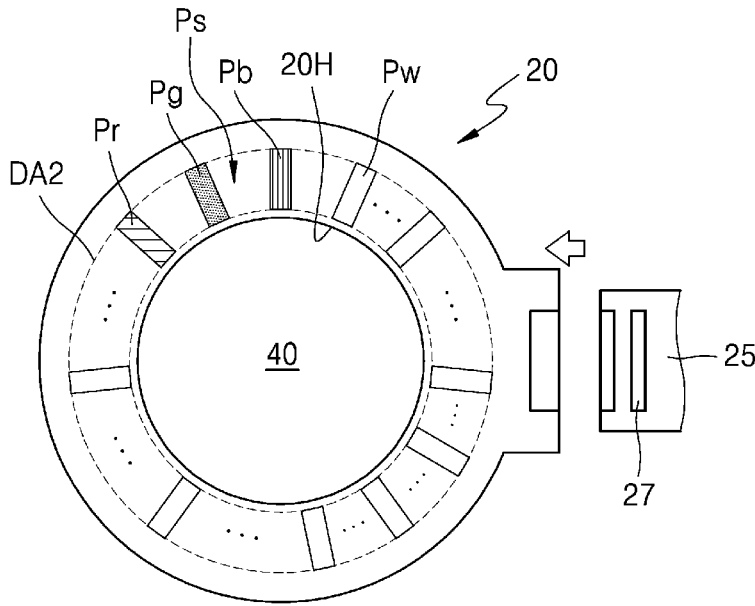
FIG. 83 is a schematic plan view of a second display panel that may be included in a display apparatus.

FIGS. 81 and 82 are schematic cross-sectional views of a portion or region of a display apparatus 1 according to embodiments, and FIG. 83 is a schematic plan view of a second display panel 20 that may be included in the display apparatus 1.

Referring to FIGS. 81 and 82, the display apparatus 1 may include a first display panel 10 and a second display panel 20 below the first display panel 10. The first display panel 10 may be the display panel 10 described above with reference to FIGS. 1 through 80. The second display panel 20 may be arranged or disposed at various locations, for example, between the first display panel 10 and the bracket 60 of FIG. 2 or between the bracket 60 and the main circuit board 70 of FIG. 2. The first display panel 10 and the second display panel 20 may be received by the lower cover 90 of FIG. 2.

The first display panel 10 may include a substrate 100, a circuit layer including thin-film transistors TFT on the substrate 100, first light-emitting elements ED1, and insulating layers IL and IL' therebetween. The first display panel 10 may include the main display area MDA, and the component area CA including the transmission area TA. Light may be emitted by the first light-emitting elements ED1 being display elements in the third direction (z direction), and an image may be displayed on an upper surface of the first display panel 10.

The second display panel 20 may include a substrate 200, a circuit layer including thin-film transistors TFT on the substrate 200, second light-emitting elements ED2, and an insulating layer IL therebetween. The second display panel 20 may include a hole 20H corresponding to the component area CA of the first display panel 10. A component 40 may be arranged or disposed below the second display panel 20 to correspond to the hole 20H. Light may be emitted by the second light-emitting elements ED2 being display elements in the third direction (z direction), and an image may be displayed on the upper surface of the second display panel 20.

As shown in FIG. 82, the second display panel 20 may be attached to the bottom of the first display panel 10. In this case, the hole 20H of the second display panel 20 may be filled with optically clear resin (OCR). The OCR may have optical transparency and thus may improve the visibility.

A light guide layer GUIL may be disposed above the second light-emitting elements ED2. The light guide layer GUIL may diffuse light that may be emitted by the second light-emitting elements ED2. The light guide layer GUIL may include an acryl material or poly methy methacrylate (PMMA). To prevent the light diffused within the light guide layer GUIL from being emitted sideways, a light leakage prevention layer 201 may be arranged or disposed around the second light-emitting elements ED2, namely, around the second display panel 20. The light leakage prevention layer 201 may include a black pigment, a black dye, and/or a material such as Cr or CrOx.

The second light-emitting elements ED2 may be arranged or disposed in the second display panel 20 to correspond to an edge of the component area CA. Alternatively, the second light-emitting elements ED2 may be arranged or disposed to correspond to an edge of the component 40. In other words, the second light-emitting elements ED2 may surround or be adjacent to the component 40 according to a plan view, as shown in FIG. 83. Alternatively, the second light-emitting elements ED2 may surround or be adjacent to the hole 20H of the second display panel 20. The second light-emitting elements ED2 may be micro-sized or nano-sized inorganic light-emitting diodes. Alternatively, the second light-emitting elements ED2 may be organic light-emitting diodes.

Referring to FIG. 83, subpixels Ps of the second display panel 20 may be implemented by the second light-emitting elements ED2. The subpixels Ps of the second display panel 20 may include red subpixels Pr, green subpixels Pg, blue subpixels Pb, and/or white subpixels Pw. The subpixels Ps may be arranged or disposed around the hole 20H in a circular configuration. Accordingly, a second display area DA2 in which the subpixels Ps may be arranged or disposed may have a substantially ring shape.

A side of the second display panel 20 may be connected to a second display circuit board 25. The second display circuit board 25 may include a second display driving unit 27 that may drive the second display panel 20. The second display driving unit 27 may generate a signal that may control the brightnesses and colors of the subpixels Ps of the second display panel 20, in connection with a driving signal of the first display panel 10 and a driving signal of the component 40.

For example, in a case that a red image may be realized on the component area CA of the first display panel 10, the second display driving unit 27 may generate a signal according to which the red subpixels Pr of the second display panel 20 may be driven. When a magenta image may be realized on the component area CA of the first display panel 10, the second display driving unit 27 may generate a signal according to which the red subpixels Pr and the blue subpixels Pb of the second display panel 20 are driven.

Because the component area CA of the first display panel 10 may include the transmission area TA, an image realized in the component area CA may have a lower brightness than the brightness of an image realized in the main display area MDA.

According to an embodiment, an image is realized in the second display area DA2 overlapped by the component area CA by employing the second display panel 20, and thus the brightness and color of the component area CA may be compensated for, leading to an improvement in visibility.

As described above, the first display panel 10 may include component areas CA, and the second display panel 20 may include second light-emitting elements ED2 corresponding to each of the component areas CA and may be arranged or disposed to surround or be adjacent to the each component area CA. In this case, the subpixels Ps of the second display panel 20 may be individually driven according to the colors respectively realized in the component areas CA. For example, in a case that a first component area may be red and a second component area may be green, the red subpixels Pr may be driven at a portion of the second display panel 20 corresponding to the first component area, and the green subpixels Pg may be driven at a portion of the second display panel 20 corresponding to the second component area.

Figure 84A:
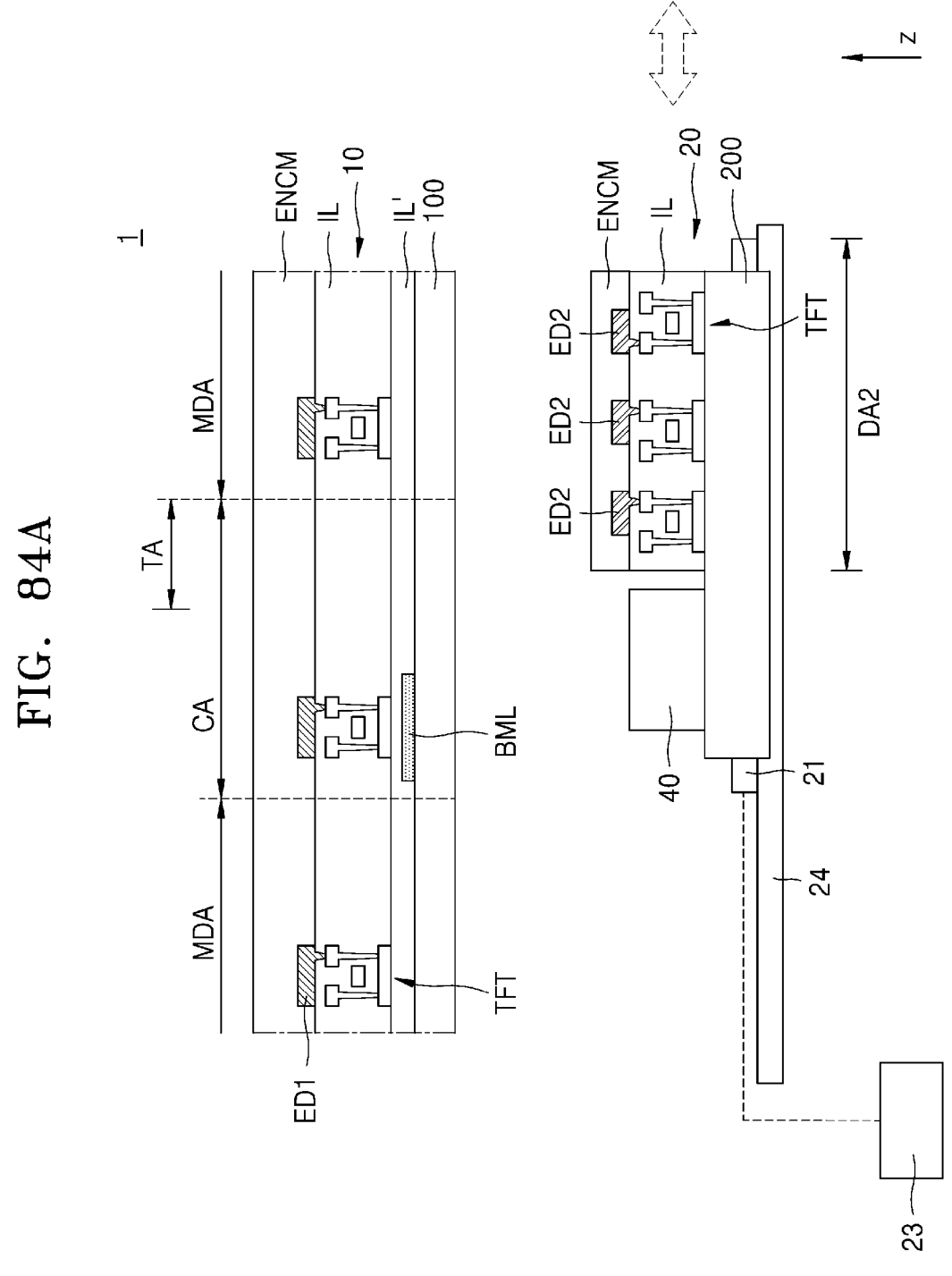
Figure 84B:
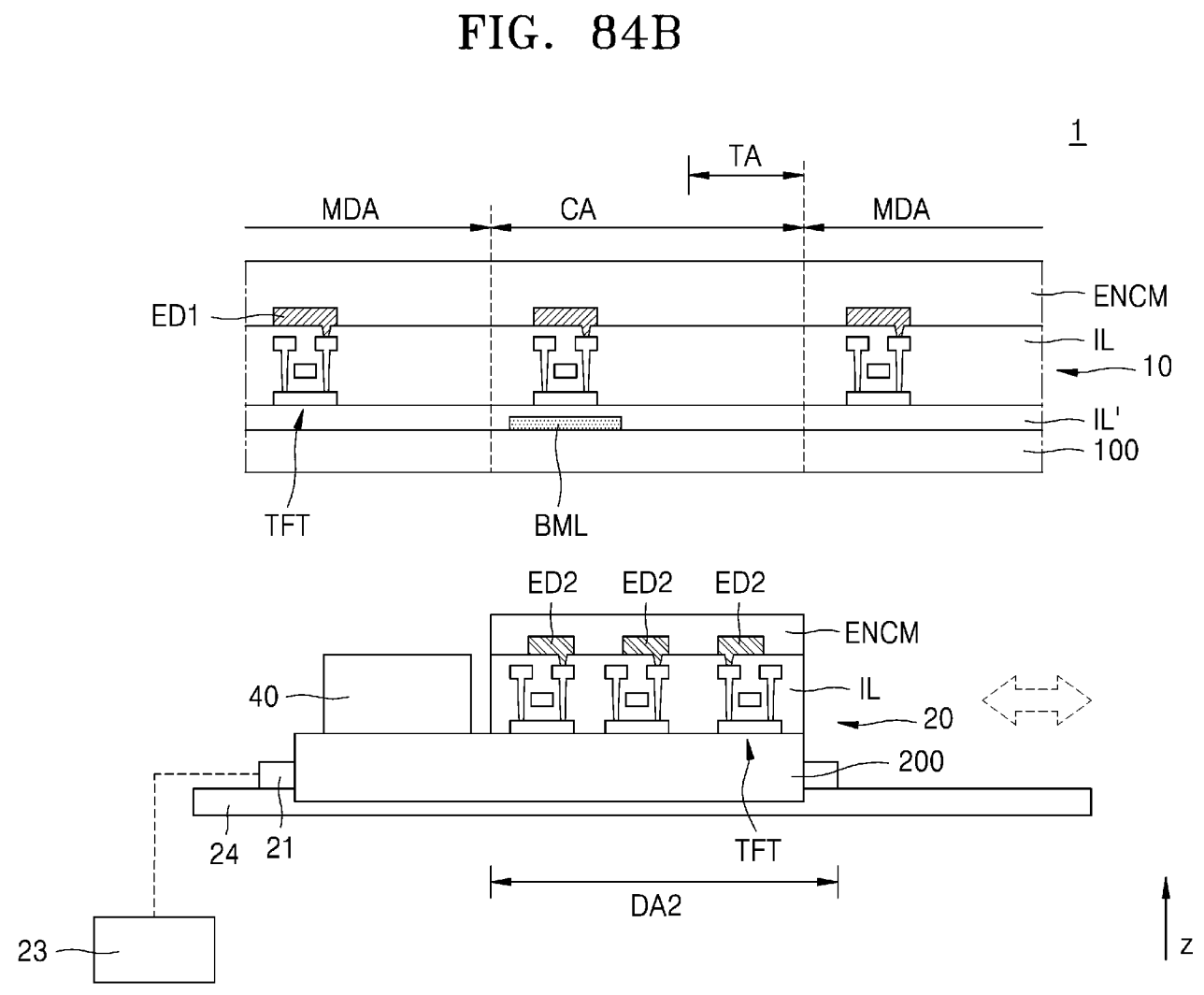
Figure 85A:
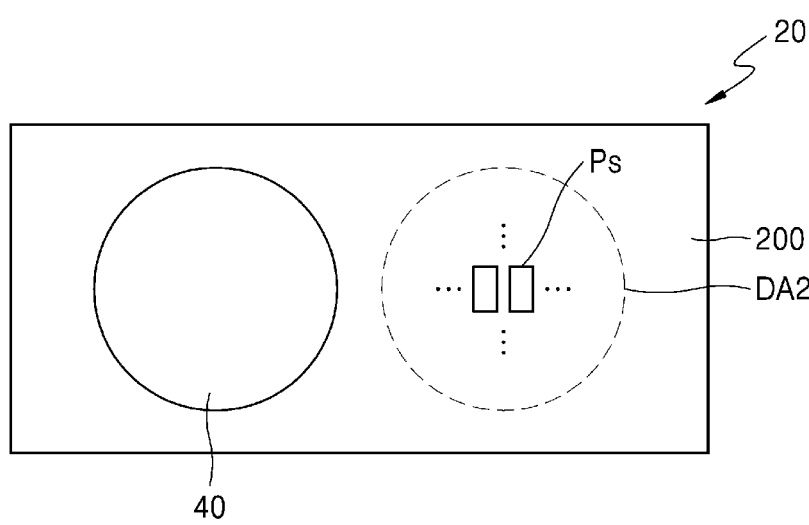
FIGS. 85A through 85B are schematic plan views of second display panels that may be included in a display apparatus.
Figure 85B:
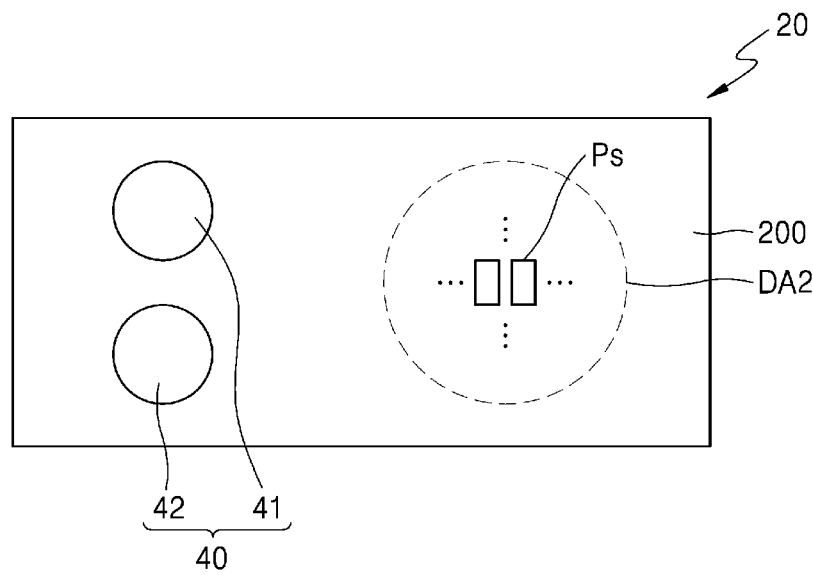

FIGS. 84A and 84B are schematic cross-sectional views of a portion or region of the display apparatus 1 according to an embodiment. FIGS. 85A through 85B are schematic plan views of second display panels 20 that may be included in the display apparatus 1.

Referring to FIGS. 84A through 85B, the display apparatus 1 may include the second display panel 20 below the first display panel 10. The first display panel 10 may be the display panel 10 described above with reference to FIGS. 1 through 80. The first display panel 10 and the second display panel 20 may be received by the lower cover 90 of FIG. 2.

The second display panel 20 may include a substrate 200, a circuit layer including thin-film transistors TFT on the substrate 200, second light-emitting elements ED2, and an insulating layer IL therebetween. A component 40 may be arranged or disposed on the second display panel 20. In other words, the component 40 may be mounted on the second display panel 20 and thus may constitute a portion of the second display panel 20.

As shown in FIG. 85B, components 40 may be included, and the first component 41 and the second component 42 may be mounted on the second display panel 20. According to an embodiment, the first component 41 may be an image sensor or a camera including an image sensor and a module that may drive the image sensor, and the second component 42 may be a flash included as an LED. According to an embodiment, the first component 41 may be an image sensor or a camera, and the second component 42 may be a solar battery. Three or more components 40 may be mounted on the second display panel 20. As described above, the components 40 may be various devices such as an infrared sensor, an iris sensor, and an ultrasonic sensor, however, the disclosure is not limited thereto.

Given that an area of the second display panel 20 where the second light-emitting elements ED2 may be arranged or disposed may be the second display area DA2, the component 40 may be arranged or disposed on a side of the second display area DA2. The area of the second display area DA2 may correspond to the area of the component area CA of the first display panel 10.

The second display panel 20 may move relative to the first display panel 10 while keeping a certain or a predetermined distance from the first display panel 10. In other words, the second display panel 20 may move on an x-y plane while maintaining a certain or a predetermined distance from the first display panel 10 in the z direction. The second display panel 20 may be moved by a movement driving unit 21 connected to the second display panel 20. The movement driving unit 21 may be driven according to a command of a controller 23. In this case, the movement driving unit 21 may have any of various shapes. For example, the movement driving unit 21 may include a linear motor connected to the second display panel 20. According to an embodiment, the movement driving unit 21 may include a cylinder connected to the second display panel 20. In this case, the movement driving unit 21 may be spaced apart from the second display panel 20, and a shaft of the movement driving unit 21 may be connected to the second display panel 20. According to an embodiment, the movement driving unit 21 may include a moving block connected to the second display panel 20, a ball screw connected to the moving block, and a motor connected to the ball screw to rotate the ball screw. The movement driving unit 21 is not limited thereto, and the movement driving unit 21 may include any of devices and structures that may be connected to the second display panel 20 and move the second display panel 20. For convenience of description, a case where the movement driving unit 21 may include a linear motor will now be described in detail.

The second display panel 20 may be connected to a guide unit 24. In this case, the guide unit 24 may guide a movement of the second display panel 20. The guide unit 24 may have any of various shapes. According to an embodiment, the guide unit 24 may include a linear motion guide. In this case, the guide unit 24 may include a block that may be connected to the second display panel 20, and a rail on which the block may slide. According to an embodiment, the guide unit 24 may have a groove shape. In this case, although not shown in the drawings, the guide unit 24 may be included in the second display panel 20 or may be included in a case in which the second display panel 20 may be arranged or disposed. In this case, the second display panel 20 or the case may include a protrusion that may be inserted into the guide unit 24. For convenience of description, a case where the guide unit 24 may include a linear motion guide will now be described in detail.

The guide unit 24 may be arranged or disposed at any of various locations. For example, the guide unit 24 may be arranged or disposed on a lower surface or a lateral surface of the second display panel 20 according to FIGS. 84A and 84B. However, for convenience of description, a case where the guide unit 24 may be arranged or disposed on the lower surface of the second display panel 20 according to FIGS. 84A and 84B will now be described in detail.

According to an embodiment, the second display panel 20 may move in connection with an operation of the component 40. For example, as shown in FIG. 84A, in a case that the component 40 operates or is in a first state, the second display panel 20 may be arranged or disposed such that the component 40 may be overlapped by the component area CA of the first display panel 10. As shown in FIG. 84B, in a case that the component 40 does not operate or is in a second state, the second display panel 20 may be located or disposed such that the second display area DA2 in which the second light-emitting elements ED2 may be arranged or disposed may be overlapped by the component area CA.

In detail, in a case that the second display panel 20 moves, the movement driving unit 21 may operate. In a case that the movement driving unit 21 operates, the second display panel 20 may move along the guide unit 24. For example, the second display panel 20 may linearly move in a lengthwise direction of the guide unit 24 along the guide unit 24.

The subpixels Ps implemented as the second light-emitting elements ED2 may be arranged or disposed in the second display area DA2. The subpixels Ps may include red, green, blue, and/or white subpixels. The shape of the second display area DA2 may be the same as or similar to the shape of the component area CA of the first display panel 10. Although the second display area DA2 is circular in FIGS. 85A and 85B, the second display area DA2 may have various other shapes such as a rectangle, a square, and a polygon, according to the shape of the component area CA.

According to an embodiment, in a case that the subpixels Ps arranged or disposed in the second display area DA2 may be overlapped by the first display panel 10, the subpixels Ps may be arranged or disposed to correspond to the transmission area TA. According to an embodiment, in a case that the subpixels Ps arranged or disposed in the second display area DA2 may be overlapped by the first display panel 10, the subpixels Ps may be arranged or disposed to surround or be adjacent to an edge of the component area CA. The subpixel Ps may be arranged or disposed in various pixel arrangement structure such as a stripe structure, a circular structure, and a pentile structure. However, the disclosure is not limited thereto.

Figure 86A:
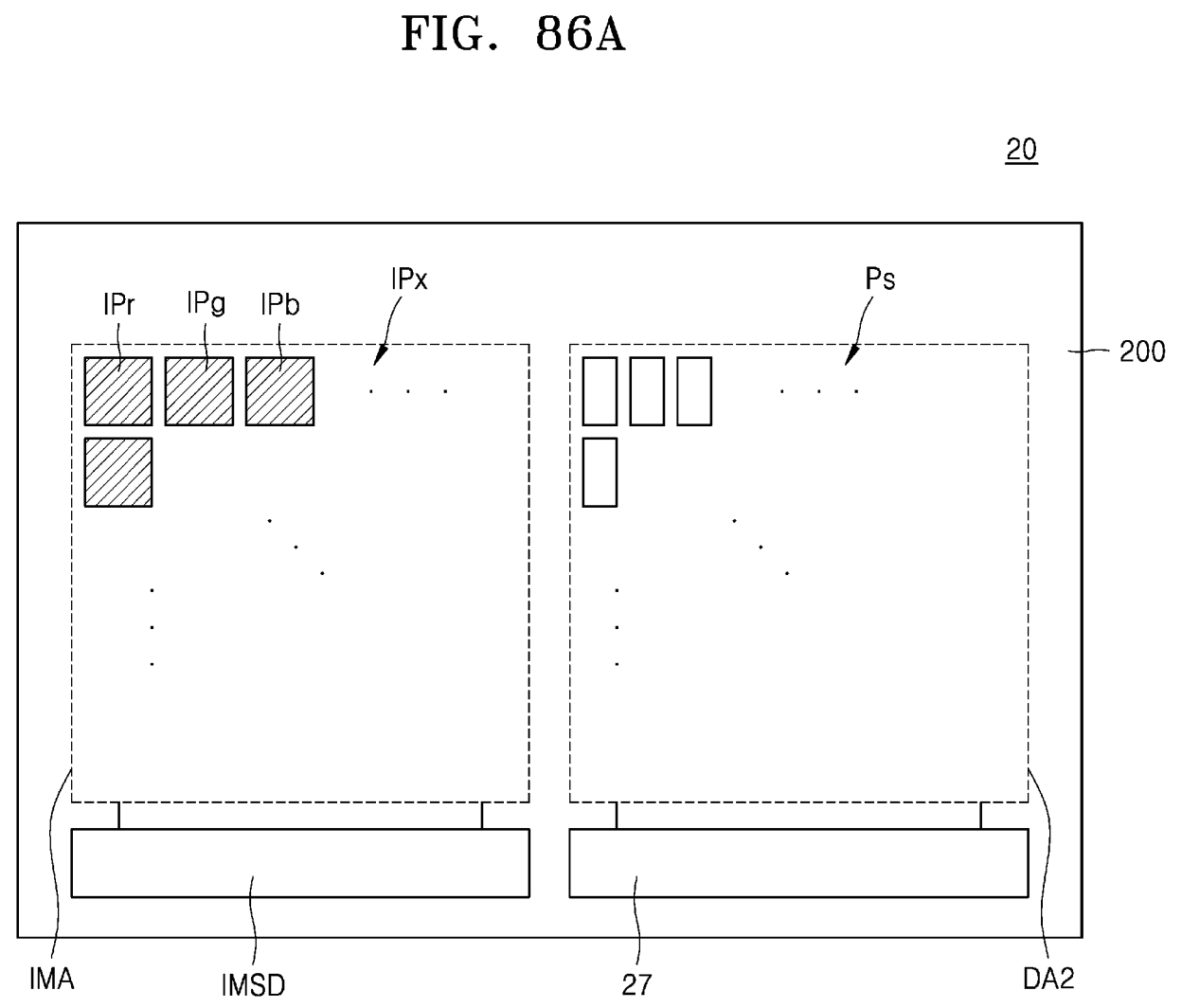
Figure 86B:
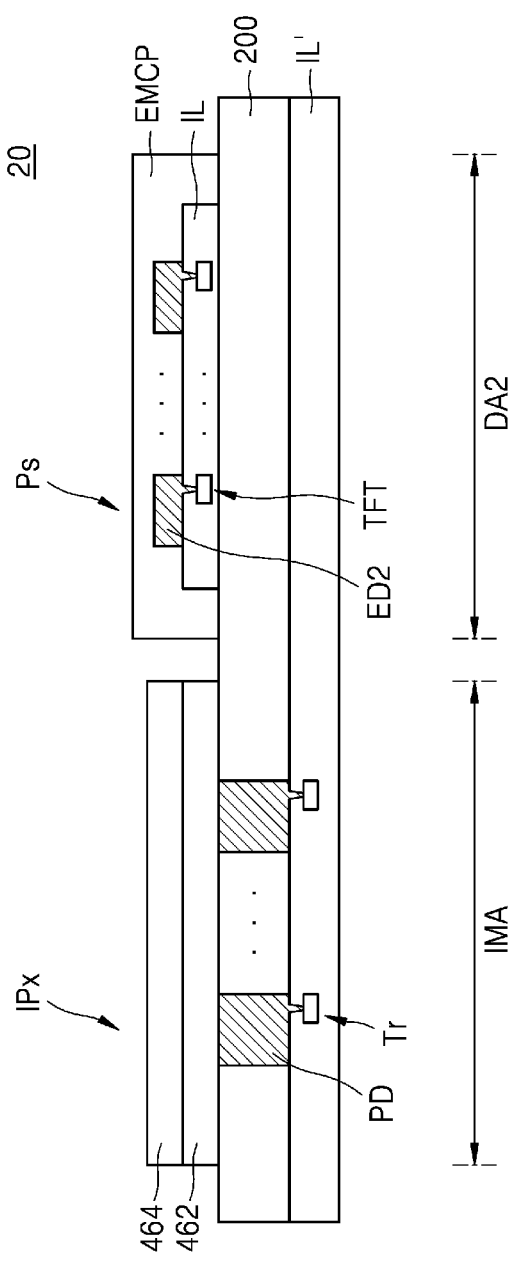
FIG. 86B is a schematic cross-sectional view of the embodiment of FIG. 86A.

FIG. 86A is a schematic plan view of a second display panel 20 according to an embodiment, and FIG. 86B is a schematic cross-sectional view of the second display panel 20 of FIG. 86A. In detail, FIGS. 86A and 86B illustrate a second display panel including a light-receiving element and a light-emitting element arranged or disposed on a single substrate.

Referring to FIGS. 86A and 86B, the second display panel 20 may include an image sensor area IMA that captures an image by using a light-receiving element such as a photodiode, and a second display area DA2 that displays an image by using a light-emitting element.

In the image sensor area IMA, light-receiving pixels IPx may be arranged or disposed in a two-dimensional (2D) array. The light-receiving pixels IPx may include red light-receiving pixels IPr, green light-receiving pixels IPg, and blue light-receiving pixels IPb. An image sensor driving unit IMSD driving the light-receiving pixels IPx may be arranged or disposed on a side of the image sensor area IMA. An image sensor may be implemented by an array of the light-receiving pixels IPx arranged or disposed in the image sensor area IMA. A second display driving unit 27 driving the subpixels Ps may be arranged or disposed on a side of the second display area DA2.

Photodiodes PD arranged or disposed in the image sensor area IMA may be within a substrate 200, and may be electrically connected to light-receiving pixel circuits respectively including transistors Tr. An insulating layer IL' may be arranged or disposed below the substrate 200, and wires may be provided or disposed in the insulating layer IL'. A color filter 462 and a micro-lens 464 may be arranged or disposed above the photodiodes PD. The above components will be described later in detail.

Second light-emitting elements ED2 arranged or disposed in the second display area DA2 may be on the substrate 200. The second light-emitting elements ED2 may be electrically connected to pixel circuits respectively including thin-film transistors TFT, and an insulating layer IL may be between the second light-emitting elements ED2 and the pixel circuits. An encapsulation member ENCM may be arranged or disposed to cover or overlap the second light-emitting elements ED2.

Figure 87:
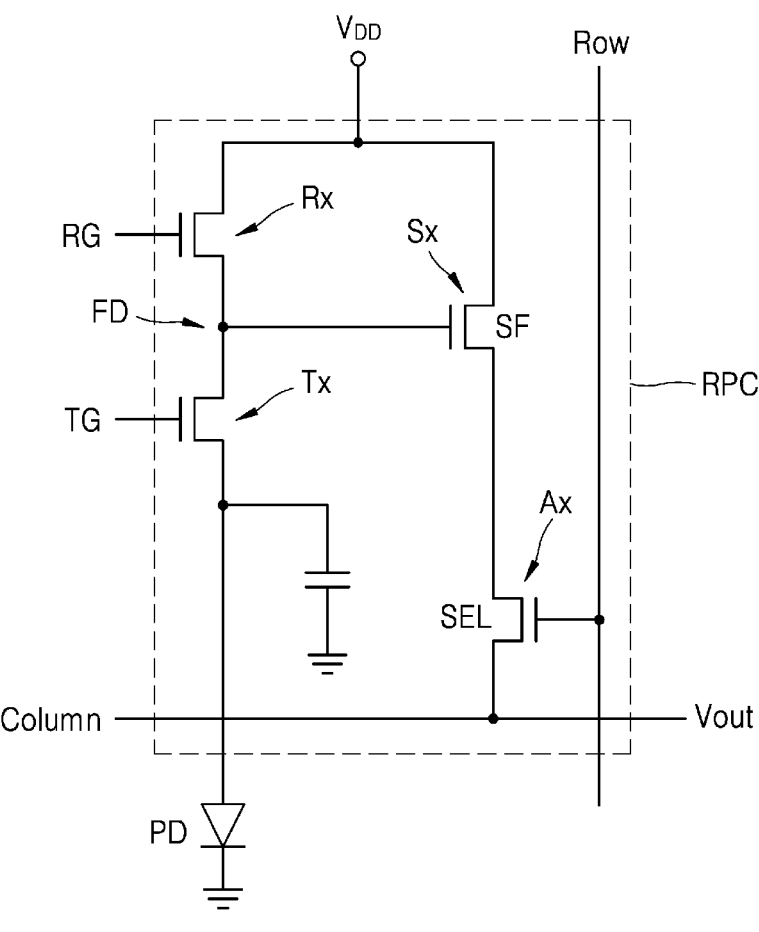
FIG. 87 is a circuit diagram of a light-receiving pixel arranged or disposed in an image sensor area.
Figure 88:
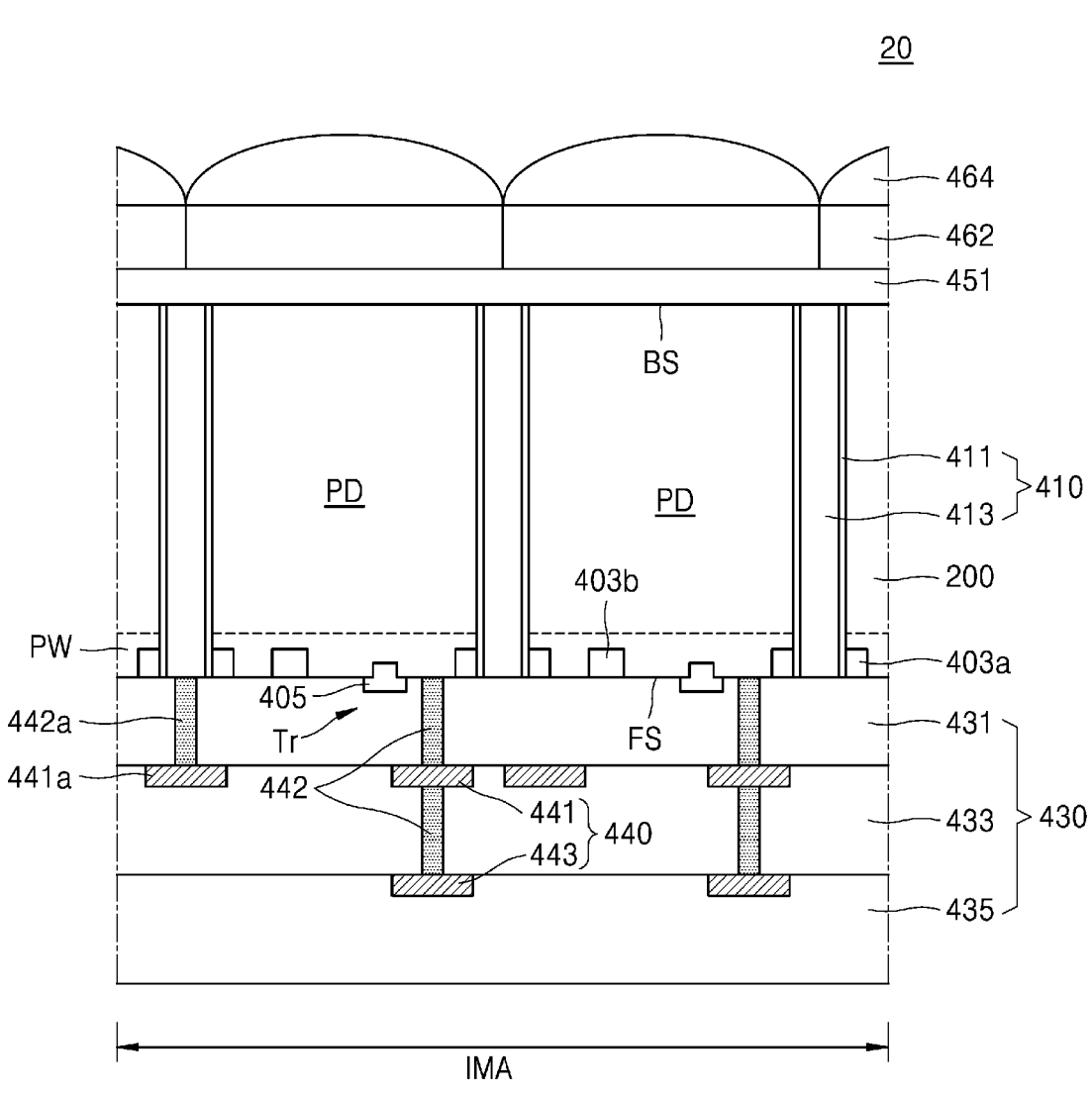
FIG. 88 is a schematic cross-sectional view of an image sensor area of a second display panel according to an embodiment.

FIG. 87 is a circuit diagram of a light-receiving pixel IPx arranged or disposed in the image sensor area IMA, and FIG. 88 is a schematic cross-sectional view of the image sensor area IMA.

As shown in FIG. 87, each of the light-receiving pixels IPx may include a photodiode PD and a light-receiving pixel circuit RPC electrically connected to the photodiode PD. The light-receiving pixel circuit RPC may include a transfer transistor Tx, a source follower transistor Sx, a reset transistor Rx, and a selection transistor Ax. The transfer transistor Tx, the source follower transistor Sx, the reset transistor Rx, and the selection transistor Ax may include a transfer gate TG, a source follower gate SF, a reset gate RG, and a selection gate SEL, respectively.

The photodiode PD may include an N-type impurity region and a P-type impurity region. A drain of the transfer transistor Tx may correspond to a floating diffusion region FD. The floating diffusion region FD may be a source of the reset transistor Rx. The floating diffusion region FD may be electrically connected to the source follower gate SF of the source follower transistor Sx. The source follower transistor Sx may be electrically connected to the selection transistor Ax. The reset transistor Rx, the source follower transistor Sx, and the selection transistor Ax may be shared by neighboring light-receiving pixels IPx, and thus integration may improve.

An operation of an image sensor will now be briefly described with reference to FIG. 87. First, when light is blocked, a power voltage $V_{DD}$ may be applied to a drain of the reset transistor Rx and a drain of the source follower transistor Sx, and thus charges remaining in the floating diffusion region FD may be emitted. Thereafter, when the reset transistor Rx is turned off and external light may be incident upon the photodiode PD, an electron-hole pair may be generated in the photodiode PD. Holes move toward a P-type impurity-injected region, and electrons move toward an N-type impurity-injected region. When the transfer transistor Tx is turned on, charge is transmitted to the floating diffusion region FD and accumulated therein. A gate bias voltage of the source follower transistor Sx may change in proportion to the amount of accumulated charge, and a source potential of the source follower transistor Sx changes. At this time, by turning on the selection transistor Ax, a signal due to charge may be read via a column line.

Referring to FIG. 88, the photodiode PD within the substrate 200, a pixel separation structure 410, a multi-wire layer 440, a color filter 462, and a micro-lens 464 may be arranged or disposed in the image sensor area IMA.

The substrate 200 may be implemented as a silicon bulk wafer or an epitaxial wafer. The epitaxial wafer may include a crystalline material layer grown on a bulk wafer via an epitaxial process, namely, an epitaxial layer. The substrate 200 is not limited to a bulk wafer or an epitaxial wafer, and may be implemented using various wafers such as a polished wafer, an annealed wafer, and a silicon on insulator (SOI) wafer.

The substrate 200 may include a front side FS and a back side BS. In FIG. 88, an upper surface of the substrate 200 may mean the back side BS of the substrate 200, and a lower surface of the substrate 200 may mean the front side FS of the substrate 200. In the description below, an upper surface and a lower surface may be used interchangeably.

As shown in FIG. 88, the multi-wire layer 440 may be arranged or disposed on the front side FS, and the color filter 462 and the micro-lens 464 may be arranged or disposed on the back side BS. Light may be incident upon the back side BS on which the micro-lens 464 has been arranged or disposed. An image sensor having a structure in which light is incident upon the back side BS of the substrate 200 as described above may be referred to a back side illumination (BSI) image sensor. An image sensor having a structure in which light is incident upon the front side FS of the substrate 200 may be referred to a front side illumination (FSI) image sensor.

Each of the light-receiving pixels IPx may absorb incident light and thus generate and accumulate charge corresponding to the amount of the incident light. Each of the light-receiving pixels IPx may include a photodiode PD and a well region PW provided or disposed within the substrate 200. The photodiode PD and the well region PW may be formed by doping impurities of opposite types via an ion injection process, in the image sensor area IMA of the substrate 200. For example, in a case that the substrate 200 is based on a P-type epitaxial wafer, N-type impurities may be doped in the photodiode PD, and P-type impurities may be doped in the well region PW. The photodiode PD may be provided relatively deeply from the front side FS of the substrate 200 to the back side BS thereof. The well region PW may be provided relatively shallowly on the front surface FS of the substrate 200.

The pixel separation structure 410 may include a sidewall insulating layer 411 and a conductive layer 413 arranged or disposed within the sidewall insulating layer 411. The sidewall insulating layer 411 may include an insulative material having a different refractive index from that of the substrate 200. For example, the sidewall insulating layer 411 may include at least one of silicon oxide ($SiO_2$), silicon nitride ($SiN_x$), and silicon oxynitride (SiON). According to an embodiment, the sidewall insulating layer 411 may extend from the front side FS of the substrate 200 to the back side BS thereof.

The conductive layer 413 may include polysilicon or impurity-doped polysilicon. However, the material of the conductive layer 413 is not limited thereto. The conductive layer 413 may include any conductive material as long as the conductive material is able to fill a trench within the sidewall insulating layer 411. For example, the conductive layer 413 may include at least one of metal, metal silicide, and a metal-containing conductive material.

The pixel separation structure 410 may have an integrally-connected structure such as a lattice (or mesh) structure. Accordingly, the conductive layer 413 may also have an integrally-connected structure such as the lattice (or mesh) structure. Accordingly, the conductive layer 413 may be an electrically integral single body. In other words, in a case that electricity may be applied to one portion of the conductive layer 413, electricity may be applied to the entire conductive layer 413.

The pixel separation structure 410 may range from the front side FS of the substrate 200 to the back side BS thereof, and thus the light-receiving pixels IPx may be separated from each other, and thus cross-talk due to slantly-incident light may be prevented. The photodiode PD may be spaced apart from the pixel separation structure 410, or may contact the pixel separation structure 410. In a case that the photodiode PD contacts the pixel separation structure 410, a light-receiving area may increase and accordingly a fill factor may improve, and thus quantum efficiency (QE) may improve.

The well region PW may be arranged or disposed above the photodiode PD near a front side FS of the substrate 200, and transistors Tr may be arranged or disposed on the well region PW. FIG. 87 illustrates only gate electrodes 405 of the transistors T r. According to an embodiment, the gate electrode 405 may be a vertical transfer gate (VTG) vertically arranged or disposed within the well region PW. Shallow trench isolation (STI) layers 403a and 403b may be arranged or disposed on the well region PW and thus active regions of the transistors Tr may be defined. The STI layers 403a and 403b may each have less depth than the sidewall insulating layer 411. In some or a predetermined number of areas, the STI layer 403a and the pixel separation structure 410 may be coupled to each other. For example, the pixel separation structure 410 may be coupled to the STI layer 403a by penetrating the STI layer 403a. Accordingly, the STI layer 403a and the pixel separation structure 410 may have a shape having a cross-section of 'T' between the light-receiving pixels IPx.

An interlayer insulating layer 430 and the multi-wire layer 440 may be on the front side FS of the substrate 200. The interlayer insulating layer 430 may be a multi-layer. For example, the interlayer insulating layer 430 may include first, second, and third insulating layers 431, 433, and 435. The number of stacked layers included in the interlayer insulating layer 430 is not limited to three. For example, the interlayer insulating layer 430 may be a multi-layer structure including four or more layers. The multi-wire layer 440 may include wire layers. For example, the multi-wire layer 440 may include first wire layers 441 and 441a on the first insulating layer 431 and a second wire layer 443 on the second insulating layer 433. The number of stacked layers included in the multi-wire layer 440 is not limited to two. For example, the multi-wire layer 440 may include three or more wire layers, based on the number of layers included in the interlayer insulating layer 430.

The first and second wire layers 441, 441a, and 443 of the multi-wire layer 440 may be electrically connected to each other via vertical contacts 442 and 442a, and may also be electrically connected to the active regions of the substrate 200 and the conductive layer 413 of the pixel separation structure 410. The multi-wire layer 440 may extend to a peripheral circuit area outside the image sensor area IMA.

An anti-reflection layer 451, the color filter 462, and the micro-lens 464 may be arranged or disposed on the back side BS of the substrate 200. The anti-reflection layer 451 may be arranged or disposed to prevent reflection of light incident upon the back side BS of the substrate 200, and may include hafnium oxide (HfOx). However, the material of the anti-reflection layer 451 is not limited thereto. The color filter 462 may be arranged or disposed in an array structure to correspond to the light-receiving pixels IPx. According to an embodiment, the color filter 462 may have a Bayer pattern structure including a red filter, a green filter, and a blue filter. According to an embodiment, the color filter 462 may include a yellow filter, a magenta filter, and a cyan filter. The color filter 462 may include a white filter.

The peripheral circuit area may be arranged or disposed outside the image sensor area IMA. Complementary metal oxide semiconductor (CMOS) circuits that may process a signal for an image may be arranged or disposed in the peripheral circuit area.

Figure 89:
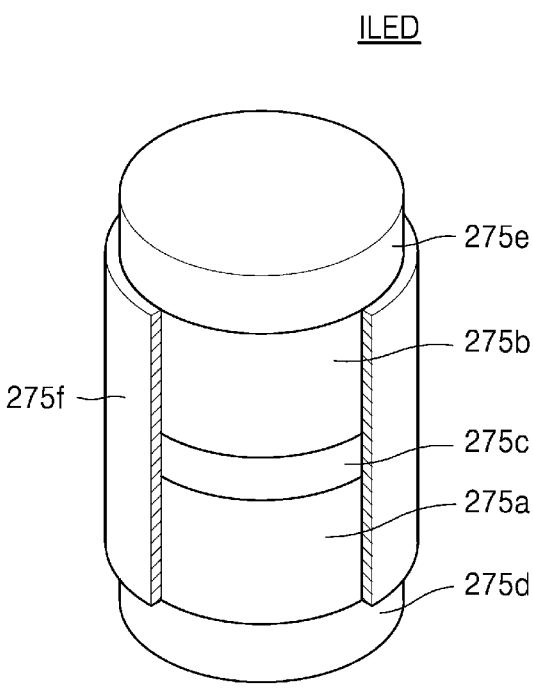
FIG. 89 is a perspective view of a light-emitting element applicable to a display apparatus according to an embodiment.

FIG. 89 is a perspective view of a light-emitting element applicable to a display apparatus according to an embodiment. The light-emitting element of FIG. 89 may be an inorganic light-emitting diode ILED having a micro or ultra-small size, and may be applicable to the first display panel 10 and/or the second display panel 20.

Referring to FIG. 89, the inorganic light-emitting diode ILED may include a first semiconductor layer 275a, a second semiconductor layer 275b, an active layer 275c, a first electrode layer 275d, a second electrode layer 275e, and an insulating layer 275f.

The first semiconductor layer 275a may be a semiconductor having a first conductivity type, for example, a p-type semiconductor, and the second semiconductor layer 275b may be at least one of AlGaInN, GaN, AlGaN, InGaN, AlN and InN each doped with a p-type dopant. For example, in a case that the inorganic light-emitting diode ILED emits light in a blue or green wavelength band, the first semiconductor layer 275a may include a semiconductor material having a chemical formula of $Al_xGa_yIn_{1-x-y}N$ (where $0 \le x \le 1$, $0 \le y \le 1$, and $0 \le x+y \le 1$). The first semiconductor layer 275a may be doped with a first conductive dopant such as Mg, Zn, Ca, Se, or Ba. According to an embodiment, the first semiconductor layer 275a may be p-GaN doped with p-type Mg.

The second semiconductor layer 275b may be a semiconductor having a second conductivity type, for example, an n-type semiconductor. The second semiconductor layer 275b may be at least one of AlGaInN, GaN, AlGaN, InGaN, AlN and InN each doped with a n-type dopant. For example, in a case that the inorganic light-emitting diode ILED emits light in a blue wavelength band, the second semiconductor layer 275b may include a semiconductor material having a chemical formula of $Al_xGa_yIn_{1-x-y}N$ (wherein $0 \leq x \leq 1$, $0 \leq y \leq 1$, and $0 \leq x+y \leq 1$). The second semiconductor layer 275b may be doped with a second conductive dopant such as Si, Ge, or Sn. For example, the second semiconductor layer 275b may be n-GaN doped with n-type Si.

The active layer 275c is between the first semiconductor layer 275a and the second semiconductor layer 275b. The active layer 275c may include a material having a single quantum or multi-quantum well structure. In a case that the active layer 275c may include a material having a multi-quantum well structure, the active layer 275c may be a structure in which a quantum layer and a well layer alternate with each other a number of times. Alternatively, the active layer 275c may be a structure in which semiconductor materials having a large band gap energy and semiconductor materials having a small band gap energy alternate with each other, and may include different semiconductor materials according to different wavelengths of light, namely, semiconductor materials of Groups III through V.

The active layer 275c may emit light due to a combination of an electron-hole pair according to an electrical signal that may be applied through the first semiconductor layer 275a and the second semiconductor layer 275b. The light emitted by the active layer 275c is not limited to light in a blue wavelength band, and the active layer 275c may emit light in a red wavelength band and light in a green wavelength band. For example, in a case that the active layer 275c emits light in a blue wavelength band, the active layer 275c may include a material such as AlGaN or AlGaInN. For example, in a case that the active layer 275c may be a multi-quantum well structure in which a quantum layer and a well layer alternate with each other, the quantum layer may include AlGaN or AlGaInN, and the well layer may include GaN or AlInN. For example, the active layer 275c may emit blue light having a central wavelength band in the range of about 450 nm through about 495 nm by including AlGaInN as a quantum layer and AlInN as a well layer as described above.

The light emitted by the active layer 275c may be emitted toward not only external surfaces of the inorganic light-emitting diode ILED in the lengthwise-direction thereof but also both lateral surfaces thereof. In other words, the directivity of the light emitted by the active layer 275c is not limited to one direction.

The first electrode layer 275d and the second electrode layer 275e may be an Ohmic contact electrode or a Schottky contact electrode. The inorganic light-emitting diode ILED may include at least one electrode layer, namely, the first and second electrode layers 275d and 275c. In a case that the inorganic light-emitting diode ILED may be electrically connected to an outside electrode, resistance between the inorganic light-emitting diode ILED and the outside electrode may be reduced by the first electrode layer 275d and/or the second electrode layer 275c. The first electrode layer 275d and the second electrode layer 275e may include a conductive metal material such as at least one of aluminum (Al), titanium (Ti), indium (In), gold (Au), silver (Ag), indium tin oxide (ITO), indium zinc oxide (IZO), and indium tin-zinc oxide (ITZO). The first electrode layer 275d and the second electrode layer 275e may include an n-type or p-type semiconductor material. The first electrode layer 275d and the second electrode layer 275e may include the same or similar material or may include different materials, but embodiments are not limited thereto.

The insulating layer 275f may be arranged or disposed to surround or be adjacent to the respective outer surfaces of the first semiconductor layer 275a, the second semiconductor layer 275b, and the active layer 275c. The insulating layer 275f protects the first semiconductor layer 275a, the second semiconductor layer 275b, and the active layer 275c. The insulating layer 275f may expose both ends of the inorganic light-emitting diode ILED in the lengthwise direction thereof. In other words, an end of the first electrode layer 275d and an end of the second electrode layer 275e may not be covered or overlapped by the insulating layer 275f.

The insulating layer 275f may include materials having an insulation property, for example, silicon oxide (SiOx), silicon nitride (SiNx), silicon oxtynitride (SiOxNy), aluminum nitride (AlN), aluminum oxide ($Al_2O_3$). The insulating layer 275f may prevent an electrical short-circuit from occurring in a case that the active layer 275c directly contacts an outside electrode which transmits an electrical signal to the inorganic light-emitting diode ILED. Because the insulating layer 275f protects the outside surface of the inorganic light-emitting diode ILED including the active layer 275c, degradation of luminescence efficiency may be prevented.

Figure 90:
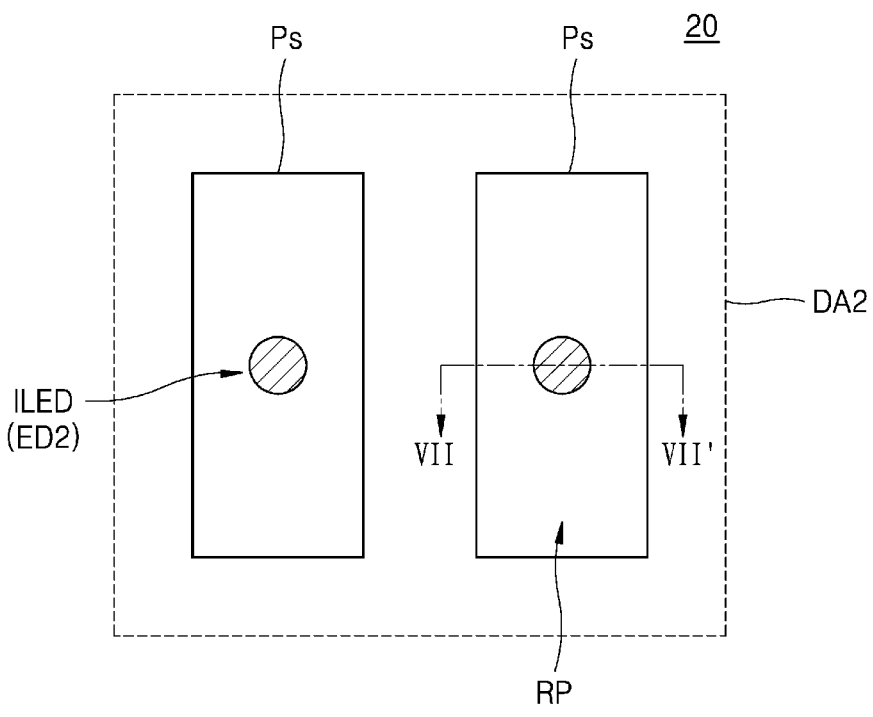
FIG. 90 is a plan view of a second display area of a second display panel according to an embodiment.
Figure 91:
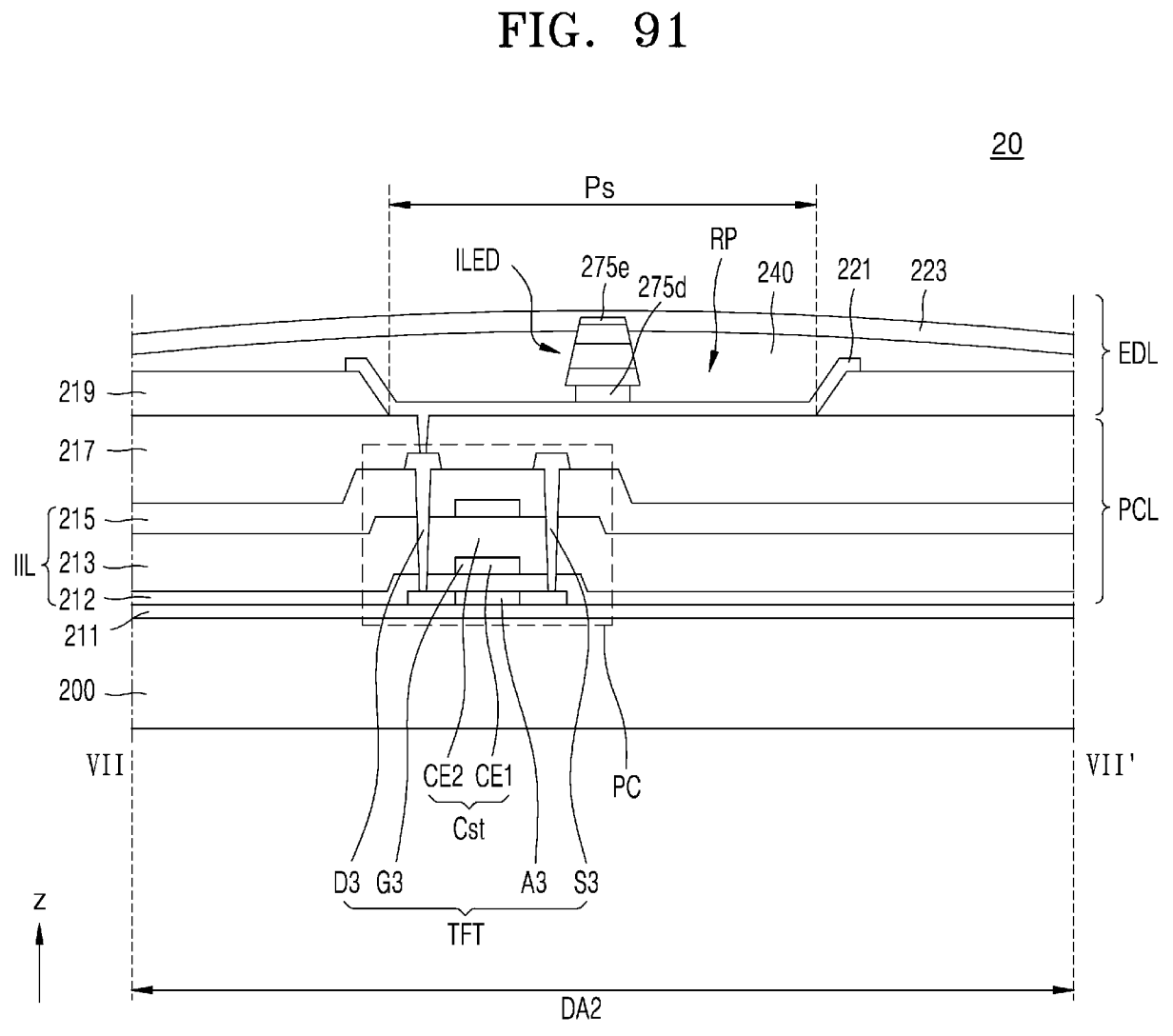

FIG. 90 is a plan view of the second display area DA2 of the second display panel 20 according to an embodiment. FIG. 91 is a schematic cross-sectional view taken along a line VII-VII' of FIG. 90.

Referring to FIGS. 90 and 91, each of the subpixels Ps arranged or disposed in the second display area DA2 may be implemented by a second light-emitting element ED2 corresponding to a micro inorganic light-emitting diode (ILED).

The second display panel 20 may include a circuit layer PCL arranged or disposed on a substrate 200, and a display element layer EDL. At least one thin-film transistor TFT and at least one capacitor Cst may be arranged or disposed, and a first gate insulating layer 212, a second gate insulating layer 213, an interlayer insulating layer 215, and a planarization layer 217 may be arranged or disposed as insulating layers in the circuit layer PCL. Because the circuit layer PCL of the second display panel 20 is substantially the same as the circuit layer PCL of the first display panel 10, a description of the circuit layer PCL of the second display panel 20 is replaced by a description of the circuit layer PCL of the first display panel 10. The micro inorganic light-emitting diode ILED may be arranged or disposed as a display element in the display element layer EDL.

A buffer layer 211 may be included or disposed on the substrate 200, and the circuit layer PCL and the inorganic light-emitting diode ILED may be included or disposed on a buffer layer 211.

The substrate 200 may include glass, plastic, or the like within the spirit and the scope of the disclosure. Alternatively, in a case that a photodiode may be included within a side of the substrate 200, the substrate 200 may be included as a silicon wafer as described above with reference to FIG. 88.

The buffer layer 211 may perform functions of blocking impure elements from being permeated via the substrate 200 and planarizing the surface of the substrate 200, and may be a monolayer or multi-layer including an inorganic material, such as silicon nitride ($SiN_x$) and/or silicon oxide ($SiO_x$).

A bank 219 defining an area of the subpixels Ps may be arranged or disposed on the circuit layer PCL. The bank 219 may include a concave portion RP in which the inorganic light-emitting diode ILED may be accommodated. A height of the bank 219 may be determined by a height and a viewing angle of the inorganic light-emitting diode ILED. A size (width) of the concave portion RP may be determined by a resolution, a subpixel density, or the like of the second display panel 20. According to an embodiment, the height of the inorganic light-emitting diode ILED may be greater than the height of the bank 219. Although the concave portion RP is quadrilateral in FIG. 91, embodiments are not limited thereto. The concave portion RP may have any of various shapes, such as a polygon, a rectangle, a circle, a cone, an oval, or a triangle.

A first electrode 221 may be arranged or disposed along the lateral surface and the lower surface of the concave portion RP and an upper surface of the bank 219 around the concave portion RP. The first electrode 221 is electrically connected to a source electrode S3 or a drain electrode D3 of the thin-film transistor TFT via a via hole provided or disposed in the planarization layer 217. In FIG. 91, the first electrode 221 may be electrically connected to the drain electrode D3.

The bank 219 may function as a light blocking unit having a low light transmittance to block light emitted to the lateral surface of the inorganic light emitting diode ILED, thereby preventing color mixing of light beams generated from adjacent inorganic light emitting diodes ILED. The bank 219 may improve a contrast of the second display panel 20 by absorbing and blocking externally-incident light. The bank 219 may include a material that absorbs at least a portion of light, a light reflection material, or a light scattering material. The bank 219 may include an insulative material that may be semi-transparent or opaque with respect to visible light (for example, light in the range of about 280 nm to about 750 nm wavelengths). The bank 219 may include an organic insulating material, such as thermoplastic resin (for example, polycarbonate, polyethylene terephthalate (PET), polyethersulfone, polyvinyl butyral, polyphenylene ether, polyamide, polyetherimide, norbornene-system resin, methacrylic resin, or cyclic polyolefin series), thermosetting resin (for example, epoxy resin, phenol resin, urethane resin, acrylic resin, vinyl ester resin, imide-based resin, urethane-based resin, urea resin, or melamine resin), polystyrene, or poly-acrylonitrile, but embodiments are not limited thereto. The bank 219 may include an inorganic insulating material, such as inorganic oxide or inorganic nitride (for example, $SiO_x$, $SiN_x$, $SiN_xO_y$, $AlO_x$, $TiO_x$, $TaO_x$, or $ZnO_x$), but embodiments are not limited thereto. According to an embodiment, the bank 219 may include an opaque material such as a black matrix material. The black matrix material may include an insulative material such as at least one of organic resin, resin or paste including glass paste and a black pigment, metal particles (for example, nickel, aluminum, molybdenum, and an alloy thereof), metal oxide particles (for example, chromium oxide), or metal nitride particles (for example, chromium nitride). According to an embodiment, the bank 219 may be a distributed Bragg reflector (DBR) having high reflectivity or a mirror reflector including metal.

The inorganic light-emitting diode ILED having a micro size may be arranged or disposed in the concave portion RP of the bank 219. The micro size may indicate a size in a range of about 1 to about 100 μm, but embodiments are not limited thereto. Light-emitting diodes having sizes that may be greater or smaller than the size in a range of about 1 to about 100 μm may be used. Inorganic light-emitting diodes ILED may be individually or collectively picked up from a wafer by a transfer mechanism and transferred to the substrate 200 and thus may be accommodated in the concave portion RP of the substrate 200. According to an embodiment, the inorganic light-emitting diode ILED may be accommodated in the concave portion RP of the substrate 200 after the bank 219 and the first electrode 221 may be formed. The inorganic light-emitting diode ILED may emit light of a certain or predetermined wavelength that may belong to a wavelength ranging from UV light to visible light. For example, the inorganic light-emitting diode ILED may be a red, green, blue, or white LED or a UV LED.

The first electrode 221 may be a reflective electrode, and may include one or more layers. For example, the first electrode 221 may include a metal such as aluminum, molybdenum, titanium, a mixture of titanium and tungsten, silver, gold, or an alloy thereof. The first electrode 221 may include a transparent conductive layer including a conductive material such as a transparent conductive oxide (TCO) (for example, ITO, IZO, ZnO, or $In_2O_3$), a carbon nanotube film, or a transparent conductive polymer, and a reflection layer. According to an embodiment, the first electrode 221 may be a triple layer including upper and lower transparent conductive layers and a reflection layer therebetween.

The second electrode 223 may be a transparent or semi-transparent electrode. For example, the second electrode 223 may include a conductive material such as a TCO (for example, ITO, IZO, ZnO, or $In_2O_3$), a carbon nanotube film, or a transparent conductive polymer. The second electrode 223 may be a common electrode that may be common to the subpixels Ps, and thus may be provided or disposed on the entire second display area DA2.

A passivation layer 240 may surround or be adjacent to the inorganic light-emitting diode ILED within the concave portion RP. The passivation layer 240 may cover or overlap the bank 219 and the inorganic light-emitting diode ILED. The passivation layer 240 has a height that may not cover or overlap an upper portion of the inorganic light-emitting diode ILED, for example, the second electrode layer 275e, and thus the second electrode layer 275c may be exposed. The passivation layer 240 may include an organic insulating material. For example, the passivation layer 240 may include acryl, PMMA, benzocyclobutene (BCB), polyimide, acrylate, epoxy, polyester, or the like within the spirit and the scope of the disclosure. The second electrode 223 that may be electrically connected to the exposed second electrode layer 275e of FIG. 89 of the inorganic light-emitting diode ILED may be provided or disposed above the passivation layer 240.

As a voltage is applied to the first electrode 221 and the second electrode 223, the inorganic light-emitting diode ILED emits light, and the emitted light fills the concave portion RP of the bank 219. In other words, the size of each subpixel Ps may be defined by the concave portion RP of the bank 219 on which the inorganic light-emitting diode ILED may be arranged or disposed.

Although an embodiment describes a case where the micro inorganic light-emitting diode ILED may be applied to the second display panel 20, the structure of an embodiment may also be applicable to the first display panel 10.

Figure 92:
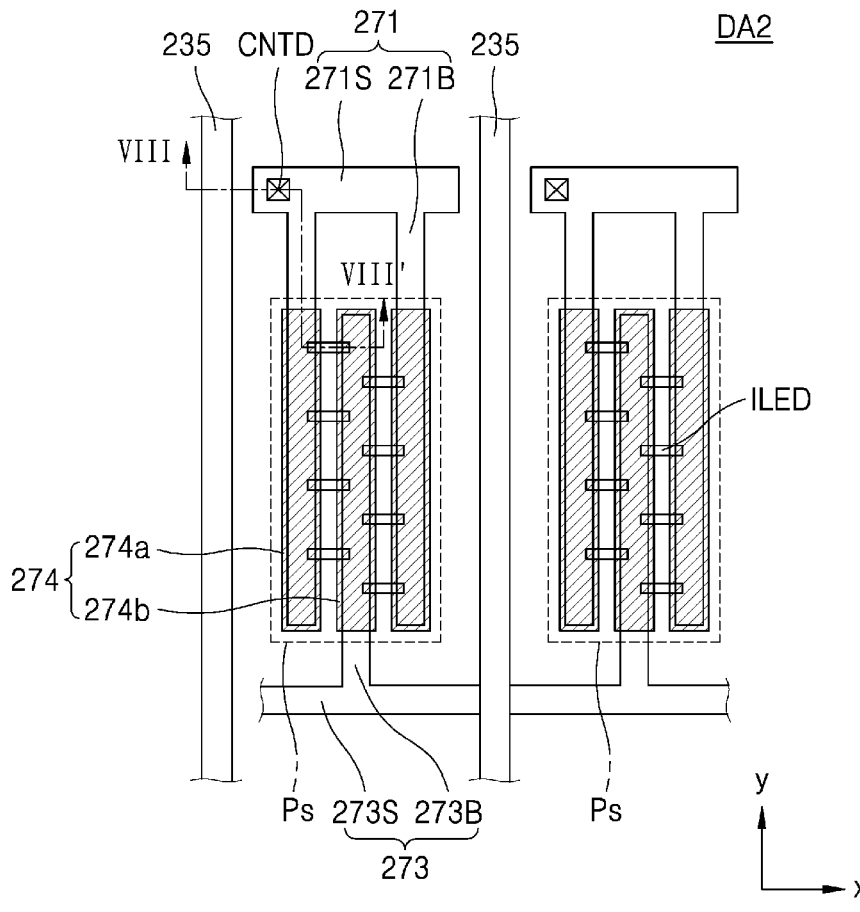
FIGS. 92 and 93 are plan views of examples of a second display area of a second display panel.
Figure 93:
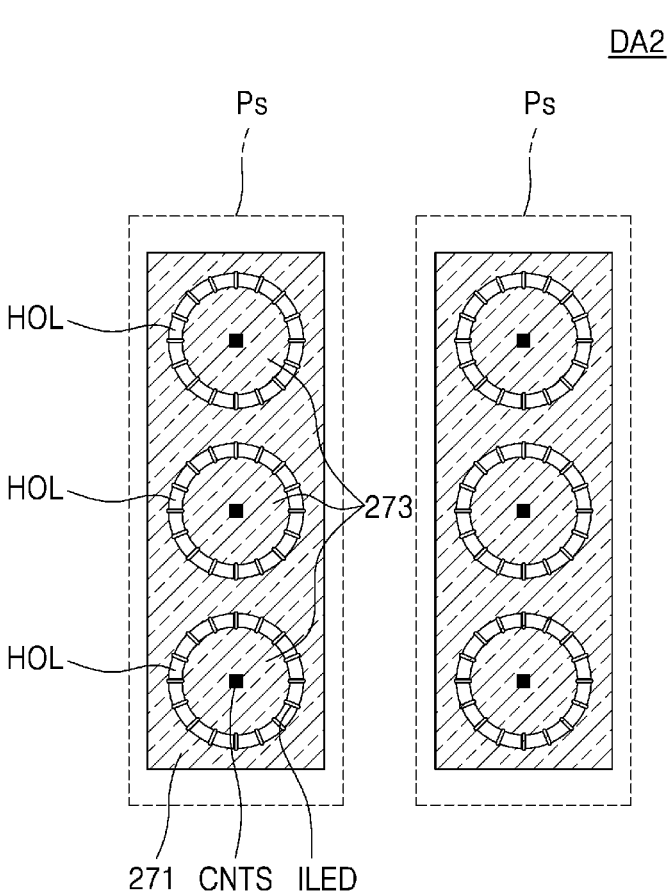

FIGS. 92 and 93 are plan views of examples of the second display area DA2 of the second display panel 20.

Referring to FIG. 92, the subpixel Ps of the second display area DA2 may be implemented by inorganic light-emitting diodes ILED included as micro- or nano-sized inorganic light-emitting diodes. Each inorganic light-emitting diode ILED may be disposed between a first electrode 271 and a second electrode 273 and may emit light.

The first electrode 271 may be an anode electrode, and the second electrode 273 may be a cathode electrode. The first electrode 271 and the second electrode 273 may include first and second electrode stems 271S and 273S each extending in the first direction (x direction), respectively, and at least one first electrode branch 271B and at least one second electrode branch 273B respectively extending from the first and second electrode stems 271S and 273S in the second direction (y direction) intersecting with the first direction (x direction), respectively.

The first electrode 271 may include the first electrode stem 271S extending in the first direction (x direction) and the at least one first electrode branch 271B growing out from the first electrode stem 271S and extending in the second direction (y direction).

The first electrode stem 271S may be electrically separated from a first electrode stem 271S driving a subpixel Ps that may be adjacent to a subpixel Ps corresponding to the former first electrode stem 271S in the first direction (x direction). The first electrode stem 271S may be spaced apart from the first electrode stem 271S of the subpixel Ps that may be adjacent to the subpixel Ps corresponding to the former first electrode stem 271S in the first direction (x direction). The first electrode stem 271S may be electrically connected to a thin-film transistor via a first electrode contact hole CNTD.

The first electrode branch 271B may be spaced apart from the second electrode stem 273S in the second direction (y direction). The first electrode branch 271B may be spaced apart from the second electrode branch 273B in the first direction (x direction).

The second electrode 273 may include a second electrode stem 271S extending in the first direction (x direction) and a second electrode branch 273B growing out from the second electrode stem 273S and extending in the second direction (y direction).

The second electrode stem 273S may be electrically connected to a second electrode stem 273S driving a subpixel Ps that may be adjacent to a subpixel Ps corresponding to the former second electrode stem 273S in the first direction (x direction). The second electrode branch 273B may be spaced apart from the first electrode stem 271S in the second direction (y direction). The second electrode branch 273B may be spaced apart from the first electrode branch 271B in the first direction (x direction). The second electrode branch 273B may be between first electrode branches 271B in the first direction (x direction).

Although the first electrode branches 271B and the second electrode branches 273B each extend in the second direction (y direction) in FIG. 92, embodiments are not limited thereto. For example, each of the first electrode branches 271B and the second electrode branches 273B may partially have a curvature or may be bent. As shown in FIG. 93, one electrode may surround or be adjacent to another electrode.

In FIG. 93, the second electrode 273 may be substantially circular, the first electrode 271 may be arranged or disposed to surround or be adjacent to the second electrode 273, ring-shaped holes HOL may be disposed between the first electrode 271 and the second electrode 273, and the second electrode 273 may receive a cathode voltage via a second electrode contact hole CNTS. In an embodiment of FIG. 93, inorganic light-emitting diodes ILED may be arranged or disposed in various directions, and thus uniform brightness may be provided according to a viewing angle.

By arranging the first electrode 271 and the second electrode 273 such that at least partial areas thereof may be spaced apart from each other and may face each other, in a case that a space in which the inorganic light-emitting diode ILED may be arranged or disposed may be provided between the first electrode 271 and the second electrode 273, the first electrode branch 271B and the second electrode branch 273B may each have any shape.

Each inorganic light-emitting diode ILED may be between a first electrode 271 and a second electrode 273. One end of the inorganic light-emitting diode ILED may be electrically connected to the first electrode 271, and the other end thereof may be electrically connected to the second electrode 273. Inorganic light-emitting diodes ILED may be spaced apart from each other. The inorganic light-emitting diodes ILED may be arranged or disposed substantially side by side.

Each inorganic light-emitting diode ILED may have a shape substantially corresponding to that of a rod, a wire, or a tube. For example, the inorganic light-emitting diode ILED may have a substantially cylindrical or rod shape as shown in FIG. 93. However, the shape of the inorganic light-emitting diode ILED is not limited thereto. The inorganic light-emitting diode ILED may have a shape substantially corresponding to that of a polyhedron such as a cube, a rectangular prism, or a hexahedron, or may have a shape that extends in one direction but may have a partially-inclined outer surface. A length of the inorganic light-emitting diode ILED may have a length in a range of about 1 μm to about 10 μm or about 2 μm to about 6 μm, for example, about 3 μm to about 5 μm. A diameter of the inorganic light-emitting diode ILED may have a diameter in a range of about 300 nm to about 700 nm, and an aspect ratio of the inorganic light-emitting diode ILED may be in a range of about 1.2 to about 100.

A contact electrode 274 may include a first contact electrode 274a and a second contact electrode 274b. The first contact electrode 274a and the second contact electrode 274b may each extend in the second direction (y direction).

The first contact electrode 274a may be on the first electrode branch 271B and may be connected to the first electrode branch 271B. The first contact electrode 274a may contact one end of the inorganic light-emitting diode ILED. The first contact electrode 274a may be between the first electrode branch 271B and the inorganic light-emitting diode ILED. Accordingly, the inorganic light-emitting diode ILED may be electrically connected to the first electrode 271 via the first contact electrode 274a.

The second contact electrode 274b may be on the second electrode branch 273B and may be connected to the second electrode branch 273B. The second contact electrode 274b may contact the other end of the inorganic light-emitting diode ILED. The second contact electrode 274b may be between the second electrode branch 273B and the inorganic light-emitting diode ILED. Accordingly, the inorganic light-emitting diode ILED may be electrically connected to the second electrode 273 via the second contact electrode 274b.

A width (or a length in the first direction (x direction)) of the first contact electrode 274a may be greater than a width (or a length in the first direction (x direction)) of the first electrode branch 271B, and a width (or a length in the first direction (x direction)) of the second contact electrode 274b may be greater than a width (or a length in the first direction (x direction)) of the second electrode branch 273B.

External banks 235 may be between subpixels Ps. The external banks 235 may each extend in the second direction (y direction). A length in the first direction (x direction) of each of the subpixels Ps may be defined as a distance between the external banks 235.

Figure 94:
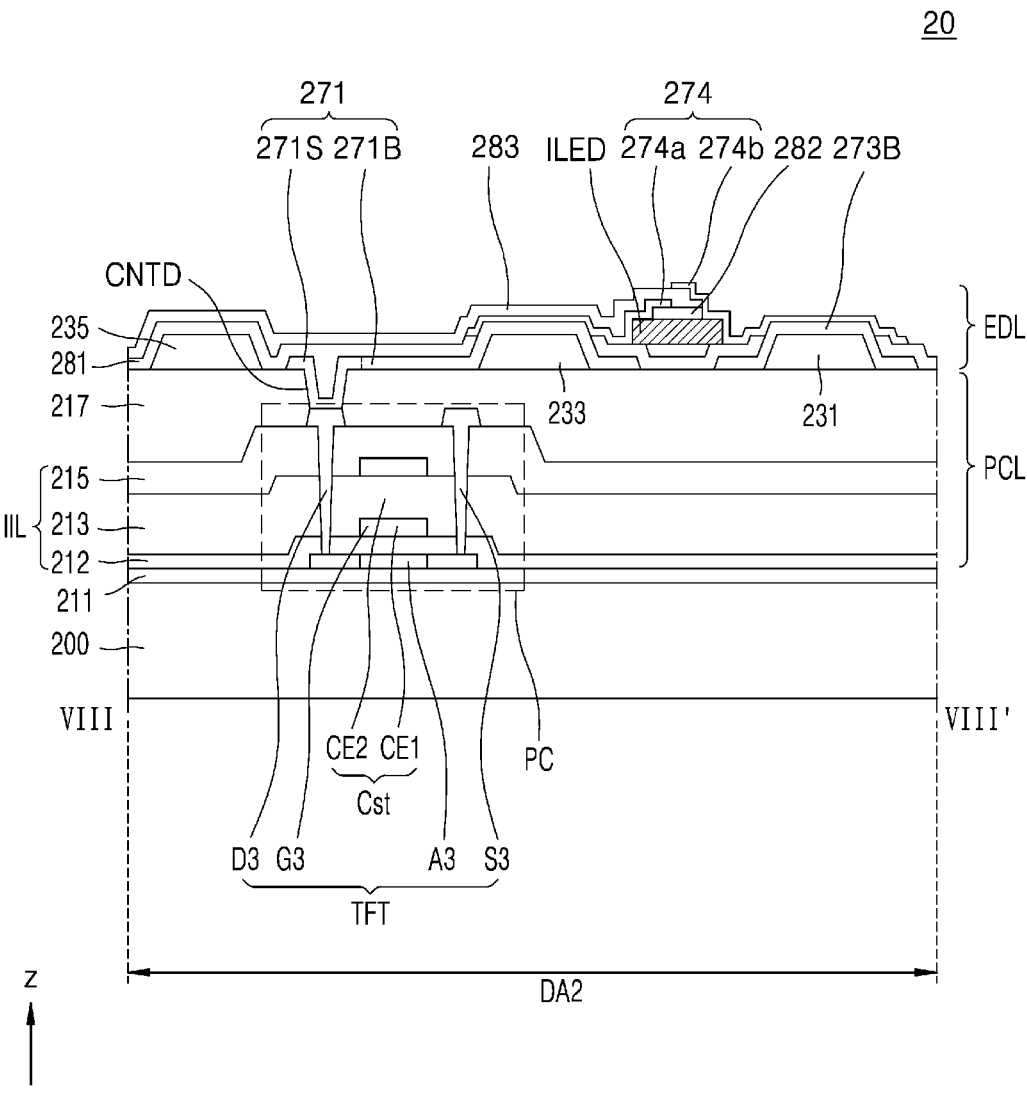
FIG. 94 is a schematic cross-sectional view taken along a line VIII-VIII' of FIG. 92.

FIG. 94 is a schematic cross-sectional view taken along a line VIII-VIII' of FIG. 92.

Referring to FIG. 94, the second display panel 20 may include a circuit layer PCL arranged or disposed on a substrate 200, and a display element layer EDL. The circuit layer PCL may include at least one thin-film transistor TFT and at least one capacitor. Because the circuit layer PCL of the second display panel 20 is substantially the same as the circuit layer PCL of the first display panel 10, a description of the circuit layer PCL of the second display panel 20 is replaced by a description of the circuit layer PCL of the first display panel 10.

The display element layer EDL may include a first internal bank 231, a second internal bank 233, a first electrode 271, a second electrode 273, a contact electrode 274, an inorganic light-emitting diode ILED, a first insulating layer 281, a second insulating layer 282, and a third insulating layer 283.

The first internal bank 231, the second internal bank 233, and an external bank 235 may be arranged or disposed on a planarization layer 217. The first internal bank 231, the second internal bank 233, and the external bank 235 may protrude from the upper surface of the planarization layer 217. The first internal bank 231, the second internal bank 233, and the external bank 235 may each have a trapezoidal cross-section, but embodiments are not limited thereto. Each of the first internal bank 231, the second internal bank 233, and the external bank 235 may include a lower surface in contact with the upper surface of the planarization layer 217, an upper surface facing the lower surface, and lateral surfaces between the upper and lower surfaces. The lateral surfaces of the first internal bank 231, the lateral surfaces of the second internal bank 233, and the lateral surfaces of the external bank 235 may be aslant.

The first internal bank 231 and the second internal bank 233 may be spaced apart from each other. Each of the first internal bank 231 and the second internal bank 233 may include an organic layer such as acryl resin, epoxy resin, phenolic resin, polyamide resin, or polyimide resin.

The first electrode branch 271B may be on the first internal bank 231, and the second electrode branch 273B may be on the second internal bank 233. The first electrode branch 271B may be connected to the first electrode stem 271S, and the first electrode stem 271S may be electrically connected to the drain electrode D3 of the thin-film transistor TFT in the first electrode contact hole CNTD. Therefore, the first electrode 271 may receive a voltage from the drain electrode D3 of the thin film transistor TFT.

The first and second electrodes 271 and 273 may include a conductive material having high reflectivity. For example, the first electrode 271 and the second electrode 273 may include metal such as silver (Ag), copper (Cu), or aluminum (Al). Accordingly, light traveling toward the first electrode 271 and the second electrode 273 from among the light emitted by the inorganic light-emitting diode ILED may be reflected by the first electrode 271 and the second electrode 273 and thus may travel to above the inorganic light-emitting diode ILED.

The first insulation layer 281 may be on the first electrode 271 and the second electrode branch 273B. The first insulating layer 281 may cover or overlap the first electrode stem 271S, the first electrode branch 271B arranged or disposed on the lateral surfaces of the first internal bank 231, and the second electrode branch 273B arranged or disposed on the lateral surfaces of the second internal bank 233. The first electrode branch 271B on the upper surface of the first internal bank 231 and the second electrode branch 273B on the upper surface of the second internal bank 233 may not be covered or overlapped by the first insulating layer 281. The first insulating layer 281 may be located or disposed on the external bank 235. The first insulating layer 281 may include an inorganic layer, for example, a silicon nitride layer, a silicon oxynitride layer, a silicon oxide layer, a titanium oxide layer, or an aluminum oxide layer.

The inorganic light-emitting diode ILED may be disposed on the first insulating layer 281 arranged or disposed between the first internal bank 231 and the second internal bank 233. One end of the inorganic light-emitting diode ILED may be adjacent to the first internal bank 231, and the other end thereof may be adjacent to the second internal bank 233.

The second insulating layer 282 may be arranged or disposed on the inorganic light-emitting diode ILED. The second insulating layer 282 may include an inorganic layer, for example, silicon oxide ($SiO_2$), silicon nitride ($SiN_x$), silicon oxynitride (SiON), or aluminum oxide ($Al_2O_3$).

The first contact electrode 274a may be on the first electrode branch 271B not covered or overlapped by the first insulating layer 281, and may contact one end of the inorganic light-emitting diode ILED. The first contact electrode 274a may be also on the second insulating layer 282.

The third insulating layer 283 may be disposed on the first contact electrode 274a. The third insulating layer 283 may cover or overlap the first contact electrode 274a to electrically separate the first contact electrode 274a and the second contact electrode 274b from each other. The third insulating layer 283 may include an inorganic layer, for example, a silicon nitride layer, a silicon oxynitride layer, a silicon oxide layer, a titanium oxide layer, or an aluminum oxide layer.

The second contact electrode 274b may be on the second electrode branch 273B not covered or overlapped by the first insulating layer 281, and may contact the other end of the inorganic light-emitting diode ILED. The second contact electrode 274b may also be on the second insulating layer 282 and the third insulating layer 283.

As such, the subpixels Ps of the second display area DA2 may be implemented by inorganic light-emitting diodes ILED. Although an embodiment describes a case where the micro inorganic light-emitting diode ILED having an ultra-small size may be applied to the second display panel 20, the structure of an embodiment may also be applicable to the first display panel 10.

Figure 95:
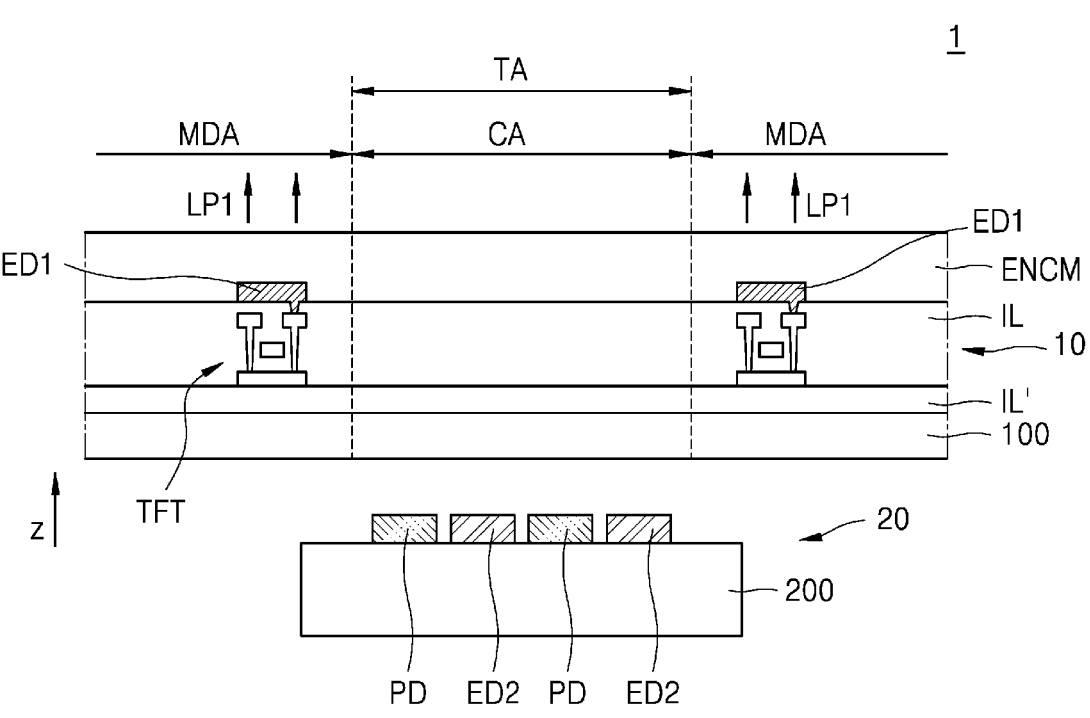
FIG. 95 is a schematic cross-sectional view of a display apparatus according to an embodiment.

FIG. 95 is a schematic cross-sectional view of a display apparatus 1 according to an embodiment.

Referring to FIG. 95, the display apparatus 1 may include a first display panel 10 and a second display panel 20 below the first display panel 10. The first display panel 10 and the second display panel 20 may be received by the lower cover 90 of FIG. 2.

The first display panel 10 may include a main display area MDA and a component area CA. The first display panel 10 according to an embodiment may be different from the above-described display panels 10 in that no light-emitting elements may be arranged or disposed in the component area CA and the component area CA may include only the transmission area TA. First light-emitting elements ED1 arranged or disposed in the main display area MDA emit light LP1 in the third direction (z direction), and thus the first display panel 10 may display an image.

The second display panel 20 may include second light-emitting elements ED2 and photodiodes PD as light-receiving elements arranged or disposed on a substrate 200. The second light-emitting elements ED2 may emit the light LP1 in the third direction (z direction), and thus the second display panel 20 displays an image. The photodiodes PD of the second display panel 20 may receive external light that may be incident in a opposite direction (−z direction) to the third direction (z direction). The photodiodes PD may function as image sensors or cells of a solar battery. The second light-emitting elements ED2 and the photodiodes PD arranged or disposed in the second display panel 20 may alternate with each other.

The second display panel 20 may be overlapped by the component area CA or the transmission area TA of the first display panel 10, and thus an image that may be displayed by the second light-emitting elements ED2 of the second display panel 20 may be visually recognized via the transmission area TA of the first display panel 10, and external light incident via the transmission area TA may be received by the photodiodes PD of the second display panel 20.

Figure 96:
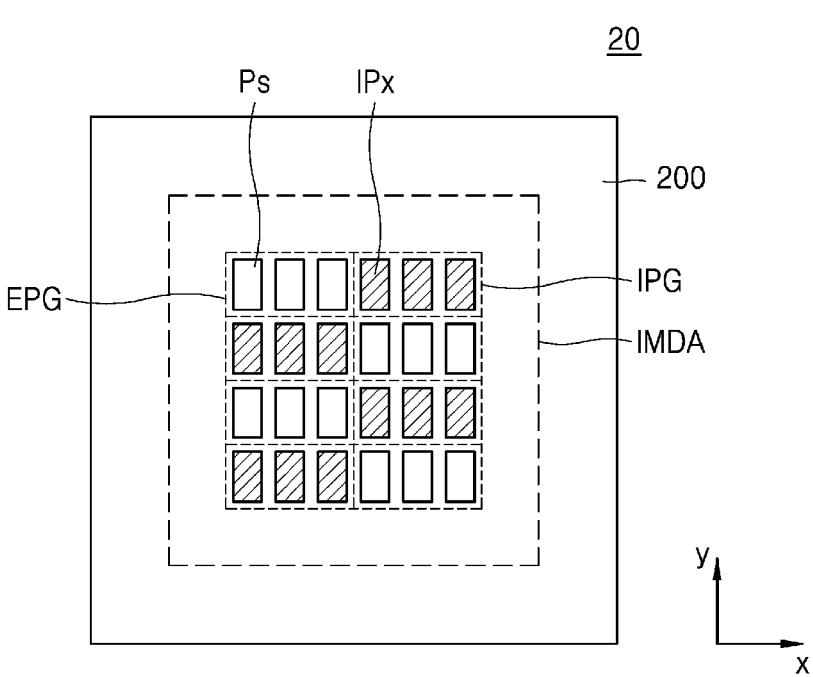
FIG. 96 is a schematic plan view of an embodiment of a second display panel of FIG. 95.

FIG. 96 is a schematic plan view of an embodiment of the second display panel 20 of FIG. 95.

Referring to FIG. 96, the second display panel 20 may include an integrated area IMDA obtained by integrating an area that displays an image with an area that captures an image. The integrated area IMDA may have the same size and shape as the component area CA or the transmission area TA of the first display panel 10 of FIG. 95.

In the integrated area IMDA, a light-emitting pixel group EPG including the subpixels Ps implemented by the second light-emitting devices ED2 of FIG. 95, and a light-receiving pixel group IPG including light-receiving pixels IPx including the photodiodes PD of FIG. 95 may alternate with each other in the first direction (x direction) and/or the second direction (y direction). Because the integrated area IMDA may be able to realize an image by using display elements, the integrated area IMDA may correspond to a second display area.

The light-emitting pixel group EPG may include red, green, and blue subpixels Ps, and the light-receiving pixel group IPG may include red, green, and blue light-receiving pixels IPx. The number of pixels included in the light-emitting pixel group EPG, the number of pixels included in the light-receiving pixel group IPG, an arrangement of the pixels included in the light-emitting pixel group EPG, and an arrangement of the pixels included in the light-receiving pixel group IPG may vary.

Figure 97:
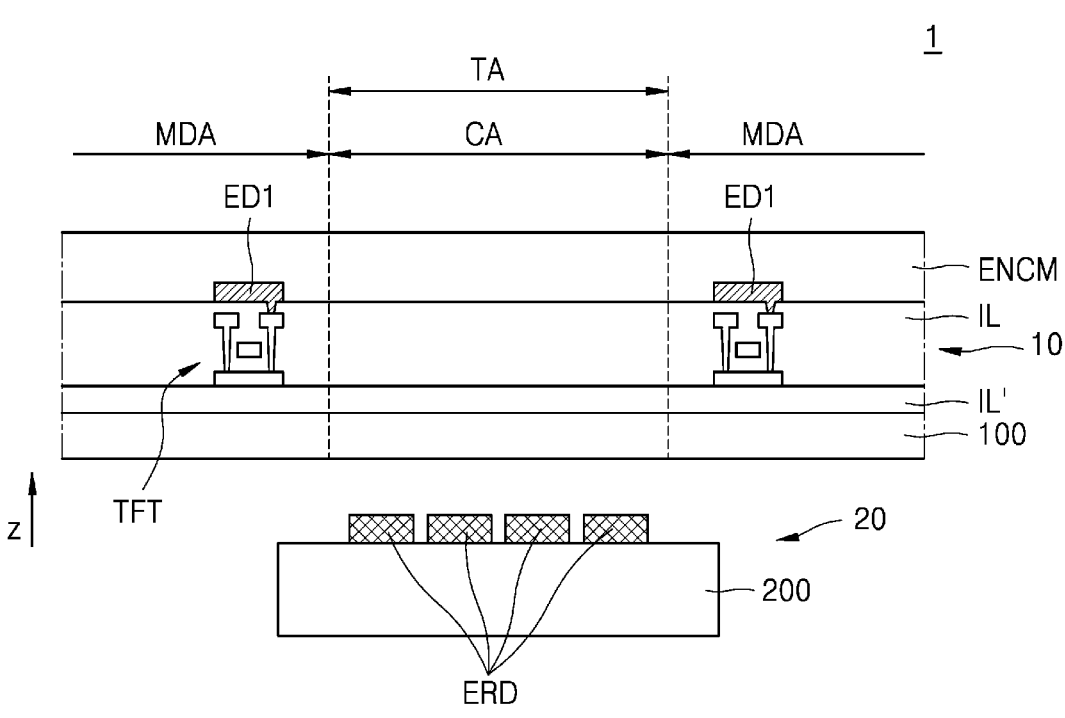
FIG. 97 is a schematic cross-sectional view of a portion or region of a display apparatus according to an embodiment.
Figure 98:
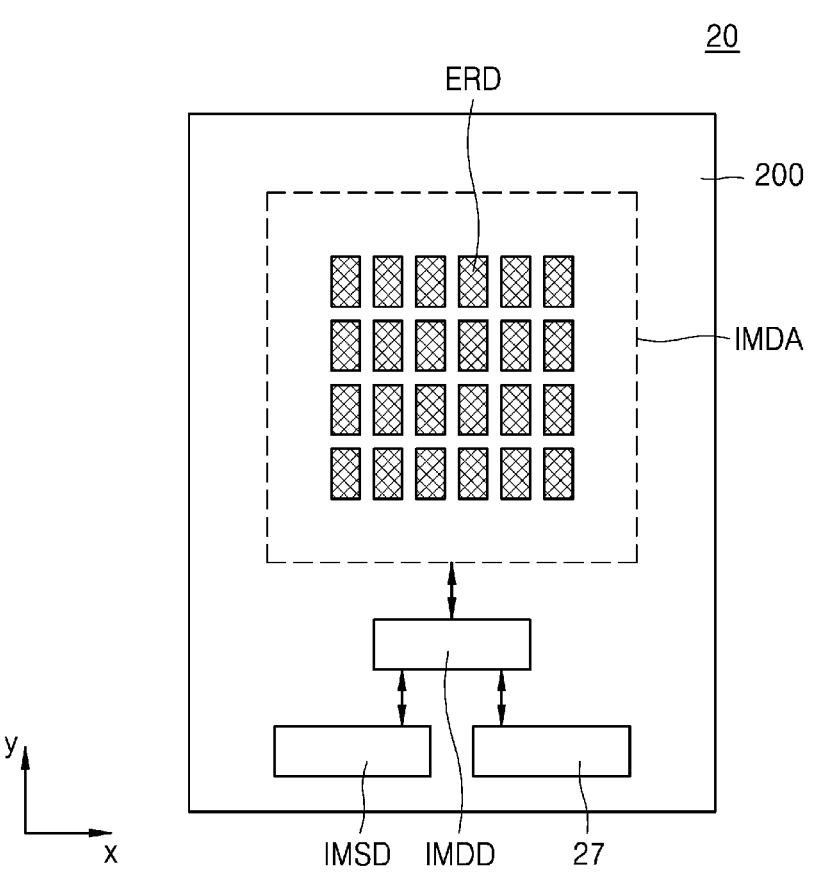
FIG. 98 is a plan view of an example of a second display panel included in the display apparatus of FIG. 97.

FIG. 97 is a schematic cross-sectional view of a portion or region of a display apparatus 1 according to an embodiment. FIG. 98 is a plan view of an example of a second display panel 20 of the display apparatus 1 of FIG. 97.

Referring to FIGS. 97 and 98, the display apparatus 1 may include a first display panel 10 and the second display panel 20 below the first display panel 10. The display apparatus 1 of FIGS. 97 and 98 may be different from the embodiment of FIG. 95 in that the second display panel 20 may include light-emitting and light-receiving elements ERD that may emit or receive light according to a connected circuit.

The first display panel 10 may include a main display area MDA and a component area CA. According to an embodiment, the entire component area CA corresponds to the transmission area TA. First light-emitting elements ED1 arranged or disposed in the main display area MDA may emit light in the third direction (z direction) and may display an image in the first display panel 10.

The second display panel 20 may include the light-emitting and light-receiving elements ERD circuit layer PCL arranged or disposed on a substrate 200. The light-emitting and light-receiving elements ERD may be PN diodes or PIN diodes. In a case that a voltage may be applied to both ends of each of the light-emitting and light-receiving elements ERD being PN diodes or PIN diodes, light may be emitted.

In a case that light may be incident upon the light-emitting and light-receiving elements ERD, a current may be generated.

According to an embodiment, each of the light-emitting and light-receiving elements ERD may be electrically connected to a first pixel circuit that drives light emission and a second pixel circuit that drives light reception, via a switch. The first pixel circuit may be the pixel circuit PC described with reference to FIGS. 11A and 11B. The second pixel circuit may be the light-receiving pixel circuit RPC described above with reference to FIG. 87.

Accordingly, in a case that the light-emitting and light-receiving element ERD may be driven as a light-emitting element, the light-emitting and light-receiving element ERD may be electrically connected to the first pixel circuit, and, in a case that the light-emitting and light-receiving element ERD may be driven as a light-receiving element, the light-emitting and light-receiving element ERD may be electrically connected to the second pixel circuit.

The light-emitting and light-receiving element ERD may be arranged or disposed in the integrated area IMDA of the second display panel 20. A color filter may be arranged or disposed above the light-emitting and light-receiving elements ERD, and thus red, green, and blue light-emitting pixels that realize an image or red, green, and blue light-receiving pixels that capture an image may be realized by the light-emitting and light-receiving elements ERD. Because the light-emitting and light-receiving element ERD in the integrated area IMDA may realize an image, the integrated area IMDA may correspond to the second display areas according to the above-described embodiments.

An image sensor driving unit IMSD and a second display driving unit 27 may be arranged or disposed in a peripheral area outside the integrated area IMDA. The image sensor driving unit IMSD and the second display driving unit 27 may be electrically connected to an integrated driving unit IMDD. In a case that an image is realized by the light-emitting and light-receiving elements ERD, the integrated driving unit IMDD may drive a driving signal of the second display driving unit 27 to be transmitted to the first pixel circuit that may drive the light-emitting and light-receiving elements ERD. In a case that an image is captured by the light-emitting and light-receiving elements ERD, the integrated driving unit IMDD may drive a driving signal of the image sensor driving unit IMSD to be transmitted to the second pixel circuit that may drive the light-emitting and light-receiving elements ERD.

Figure 99:
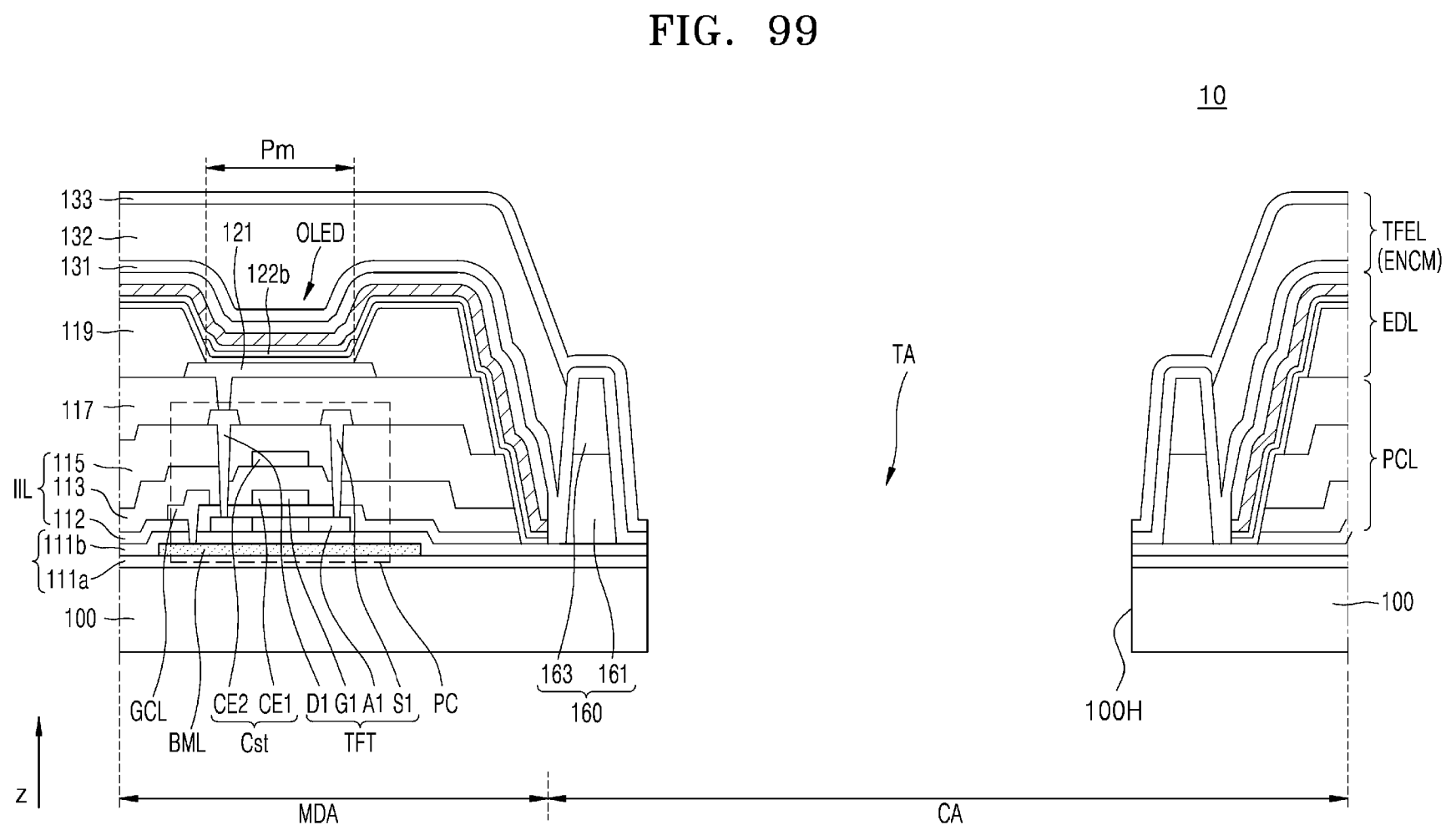

FIG. 99 is a schematic cross-sectional view of a portion or region of a display panel 10 according to an embodiment. In detail, FIG. 99 mainly describes that a substrate 100 of the display panel 10 may include a through hole 100H corresponding to the component area CA. The embodiment of FIG. 99 may be different from the embodiment of FIG. 17 in that no auxiliary subpixels may be arranged or disposed in the component area CA of the display panel 10 and the through hole 100H is included in the substrate 100 to correspond to the component area CA.

The display panel 10 may include a main display area MDA and a component area CA. A main subpixel Pm may be arranged or disposed in the main display area MDA, and a transmission area TA may be arranged or disposed in the component area CA. A main pixel circuit PC including a main thin-film transistor TFT and a main storage capacitor Cst, and a main organic light-emitting diode OLED as a display element electrically connected to the main pixel circuit PC may be arranged or disposed in the main display area MDA.

The substrate 100, the buffer layer 111, the circuit layer PCL, and the display element layer EDL may be sequentially stacked, and the thin-film encapsulation layer TFEL may be arranged or disposed as the encapsulation member ENCM above the display element layer EDL in the display panel 10. The thin-film encapsulation layer TFEL may include the first inorganic encapsulation layer 131, the organic encapsulation layer 132, and the second inorganic encapsulation layer 133 that may be sequentially stacked.

According to an embodiment, the substrate 100 may include the through hole 100H corresponding to the component area CA. A dam unit 160 protruding from the upper surface of the substrate 100 in the +z direction may be arranged or disposed around the through hole 100H of the substrate 100.

The dam unit 160 may be included to prevent the organic encapsulation layer 132 of the thin-film encapsulation layer TFEL from overflowing toward the through hole 100H. The organic encapsulation layer 132 may be formed by coating and curing monomer, and flow of the monomer may be controlled by the dam unit 160. Accordingly, an end of the organic encapsulation layer 132 may be located or disposed on a side of the dam unit 160 that may be far from the through hole 100H. The dam unit 160 may be arranged or disposed to surround or be adjacent to the through hole 100H.

The dam unit 160 may have a multi-layer structure. For example, the dam unit 160 may be a stack of a first layer 161 and a second layer 163. The first layer 161 may include the same or similar material as the inorganic insulating layer IL, and the second layer 163 may include the same or similar material as the planarization layer 117.

The first inorganic encapsulation layer 131 and the second inorganic encapsulation layer 133 may contact each other on a side of the dam unit 160 that may be adjacent to the through hole 100H. Accordingly, external air and moisture that may enter via the through hole 100H may be prevented from permeating into the display element layer EDL.

In an embodiment, a case where the through hole 100H is included in the substrate 100 of the display panel 10 and a case where the thin-film encapsulation layer TFEL may be applied as the encapsulation member ENCM have been described. However, an encapsulation substrate may be applicable as the encapsulation member ENCM. In a case that the encapsulation substrate may be used as the encapsulation member ENCM, a sealant that may couple the substrate 10 with the encapsulation substrate may be introduced around the through hole 100H.

Figure 100:
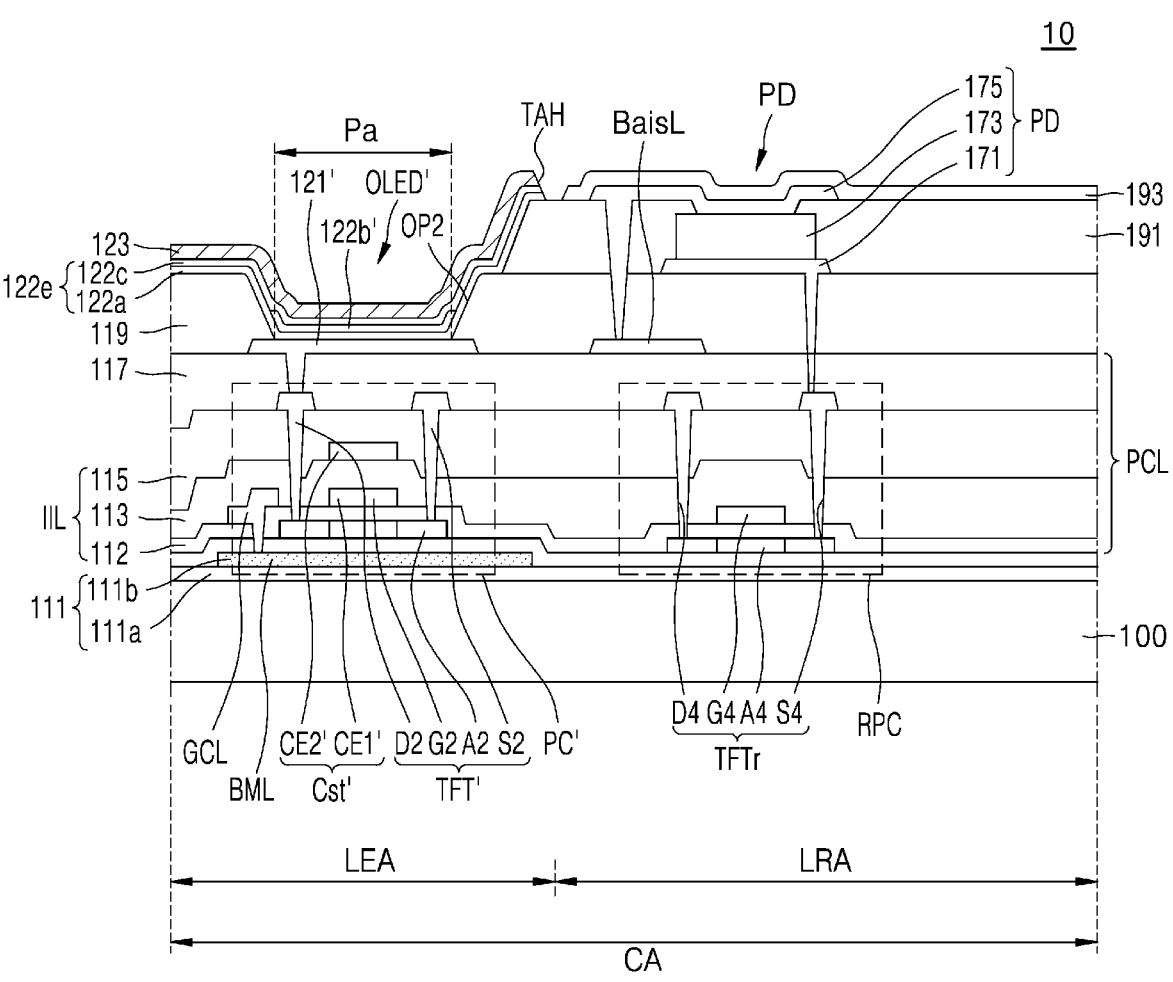
FIG. 100 is a schematic cross-sectional view of a component area of a display panel according to an embodiment.

FIG. 100 is a schematic cross-sectional view of a component area CA of a display panel 10 according to an embodiment. The embodiment of FIG. 100 may be different from the embodiment of FIG. 17 in that a photodiode PD may be arranged or disposed as a light-receiving element in the component area CA of the display panel 10.

The component area CA of the display panel 10 may include a light-emission area LEA and a light-reception area LRA. In the light-emission area LEA, an auxiliary pixel circuit PC' including an auxiliary thin-film transistor TFT' and an auxiliary storage capacitor Cst', and an auxiliary organic light-emitting diode OLED' as a display element electrically connected to the auxiliary pixel circuit PC' may be arranged or disposed.

A light-receiving pixel circuit RPC including a light-reception thin-film transistor TFTr, and the photodiode PD as a light-receiving element electrically connected to the light-receiving pixel circuit RPC may be arranged or disposed in the light-reception area LRA. The light-reception thin-film transistor TFTr may include a semiconductor layer A4, a gate electrode G4, a source electrode S4, and a drain electrode D4, and may be arranged or disposed in the circuit layer PCL.

The photodiode PD may be a stack of a first electrode 171, an active layer 173, and a second electrode 175. The first electrode 171 may be above the pixel defining layer 119, and may be electrically connected to one electrode of the light-reception thin-film transistor TFTr via a contact hole. The first electrode 171 may include a conductive material including molybdenum (Mo), aluminum (Al), copper (Cu), and titanium (Ti), and may be a multi-layer or single layer including the aforementioned materials.

The second electrode 175 may be disposed above the active layer 173, and may be electrically connected to a bias wire BaisL arranged or disposed on the planarization layer 117 via a contact hole. The second electrode 175 may include transparent conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

The active layer 173 may have a structure in which an n-type conductive semiconductor layer and a p-type conductive semiconductor layer are stacked, or may have a structure in which an n-type conductive semiconductor layer, an intrinsic semiconductor layer, and a p-type conductive semiconductor layer are stacked. The active layer 173 may include amorphous silicon (a-Si), amorphous silicon germanium (a-SiGe), hydrogenated amorphous silicon (a-Si:H), and amorphous silicon carbide (a-SiC:H).

A first protection layer 191 may be arranged or disposed to cover or overlap the lateral surfaces of the photodiode PD, and a second protection layer 193 on the first protection layer 191 may be arranged or disposed to cover or overlap the upper surface of the photodiode PD. Each of the first and second protection layers 191 and 193 may include an organic or inorganic insulating material.

Because the photodiode PD generates a current by absorbing external light, the photodiode PD may function as an image sensor or a cell of a solar battery.

Figure 101A:
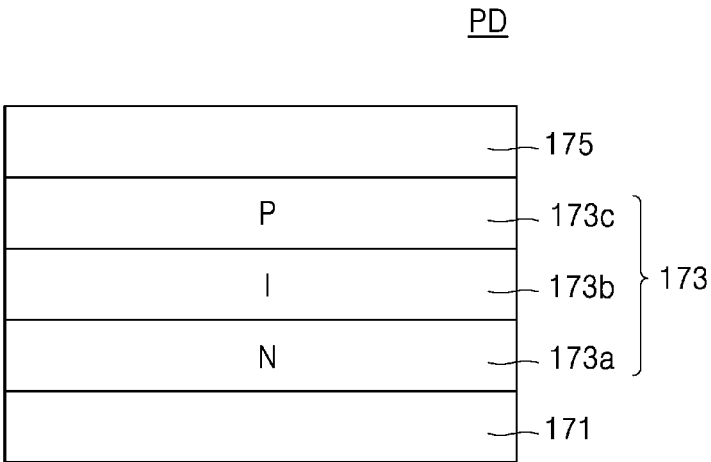
FIGS. 101A through 101C are schematic cross-sectional views of photodiodes applicable to FIG. 100.
Figure 101B:
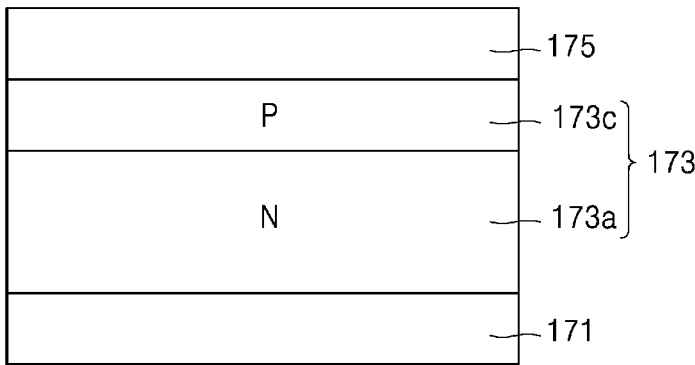
Figure 101C:
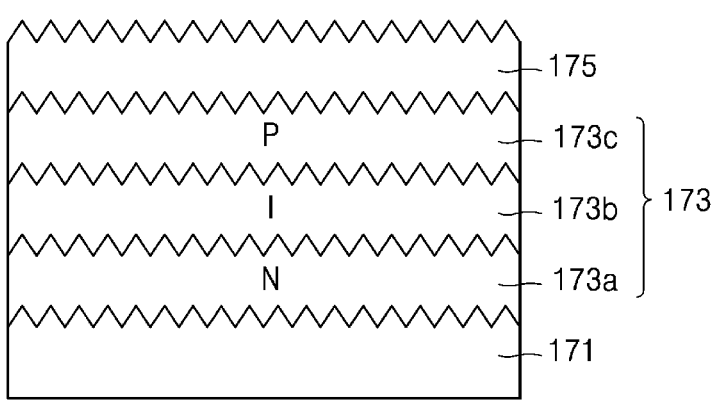

FIGS. 101A through 101C are schematic cross-sectional views of photodiodes PD applicable to FIG. 100.

Referring to FIG. 101A, the photodiode PD may be a stack of a first electrode 171, an n-type conductive semiconductor layer 173a, an intrinsic semiconductor layer 173b, a p-type conductive semiconductor layer 173c, and a second electrode 175.

According to an embodiment, the intrinsic semiconductor layer 173b may include amorphous silicon germanium (a-SiGe), the n-type conductive semiconductor layer 173a may include amorphous silicon germanium (a-SiGe) doped with n-type impurities, and the p-type conductive semiconductor layer 173c may include amorphous silicon (a-Si) doped with p-type impurities.

According to an embodiment, the intrinsic semiconductor layer 173b may include amorphous silicon carbide (a-SiC), the n-type conductive semiconductor layer 173a may include amorphous silicon carbide (a-SiC) doped with n-type impurities, and the p-type conductive semiconductor layer 173c may include amorphous silicon (a-Si) doped with p-type impurities.

Referring to FIG. 101B, the photodiode PD may be a stack of a first electrode 171, an n-type conductive semiconductor layer 173a, a p-type conductive semiconductor layer 173c, and a second electrode 175.

According to an embodiment, the n-type conductive semiconductor layer 173a may include amorphous silicon germanium (a-SiGe) doped with n-type impurities, and the p-type conductive semiconductor layer 173c may include amorphous silicon (a-Si) doped with p-type impurities.

According to an embodiment, the n-type conductive semiconductor layer 173a may include amorphous silicon carbide (a-SiC) doped with n-type impurities, and the p-type conductive semiconductor layer 173c may include amorphous silicon (a-Si) doped with p-type impurities.

Referring to FIG. 101C, the photodiode PD may be obtained by providing an irregularity or a texture on the surface of at least one of a first electrode 171, an n-type conductive semiconductor layer 173a, an intrinsic semiconductor layer 173b, a p-type conductive semiconductor layer 173c, and a second electrode 175. The irregularity or the texture may reduce light reflectivity above the second electrode 173, and may increase a light path and thus may increase luminescent efficiency of the photodiode PD. The irregularity or the texture may be formed via various methods. For example, the irregularity or the texture may be formed by wet etching, dry etching, or patterning using laser.

Figure 102A:
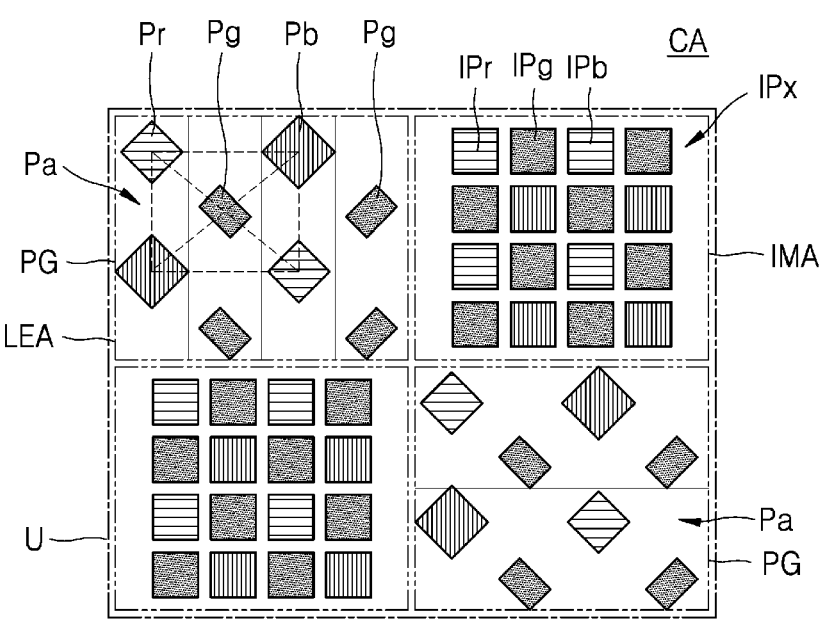
FIG. 102A is a schematic plan view of a component area of a display panel according to an embodiment.
Figure 102A:
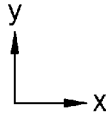
Figure 102B:
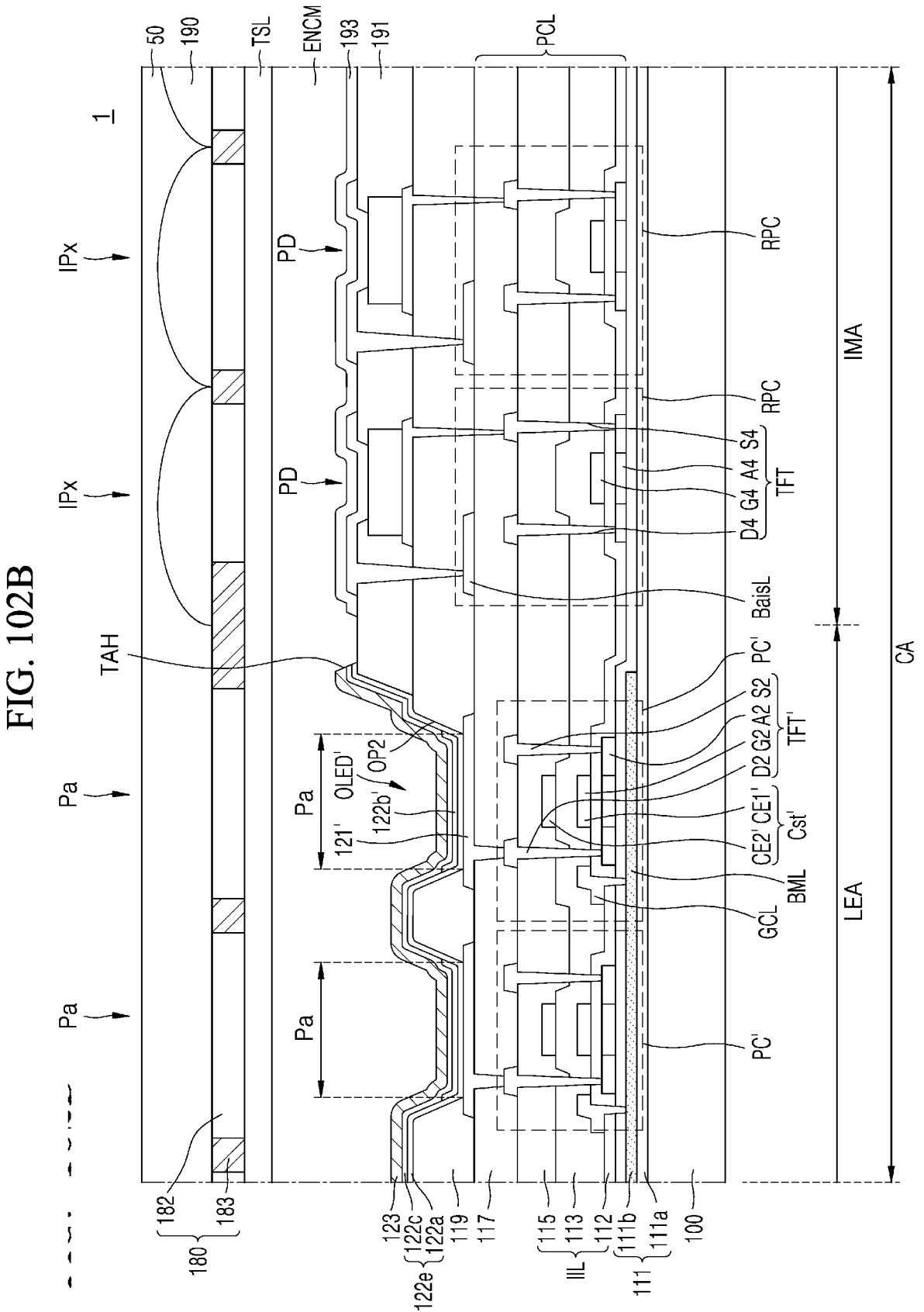
FIG. 102B is a schematic cross-sectional view of the embodiment of FIG. 102A.

FIG. 102A is a schematic plan view of a component area CA of a display panel 10 according to an embodiment. FIG. 102B is a schematic cross-sectional view of the embodiment of FIG. 102A.

Referring to FIGS. 102A and 102B, the display panel 10 according to an embodiment may realize an image by using the main and auxiliary subpixels Pa and Pm implemented as organic light-emitting diodes OLED, and may capture an image by using the light-receiving pixels IPx including the photodiodes PD. The display panel 10 according to an embodiment may be different from the above-described embodiments in that an image sensor area IMA instead of a transmission area TA may be arranged or disposed in the component area CA.

According to an embodiment, because the main display area MDA of the display panel 10 may correspond to the above-described various embodiments, a description thereof will be omitted. The same reference numerals in FIGS. 100 and 102B denote the same elements, and thus repeated descriptions thereof are omitted.

The component area CA of the display panel 10 may include the light-emission area LEA in which the auxiliary subpixels Pa may be arranged or disposed, and the image sensor area IMA in which the light-receiving pixels IPx may be arranged or disposed. In the light-emission area LEA, pixel groups PG each including auxiliary subpixels Pa may be arranged or disposed. Although the auxiliary subpixels Pa included in each pixel groups PG may be arranged or disposed in a pentile structure in FIG. 102A, the auxiliary subpixels Pa included in each pixel group PG may be arranged or disposed in various pixel arrangement structures as described above with reference to FIGS. 13A through 15. The auxiliary subpixels Pa included in the pixel group PG may include red pixels Pr, green pixels Pg, and blue pixels Pb.

In the image sensor area IMA, light-receiving pixels IPx may be arranged or disposed in a two-dimensional (2D) array. The light-receiving pixels IPx may include red light-receiving pixels IPr, green light-receiving pixels IPg, and blue light-receiving pixels IPb. Although the light-receiving pixels IPx may be arranged or disposed in a Bayer pattern in FIG. 102A, the light-receiving pixels IPx may be arranged or disposed in various other patterns. The light-emission area LEA and the image sensor area IMA may alternate with each other in the x direction and/or the y direction.

Referring to FIG. 102B, an auxiliary organic light-emitting diode OLED' as an auxiliary display element and an auxiliary pixel circuit PC' electrically connected to the auxiliary organic light-emitting diode OLED' may be arranged or disposed on the substrate 100 to correspond to the light-emission area LEA of the display panel 10. The auxiliary pixel circuit PC' may include an auxiliary thin-film transistor TFT' and an auxiliary storage capacitor Cst'.

A photodiode PD and a light-receiving pixel circuit RPC electrically connected to the photodiode PD may be arranged or disposed on the substrate 100 to correspond to the image sensor area IMA of the display panel 10. The photodiode PD may be a PIN diode or a PN diode each including an amorphous silicon semiconductor.

The encapsulation member ENCM may be arranged or disposed to cover or overlap the auxiliary organic light-emitting diode OLED' and the photodiode PD. The encapsulation member ENCM may be the thin-film encapsulation layer TFEL or the encapsulation substrate ENS.

The touch screen layer TSL may be disposed on the encapsulation member ENCM. According to an embodiment, the touch screen layer TSL may include an opening to correspond to the image sensor area IMA.

A filter plate 180 may be arranged or disposed above the touch screen layer TSL. The filter plate 180 may include a color filter 182 and a black matrix 183.

The color filter 182 may be arranged or disposed to correspond to the light-emission area of the organic light-emitting diode OLED' and the light-reception area of the photodiode PD. Color filters 182 may be arranged or disposed by considering the colors of light beams respectively emitted by the auxiliary subpixels Pa or the colors of light beams respectively received by the light-receiving pixels IPx. For example, each color filter 182 may have a red, green, or blue color according to the color of light emitted by an organic light-emitting diode OLED and the color of light received by a light-receiving pixel IPx.

The black matrix 183 may be a member for preventing color interference between adjacent pixels to improve color clarity and contrast. The black matrix 183 may be disposed between auxiliary subpixels Pa and between light-receiving pixels IPx. The black matrix 183 may include Cr, CrOx, Cr/CrOx, Cr/CrOx/CrNy, resin (for example, a carbon pigment or an RGB mixed pigment), graphite, a non-Cr-based material, or the like within the spirit and the scope of the disclosure.

A micro-lens 190 may be arranged or disposed above the color filter 182 to correspond to the image sensor area IMA. The micro-lens 190 may include one convex lens for one light-receiving pixel IPx. The arrangement of the micro-lens 190 may increase the amount of light incident upon the photodiode PD. The micro-lens 190 may be embedded in the cover window 50. An image sensor may be implemented by an array of the light-receiving pixels IPx arranged or disposed in the image sensor area IMA. An image sensor driving unit may be arranged or disposed in the peripheral area DPA of FIG. 10 of the display panel 10 or in a circuit board (not shown) electrically connected with the display panel 10 in order to drive the light-receiving pixels IPx.

According to an embodiment, the photodiodes PD may be arranged or disposed on the substrate 100. However, according to an embodiment, as shown in FIG. 88, the photodiodes PD may be arranged or disposed within the substrate 100. In this way, various modifications may be made.

Figure 103:
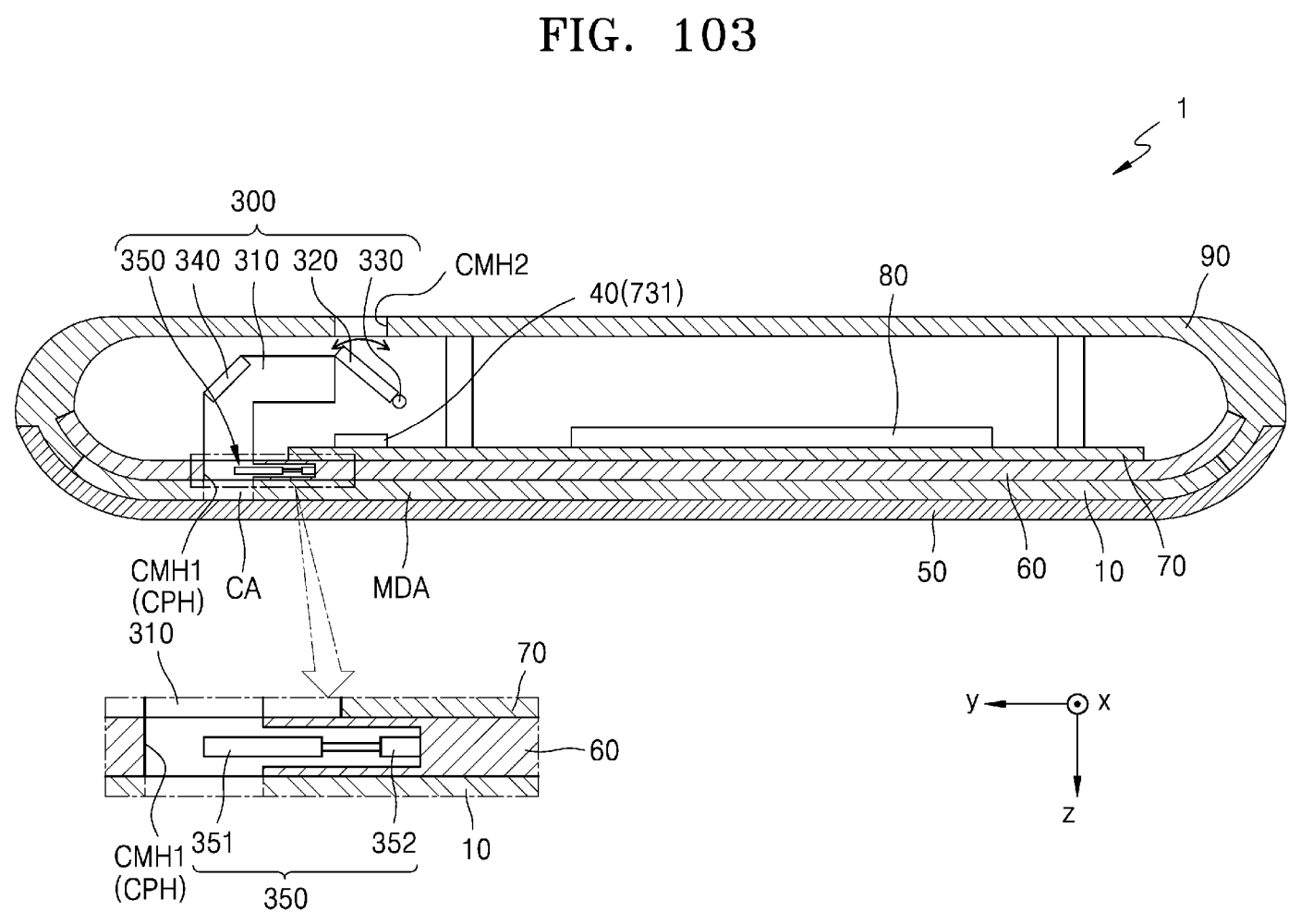

FIG. 103 is a schematic cross-sectional view of a display apparatus according to an embodiment.

Referring to FIG. 103, a display apparatus 1 may include, as described above with reference to FIGS. 1 and 2, a cover window 50, a display panel 10, a display circuit board (not shown), a display driving unit (not shown), a touch sensor driving unit (not shown), a component unit (not shown), a bracket 60, a main circuit board 70, a battery 80, and a lower cover 90.

The component unit may include at least one of a component 40 and a camera 731. The component 40 and the camera 731 are the same as or similar to those described above with reference to FIGS. 1 and 2, and thus detailed descriptions thereof are omitted herein.

The display apparatus 1 may include a light guiding unit 300 for guiding light existing on the outer surface of the display apparatus 1 into the display apparatus 1, namely, to at least one of the component 40 and the camera 731. For example, the light guiding unit 300 may guide light incident upon the component area CA to at least one of the component 40 and the camera 731. The light guiding unit 300 may also guide light incident from the outer surface of the lower cover 90 to at least one of the component 40 and the camera 731. For convenience of description, a case where the light guiding unit 300 guides light to the component 40 will now be described in detail.

In such a case, the component 40 may be arranged or disposed to face a direction from the bracket 60 to the lower cover 90 (for example, the −z direction in FIG. 103). In other words, the component 40 may be arranged or disposed to face a direction that may be opposite to the direction in which the component area CA may be arranged or disposed. In this case, the lower cover 90 may include a hole to correspond to at least one of the component 40 and the camera 731. For example, the lower cover 90 may include a component hole (not shown) to correspond to the component 40, and a second camera hole CMH2 provided or disposed to correspond to the camera 731. These holes are not limited to the aforementioned locations. The second camera hole CMH2 may be arranged or disposed to correspond to the component 40 and the component hole may be arranged or disposed to correspond to the camera 731. For convenience of description, the component 40 may be arranged or disposed to correspond to the second camera hole CMH2 of the lower cover 90.

The light guiding unit 300 may include a light guide 310, a first path changer 320, a path change driver 330, a second path changer 340, and a light shielder 350.

The light guide 310 may include a transmissive material and may guide light. The light guide 310 may be bent at least once. The light guide 310 may include a light-transmitting resin such as glass, acryl, or silicon. A shielding layer may be arranged or disposed on the outer surface of the light guide 310 in order to shield external light. In this case, the shielding layer may be attached in the form of a film onto the outer surface of the light guide 310 or may be coated on the outer surface of the light guide 310.

The first path changer 320 may change the path of light that may be incident along the light guide 310. In this case, the first path changer 320 may reflect light that may be incident upon the component area CA and may be transmitted along the light guide 310, and make the light be incident upon the component 40. The first path changer 320 may be provided in various shapes. According to an embodiment, the first path changer 320 may include a mirror. According to an embodiment, the first path changer 320 may include a light-reflecting metal layer coated on the outer surface thereof.

The path change driver 330 may be connected to the first path changer 320 and may change the location of the first path changer 320. For example, the path change driver 330 may be connected to the first path changer 320 and may rotate the first path changer 320. According to an embodiment, the path change driver 330 may be connected to the first path changer 320 and may linearly move the first path changer 320. For convenience of description, a case where the path change driver 330 rotates the first path changer 320 will now be described in detail.

The path change driver 330 may include a motor that may be connected to the first path changer 320. According to an embodiment, the path change driver 330 may include a cylinder that may be connected to the first path changer 320 such that the cylinder may be eccentric from the rotation center of the first path changer 320. The path change driver 330 is not limited thereto, and all cases in which there may be an ability to connect to the first path changer 320 and rotate the first path changer 320 may be applied to the path change driver 330.

The second path changer 340 may be arranged or disposed in the light guide 310 and may change a light path by reflecting the light incident upon the component area CA. In this case, the second path changer 340 may include a material that may be the same as or similar to that included in the first path changer 320. The second path changer 340 may be fixed to the light guide 310.

In a case that the path change driver 330 operates, the light shielder 350 may shield the light incident upon the component area CA. In this case, the light shielder 350 may be arranged or disposed at any of various locations. For example, the light shielder 350 may be arranged or disposed in the light guide 310 and may selectively shield light that passes through the light guide 310. According to an embodiment, the light shielder 350 may be arranged or disposed on the bracket 60 and may selectively block at least one of a component hole CPH and a first camera hole (not shown). In this case, light incident upon one of the component hole CPH or the first camera hole may be incident upon one of the component 40 or the camera 731. In this case, light incident upon the other of the component hole CPH or the first camera hole may be incident upon the other of the component 40 or the camera 731. For convenience of description, a case where the light incident upon the component hole CPH may be incident upon the component 40 via the light guiding unit 300 and the light shielder 350 may be arranged or disposed on the bracket 60 and selectively shields the component hole CPH will now be focused on and described in detail.

The light shielder 350 may be provided in various shapes. According to an embodiment, the light shielder 350 may include a film or window that may be changed to be transparent or opaque according to an external signal. According to an embodiment, the light shielder 350 may include a shielder 351 selectively shielding the component hole CPH, and a shielding driver 352 connected to the shielder 351 to move the shielder 351. In this case, the shielding driver 352 may include a motor, and a ball screw that may be connected to the motor and the shielder 351. According to an embodiment, the shielding driver 352 may include a linear motor that may be connected to the shielder 351. According to an embodiment, the shielding driver 352 may include a cylinder that may be connected to the shielder 351. According to an embodiment, the shielding driver 352 may include a motor, a gear, and a rack gear that may be connected to the gear and connected to the shielder 351. The shielding driver 352 is not limited thereto, and may include any structure that may be connected to the shielder 351 and linearly moving the shielder 351.

In an operation of the display apparatus 1 having the above-described structure, the component 40 may sense light that may be incident from a front surface of the display apparatus 1 (for example, a surface on which an image is displayed in a case that the display panel 10 operates).

In this case, the path change driver 330 may locate the first path changer 320 such that the first path changer 32 may shield light that may be incident upon the second camera hole CMH2 of the lower cover 90. In this case, the first path changer 320 may completely shield the second camera hole CMH2, and may be arranged or disposed at an angle to one surface of the component 40. Light that has passed through the component area CA may travel along the light guide 310 and may be reflected by the second path changer 340 and be incident upon the first path changer 320. Light that has been reflected by the first path changer 320 may be finally incident upon the component 40.

On the other hand, in a case that the display apparatus 1 senses light that may be incident from an outer surface of the lower cover 90 (for example, a surface on which no images may be displayed in a case that the display panel 10 operates), the path change driving unit 330 may rotate the first path changer 320. At this time, the first path changer 320 may rotate clockwise according to FIG. 103 and thus may not be overlapped by the second camera hole CMH2. In this case, light may pass through the second camera hole CMH2 and be incident upon the component 40. At this time, the light incident upon the component area CA may be incident upon the first path changer 320 via the light guide 310, but may not be finally incident upon the component 40 after being reflected by the first path changer 320. According to an embodiment, in a case that the light shielder 350 may be included, the light shielder 350 may shield light incident via the light guide 310.

Accordingly, the display apparatus 1 may sense the light beams incident from two different surfaces of the display apparatus 1, via a single component 40 or a single camera 731.

Figure 104:
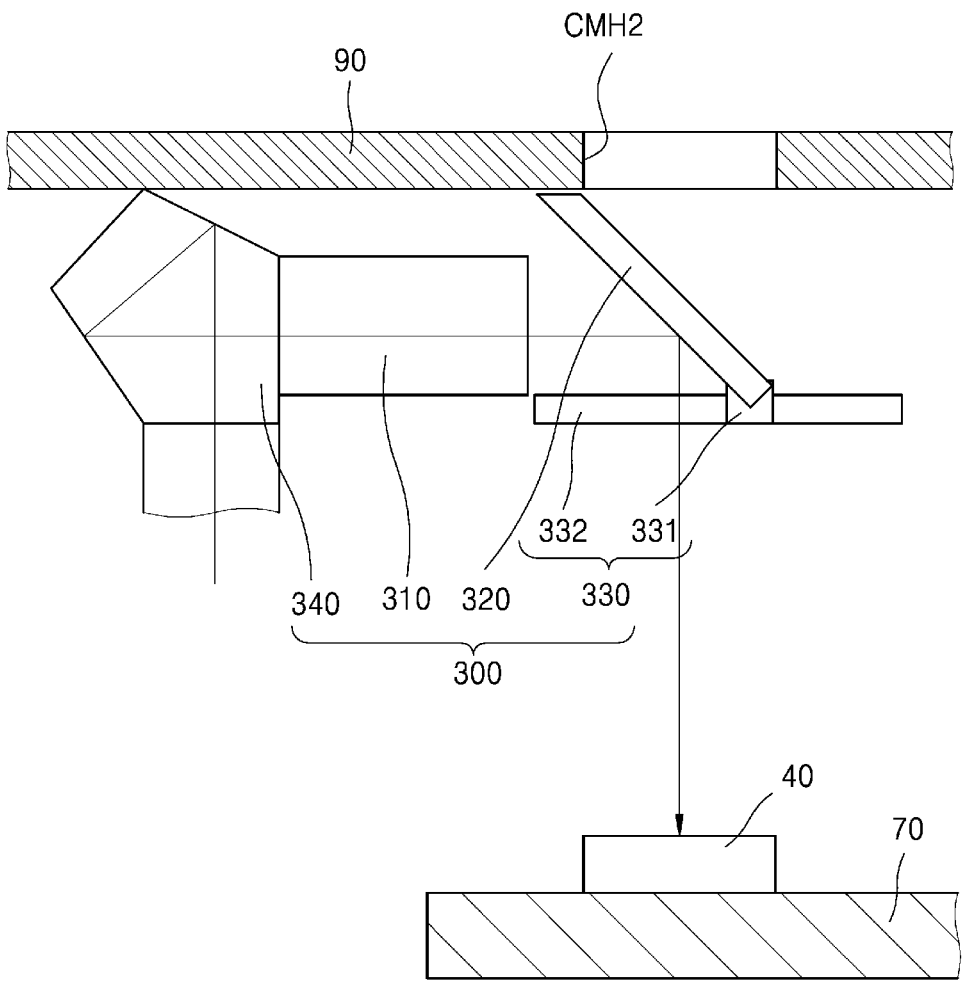
FIG. 104 is a schematic cross-sectional view of a portion or region of a display apparatus according to an embodiment.

FIG. 104 is a schematic cross-sectional view of a portion or region of a display apparatus according to an embodiment.

Referring to FIG. 104, a display apparatus (not shown) may be similar to the display apparatus 1 of FIG. 103. Differences between FIGS. 103 and 104 will now be focused on and described in detail.

A light guiding unit 300 may include a light guide 310, a first path changer 320, a path change driver 330, and a second path changer 340. The light guide 310 and the first path changer 320 are the same as or similar to those described above with reference to FIG. 103, and thus detailed descriptions thereof are omitted herein.

The path change driver 330 may be connected to the first path changer 320 and may linearly move the first path changer 320. At this time, the path change driving unit 330 may be connected to a lateral surface of the first path changer 320 to minimize interference with the light incident via the second camera hole CMH2. In this case, the first path changer 330 may not be overlapped by the second camera hole CMH2.

The path change driver 330 may include a linear driver 331 linearly moving the first path changer 320, and a linear guide 332. In this case, the linear driver 331 may be provided in various shapes. According to an embodiment, the linear driver 331 may include a motor, and a ball screw that may be connected to the motor and the first path changer 320. According to an embodiment, the linear driver 331 may include a linear motor that may be connected to the first path changer 320. According to an embodiment, the linear driver 331 may include a cylinder that may be connected to the first path changer 320. The linear driver 331 is not limited thereto, and may include any device that may be connected to the first path changer 320 and linearly moving the first path changer 320. The linear guide 332 may be connected to the first path changer 320 and may guide linear movement of the first path changer 320 in a case that the first path changer 320 linearly moves. In a case that the linear driver 331 may include a motor, the linear guide 332 may be integral with the linear driver 331. According to an embodiment, the linear guide 332 may include a linear motion guide that may be included separately from the linear driver 331.

The second path changer 340 may include a prism. In this case, the second path changer 340 may totally reflect at least once the light incident upon the component area CA and may move the totally reflected light toward the first path changer 320.

In an operation of the display apparatus, according to a user's selection, the light incident upon the component area CA may be incident upon at least one of the component 40 and the camera 731, or the light that has passed through the second camera hole CMH2 may be incident upon at least one of the component 40 and the camera 731. For convenience of description, a case where the light guiding unit 300 guides light to the component 40 will now be described in detail.

In a case that only the light incident upon the component area CA is sensed, the path change driver 330 may drive the first path changer 320 to shield the second camera hole CMH2. In this case, the first path changer 320 may completely shield the second camera hole CMH2, and may be arranged or disposed at an angle to one surface of the component 40.

The light incident upon the component area CA may pass through the component hole CPH and may be incident upon the light guide 310. The light may travel within the light guide 310, may be totally reflected by the second path changer 340, and may be guided to the first path changer 320 via the light guide 310. The first path changer 320 may reflect this light toward the component 40. The component 40 may sense the light.

On the other hand, in a case that only the light incident via the second camera hole CMH2 is sensed, the path change driving unit 330 may change the location of the first path changer 320. For example, the path change driver 330 may position the first path changer 320 to be closer to or farther from the second path changer 340 than at an initial location. In this case, the first path changer 320 may be arranged or disposed at a different location from the location of the second camera hole CMH2, and the light that has passed through the second camera hole CMH2 may be incident upon the component 40. In such as case, in a case that the first path changer 320 is positioned closer to or farther from the second path changer 340 than at the initial location, the light incident upon the first path changer 320 via the second path changer 340 may be incident upon a portion of the display apparatus on which the component 40 may not be arranged, and thus the light incident upon the component area CA may not be sensed by the component 40.

In such a case, although not shown in the drawings, the light shielder 350 of FIG. 103 may be included to prevent the light incident via the second camera hole CMH2 from being interfered with or distorted by the light incident upon the component area CA.

Accordingly, the display apparatus may sense the light beams incident from two different surfaces of the display apparatus, via a single component 40 or a single camera 731.

One or more embodiments include a display panel having an extended display area such that an image may be displayed even in an area where a component as an electronic element may be arranged or disposed, and a display apparatus including the display panel. However, the scope of the disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel comprising:
a substrate including a main display area and a component area, the component area including a transmission area;
main display elements disposed on the substrate in the main display area, the main display elements arranged in a pentile matrix structure;
main pixel circuits electrically connected to the main display elements;
auxiliary display elements disposed on the substrate in the component area, the auxiliary display elements arranged in a pentile matrix structure;
auxiliary pixel circuits electrically connected to the auxiliary display elements;
a transparent electrode layer disposed on the substrate in the component area connecting one of the auxiliary pixel circuits to one of the auxiliary display elements;
a thin-film encapsulation layer disposed over the main display elements and the auxiliary display elements and comprising a first inorganic encapsulation layer, an organic encapsulation layer, and a second inorganic encapsulation layer;
a touch buffer layer directly disposed on the thin-film encapsulation layer; and
a touch electrode having a mesh structure disposed on the touch buffer layer, wherein
at least one of light emitting areas of the auxiliary display elements does not overlap with the auxiliary pixel circuits in a plan view,
wherein the touch electrode has a hole in the component area, and
wherein the hole of the touch electrode in the component area does not include any mesh structure of the touch electrode.

2. The display panel of claim 1, wherein
the main display elements include at least four main subpixels comprising a red main subpixel, a blue main subpixel and two green main subpixels,
the red main subpixel and the blue main subpixel are arranged on a first row,
the two green main subpixels are arranged on a second row,
the auxiliary display elements include at least four auxiliary subpixels comprising a red auxiliary subpixel, a blue auxiliary subpixel and two green auxiliary subpixels,
the red auxiliary subpixel and the blue auxiliary subpixel are arranged on the first row, and
the two green auxiliary subpixels are arranged on the second row.

3. The display panel of claim 2, wherein
the four main subpixels are arranged at four vertexes of a virtual main parallelogram, and
the four auxiliary subpixels are arranged at four vertexes of a virtual auxiliary parallelogram, and
wherein the component area and the main display area have a same resolution and a same pixel arrangement.

4. The display panel of claim 3, wherein a resolution of the main display area is about 400 pixels per inch.

5. The display panel of claim 1, wherein each of the auxiliary display elements and each of the main display elements are an organic light-emitting diode, the organic light-emitting diode includes a stack of a pixel electrode, an emission layer, and an opposite electrode.

6. The display panel of claim 1, further comprising:
a camera below the component area of the substrate.

7. The display panel of claim 1, wherein the main display elements include at least four main subpixels comprising a red main subpixel, a blue main subpixel and two green main subpixels,
the red main subpixel and the blue main subpixel are arranged on a first row,
the two green main subpixels are arranged on a second row,
the auxiliary display elements include at least four auxiliary subpixels comprising a red auxiliary subpixel, a blue auxiliary subpixel and two green auxiliary subpixels,
the red auxiliary subpixel and the blue auxiliary subpixel are arranged on the first row, and
wherein the four main subpixels are arranged at four vertexes of a virtual main parallelogram.

8. The display panel of claim 7, wherein a resolution of the main display area is about 400 pixels per inch.

9. The display panel of claim 7, wherein a resolution of the component area is ½ of a resolution of the main display area.

10. The display panel of claim 9, further comprising:
a camera below the component area of the substrate.

11. An electronic device comprising:
a lower cover having a first component area;
a display panel disposed on the lower cover, the display panel comprising a main display area and a second component area, the second component area including a transmission area;
a second component disposed between the display panel and the lower cover in the second component area;
a bracket between the display panel and the lower cover;
a main circuit board including a main processor;
a battery below the bracket;
a first component disposed in the lower cover in the first component area;
main display elements disposed in the main display area, the main display elements arranged in a pentile matrix structure;
main pixel circuits electrically connected to the main display elements;
auxiliary display elements disposed in the second component area, the auxiliary display elements arranged in a pentile matrix structure;
auxiliary pixel circuits electrically connected to the auxiliary display elements;
transparent electrode layers disposed in the second component area and connecting the auxiliary pixel circuits to the auxiliary display elements;
a thin-film encapsulation layer disposed over the main display elements and the auxiliary display elements and comprising a first inorganic encapsulation layer, an organic encapsulation layer, and a second inorganic encapsulation layer;

a touch buffer layer directly disposed on the thin-film encapsulation layer; and a touch electrode having a mesh structure disposed on the touch buffer layer;

wherein at least one of light emitting areas of the auxiliary display elements does not overlap with the auxiliary pixel circuits in a plan view, and wherein the touch electrode has a hole in the second component area, and wherein the hole of the touch electrode in the second component area does not include any mesh structure of the touch electrode.

12. The electronic device of claim 11, wherein the main display elements include at least four main subpixels comprising a red main subpixel, a blue main subpixel and two green main subpixels, the red main subpixel and the blue main subpixel are arranged on a first row, the two green main subpixels are arranged on a second row, the auxiliary display elements include at least four auxiliary subpixels comprising a red auxiliary subpixel, a blue auxiliary subpixel and two green auxiliary subpixels, the red auxiliary subpixel and the blue auxiliary subpixel are arranged on the first row, and the two green auxiliary subpixels are arranged on the second row.

13. The electronic device of claim 12, wherein the four main subpixels are arranged at four vertexes of a virtual main parallelogram, and the four auxiliary subpixels are arranged at four vertexes of a virtual auxiliary parallelogram, and wherein the second component area and the main display area have a same resolution and a same pixel arrangement.

14. The electronic device of claim 13, wherein a resolution of the main display area is about 400 pixels per inch.

15. The electronic device of claim 11, wherein each of the auxiliary display elements and each of the main display elements are an organic light-emitting diode, the organic light-emitting diode includes a stack of a pixel electrode, an emission layer, and an opposite electrode.

16. The electronic device of claim 11, wherein the first component is a first camera, and wherein the second component is a second camera.

17. The electronic device of claim 11, wherein the main display elements include at least four main subpixels comprising a red main subpixel, a blue main subpixel and two green main subpixels, the red main subpixel and the blue main subpixel are arranged on a first row, the two green main subpixels are arranged on a second row, the auxiliary display elements include at least four auxiliary subpixels comprising a red auxiliary subpixel, a blue auxiliary subpixel and two green auxiliary subpixels, the red auxiliary subpixel and the blue auxiliary subpixel are arranged on the first row, and wherein the four main subpixels are arranged at four vertexes of a virtual main parallelogram.

18. The electronic device of claim 17, wherein a resolution of the main display area is about 400 pixels per inch.

19. The electronic device of claim 17, wherein a resolution of the second component area is ½ of a resolution of the main display area.

20. The electronic device of claim 19, wherein the first component is an image sensor, and wherein the second component is an infrared sensor.

* * * * *